US011257695B1

(12) United States Patent
Sung et al.

(10) Patent No.: US 11,257,695 B1
(45) Date of Patent: Feb. 22, 2022

(54) APPARATUS FOR TRANSFERRING MICRODEVICE AND METHOD FOR TRANSFERRING MICRODEVICE

(71) Applicant: CCS Technology Corporation, Taoyuan (TW)

(72) Inventors: Tung-Po Sung, Taoyuan (TW); Chang-Cheng Lo, Taoyuan (TW)

(73) Assignee: CCS TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 16/950,969

(22) Filed: Nov. 18, 2020

(30) Foreign Application Priority Data

Aug. 14, 2020 (TW) .................................. 109127688

(51) Int. Cl.
*H01L 21/67* (2006.01)
*H01L 21/683* (2006.01)
*H01L 25/075* (2006.01)
*H01L 33/62* (2010.01)
*B65G 47/90* (2006.01)

(52) U.S. Cl.
CPC ........ *H01L 21/67144* (2013.01); *B65G 47/90* (2013.01); *H01L 21/6835* (2013.01); *H01L 25/0753* (2013.01); *H01L 33/62* (2013.01); *H01L 2221/68354* (2013.01); *H01L 2221/68363* (2013.01); *H01L 2221/68381* (2013.01); *H01L 2933/0066* (2013.01)

(58) Field of Classification Search
CPC ........... H01L 21/67144; H01L 21/6835; H01L 25/0753; H01L 33/62; H01L 2221/68354; H01L 2221/68363; H01L 2221/68381; H01L 2933/0066; B65G 47/90
USPC .......................................................... 438/28
See application file for complete search history.

(56) References Cited

U.S. PATENT DOCUMENTS 10,607,515 B2 * 3/2020 Park .......................... G09F 9/33

* cited by examiner

*Primary Examiner* — Vu A Vu

(57) ABSTRACT

This invention provides an apparatus for transferring at least one microdevice and a method for transferring at least one microdevice, which is characterized by utilizing the apparatus for transferring at least one microdevice having a magnetic attracting substrate with at least one magnetic attracting head or magnetic attracting position hole to attract at least one microdevice having at least one magnetic layer disposed on a temporary substrate, and transfer the at least one microdevice to the conductive bonding layer of the at least one microdevice bonding region on a target substrate thereafter.

52 Claims, 125 Drawing Sheets

APPARATUS FOR TRANSFERRING MICRODEVICE AND METHOD FOR TRANSFERRING MICRODEVICE

This application claims the benefit of Taiwanese application serial No. 109127688, filed on Aug. 14, 2020, and the subject matter of which is incorporated herein by reference.

BACKGROUND OF THE INVENTION

Field of the Invention

The invention relates in general to an apparatus for transferring at least one microdevice and a method for transferring at least one microdevice.

Description of the Related Art

With the development of science and technology, microdevices including semiconductor elements, light-emitting diode dies, or micro-light-emitting diode dies, have been widely used in various electronic devices. Among them, light-emitting diodes have the advantages of active light emission, high brightness, energy saving, etc., so they have been widely used in technical fields such as lighting, displays and projectors, and micro LED displays have gradually become a new generation of display technology. However, a high-density (FHD: Full High Density) display has about 2 million pixels of 1920 rows×1080 columns, and each pixel is divided into three sub-pixels: red, green, and blue. Therefore, a high-density light-emitting diode display (FHD LED Display) has a total of about 6 million LED dies. The key technology for bonding 6 million divided dies smaller than the diameter of a human hair on a display panel is how to accurately transfer a large number of micro LED dies to the substrate of the display panel.

Besides, in order to cope with the current trend of miniaturization and integration of components with different characteristics into a single electronic device, thus the difficulty of manufacturing is highly enhanced. Therefore, it is a major issue to provide a method for transfer a large number of miniaturized microdevices to a target carrier substrate and achieve the purposes of fast package, high integration, size-shrinkage of packaged module, and increase of pad number.

Accordingly, an apparatus for precisely transferring microdevices to a target substrate and a method for transferring microdevices by using the same are highly expected.

SUMMARY OF THE INVENTION

One object of this invention is to provide a microdevice, comprising a bonding surface and a magnetic attracting surface opposite to the bonding surface, wherein, the bonding surface comprises at least one bonding pad, and the magnetic attracting surface comprises at least one magnetic attracting layer.

The microdevice as mentioned above, wherein the microdevice is a semiconductor device, a light emitting diode (LED) die or a micro light emitting diode (LED) die.

The microdevice as mentioned above, wherein the magnetic material layer comprises a magnetic material selected from at least one of the group consisting of iron, cobalt, nickel and alloy thereof.

One object of this invention is to provide an apparatus for transferring at least one microdevice, comprising: a first magnet with a first terminal and a second terminal opposite to each other; a first magnetic attracting substrate with a first surface and a second surface opposite to each other disposed under the first magnet, wherein the first surface of the first magnetic attracting substrate is contacted to the first terminal of the first magnet, and the second surface of the first magnetic attracting substrate comprises at least one microdevice alignment region, and each one of the at least one microdevice alignment region comprises at least one magnetic attracting head protruding out of the second surface; and an insulating layer enveloped the first magnetic attracting substrate but partially exposed the at least one magnetic attracting head in each of the at least one microdevice alignment region.

The apparatus for transferring at least one microdevice as mentioned above, further comprises a magnetic shielding layer disposed adjacent to the second surface of the first magnetic attracting substrate spaced with a distance d (d>0), wherein the magnetic shielding layer surrounds the at least one magnetic attracting head in each of the at least one microdevice alignment region.

The apparatus for transferring at least one microdevice as mentioned above, further comprises a second magnet with a third terminal and a fourth terminal opposite to each other and a second magnetic attracting substrate, wherein the second magnetic attracting substrate is contacted to the third terminal of the second magnet, and the second magnetic substrate is disposed under the first magnetic substrate.

The apparatus for transferring at least one microdevice as mentioned above, further comprises a second magnet with a third terminal and a fourth terminal opposite to each other and a second magnetic attracting substrate, wherein the second magnetic attracting substrate is contacted to the third terminal of the second magnet, and the second magnetic substrate is disposed under the first magnetic substrate.

Another object of this invention is to provide a method for transferring at least one microdevice, comprising the steps of: providing an apparatus for transferring at least one microdevice as mentioned above; providing a temporary carrier substrate with a third surface and a fourth surface opposite to each other, wherein at least one microdevice is placed on the third surface of the temporary carrier substrate through the bonding surface thereof, wherein the at least one microdevice comprises a bonding surface and a magnetic attracting surface opposite to the bonding surface, and the bonding surface comprises at least one bonding pad, and the magnetic attracting surface comprises at least one magnetic attracting layer; providing a target substrate with a fifth surface and a sixth surface opposite to each other, wherein the fifth surface comprises at least one microdevice bonding region, and each of the at least one microdevice bonding region has a conductive bonding layer formed thereon; moving the temporary carrier substrate into the apparatus for transferring at least one microdevice, wherein the temporary carrier substrate is located below the first magnetic attracting substrate and faces the second surface of the first magnetic attracting substrate by the third surface, and the magnetic attracting layer of the magnetic attracting surface of the at least one microdevice faces the at least one microdevice alignment region of the first magnetic attracting substrate; controlling the magnetic field intensity of the first magnet of the apparatus for transferring at least one microdevice to make the at least one microdevice be attracted by one of the at least one Magnetic attracting head in one of the at least one microdevice alignment region through the magnetic attracting layer of the magnetic attracting surface thereof and separated from the third surface of the temporary carrier substrate; removing the temporary carrier substrate out of the apparatus for transferring at least one microdevice, and moving the target substrate into the apparatus for transferring at least one microdevice thereafter, wherein the target substrate is located below the first magnetic attracting substrate and faces the second surface of the first magnetic attracting substrate through the fifth surface, and each of the at least one microdevice bonding region on the fifth surface of the target substrate faces and aligns to each of the at least one microdevice alignment region on the second surface of the first magnetic attracting substrate; jointing the first magnetic attracting substrate with the target substrate to contact the at least one microdevice attracted by one of the at least one magnetic attracting head in one of the at least one microdevice alignment region to the conductive bonding layer of the at least one microdevice bonding region on the fifth surface of the target substrate through the bonding surface thereof; and applying a thermal treatment to make the at least one microdevice bond to the conductive bonding layer of the at least one microdevice bonding region through the bonding surface thereof, and separate from the at least one alignment region and independently bond to the conductive bonding layer of the at least one microdevice bonding region on the fifth surface of the target substrate thereafter, and finish the process for transferring the at least one microdevice from the temporary carrier substrate to the target substrate.

The method for transferring at least one microdevice as mentioned above, further comprises a step of lift-off to lift off the at least one microdevice from the third surface of the temporary carrier substrate before the step of moving the temporary carrier substrate into the apparatus for transferring at least one microdevice. The step of lift-off can be proceeded by laser or UV.

The method for transferring at least one microdevice as mentioned above, when an apparatus for transferring at least one microdevice as mentioned above is used, a magnetic force generated by the first magnetic substrate greater than that generated by the second magnetic substrate felt by the at least one microdevice on the temporary carrier substrate is achieved by adjusting the distance between the temporary carrier substrate and the first magnetic attracting substrate, and/or enveloping the second magnetic substrate with a magnetic shielding layer.

Another object of this invention is to provide another apparatus for transferring at least one microdevice, comprising: a first magnet with a first terminal and a second terminal opposite to each other; a first magnetic attracting substrate with a first surface and a second surface opposite to each other disposed under the first magnet, wherein the first surface of the first magnetic attracting substrate is contacted to the first terminal of the first magnet, and the second surface of the first magnetic attracting substrate comprises at least one microdevice alignment region; and an insulating layer enveloped the first magnetic attracting substrate, wherein each of the at least one microdevice alignment region comprises at least one magnetic attracting hole exposing the second substrate of the first magnetic attracting substrate.

The another apparatus for transferring at least one microdevice as mentioned above, further comprises a magnetic shielding layer disposed adjacent to the second surface of the first magnetic attracting substrate spaced with a distance d (d>0), wherein the magnetic shielding layer surrounds the at least one magnetic attracting hole in each of the at least one microdevice alignment region.

The another apparatus for transferring at least one microdevice as mentioned above, further comprises a second magnet with a third terminal and a fourth terminal opposite to each other and a second magnetic attracting substrate, wherein the second magnetic attracting substrate is contacted to the third terminal of the second magnet, and the second magnetic substrate is disposed under the first magnetic substrate.

The another apparatus for transferring at least one microdevice as mentioned above, further comprises a second magnet with a third terminal and a fourth terminal opposite to each other and a second magnetic attracting substrate, wherein the second magnetic attracting substrate is contacted to the third terminal of the second magnet, and the second magnetic substrate is disposed under the first magnetic substrate.

Another object of this invention is to provide another method for transferring at least one microdevice, comprising the steps of: providing an apparatus for transferring at least one microdevice as mentioned above; providing a temporary carrier substrate with a third surface and a fourth surface opposite to each other, wherein at least one microdevice is placed on the third surface of the temporary carrier substrate through the bonding surface thereof, wherein the at least one microdevice comprises a bonding surface and a magnetic attracting surface opposite to the bonding surface, and the bonding surface comprises at least one bonding pad, and the magnetic attracting surface comprises at least one magnetic attracting layer; providing a target substrate with a fifth surface and a sixth surface opposite to each other, wherein the fifth surface comprises at least one microdevice bonding region, and each of the at least one microdevice bonding region has a conductive bonding layer formed thereon; moving the temporary carrier substrate into the apparatus for transferring at least one microdevice, wherein the temporary carrier substrate is located below the first magnetic attracting substrate and faces the second surface of the first magnetic attracting substrate by the third surface, and the magnetic attracting layer of the magnetic attracting surface of the at least one microdevice faces the at least one microdevice alignment region of the first magnetic attracting substrate; controlling the magnetic field intensity of the first magnet of the apparatus for transferring at least one microdevice to make the at least one microdevice be attracted by one of the at least one magnetic attracting hole in one of the at least one microdevice alignment region through the magnetic attracting layer of the magnetic attracting surface thereof and separated from the third surface of the temporary carrier substrate; removing the temporary carrier substrate out of the apparatus for transferring at least one microdevice, and moving the target substrate into the apparatus for transferring at least one microdevice thereafter, wherein the target substrate is located below the first magnetic attracting substrate and faces the second surface of the first magnetic attracting substrate through the fifth surface, and each of the at least one microdevice bonding region on the fifth surface of the target substrate faces and aligns to each of the at least one microdevice alignment region on the second surface of the first magnetic attracting substrate; jointing the first magnetic attracting substrate with the target substrate to contact the at least one microdevice attracted by one of the at least one magnetic attracting hole in one of the at least one microdevice alignment region to the conductive bonding layer of the at least one microdevice bonding region on the fifth surface of the target substrate through the bonding surface thereof; and applying a thermal treatment to make the at least one microdevice bond to the conductive bonding layer of the at least one microdevice bonding region through the bonding surface thereof, and separate from the at least one alignment region and independently bond to the conductive bonding layer of the at least one microdevice bonding region on the fifth surface of the target substrate thereafter, and finish the process for transferring the at least one microdevice from the temporary carrier substrate to the target substrate.

The another method for transferring at least one microdevice as mentioned above, further comprises a step of lift-off to lift off the at least one microdevice from the third surface of the temporary carrier substrate before the step of moving the temporary carrier substrate into the apparatus for transferring at least one microdevice. The step of lift-off can be proceeded by laser or UV.

The another method for transferring at least one microdevice as mentioned above, when an apparatus for transferring at least one microdevice as mentioned above is used, a magnetic force generated by the first magnetic substrate greater than that generated by the second magnetic substrate felt by the at least one microdevice on the temporary carrier substrate is achieved by adjusting the distance between the temporary carrier substrate and the first magnetic attracting substrate, and/or enveloping the second magnetic substrate with a magnetic shielding layer.

DETAILED DESCRIPTION OF THE INVENTION

The detailed description provided below in connection with the appended drawings is intended as a description of the present examples and is not intended to represent the only forms in which the present example may be constructed or utilized. The description sets forth the functions of the example and the sequence of steps for constructing and operating the example. However, the same or equivalent functions and sequences may be accomplished by different examples.

In the following description, numerous specific details are described in detail in order to enable the reader to fully understand the following examples. However, embodiments of the present invention may be practiced in case no such specific details. In other cases, in order to simplify the drawings the structure of the apparatus known only schematically depicted in figures.

EMBODIMENT

Embodiment 1

Figure 1A:
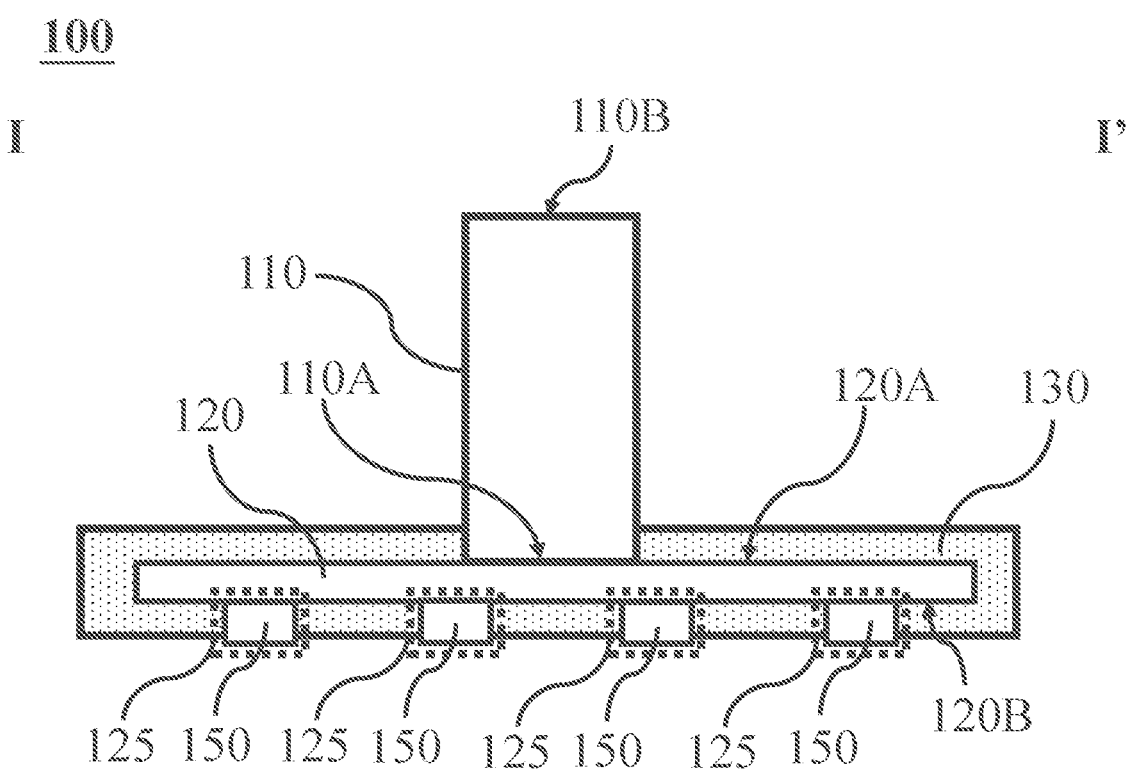
FIGS. 1A~1C are respectively a cross-sectional view, a top view and a bottom view of an apparatus for transferring microdevice 100 of Embodiment 1 of this invention.
Figure 1B:
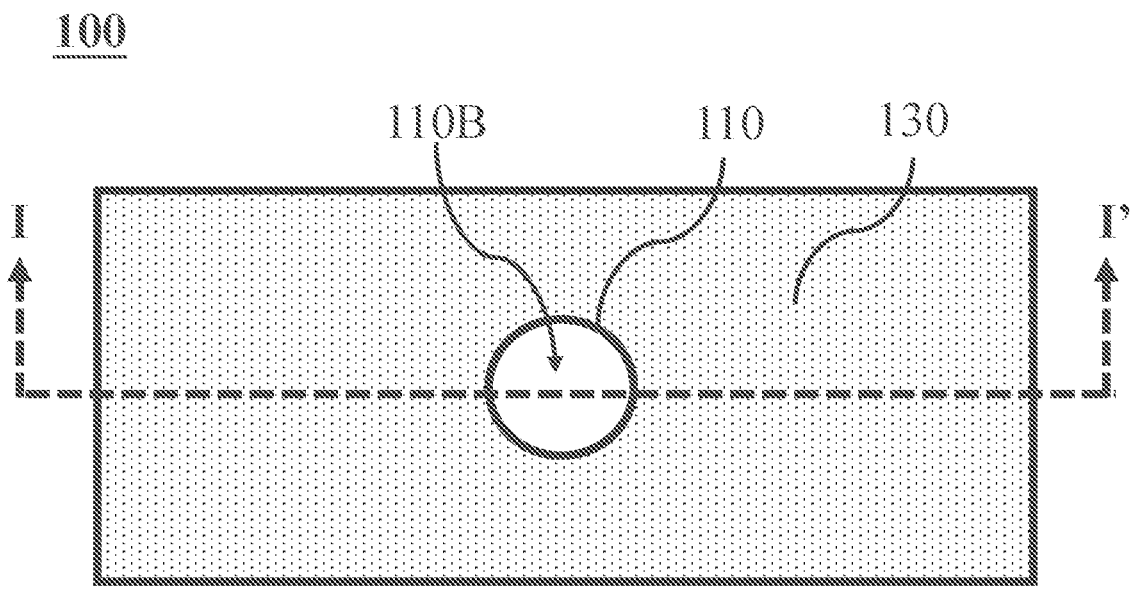
Figure 1C:
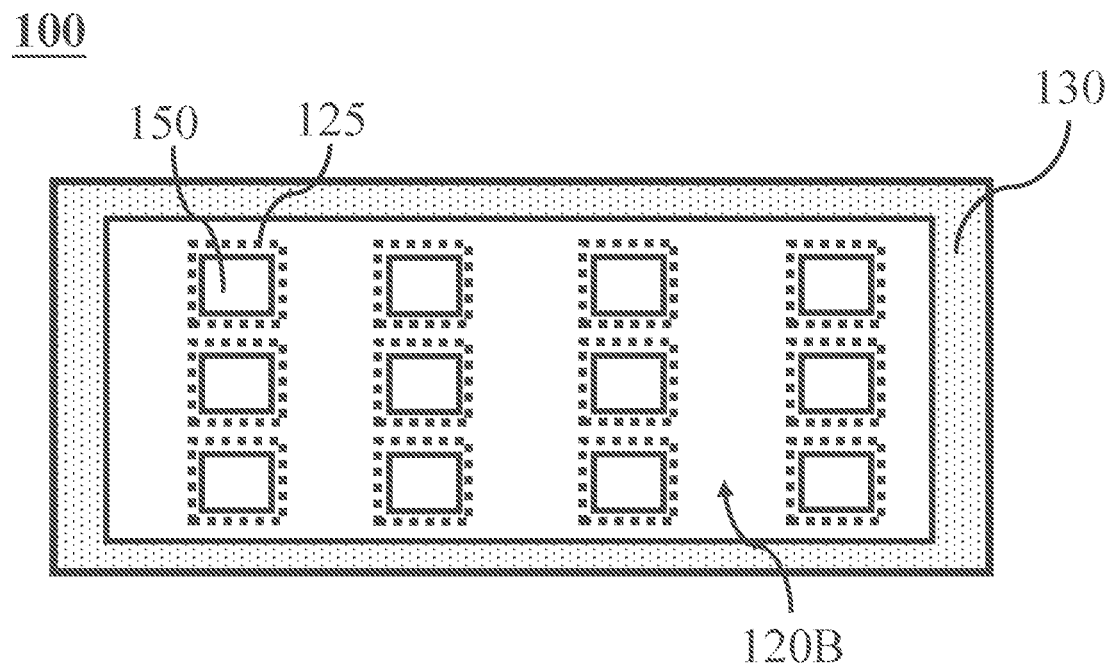
Figure 2A:
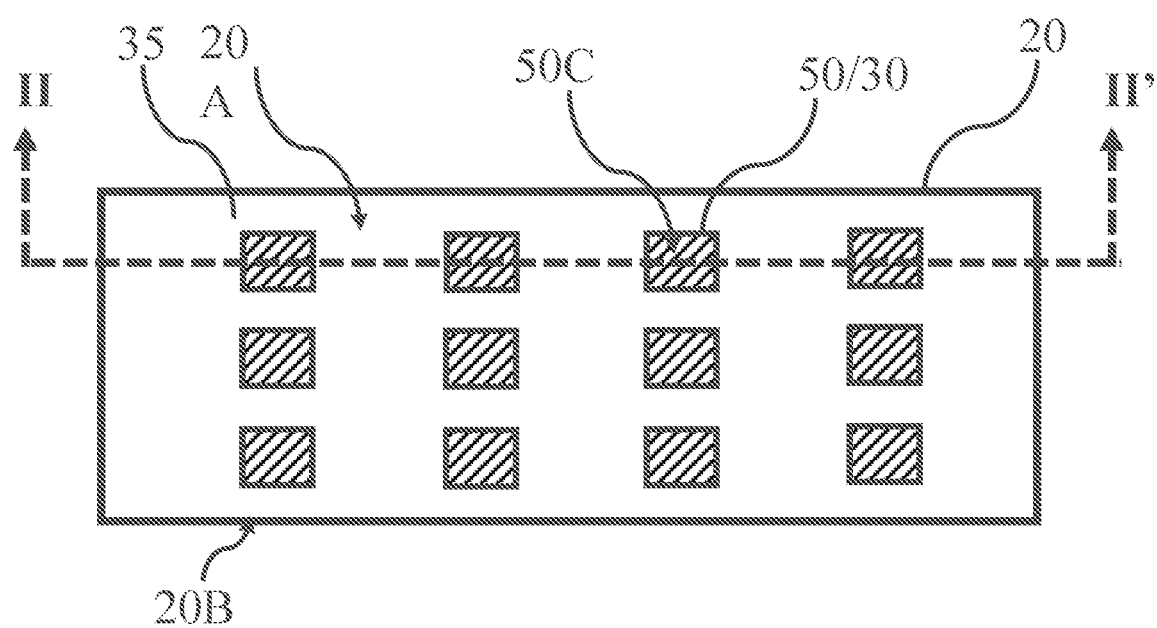
FIG. 2A is a top view of a temporary carrier substrate 20 with a plurality of microdevices 30 to be transferred formed thereon.
Figure 2B:
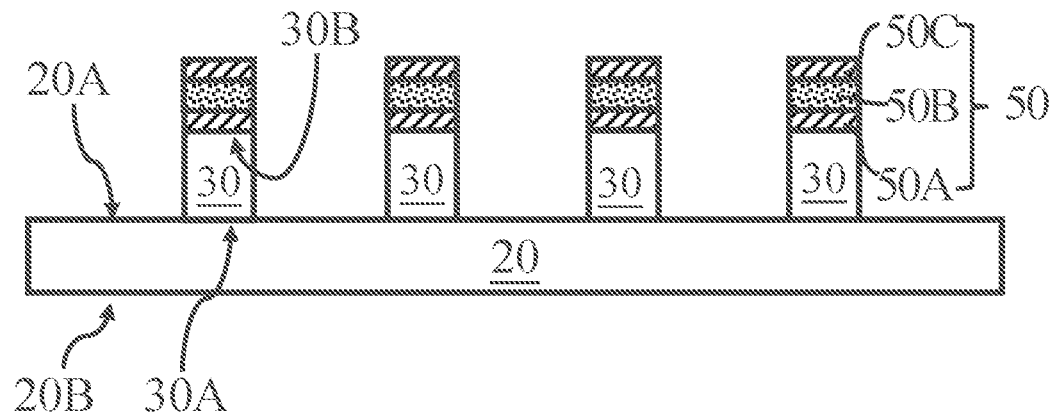
FIGS. 2B~2C are cross-sectional views of the temporary carrier substrate 20 along with the cross-sectional line II-II' shown in FIG. 2A.
Figure 2C:
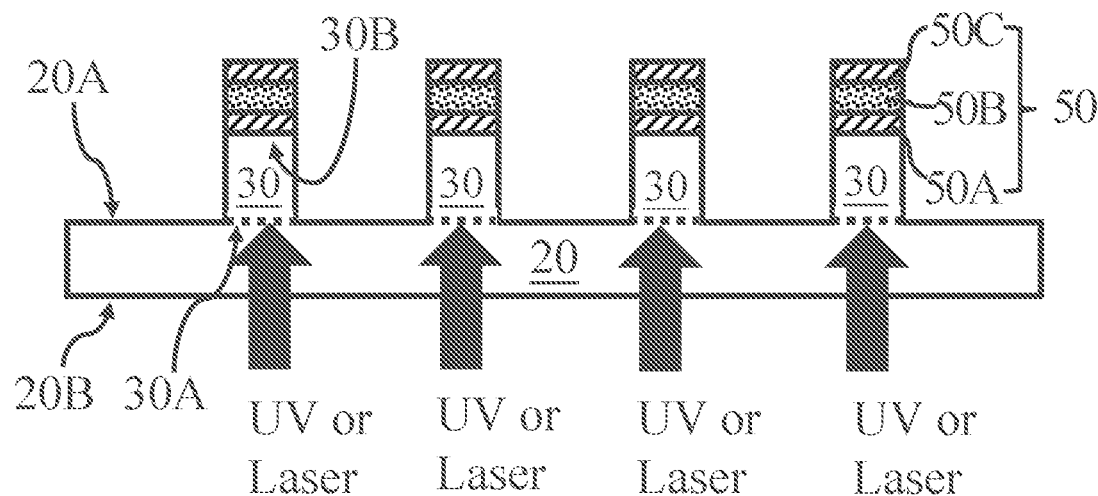
Figure 3A:
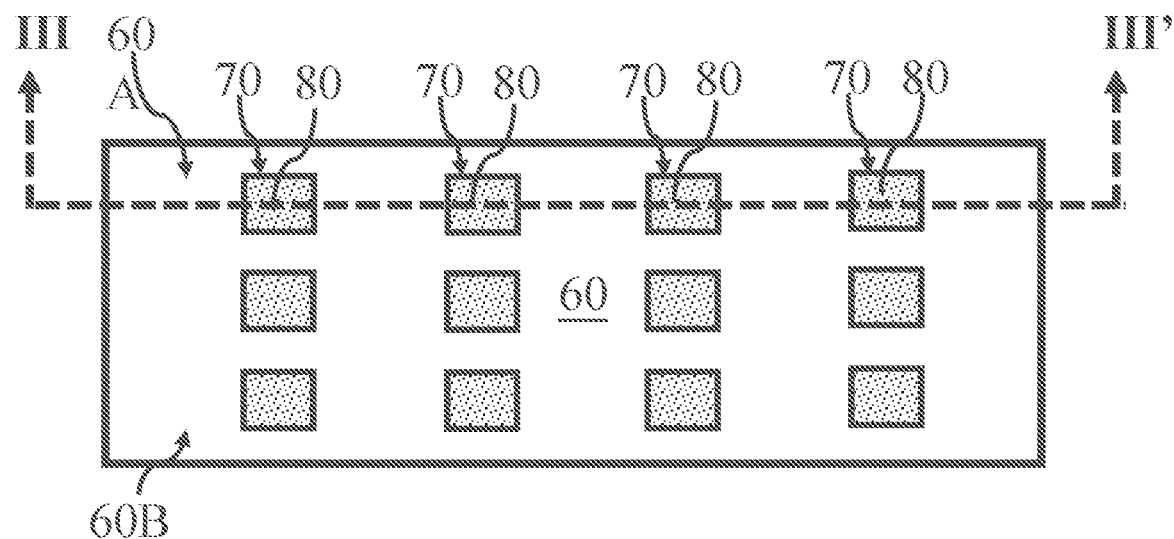
FIG. 3A is a top view of a target substrate 60 with a plurality of microdevice bonding regions 70 formed thereon, and each of the microdevice bonding regions 70 comprises a conductive bonding layer 80 formed thereon.
Figure 3B:
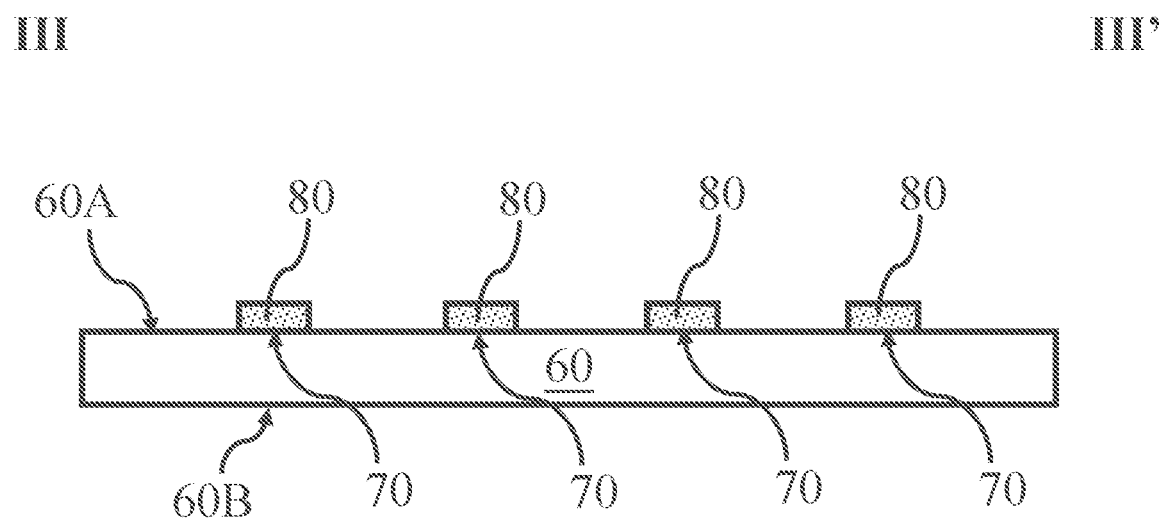
FIG. 3B is a cross-sectional view of the target substrate 60 along with the cross-sectional line III-III as shown in FIG. 3A.

Please refer to FIGS. 1A~1C, 2A~2C, 3A~3B and 4A~4F. FIGS. 1A~1C are respectively a cross-sectional view, a top view and a bottom view of an apparatus for transferring microdevice 100 of Embodiment 1 of this invention. FIG. 1A is a cross-sectional view along with the cross-section line I-I' shown in FIG. 1B. FIG. 2A is a top view of a temporary carrier substrate 20 with a plurality of microdevices 30 to be transferred formed thereon. FIGS. 2B~2C are cross-sectional views of the temporary carrier substrate 20 along with the cross-sectional line II-II' shown in FIG. 2A. FIG. 3A is a top view of a target substrate 60 with a plurality of microdevice bonding regions 70 formed thereon, and each of the microdevice bonding regions 70 comprises a conductive bonding layer 80 formed thereon. FIG. 3B is a cross-sectional view of the target substrate 60 along with the cross-sectional line III-III' as shown in FIG. 3A. FIGS. 4A~4F are cross-sectional views showing the process according to the method for transferring microdevices of the Embodiment 1.

The apparatus for transferring microdevice 100 as shown in FIGS. 1A~1C was provided. The apparatus for transferring microdevice 100 comprises a first magnet 110 with a first terminal 110A and a second terminal 110B opposite to each other; a first magnetic attracting substrate 120 with a first surface 120A and a second surface 120B opposite to each other disposed under the first magnet 110, wherein the first surface 120A of the first magnetic attracting substrate 120 is contacted to the first terminal 110A of the first magnet 110, and the second surface 120B of the first magnetic attracting substrate 120 comprises a plurality of microdevice alignment regions 125, and each of the microdevice alignment regions 125 comprises a magnetic attracting head 150 protruding out of the second surface 120B; and an insulating layer 130 enveloped the first magnetic attracting substrate 120 but partially exposed the magnetic attracting head 150 in each of the microdevice alignment regions 125. The first magnet 110 can be a permanent magnet or a electromagnet.

Next, a temporary carrier substrate 20 with a third surface 20A having a plurality of microdevices 30 spaced to each other and formed thereon and a fourth surface 20B opposite to each other as shown in FIGS. 2A~2C was provided. Each of the microdevices 30 comprises a bonding surface 30A and a magnetic attracting surface 30B opposite to the bonding surface 30A, wherein the bonding surface 30A comprises at least one bonding pad (not shown), and the magnetic attracting surface 30B comprises a magnetic attracting layer 50. The microdevices 30 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 3A~3B was provided. The fifth surface 60A comprises a plurality of microdevice bonding regions 70, and each of the microdevice bonding regions 70 has a conductive bonding layer 80 formed thereon. The conductive bonding layer 80 can be for example but not limited to a conductive glue, an anisotropic conductive film (ACF) or a thermal welding metal layer.

Figure 4A:
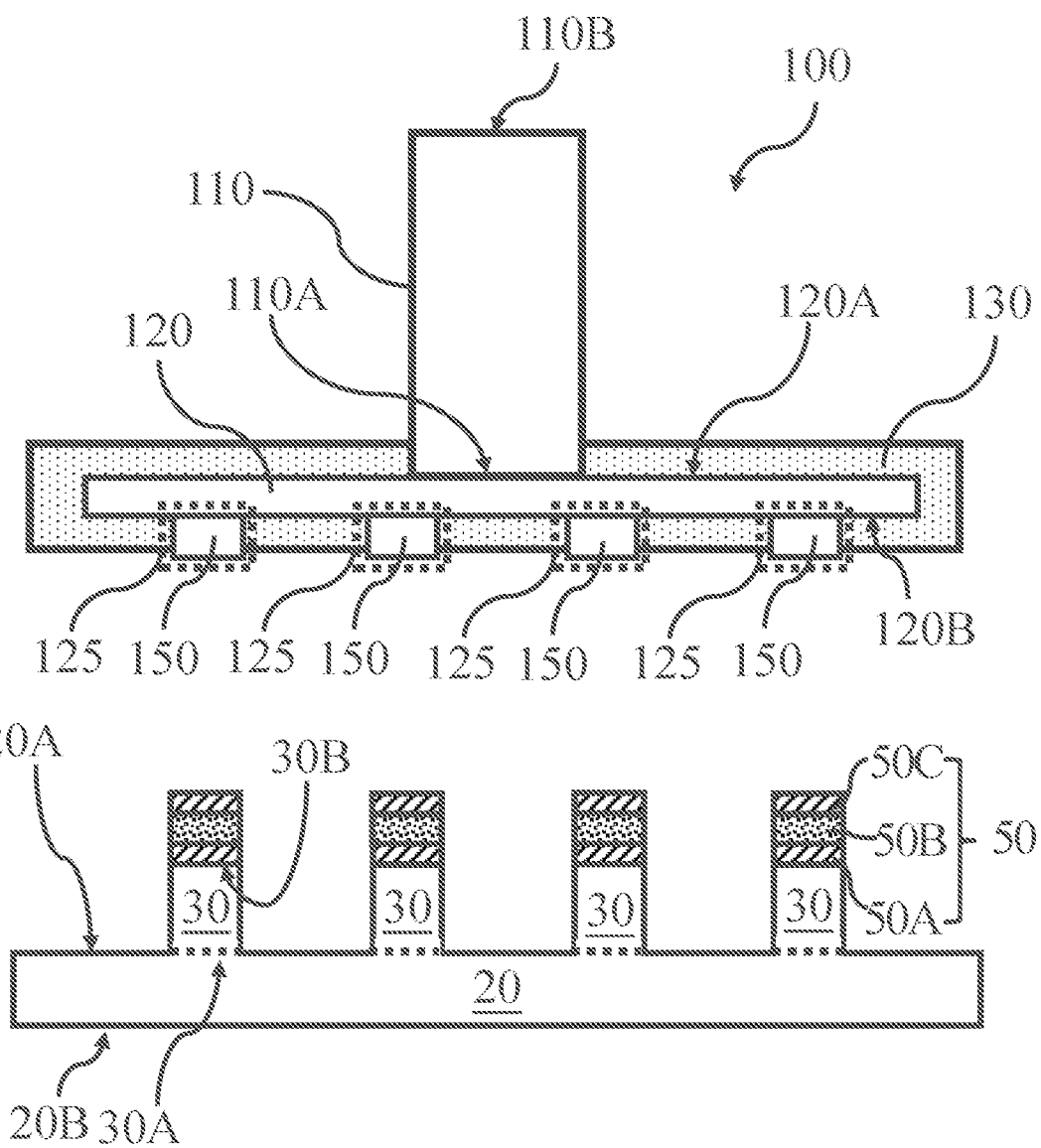
FIGS. 4A~4F are cross-sectional views showing the process according to the method for transferring microdevices of the Embodiment 1.

Next, referring to FIG. 4A. The temporary carrier substrate 20 was moved into the apparatus for transferring microdevice 100, wherein the temporary carrier substrate 20 was located below the first magnetic attracting substrate 120 and faced the second surface 120B of the first magnetic attracting substrate 120 by the third surface 20A to make each magnetic attracting layer 50B of the magnetic attracting surface 30B of each microdevice 30 on the third surface 20A of the temporary carrier substrate 20 face the microdevice alignment regions 125 of the first magnetic attracting substrate 120. According to one embodiment of this invention, a step of lift-off by laser or UV to lift off the microdevices 30 from the third surface 20A of the temporary carrier substrate 20 as shown in FIG. 2C was optionally proceeded before the step of moving the temporary carrier substrate 20 into the apparatus for transferring microdevice 100.

Figure 4B:
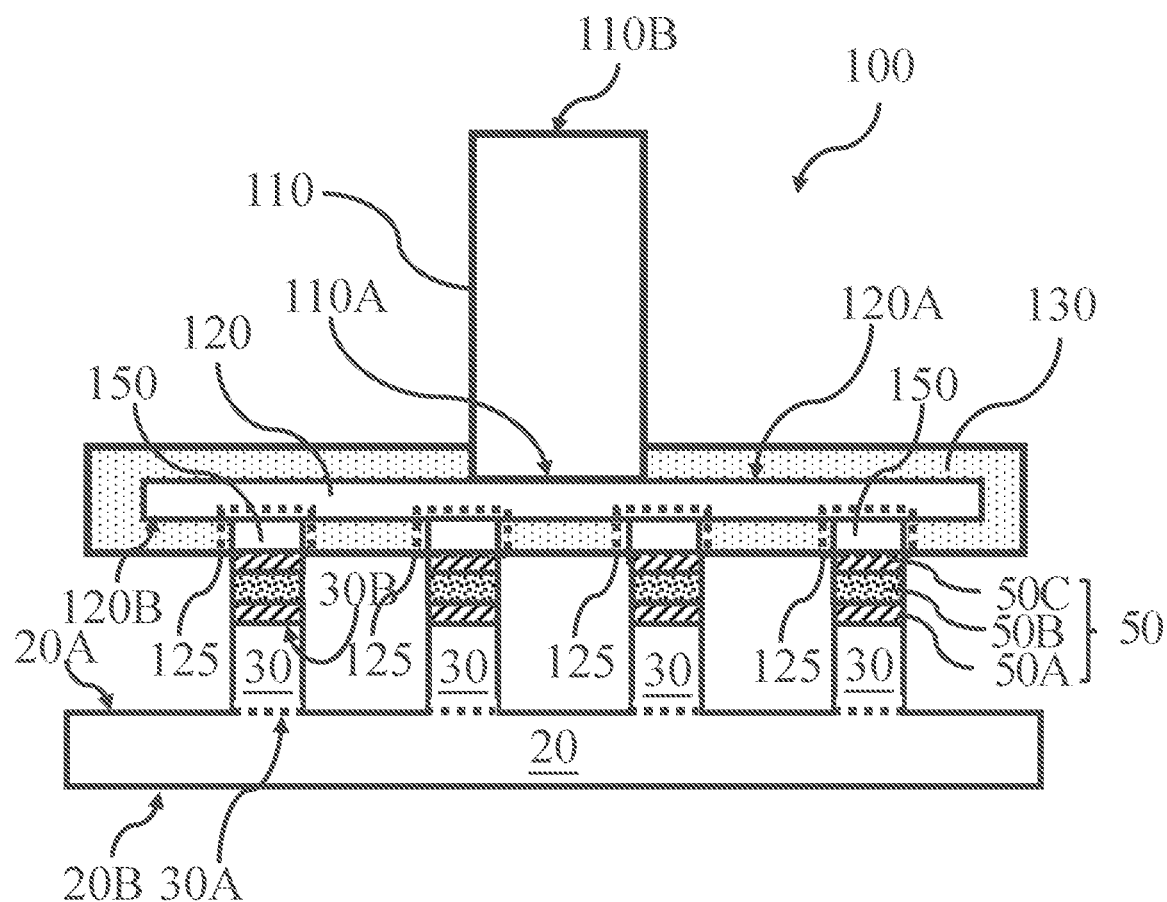
Figure 4C:
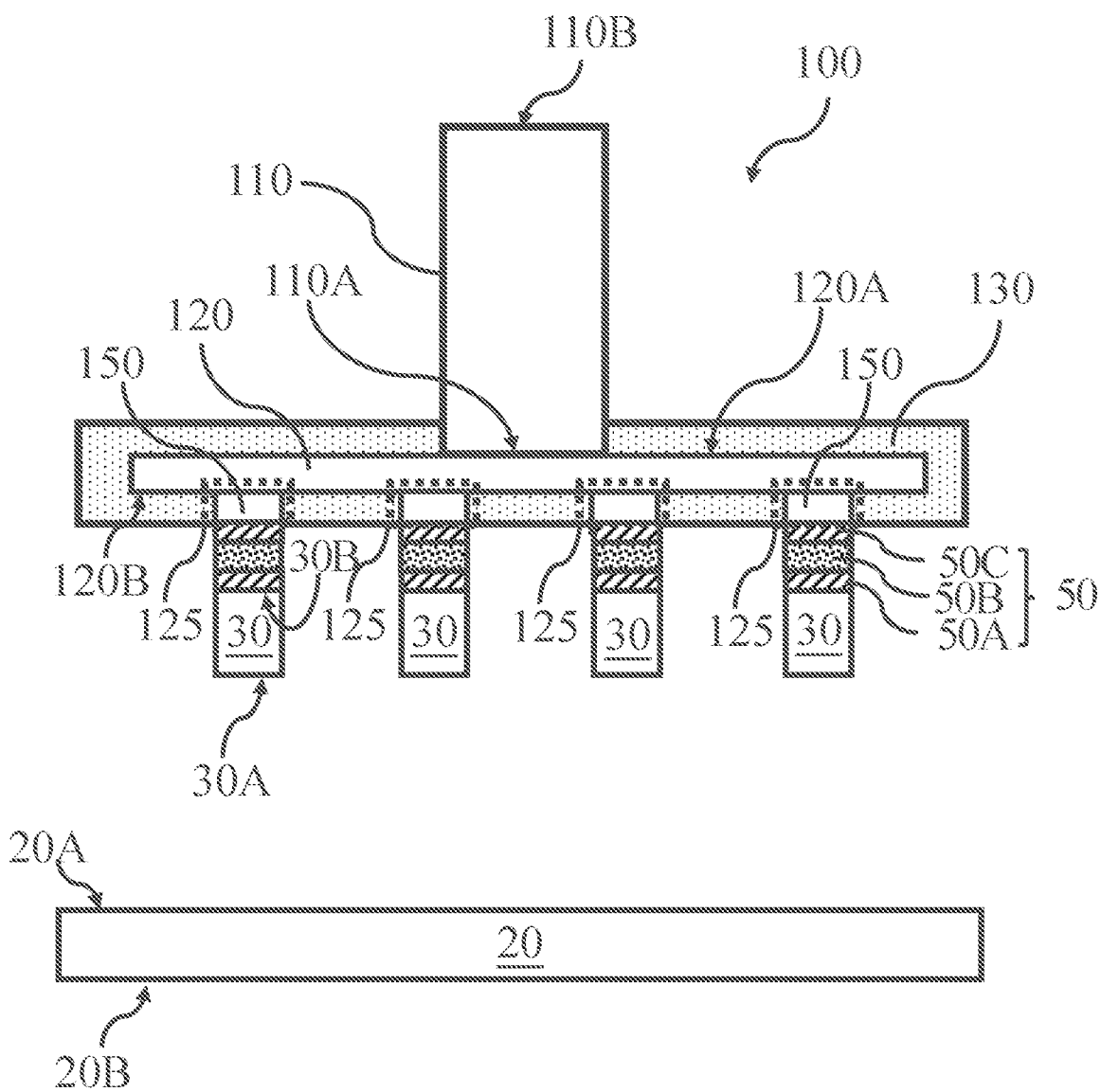

Next, referring to FIGS. 4B~4C. The magnetic field intensity of the first magnet 110 of the apparatus for transferring microdevice 100 was controlled to make each of the microdevices 30 be attracted by one of the magnetic attracting heads 150 in the microdevice alignment regions 125 through the magnetic attracting layer 50 of the magnetic attracting surface 30B thereof as shown in FIG. 4B and separated from the third surface 20A of the temporary carrier substrate 20 as shown in FIG. 4C.

Figure 4D:
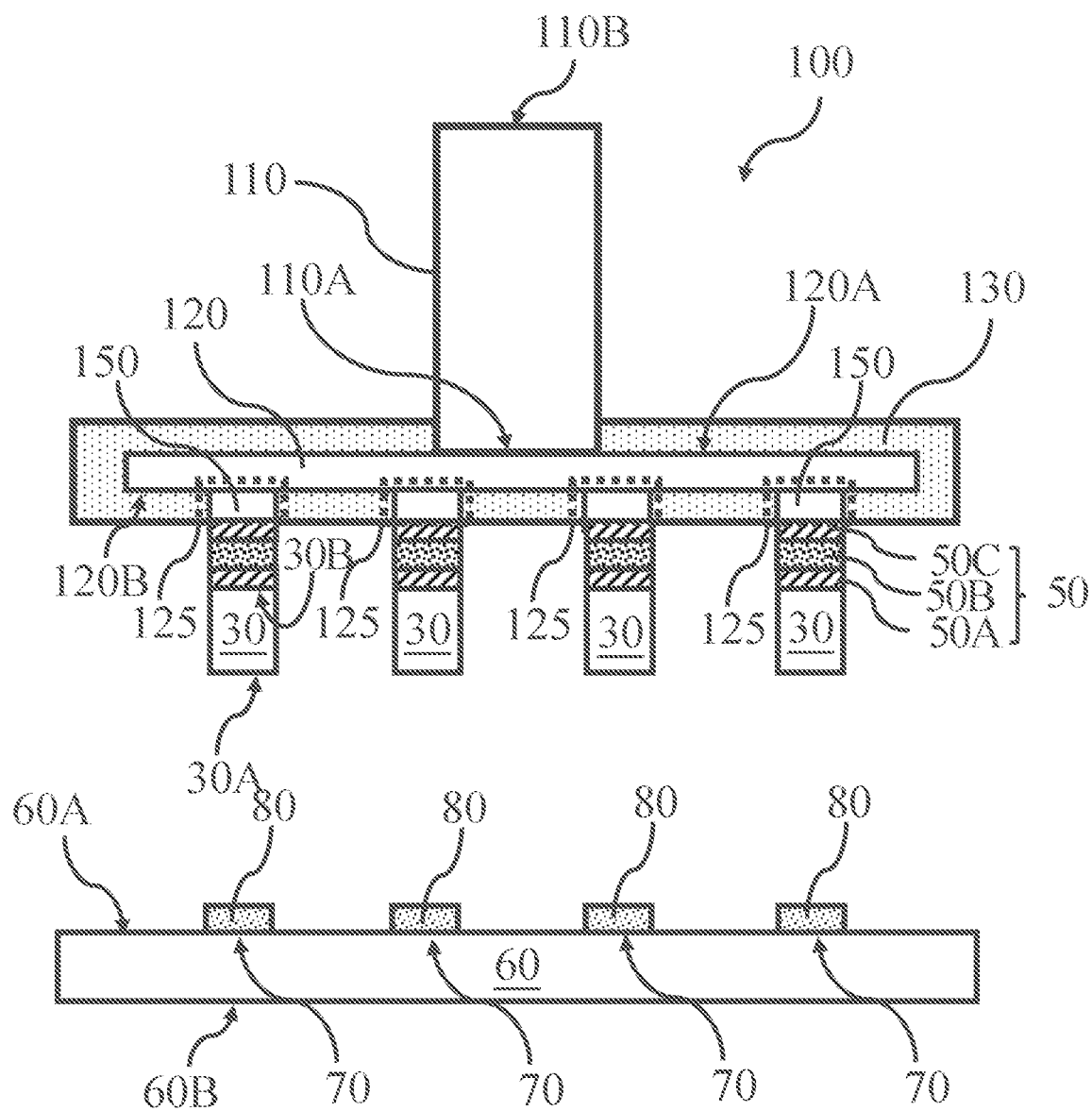

Next, referring to FIG. 4D. The target substrate 60 was moved into the apparatus for transferring microdevice 100 after the temporary carrier substrate 20 was moved out of the apparatus for transferring microdevice 100, wherein the target substrate 60 was located below the first magnetic attracting substrate 120 and faced the second surface 120B of the first magnetic attracting substrate 120 through the fifth surface 60A, and each of the microdevice bonding regions 70 on the fifth surface 60A of the target substrate 60 faced and aligned to each of the microdevice alignment regions 125 on the second surface 120B of the first magnetic attracting substrate 120.

Figure 4E:
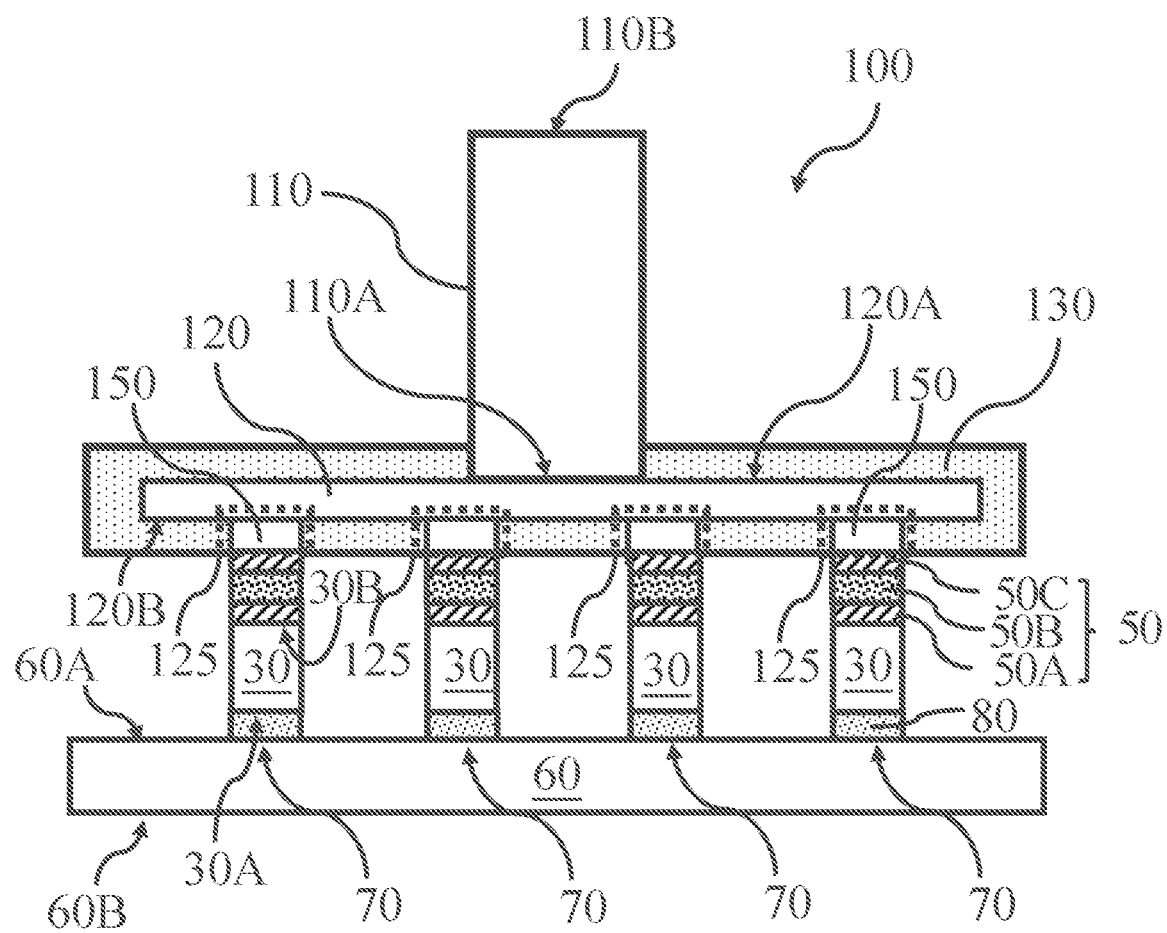

Next, referring to FIG. 4E. The first magnetic attracting substrate 120 was joined with the target substrate 60 to contact each of the microdevices 30 attracted by one of the magnetic attracting heads 150 in the microdevice alignment regions 125 to the conductive bonding layer 80 of the microdevice bonding regions 70 on the fifth surface 60A of the target substrate 60 through the bonding surface 30A thereof.

Figure 4F:
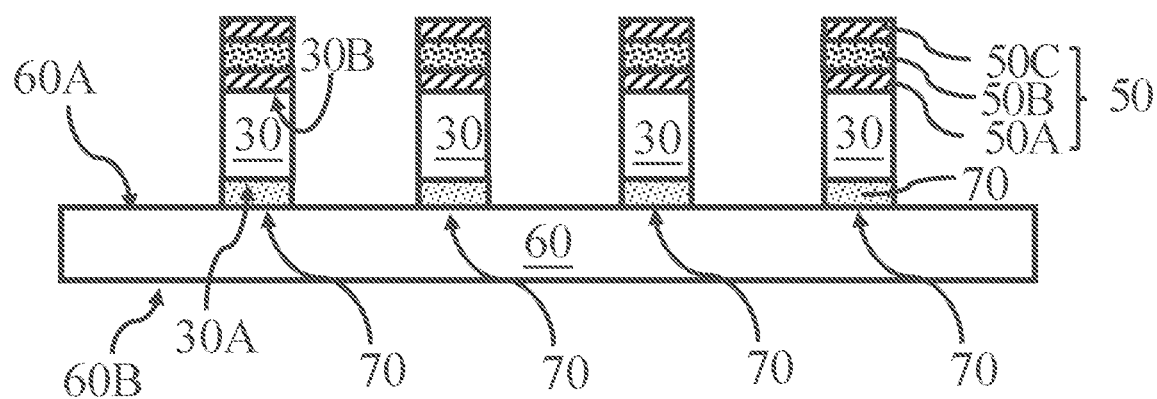

Finally, referring to FIG. 4F. A thermal treatment was applied to make each microdevice 30 bond to each conductive bonding layer 80 of each microdevice bonding region 70 through the bonding surface 30A thereof and separate from one of the alignment region 125 thereafter. Then, the process for transferring the microdevices 30 from the temporary carrier substrate 20 to the target substrate 60 was finished after each microdevice 30 was independently bonded to each conductive bonding layer 80 of each microdevice bonding region 70 on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80.

Accordingly, microdevices can be mass-transferred and self-aligned since each of the microdevices 30 on the temporary carrier substrate 20 cab be attracted by one of the magnetic attracting heads 150 in each of the alignment regions 125 through the magnetic attracting layer 50 of the magnetic attracting surface 30B thereof, and transferred to each microdevice bonding regions 70 formed on the target 60 and aligned to each alignment region 125 thereafter.

Embodiment 2

Figure 5A:
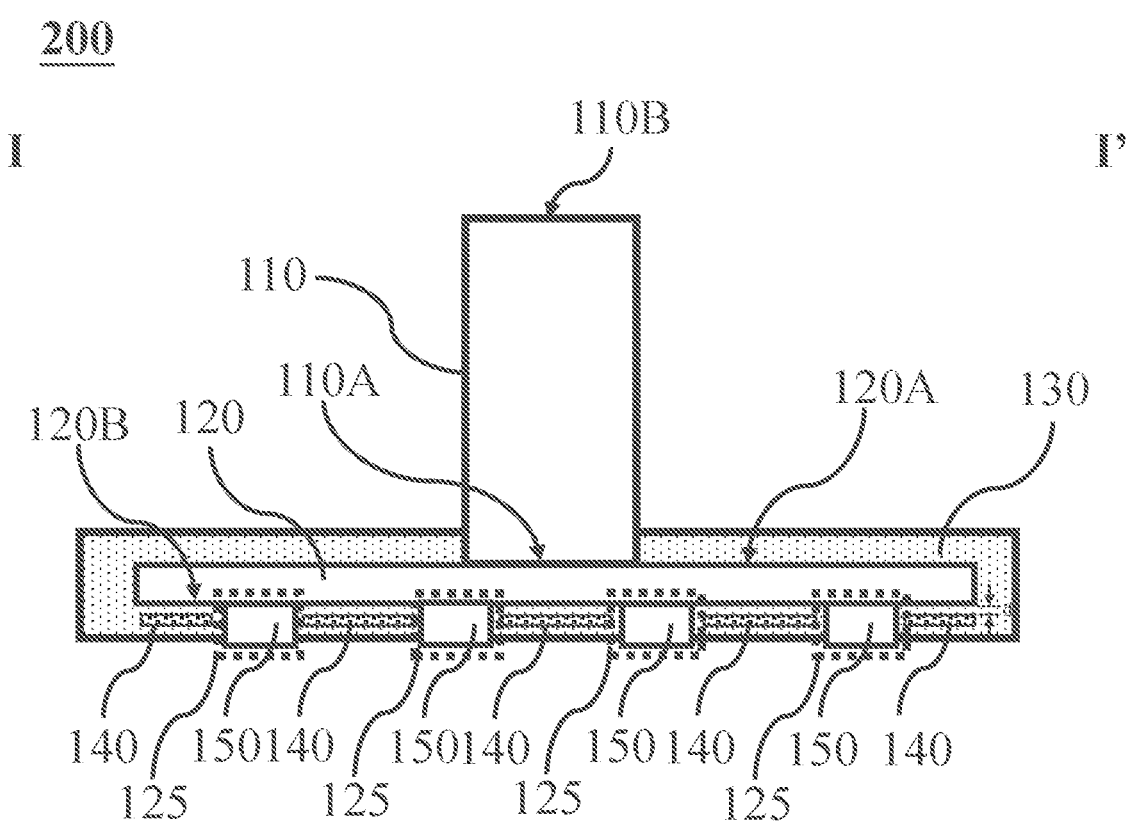
FIGS. 5A~5C are respectively a cross-sectional view, a top view and a bottom view of an apparatus for transferring microdevice 200 of Embodiment 2 of this invention.
Figure 5B:
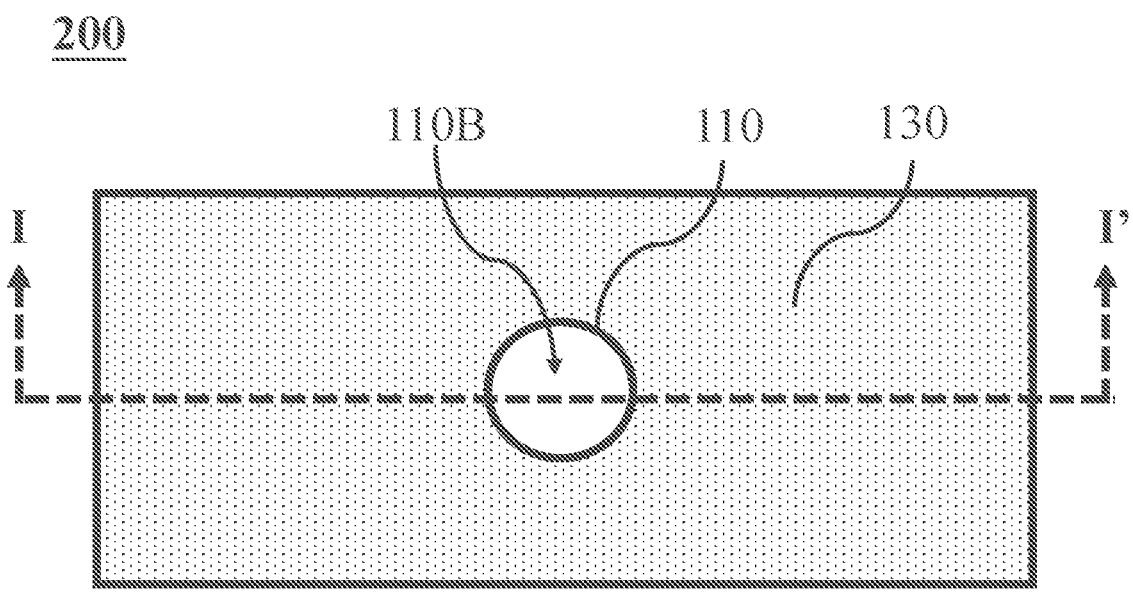
Figure 5C:
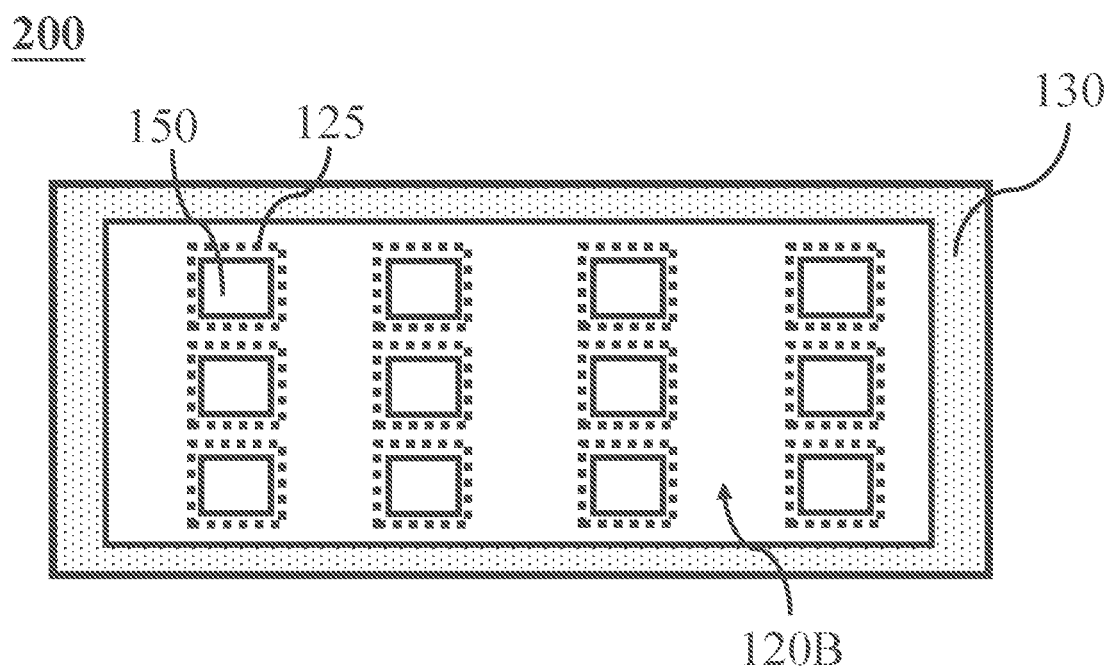

Please refer to FIGS. 5A~5C, 2A~2C, 3A~3B and 6A~6F. FIGS. 5A~5C are respectively a cross-sectional view, a top view and a bottom view of an apparatus for transferring microdevice 200 of Embodiment 2 of this invention. FIG. 5A is a cross-sectional view along with the cross-section line II-II' shown in FIG. 5B. FIG. 2A is a top view of a temporary carrier substrate 20 with a plurality of microdevices 30 to be transferred formed thereon. FIGS. 2B~2C are cross-sectional views of the temporary carrier substrate 20 along with the cross-sectional line II-II' shown in FIG. 2A. FIG. 3A is a top view of a target substrate 60 with a plurality of microdevice bonding regions 70 formed thereon, and each of the microdevice bonding regions 70 comprises a conductive bonding layer 80 formed thereon. FIG. 3B is a cross-sectional view of the target substrate 60 along with the cross-sectional line III-III' as shown in FIG. 3A. FIGS. 6A~6F are cross-sectional views showing the process according to the method for transferring microdevices of the Embodiment 2.

First, an apparatus for transferring microdevice 200 as shown in FIGS. 5A~5C were provided. The structure of the apparatus for transferring microdevice 200 is similar to that of the apparatus for transferring microdevice 100 as shown in FIGS. 1A~1C except that the insulating layer 130 of the apparatus for transferring microdevice 200 further comprises a magnetic shielding layer 140 disposed adjacent to the second surface 120B of the first magnetic attracting substrate 120 spaced with a distance d (d>0), wherein the magnetic shielding layer 140 surrounds each of the magnetic attracting heads 150 in each of the microdevice alignment regions 125.

Next, a temporary carrier substrate 20 with a third surface 20A having a plurality of microdevices 30 spaced to each other and formed thereon and a fourth surface 20B opposite to each other as shown in FIGS. 2A~2C was provided. Each of the microdevices 30 comprises a bonding surface 30A and a magnetic attracting surface 30B opposite to the bonding surface 30A, wherein the bonding surface 30A comprises at least one bonding pad (not shown), and the magnetic attracting surface 30B comprises a magnetic attracting layer 50. The microdevices 30 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected, from at least one of the group consisting of iron, cobalt, nickel and alloy thereof.

Next, a target substrate 60 with a fifth surface 60A and a sixth surface 60B opposite to each other as shown in FIGS. 3A~3B was provided. The fifth surface 60A comprises a plurality of microdevice bonding regions 70, and each of the microdevice bonding regions 70 has a conductive bonding layer 80 formed thereon. The conductive bonding layer 80 can be for example but not limited to a conductive glue, an anisotropic conductive film (ACF) or a thermal welding metal layer.

Figure 6A:
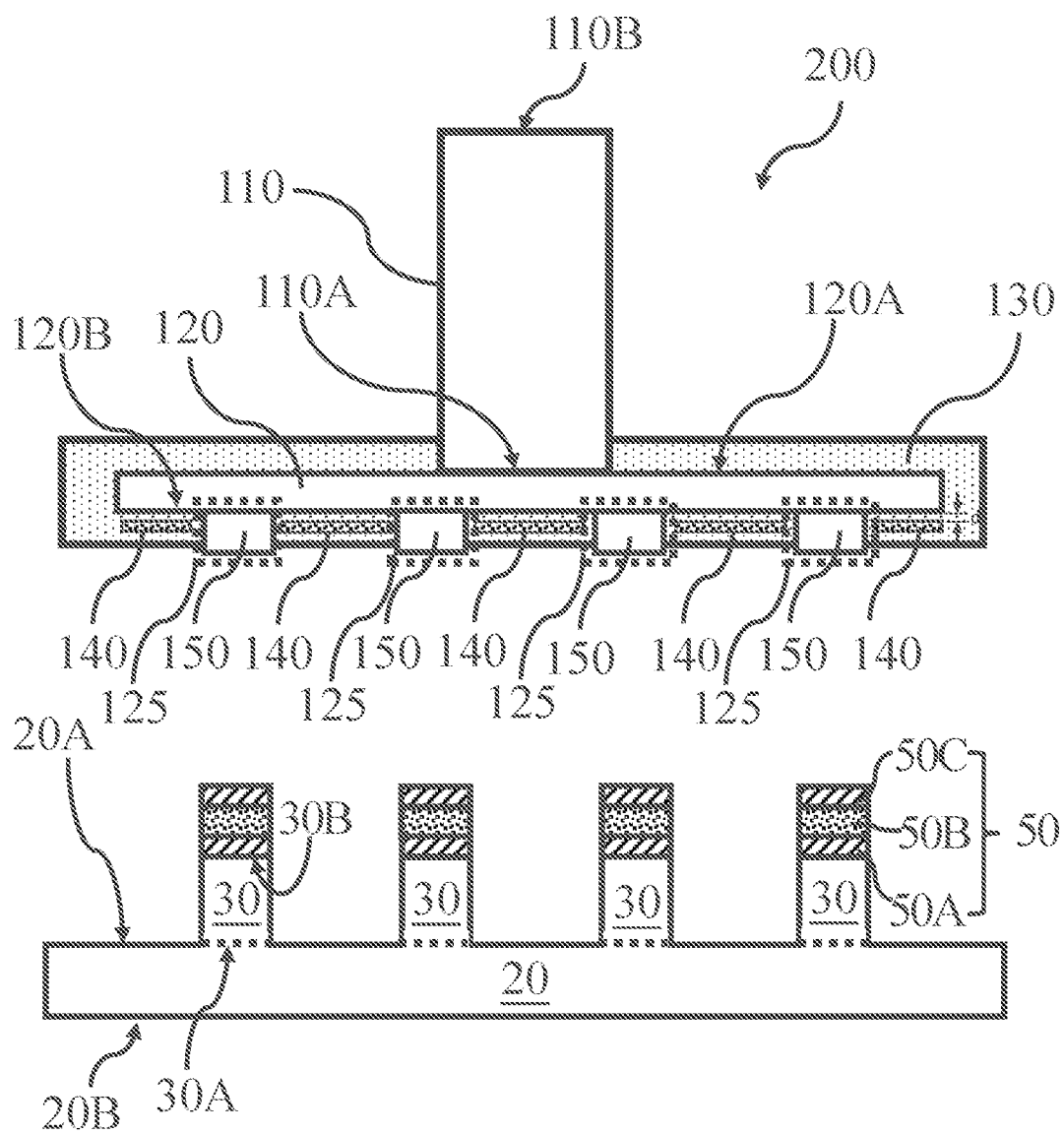
FIGS. 6A~6F are cross-sectional views showing the process according to the method for transferring microdevices of the Embodiment 2.

Next, referring to FIG. 6A. The temporary carrier substrate 20 was moved into the apparatus for transferring microdevice 200, wherein the temporary carrier substrate 20 was located below the first magnetic attracting substrate 120 and faced the second surface 120B of the first magnetic attracting substrate 120 by the third surface 20A to make each magnetic attracting layer 50B of the magnetic attracting surface 30B of each microdevice 30 on the third surface 20A of the temporary carrier substrate 20 face the microdevice alignment regions 125 of the first magnetic attracting substrate 120. According to one embodiment of this invention, a step of lift-off by laser or UV to lift off the microdevices 30 from the third surface 20A of the temporary carrier substrate 20 as shown in FIG. 2C was optionally proceeded before the step of moving the temporary carrier substrate 20 into the apparatus for transferring microdevice 200.

Figure 6B:
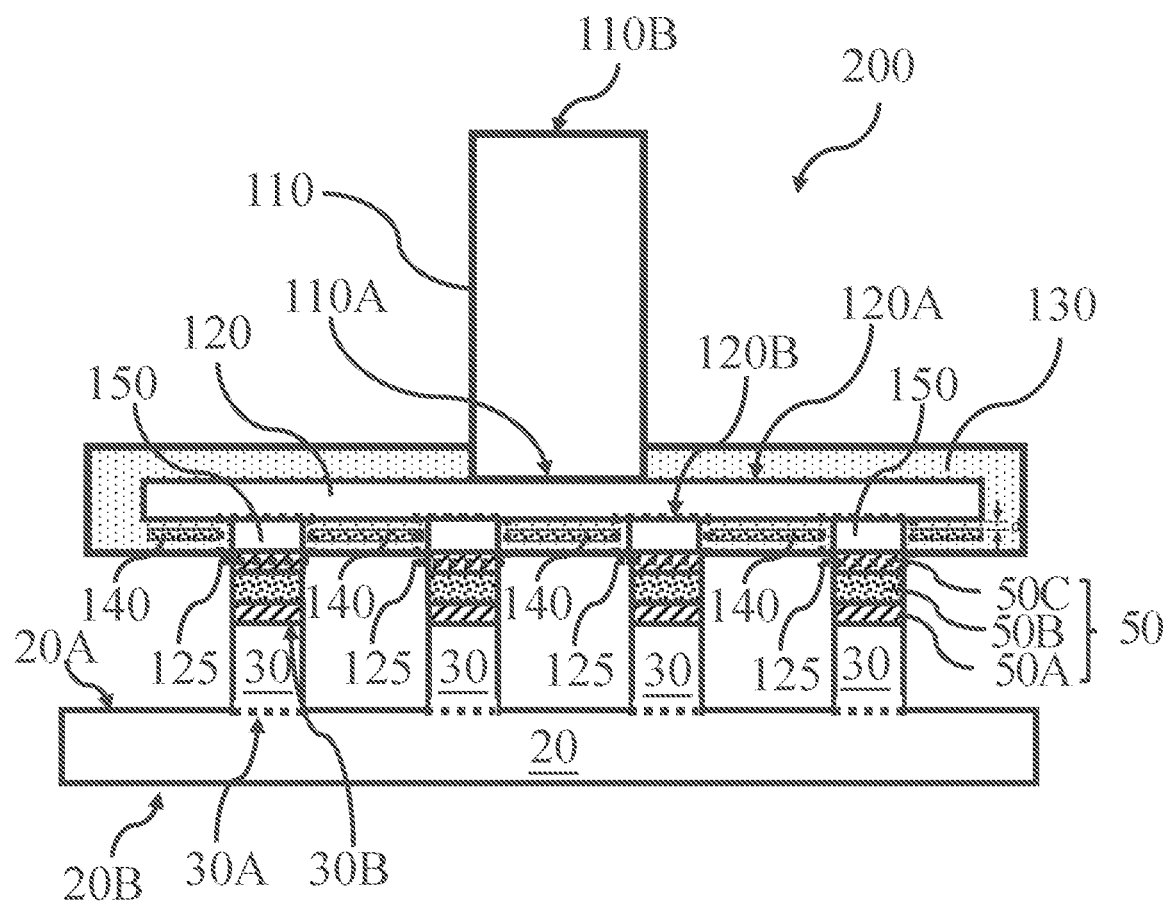
Figure 6C:
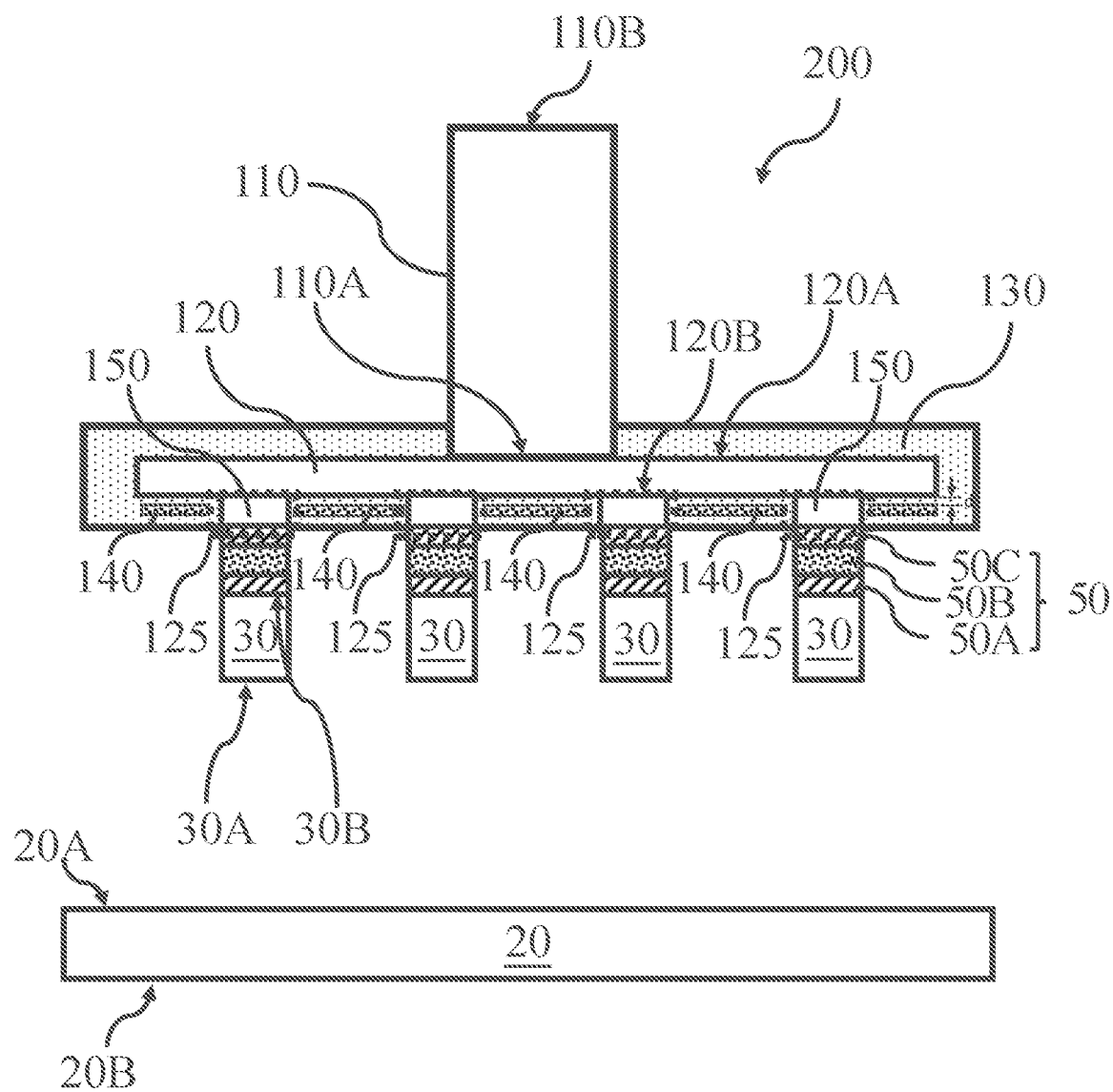

Next, referring to FIGS. 6B~6C. The magnetic field intensity of the first magnet 110 of the apparatus for transferring microdevice 200 was controlled to make each of the microdevices 30 be attracted by one of the magnetic attracting heads 150 in the microdevice alignment regions 125 through the magnetic attracting layer 50 of the magnetic attracting surface 30B thereof as shown in FIG. 6B and separated from the third surface 20A of the temporary carrier substrate 20 as shown in FIG. 6C.

Figure 6D:
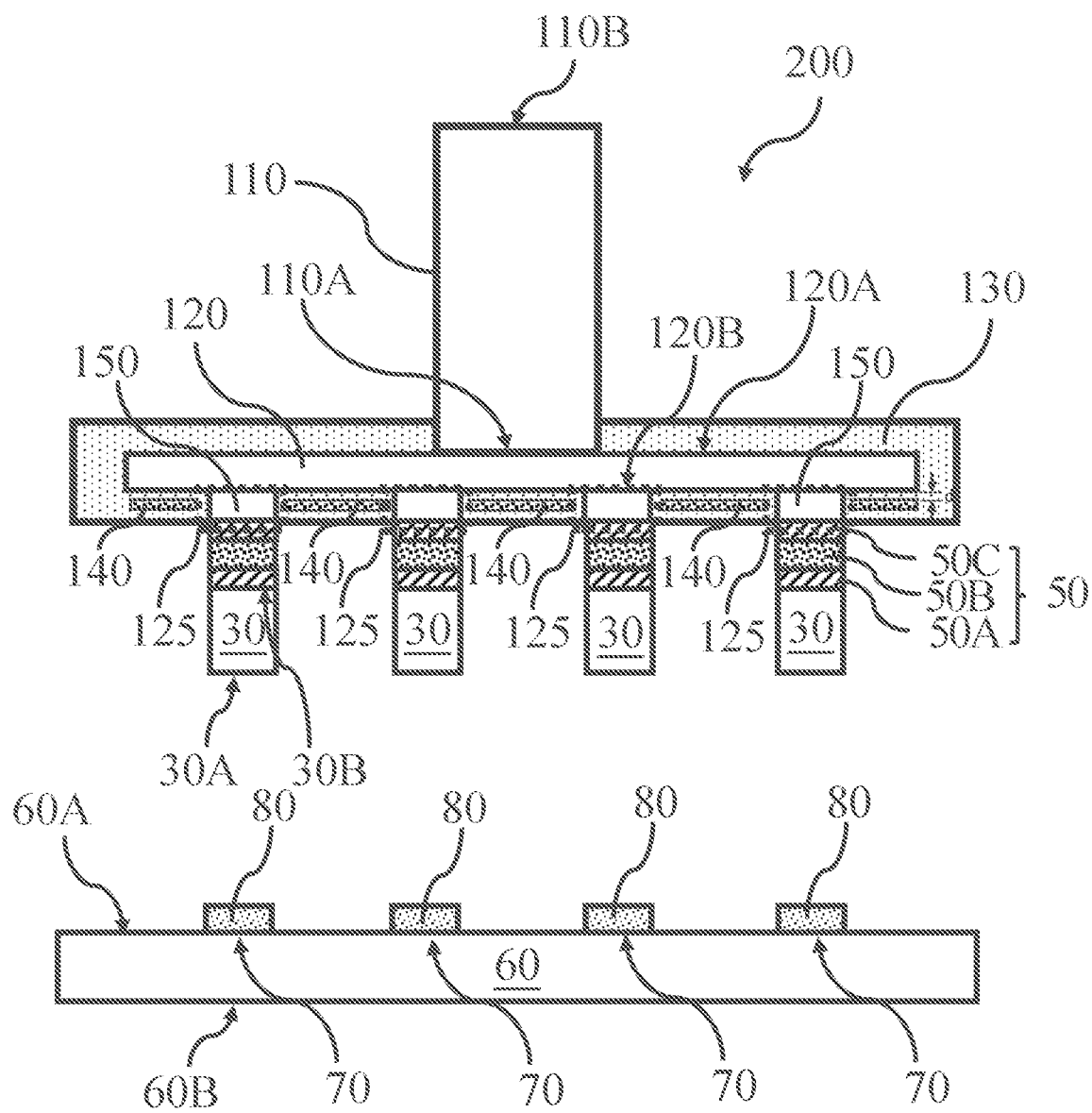

Next, referring to FIG. 6D. The target substrate 60 was moved into the apparatus for transferring microdevice 200 after the temporary carrier substrate 20 was moved out of the apparatus for transferring microdevice 200, wherein the target substrate 60 was located below the first magnetic attracting substrate 120 and faced the second surface 120B of the first magnetic attracting substrate 120 through the fifth surface 60A, and each of the microdevice bonding regions 70 on the fifth surface 60A of the target substrate 60 faced and aligned to each of the microdevice alignment regions 125 on the second surface 120B of the first magnetic attracting substrate 120.

Figure 6E:
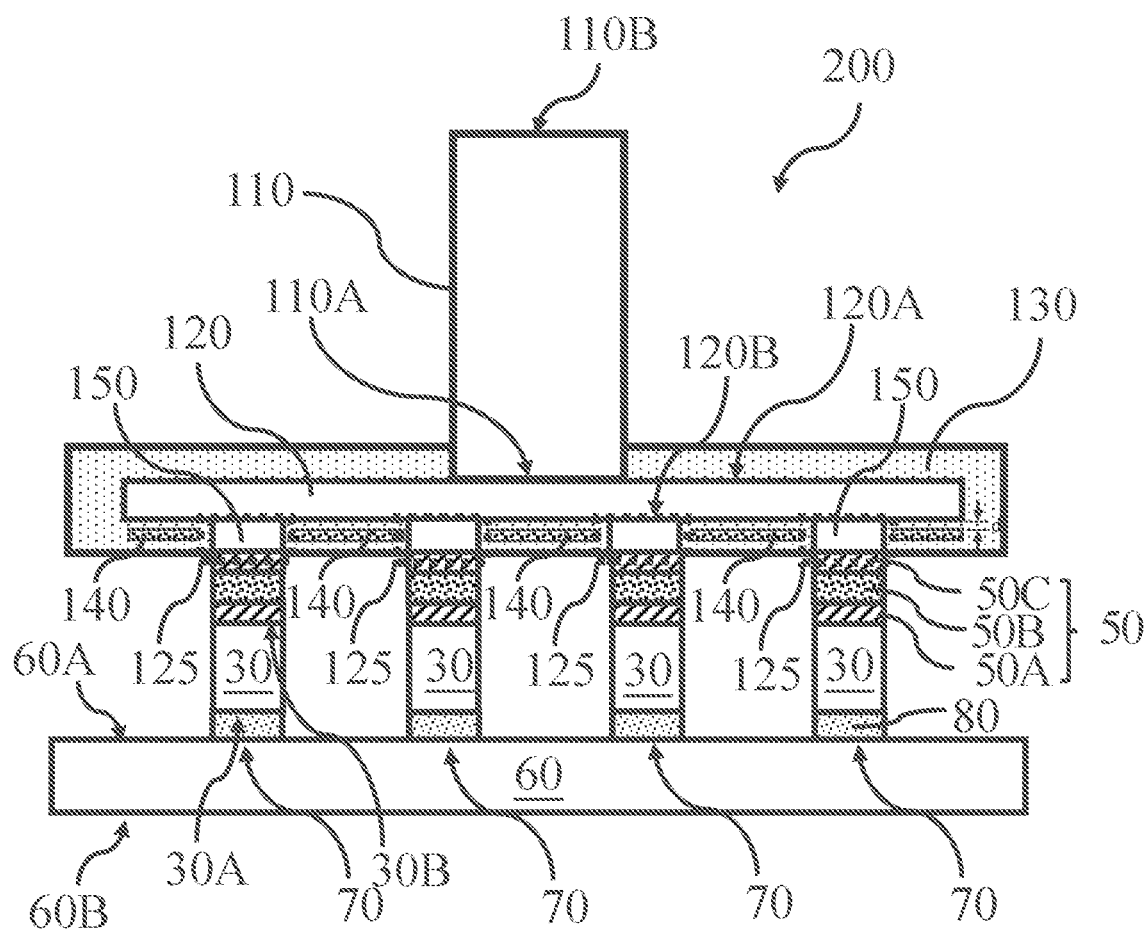

Next, referring to FIG. 6E. The first magnetic attracting substrate 120 was joined with the target substrate 60 to contact each of the microdevices 30 attracted by one of the magnetic attracting heads 150 in the microdevice alignment regions 125 to the conductive bonding layer 80 of the microdevice bonding regions 70 on the fifth surface 60A of the target substrate 60 through the bonding surface 30A thereof.

Figure 6F:
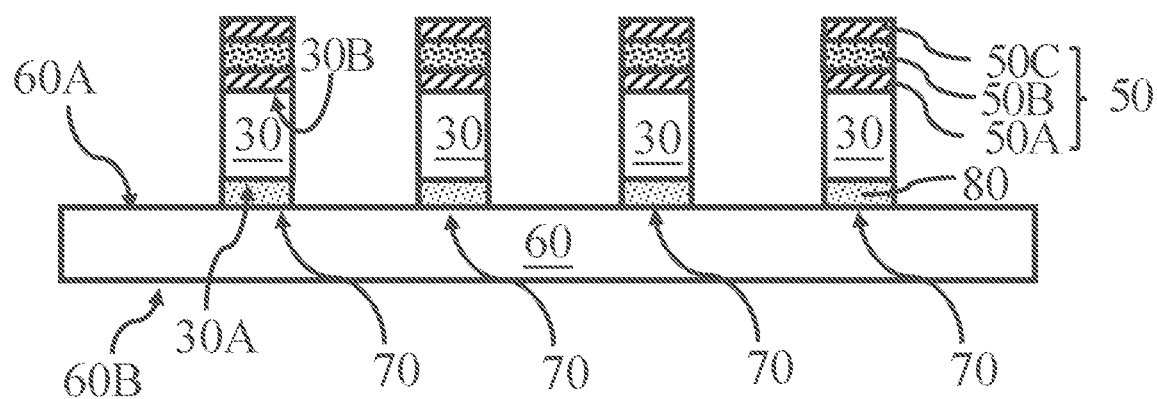

Finally, referring to FIG. 6F. A thermal treatment was applied to make each microdevice 30 bond to each conductive bonding layer 80 of each microdevice bonding region 70 through the bonding surface 30A thereof and separate from one of the alignment region 125 thereafter. Then, the process for transferring the microdevices 30 from the temporary carrier substrate 20 to the target substrate 60 was finished after each microdevice 30 was independently bonded to each conductive bonding layer 80 of each microdevice bonding region 70 on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80.

Accordingly, microdevices can be mass-transferred and self-aligned since each of the microdevices 30 on the temporary carrier substrate 20 cab be attracted by one of the magnetic attracting heads 150 in each of the alignment regions 125 through the magnetic attracting layer 50 of the magnetic attracting surface 30B thereof, and transferred to each microdevice bonding regions 70 formed on the target 60 and aligned to each alignment region 125 thereafter.

Embodiment 3

Figure 7A:
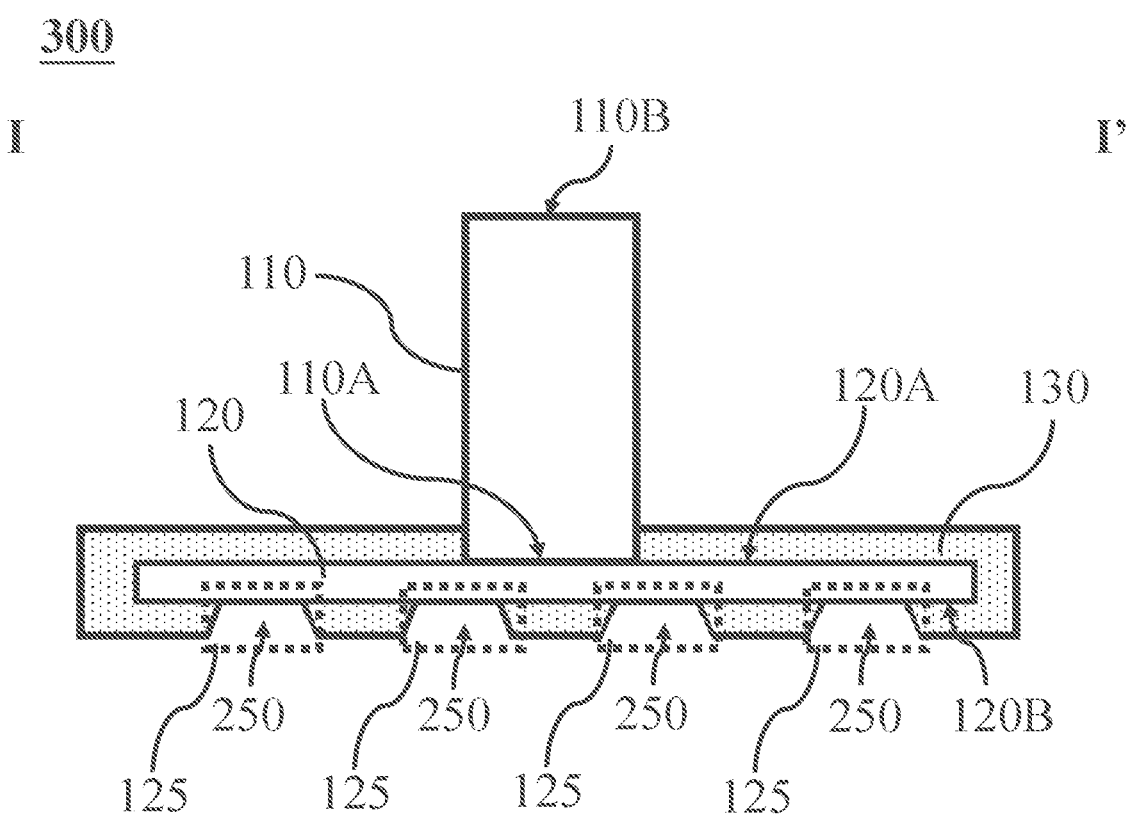
FIGS. 7A~7C are respectively a cross-sectional view, a top view and a bottom view of an apparatus for transferring microdevice 300 of Embodiment 3 of this invention.
Figure 7B:
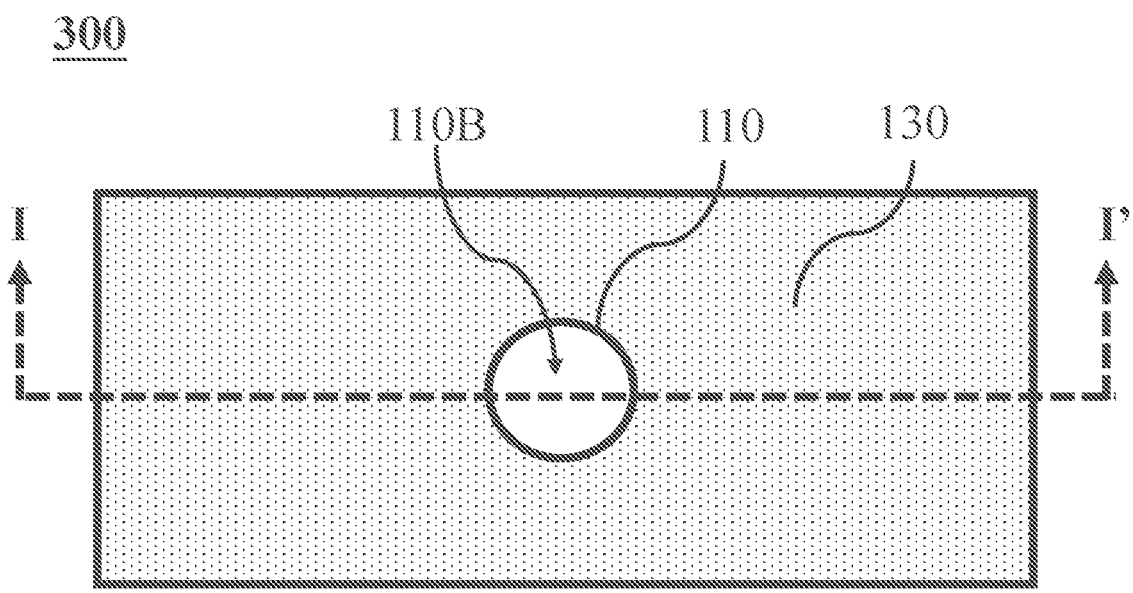
Figure 7C:
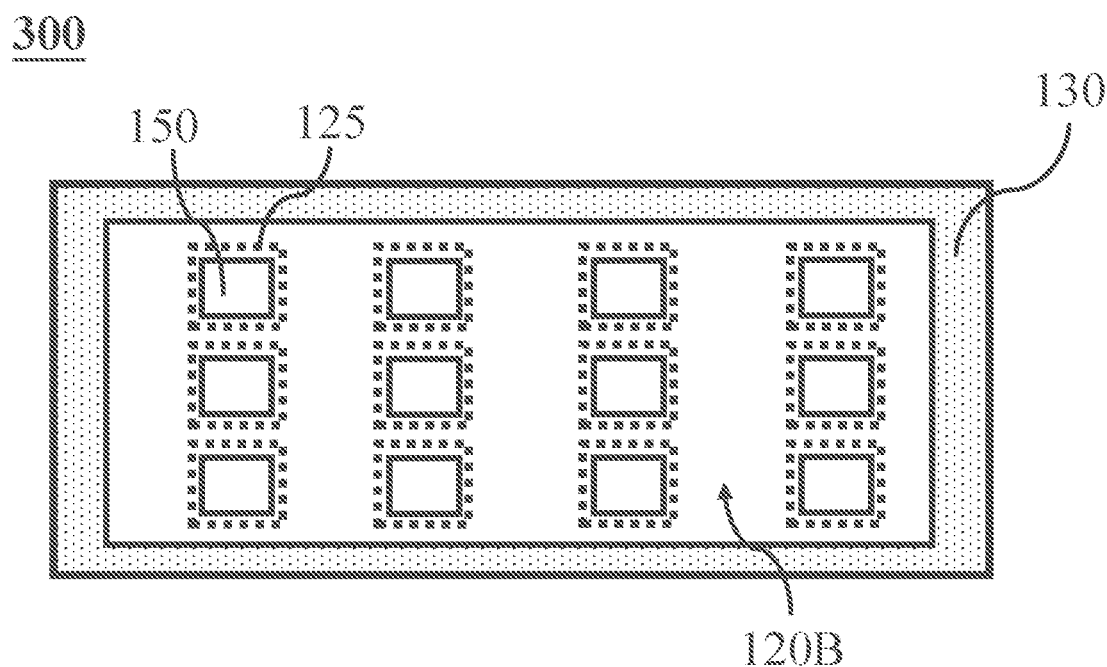

Please refer to FIGS. 7A~7C, 2A~2C, 3A~3B and 8A~8F. FIGS. 7A~7C are respectively a cross-sectional view, a top view and a bottom view of an apparatus for transferring microdevice 300 of Embodiment 3 of this invention. FIG. 7A is a cross-sectional view along with the cross-section line I-I' shown in FIG. 7B. FIG. 2A is a top view of a temporary carrier substrate 20 with a plurality of microdevices 30 to be transferred formed thereon. FIGS. 2B~2C are cross-sectional views of the temporary carrier substrate 20 along with the cross-sectional line II-IF shown in FIG. 2A. FIG. 3A is a top view of a target substrate 60 with a plurality of microdevice bonding regions 70 formed thereon, and each of the microdevice bonding regions 70 comprises a conductive bonding layer 80 formed thereon. FIG. 3B is a cross-sectional view of the target substrate 60 along with the cross-sectional line III-III' as shown in FIG. 3A. FIGS. 8A~8F are cross-sectional views showing the process according to the method for transferring microdevices of the Embodiment 3.

The apparatus for transferring microdevice 300 as shown in FIGS. 7A~7C was provided. The apparatus for transferring microdevice 300 comprises a first magnet 110 with a first terminal 110A and a second terminal 110B opposite to each other; a first magnetic attracting substrate 120 with a first surface 120A and a second surface 120B opposite to each other disposed under the first magnet 110, wherein the first surface 120A of the first magnetic attracting substrate 120 is contacted to the first terminal 110A of the first magnet 110, and the second surface 120B of the first magnetic attracting substrate 120 comprises a plurality of microdevice alignment regions 125; and an insulating layer 130 enveloped the first magnetic attracting substrate 120, wherein each of the microdevice alignment region 125 comprises a magnetic attracting hole 250 exposing the second substrate 120B of the first magnetic attracting substrate 120. The first magnet 110 can be a permanent magnet or a electromagnet.

Next, a temporary carrier substrate 20 with a third surface 20A having a plurality of microdevices 30 spaced to each other and formed thereon and a fourth surface 20B opposite to each other as shown in FIGS. 2A~2C was provided. Each of the microdevices 30 comprises a bonding surface 30A and a magnetic attracting surface 30B opposite to the bonding surface 30A, wherein the bonding surface 30A comprises at least one bonding pad (not shown), and the magnetic attracting surface 30B comprises a magnetic attracting layer 50. The microdevices 30 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 3A~3B was provided. The fifth surface 60A comprises a plurality of microdevice bonding regions 70, and each of the microdevice bonding regions 70 has a conductive bonding layer 80 formed thereon. The conductive bonding layer 80 can be for example but not limited to a conductive glue, an anisotropic conductive film (ACF) or a thermal welding metal layer.

Figure 8A:
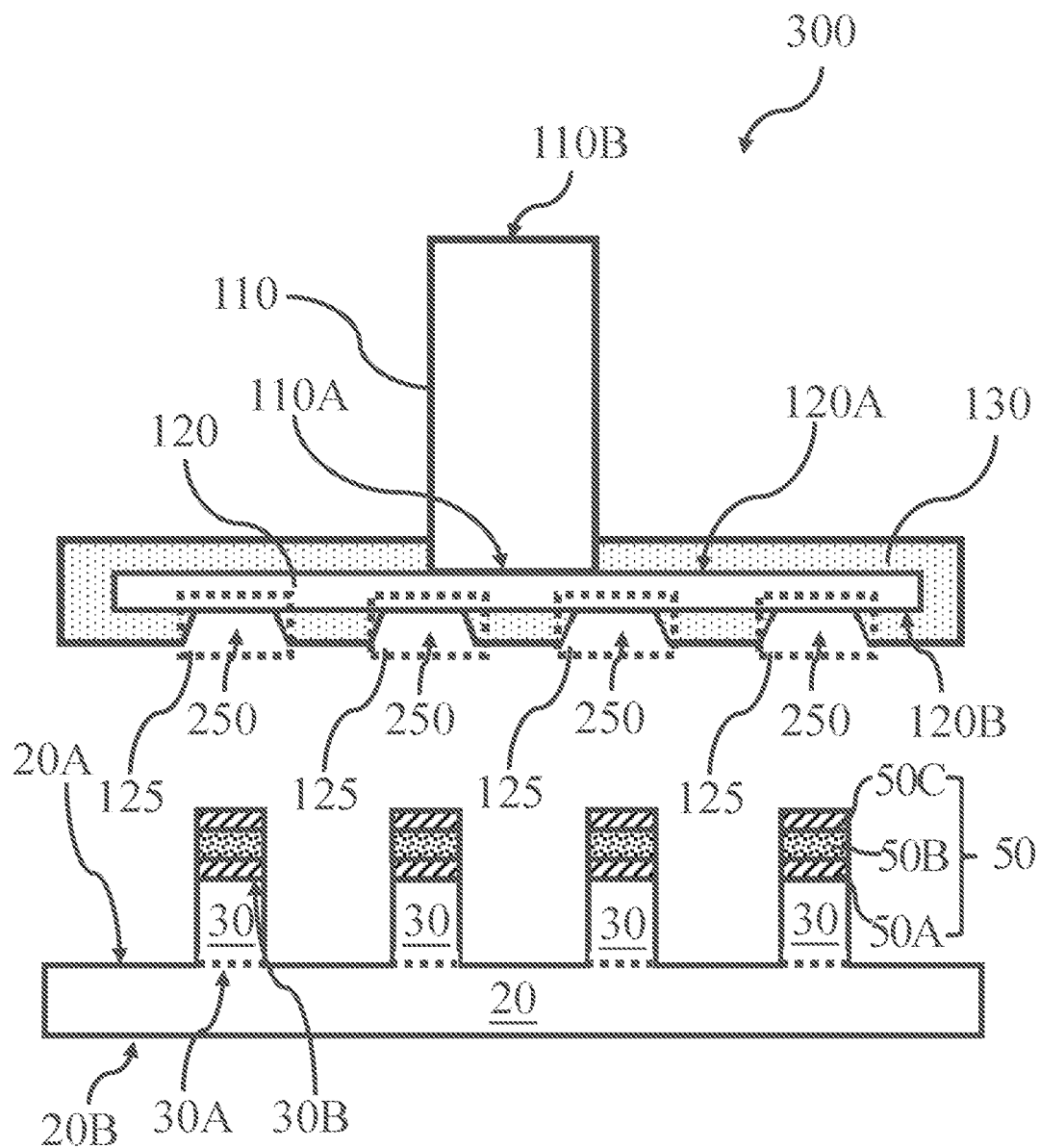
FIGS. 8A~8F are cross-sectional views showing the process according to the method for transferring microdevices of the Embodiment 3.

Next, referring to FIG. 8A. The temporary carrier substrate 20 was moved into the apparatus for transferring microdevice 300, wherein the temporary carrier substrate 20 was located below the first magnetic attracting substrate 120 and faced the second surface 120B of the first magnetic attracting substrate 120 by the third surface 20A to make each magnetic attracting layer 50B of the magnetic attracting surface 30B of each microdevice 30 on the third surface 20A of the temporary carrier substrate 20 face the microdevice alignment regions 125 of the first magnetic attracting substrate 120. According to one embodiment of this invention, a step of lift-off by laser or UV to lift off the microdevices 30 from the third surface 20A of the temporary carrier substrate 20 as shown in FIG. 2C was optionally proceeded before the step of moving the temporary carrier substrate 20 into the apparatus for transferring microdevice 300.

Figure 8B:
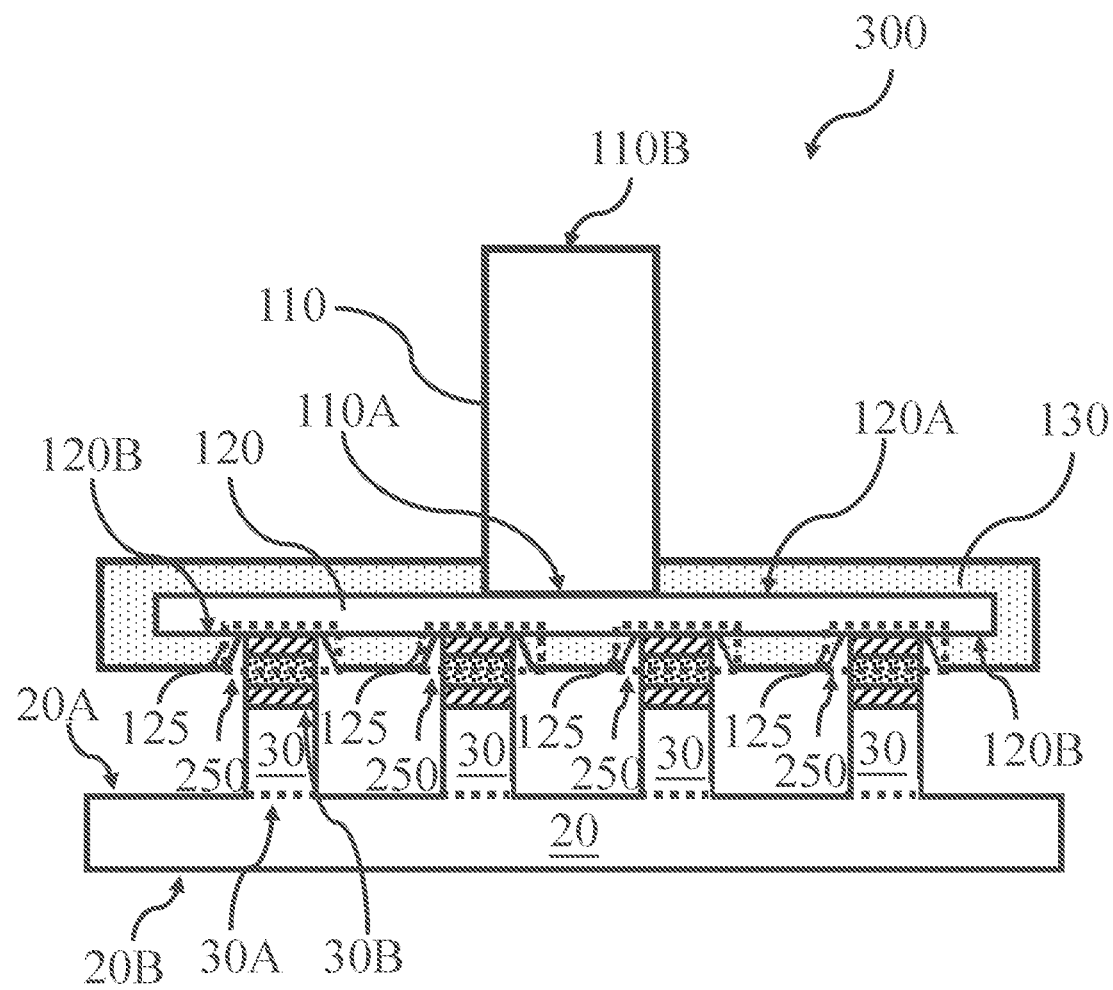
Figure 8C:
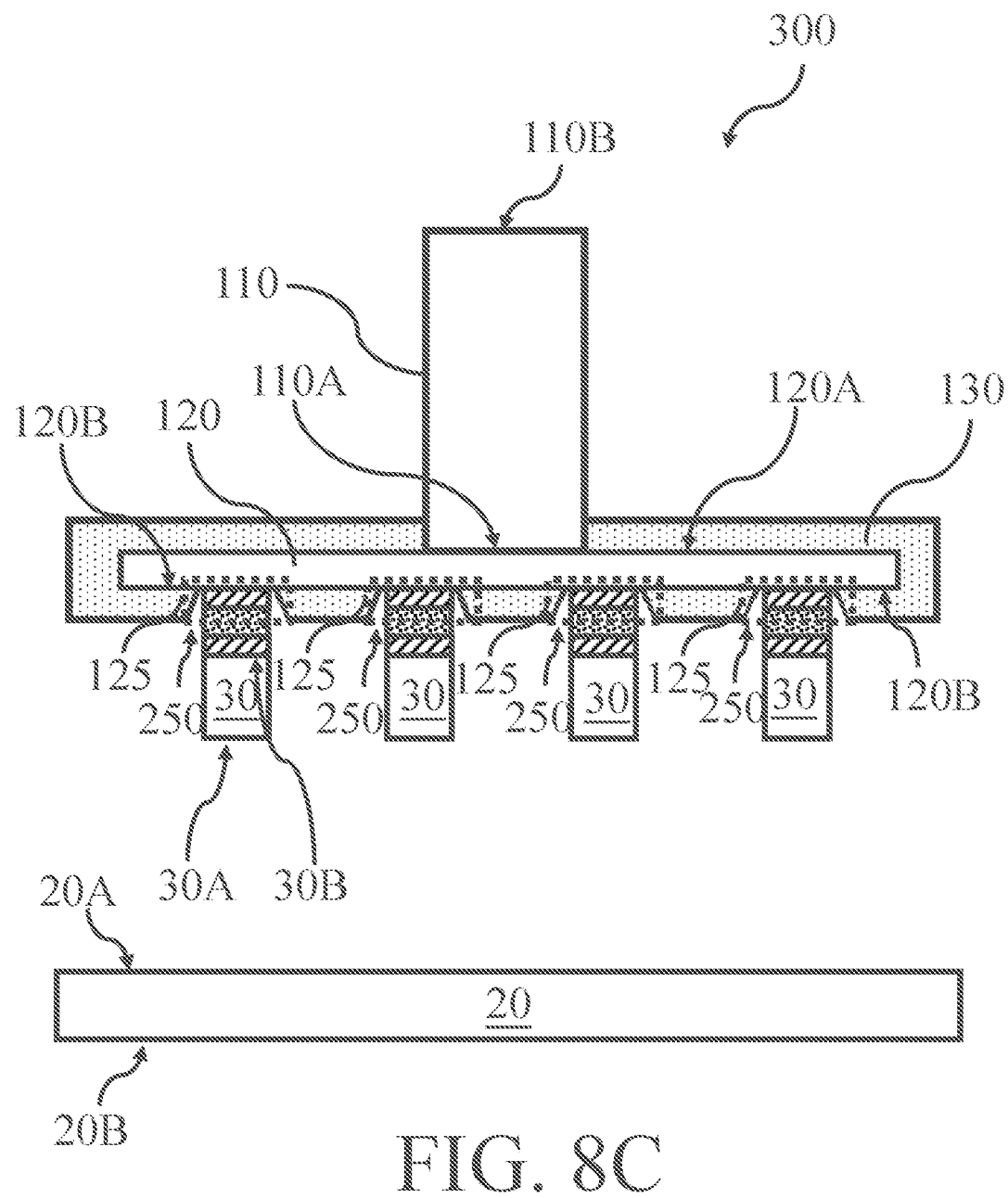

Next, referring to FIGS. 8B~8C. The magnetic field intensity of the first magnet 110 of the apparatus for transferring microdevice 300 was controlled to make each of the microdevices be attracted by one of the magnetic attracting hole 250 in the microdevice alignment regions 125 through the magnetic attracting layer 50 of the magnetic attracting surface 30B thereof as shown in FIG. 8B and separated from the third surface 20A of the temporary carrier substrate 20 as shown in FIG. 8C.

Figure 8D:
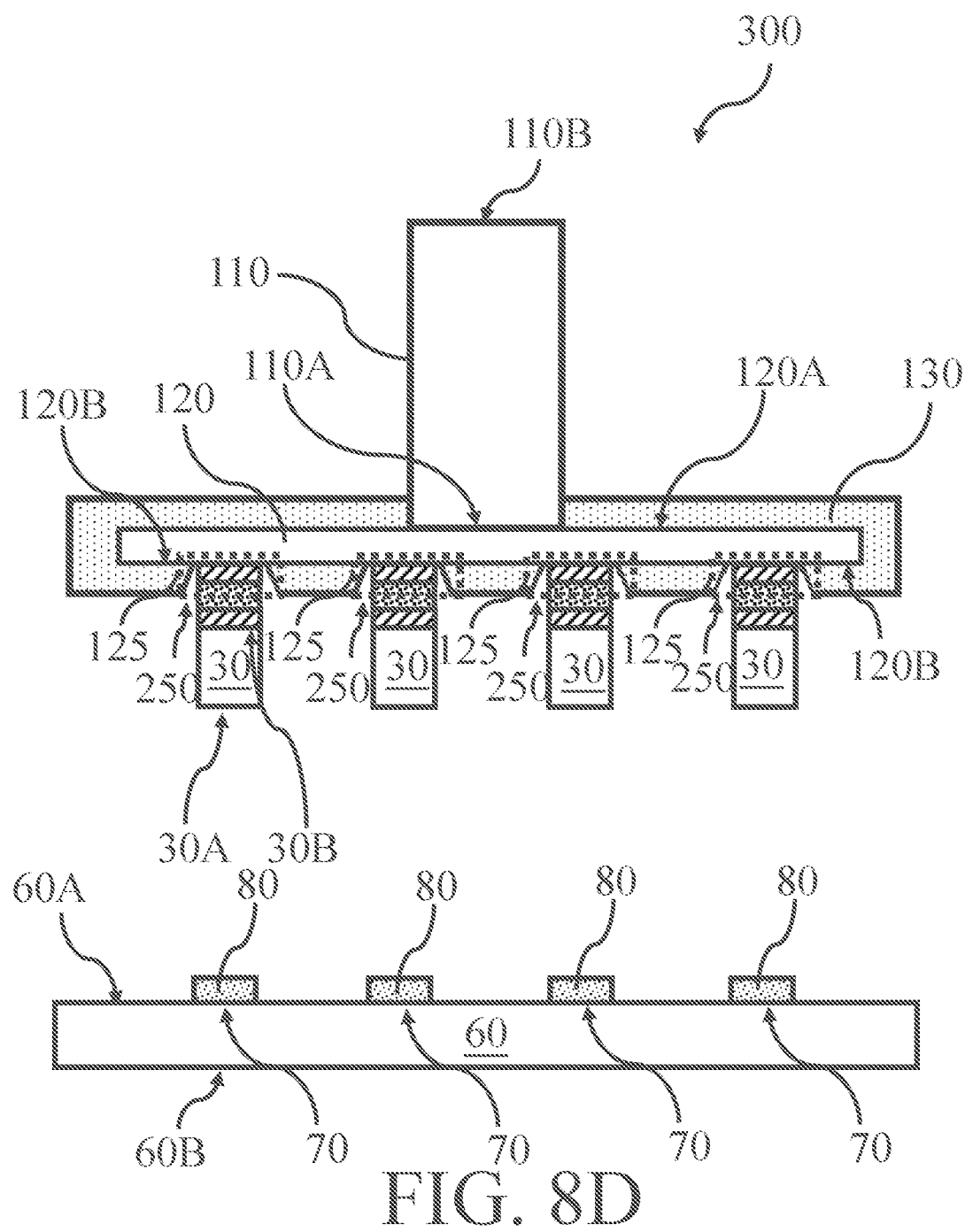

Next, referring to FIG. 8D. The target substrate 60 was moved into the apparatus for transferring microdevice 300 after the temporary carrier substrate 20 was moved out of the apparatus for transferring microdevice 300, wherein the target substrate 60 was located below the first magnetic attracting substrate 120 and faced the second surface 120B of the first magnetic attracting substrate 120 through the fifth surface 60A, and each of the microdevice bonding regions 70 on the fifth surface 60A of the target substrate 60 faced and aligned to each of the microdevice alignment regions 125 on the second surface 120B of the first magnetic attracting substrate 120.

Figure 8E:
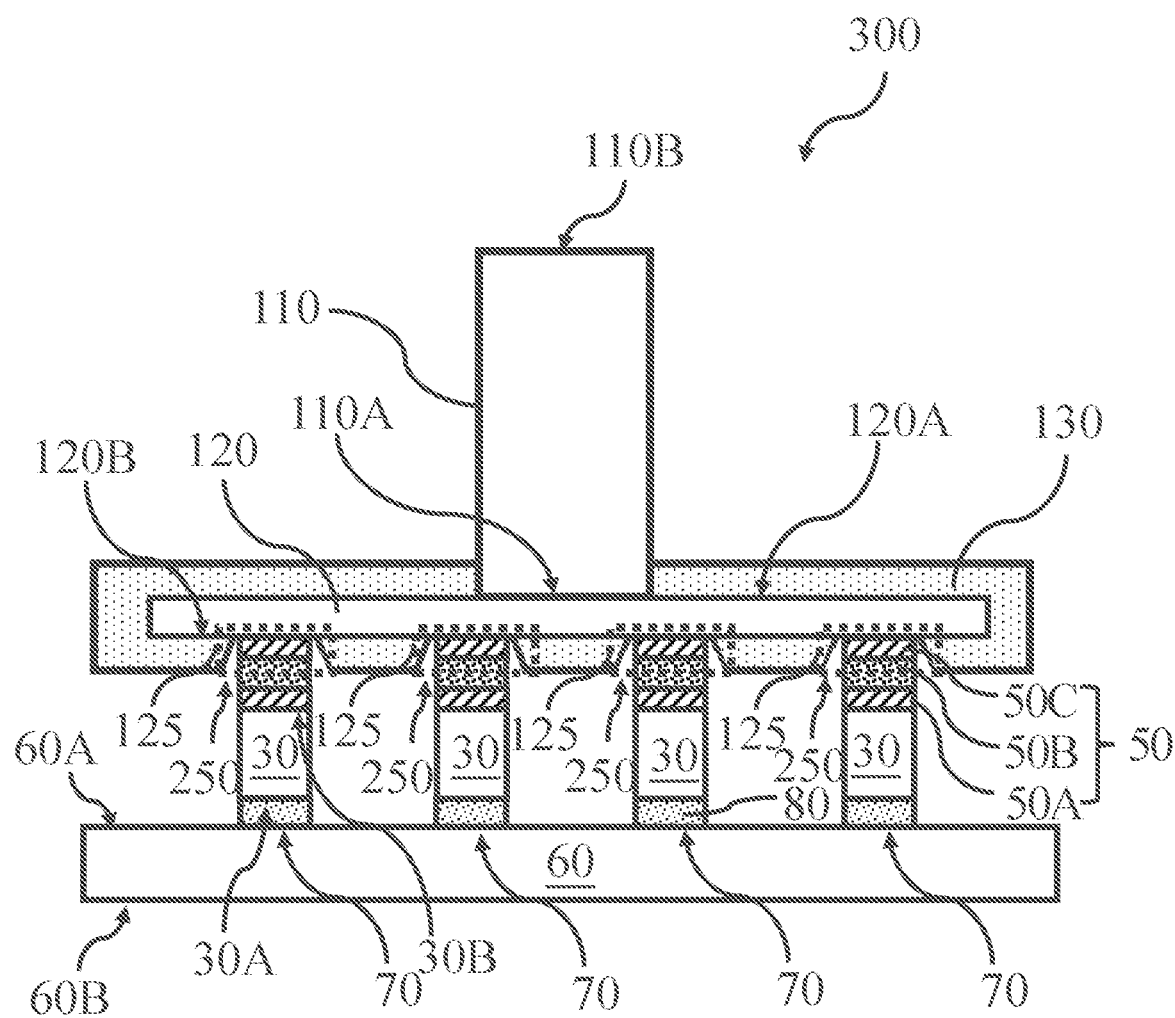

Next, referring to FIG. 8E. The first magnetic attracting substrate 120 was joined with the target substrate 60 to contact each of the microdevices 30 attracted by one of the magnetic attracting holes 250 in the microdevice alignment regions 125 to the conductive bonding layer 80 of the microdevice bonding regions 70 on the fifth surface 60A of the target substrate 60 through the bonding surface 30A thereof.

Figure 8F:
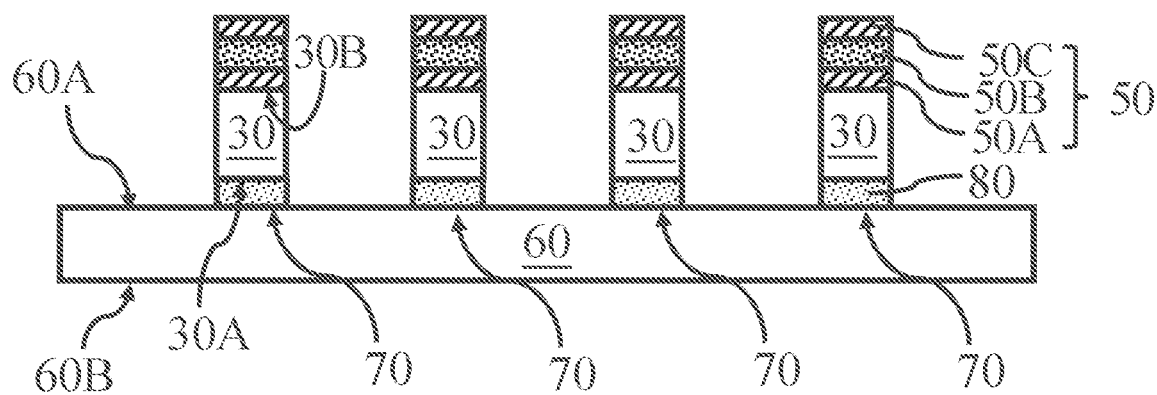

Finally, referring to FIG. 8F. A thermal treatment was applied to make each microdevice 30 bond to each conductive bonding layer 80 of each microdevice bonding region 70 through the bonding surface 30A thereof and separate from one of the alignment region 125 thereafter. Then, the process for transferring the microdevices 30 from the temporary carrier substrate 20 to the target substrate 60 was finished after each microdevice 30 was independently bonded to each conductive bonding layer 80 of each microdevice bonding region 70 on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80.

Accordingly, microdevices can be mass-transferred and self-aligned since each of the microdevices 30 on the temporary carrier substrate 20 cab be attracted by one of the magnetic attracting holes 250 in each of the alignment regions 125 through the magnetic attracting layer 50 of the magnetic attracting surface 30B thereof, and transferred to each microdevice bonding regions 70 formed on the target 60 and aligned to each alignment region 125 thereafter.

Embodiment 4

Figure 9A:
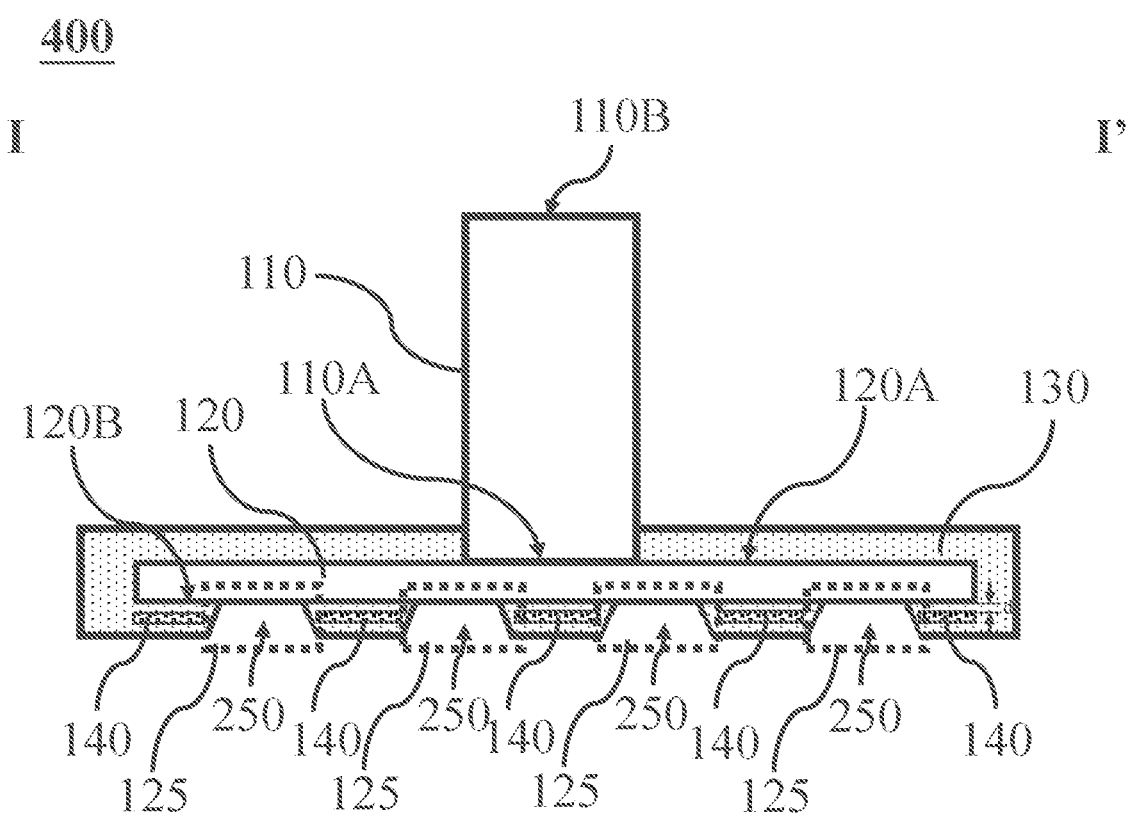
FIGS. 9A~9C are respectively a cross-sectional view, a top view and a bottom view of an apparatus for transferring microdevice 400 of Embodiment 4 of this invention.

Please refer to FIGS. 9A~9C, 2A~2C, 3A~3B and 10A~10F. FIGS. 5A~5C are respectively a cross-sectional view, a top view and a bottom view of an apparatus for transferring microdevice 400 of Embodiment 4 of this invention. FIG. 9A is a cross-sectional view along with the cross-section line II-II' shown in FIG. 9B. FIG. 2A is a top view of a temporary carrier substrate 20 with a plurality of microdevices 30 to be transferred formed thereon. FIGS. 2B~2C are cross-sectional views of the temporary carrier substrate 20 along with the cross-sectional line II-II' shown in FIG. 2A. FIG. 3A is a top view of a target substrate 60 with a plurality of microdevice bonding regions 70 formed thereon, and each of the microdevice bonding regions 70 comprises a conductive bonding layer 80 formed thereon. FIG. 3B is a cross-sectional view of the target substrate 60 along with the cross-sectional line III-III' as shown in FIG. 3A. FIGS. 10A~10F are cross-sectional views showing the process according to the method for transferring microdevices of the Embodiment 4.

Figure 9B:
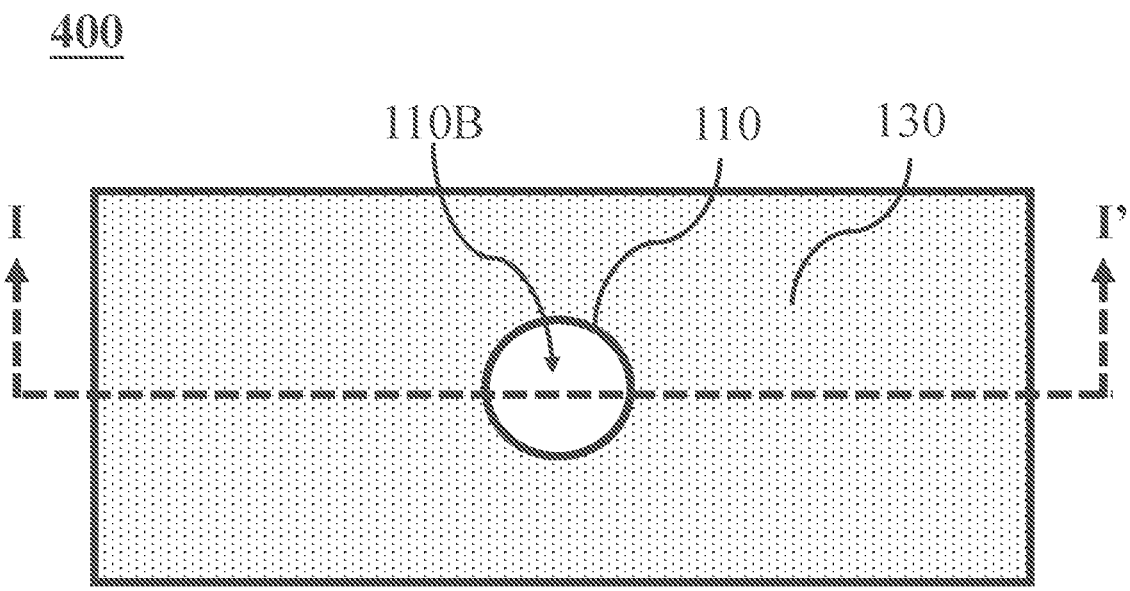
Figure 9C:
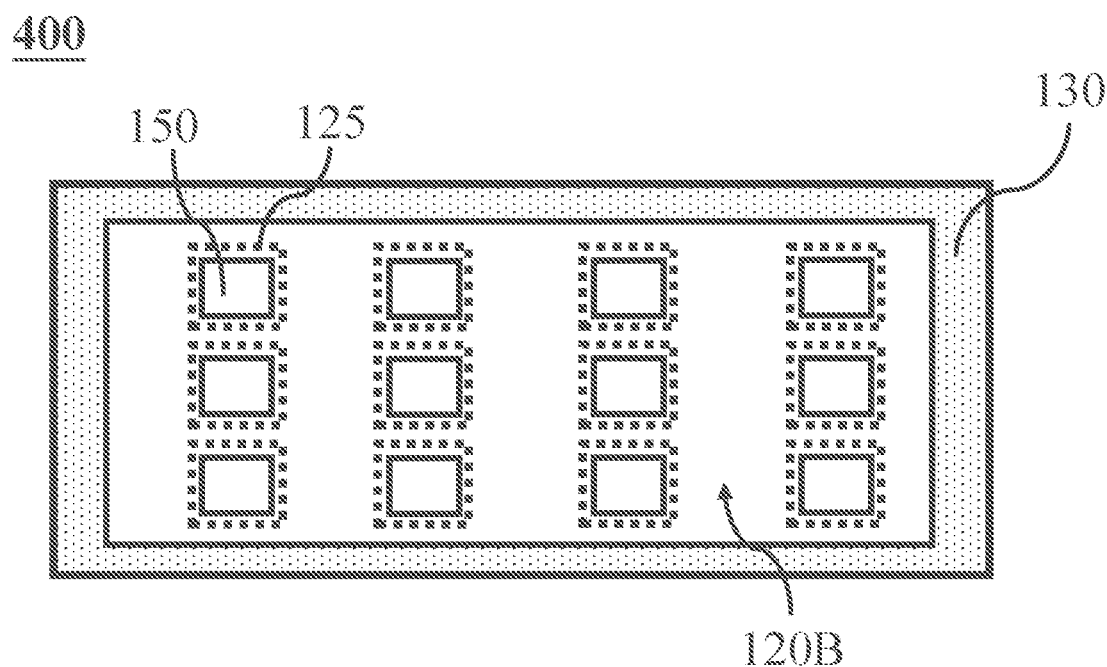

First, an apparatus for transferring microdevice 400 as shown in FIGS. 9A~9C were provided. The structure of the apparatus for transferring microdevice 400 is similar to that of the apparatus for transferring microdevice 300 as shown in FIGS. 7A~7C except that the insulating layer 130 of the apparatus for transferring microdevice 200 further comprises a magnetic shielding layer 140 disposed adjacent to the second surface 120B of the first magnetic attracting substrate 120 spaced with a distance d (d>0), wherein the magnetic shielding layer 140 surrounds each of the magnetic attracting holes 250 in each of the microdevice alignment regions 125.

Next, a temporary carrier substrate 20 with a third surface 20A having a plurality of microdevices 30 spaced to each other and formed thereon and a fourth surface 20B opposite to each other as shown in FIGS. 2A~2C was provided. Each of the microdevices 30 comprises a bonding surface 30A and a magnetic attracting surface 30B opposite to the bonding surface 30A, wherein the bonding surface 30A comprises at least one bonding pad (not shown), and the magnetic attracting surface 30B comprises a magnetic attracting layer 50. The microdevices 30 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 3A~3B was provided. The fifth surface 60A comprises a plurality of microdevice bonding regions 70, and each of the microdevice bonding regions 70 has a conductive bonding layer 80 formed thereon. The conductive bonding layer 80 can be for example but not limited to a conductive glue, an anisotropic conductive film (ACF) or a thermal welding metal layer.

Figure 10A:
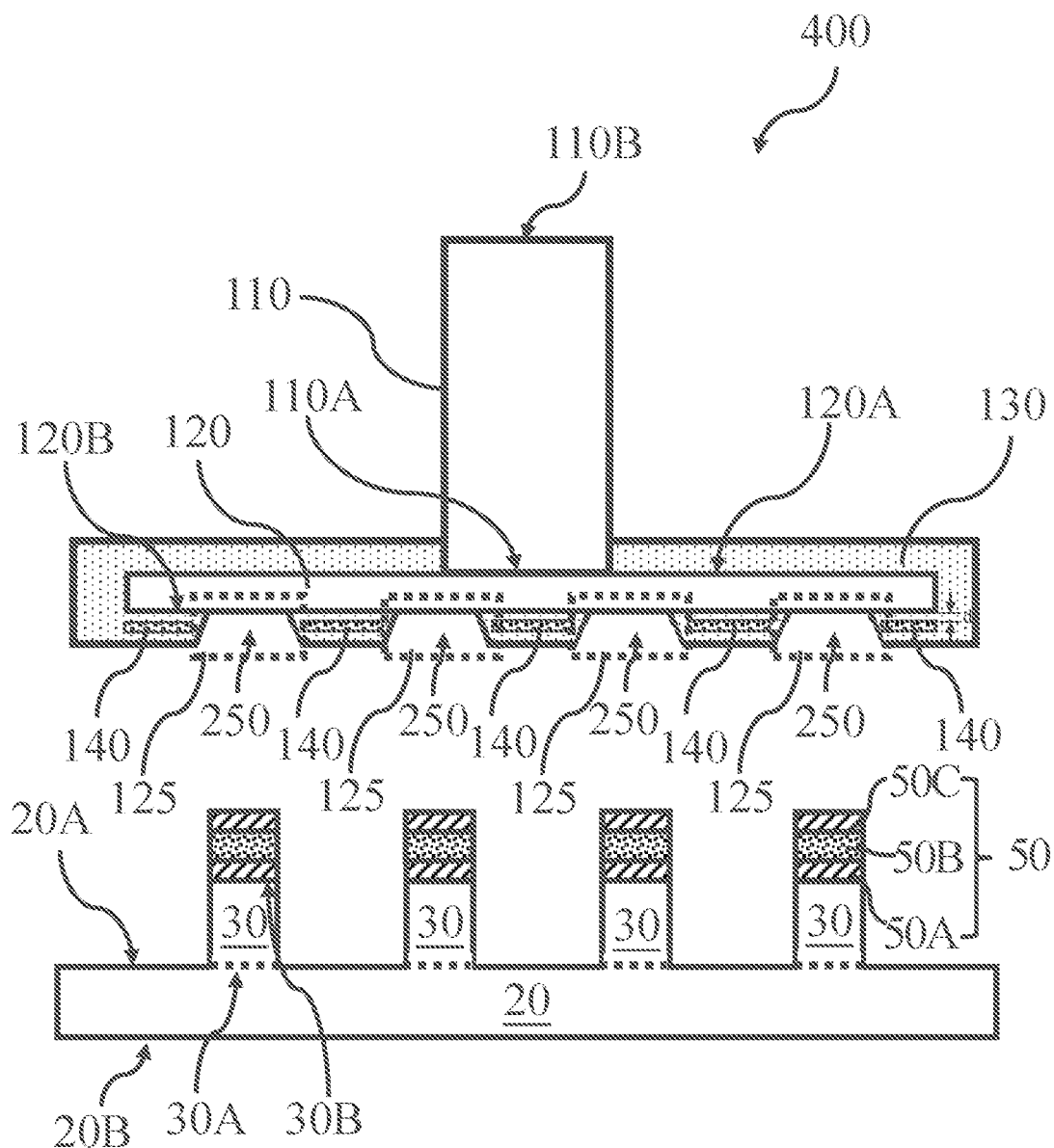
FIGS. 10A~10F are cross-sectional views showing the process according to the method for transferring microdevices of the Embodiment 4.

Next, referring to FIG. 10A. The temporary carrier substrate 20 was moved into the apparatus for transferring microdevice 400, wherein the temporary carrier substrate 20 was located below the first magnetic attracting substrate 120 and faced the second surface 120B of the first magnetic attracting substrate 120 by the third surface 20A to make each magnetic attracting layer 50B of the magnetic attracting surface 30B of each microdevice 30 on the third surface 20A of the temporary carrier substrate 20 face the microdevice alignment regions 125 of the first magnetic attracting substrate 120. According to one embodiment of this invention, a step of lift-off by laser or UV to lift off the microdevices 30 from the third surface 20A of the temporary carrier substrate 20 as shown in FIG. 2C was optionally proceeded before the step of moving the temporary carrier substrate 20 into the apparatus for transferring microdevice 400.

Figure 10B:
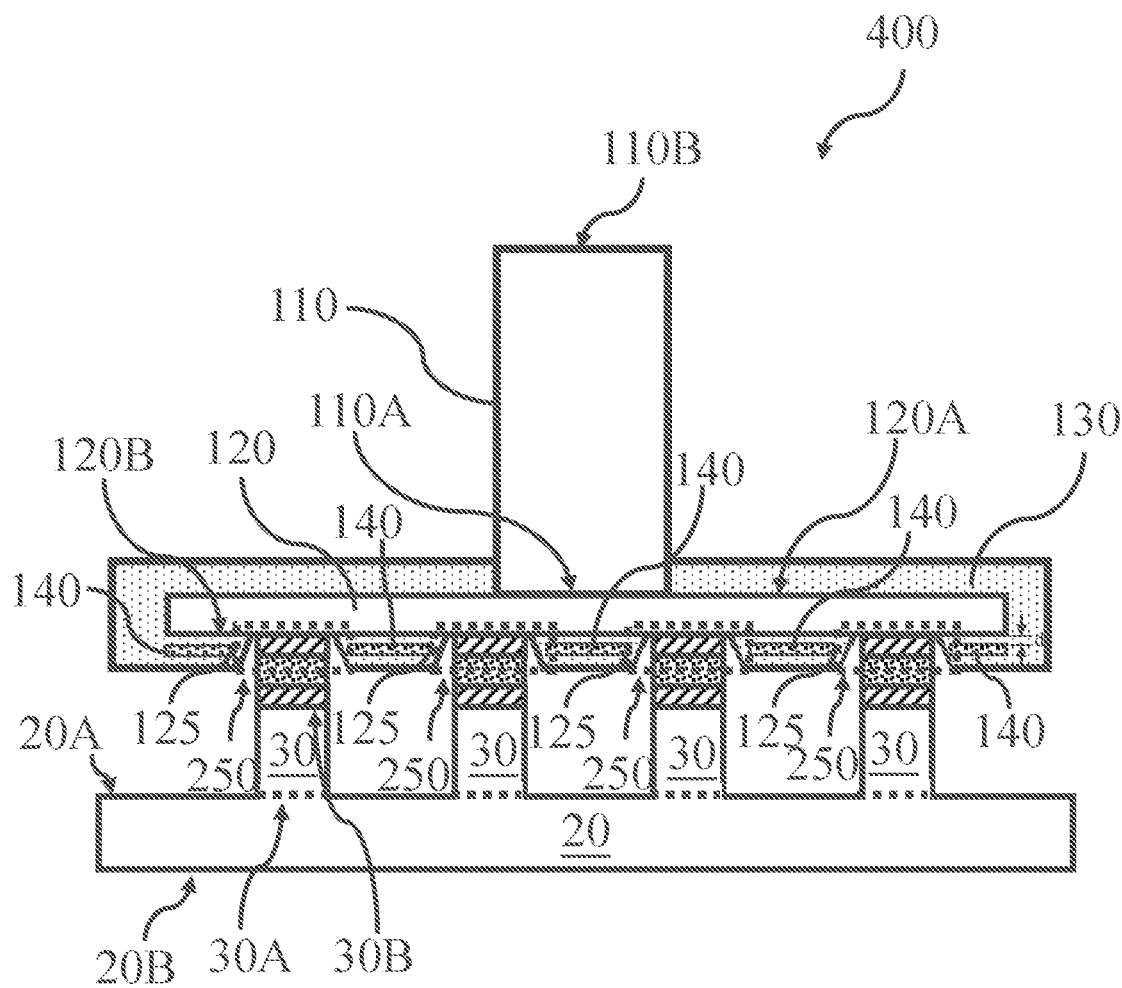
Figure 10C:
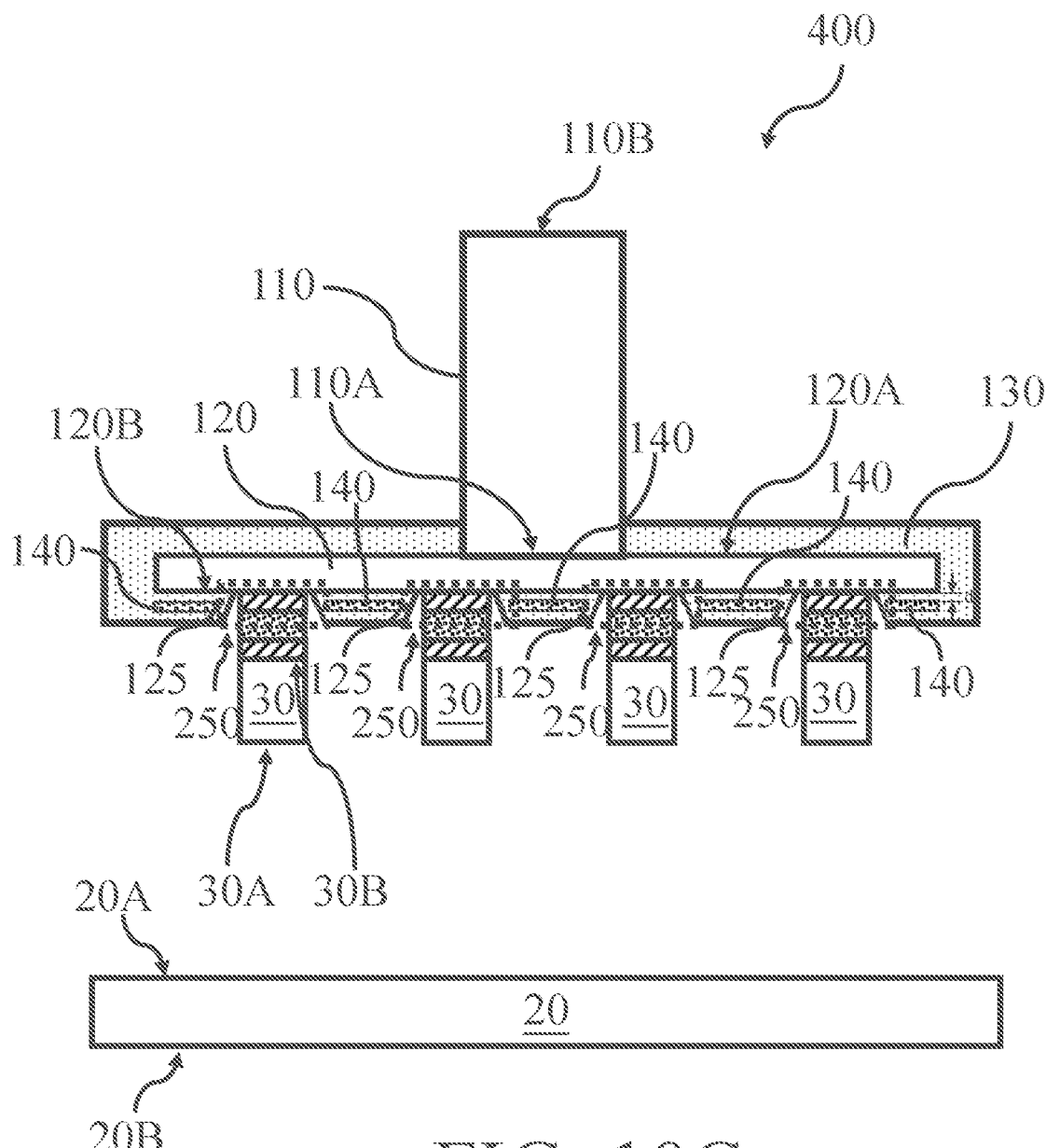

Next, referring to FIGS. 10B~10C. The magnetic field intensity of the first magnet 110 of the apparatus for transferring microdevice 400 was controlled to make each of the microdevices be attracted by one of the magnetic attracting hole 250 in the microdevice alignment regions 125 through the magnetic attracting layer 50 of the magnetic attracting surface 30B thereof as shown in FIG. 10B and separated from the third surface 20A of the temporary carrier substrate 20 as shown in FIG. 10C.

Figure 10D:
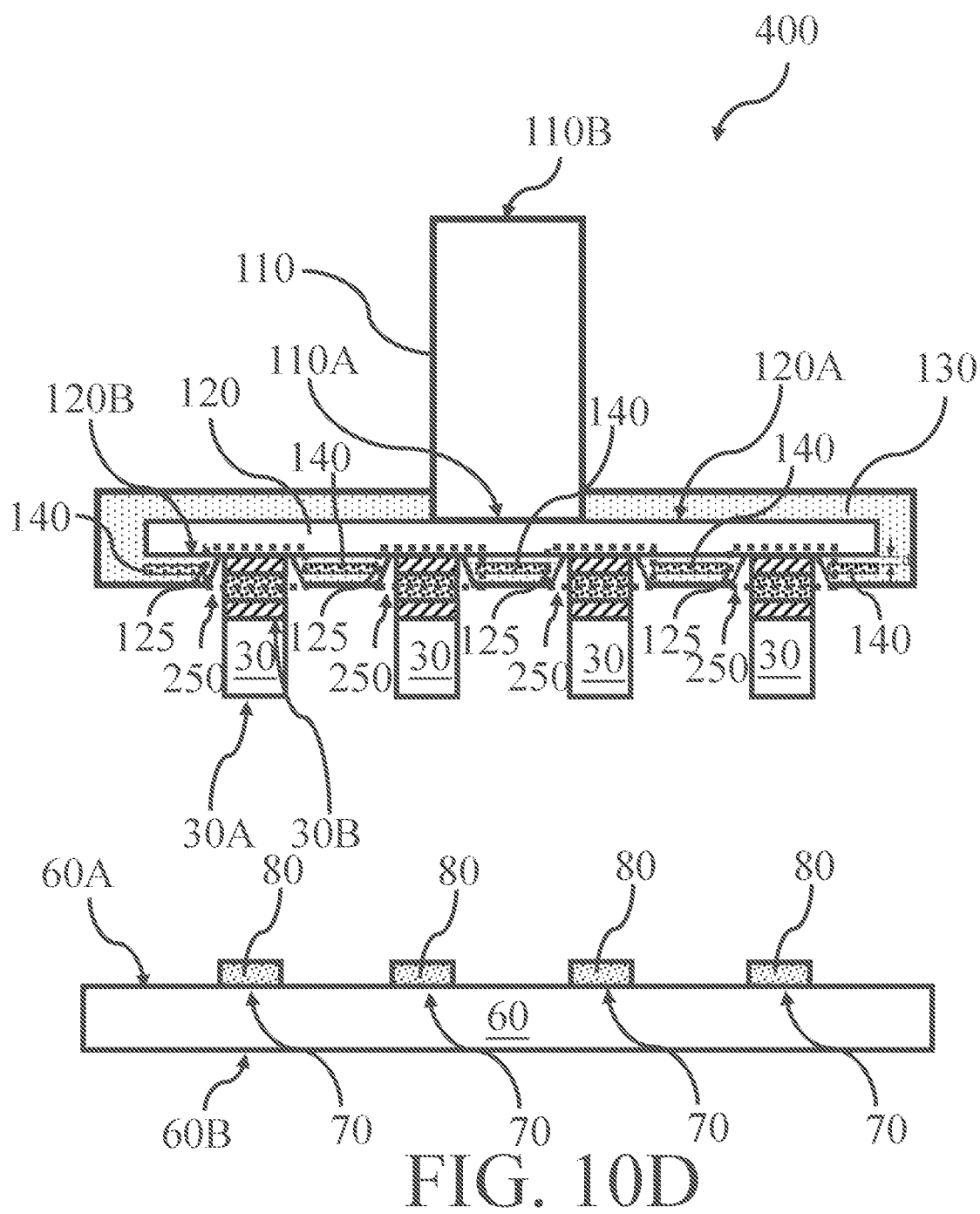

Next, referring to FIG. 10D. The target substrate 60 was moved into the apparatus for transferring microdevice 400 after the temporary carrier substrate 20 was moved out of the apparatus for transferring microdevice 400, wherein the target substrate 60 was located below the first magnetic attracting substrate 120 and faced the second surface 120B of the first magnetic attracting substrate 120 through the fifth surface 60A, and each of the microdevice bonding regions 70 on the fifth surface 60A of the target substrate 60 faced and aligned to each of the microdevice alignment regions 125 on the second surface 120B of the first magnetic attracting substrate 120.

Figure 10E:
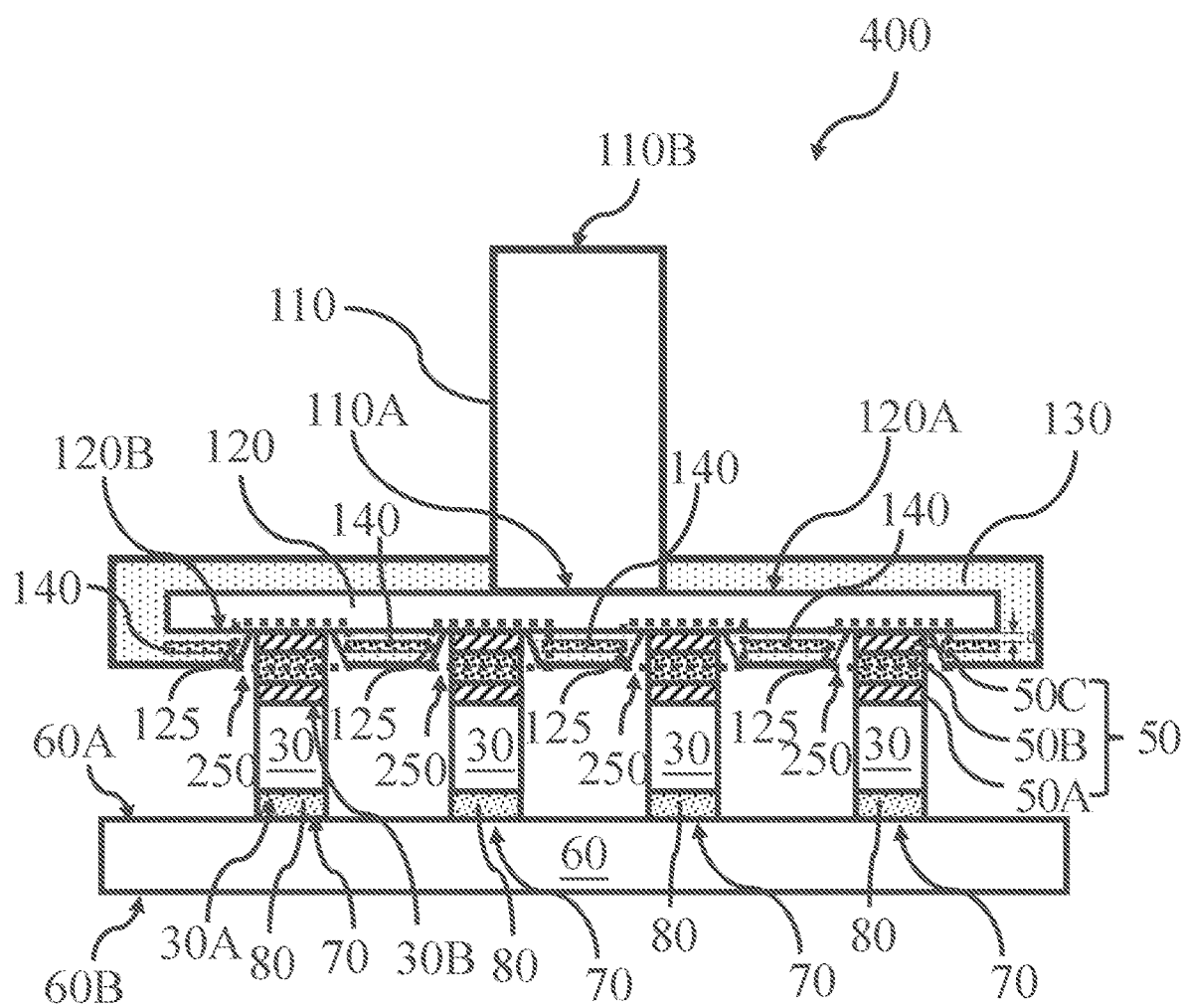

Next, referring to FIG. 10E. The first magnetic attracting substrate 120 was joined with the target substrate 60 to contact each of the microdevices 30 attracted by one of the magnetic attracting holes 250 in the microdevice alignment regions 125 to the conductive bonding layer 80 of the microdevice bonding regions 70 on the fifth surface 60A of the target substrate 60 through the bonding surface 30A thereof.

Figure 10F:
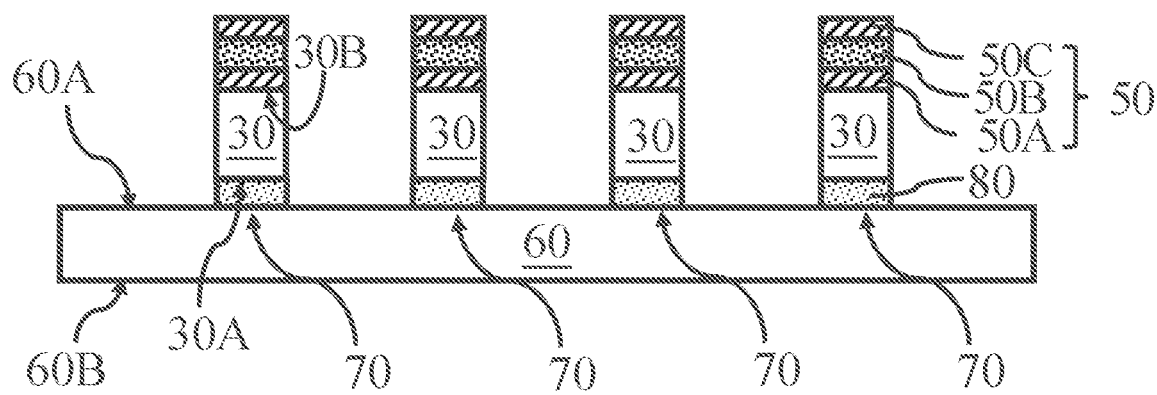

Finally, referring to FIG. 10F. A thermal treatment was applied to make each microdevice 30 bond to each conductive bonding layer 80 of each microdevice bonding region 70 through the bonding surface 30A thereof and separate from one of the alignment region 125 thereafter. Then, the process for transferring the microdevices 30 from the temporary carrier substrate 20 to the target substrate 60 was finished after each microdevice 30 was independently bonded to each conductive bonding layer 80 of each microdevice bonding region 70 on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80.

Accordingly, microdevices can be mass-transferred and self-aligned since each of the microdevices 30 on the temporary carrier substrate 20 cab be attracted by one of the magnetic attracting holes 250 in each of the alignment regions 125 through the magnetic attracting layer 50 of the magnetic attracting surface 30B thereof, and transferred to each microdevice bonding regions 70 formed on the target 60 and aligned to each alignment region 125 thereafter.

Embodiment 5

Figure 11:
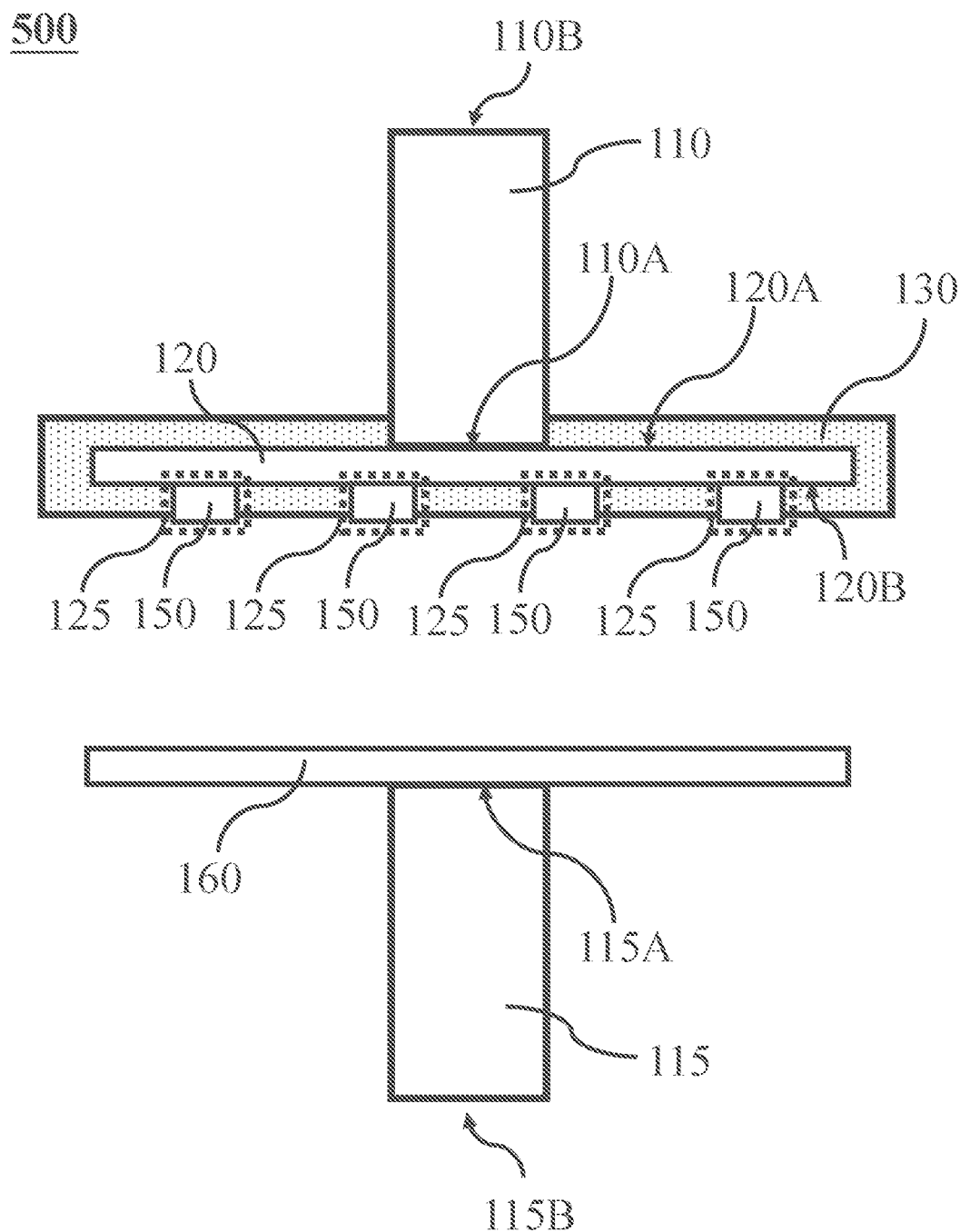
FIG. 11 is a cross-sectional view of an apparatus for transferring microdevice 500 of Embodiment 5 of this invention.

Please refer to FIGS. 11, 2A~2C, 3A~3B and 12A~12F. FIG. 11 is a cross-sectional view of an apparatus for transferring microdevice 500 of Embodiment 5 of this invention. FIG. 2A is a top view of a temporary carrier substrate 20 with a plurality of microdevices 30 to be transferred formed thereon. FIGS. 2B~2C are cross-sectional views of the temporary carrier substrate 20 along with the cross-sectional line II-II' shown in FIG. 2A. FIG. 3A is a top view of a target substrate 60 with a plurality of microdevice bonding regions 70 formed thereon, and each of the microdevice bonding regions 70 comprises a conductive bonding layer 80 formed thereon. FIG. 3B is a cross-sectional view of the target substrate 60 along with the cross-sectional line III-III' as shown in FIG. 3A. FIGS. 12A~12F are cross-sectional views showing the process according to the method for transferring microdevices of the Embodiment 5.

First, an apparatus for transferring microdevice 500 as shown in FIG. 11 was provided. The structure of the apparatus for transferring microdevice 500 is similar to that of the apparatus for transferring microdevice 100 as shown in FIGS. 1A~1C except that the apparatus for transferring microdevice 500 further comprises a second magnet 115 with a third terminal 115A and a fourth terminal 115B opposite to each other and a second magnetic attracting substrate 160, wherein the second magnetic attracting substrate 160 is contacted to the third terminal 115A of the second magnet 115, and the second magnetic substrate 160 is disposed under the first magnetic substrate 120. The second magnet 115 can be a permanent magnet or a electromagnet.

Next, a temporary carrier substrate 20 with a third surface 20A having a plurality of microdevices 30 spaced to each other and formed thereon and a fourth surface 20B opposite to each other as shown in FIGS. 2A~2C was provided. Each of the microdevices 30 comprises a bonding surface 30A and a magnetic attracting surface 30B opposite to the bonding surface 30A, wherein the bonding surface 30A comprises at least one bonding pad (not shown), and the magnetic attracting surface 30B comprises a magnetic attracting layer 50. The microdevices 30 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 3A~3B was provided. The fifth surface 60A comprises a plurality of microdevice bonding regions 70, and each of the microdevice bonding regions 70 has a conductive bonding layer 80 formed thereon. The conductive bonding layer 80 can be for example but not limited to a conductive glue, an anisotropic conductive film (ACF) or a thermal welding metal layer.

Figure 12A:
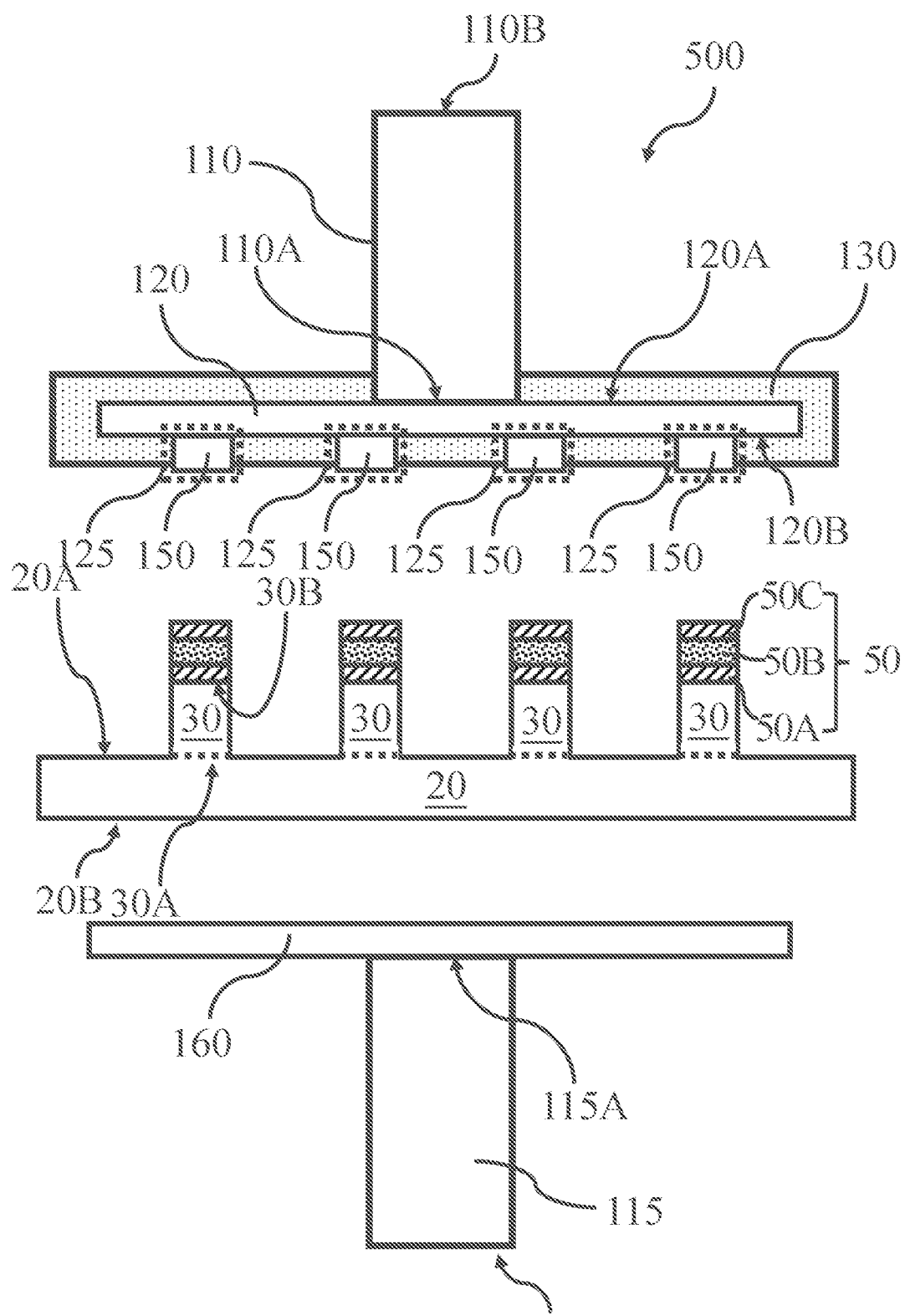
FIGS. 12A~12F are cross-sectional views showing the process according to the method for transferring microdevices of the Embodiment 5.

Next, referring to FIG. 12A. The temporary carrier substrate 20 was moved into the apparatus for transferring microdevice 500, wherein the temporary carrier substrate 20 was located between the first magnetic attracting substrate 120 and the second magnetic attracting substrate 160, and faced the second surface 120B of the first magnetic attracting substrate 120 by the third surface 20A to make each magnetic attracting layer 50B of the magnetic attracting surface 30B of each microdevice 30 on the third surface 20A of the temporary carrier substrate 20 face the microdevice alignment regions 125 of the first magnetic attracting substrate 120. According to one embodiment of this invention, a step of lift-off by laser or UV to lift off the microdevices 30 from the third surface 20A of the temporary carrier substrate 20 as shown in FIG. 2C was optionally proceeded before the step of moving the temporary carrier substrate 20 into the apparatus for transferring microdevice 500.

Figure 12B:
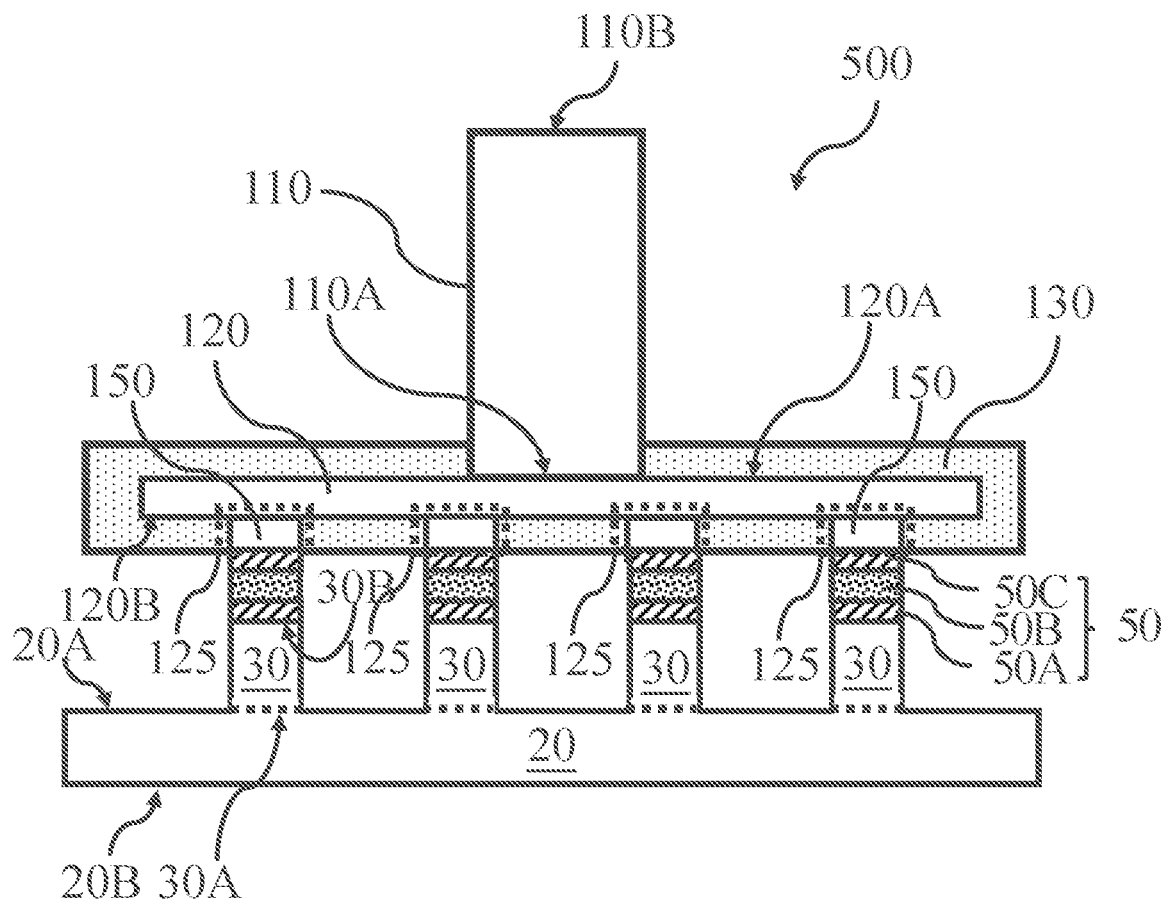
Figure 12B:
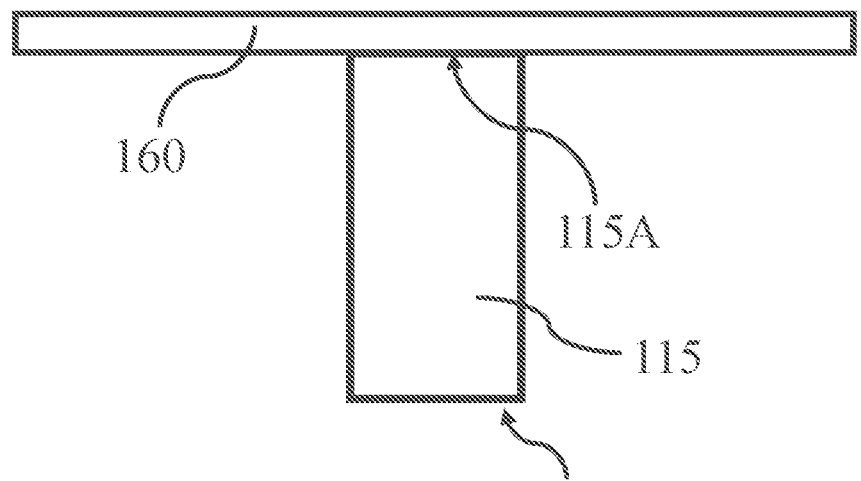
Figure 12C:
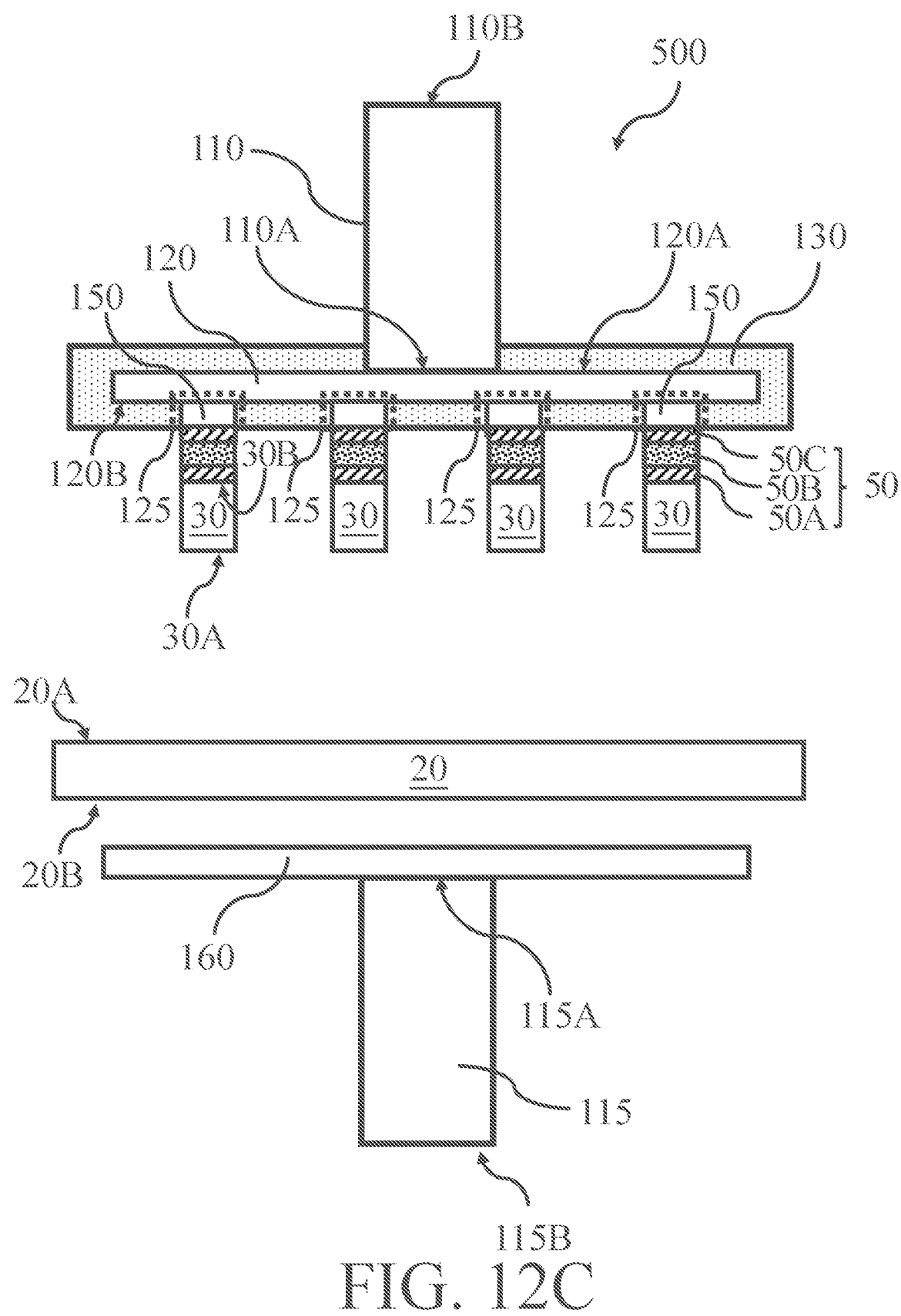

Next, referring to FIGS. 12B~12C. The magnetic field intensity of the first magnet 110 of the apparatus for transferring microdevice 500 was controlled to make each of the microdevices 30 be attracted by one of the magnetic attracting heads 150 in the microdevice alignment regions 125 through the magnetic attracting layer 50 of the magnetic attracting surface 30B thereof as shown in FIG. 12B and separated from the third surface 20A of the temporary carrier substrate 20 as shown in FIG. 12C. The microdevices 30 on the temporary carrier substrate 20 can sensing greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160. The microdevices 30 on the temporary carrier substrate 20 of this embodiment sensed greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160, and the magnetic field generated by the first magnetic substrate 120 and the second magnetic substrate 160 was stable, thereby the magnetic attracting layer 50 of the magnetic attracting surface 30B of each microdevice 30 was more precisely attracted by one of the magnetic attracting heads 150 in the alignment regions 125.

Figure 12D:
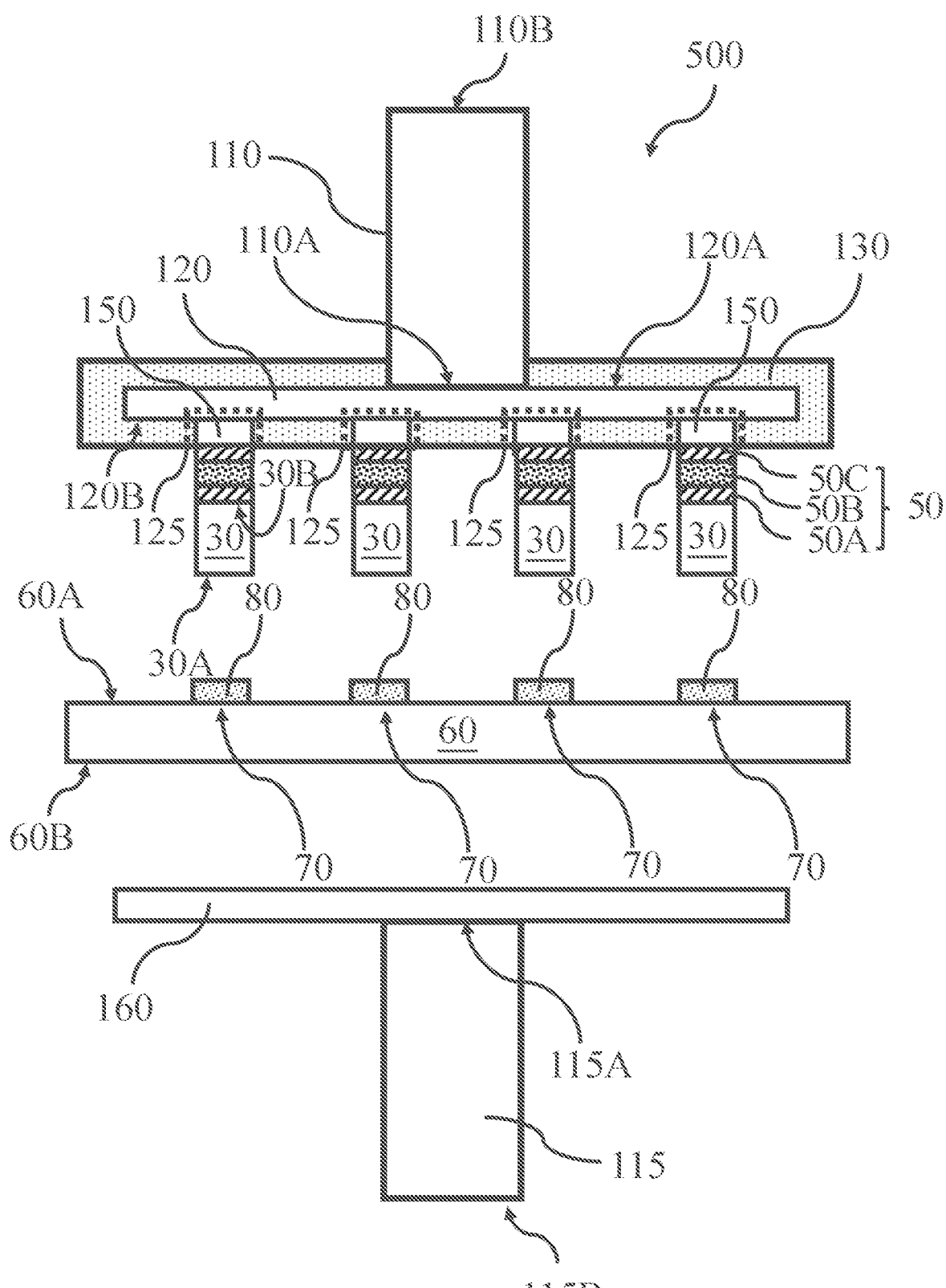

Next, referring to FIG. 12D. The target substrate 60 was moved into the apparatus for transferring microdevice 500 after the temporary carrier substrate 20 was moved out of the apparatus for transferring microdevice 100, wherein the target substrate 60 was located below the first magnetic attracting substrate 120 and faced the second surface 120B of the first magnetic attracting substrate 120 through the fifth surface 60A, and each of the microdevice bonding regions 70 on the fifth surface 60A of the target substrate 60 faced and aligned to each of the microdevice alignment regions 125 on the second surface 120B of the first magnetic attracting substrate 120.

Figure 12E:
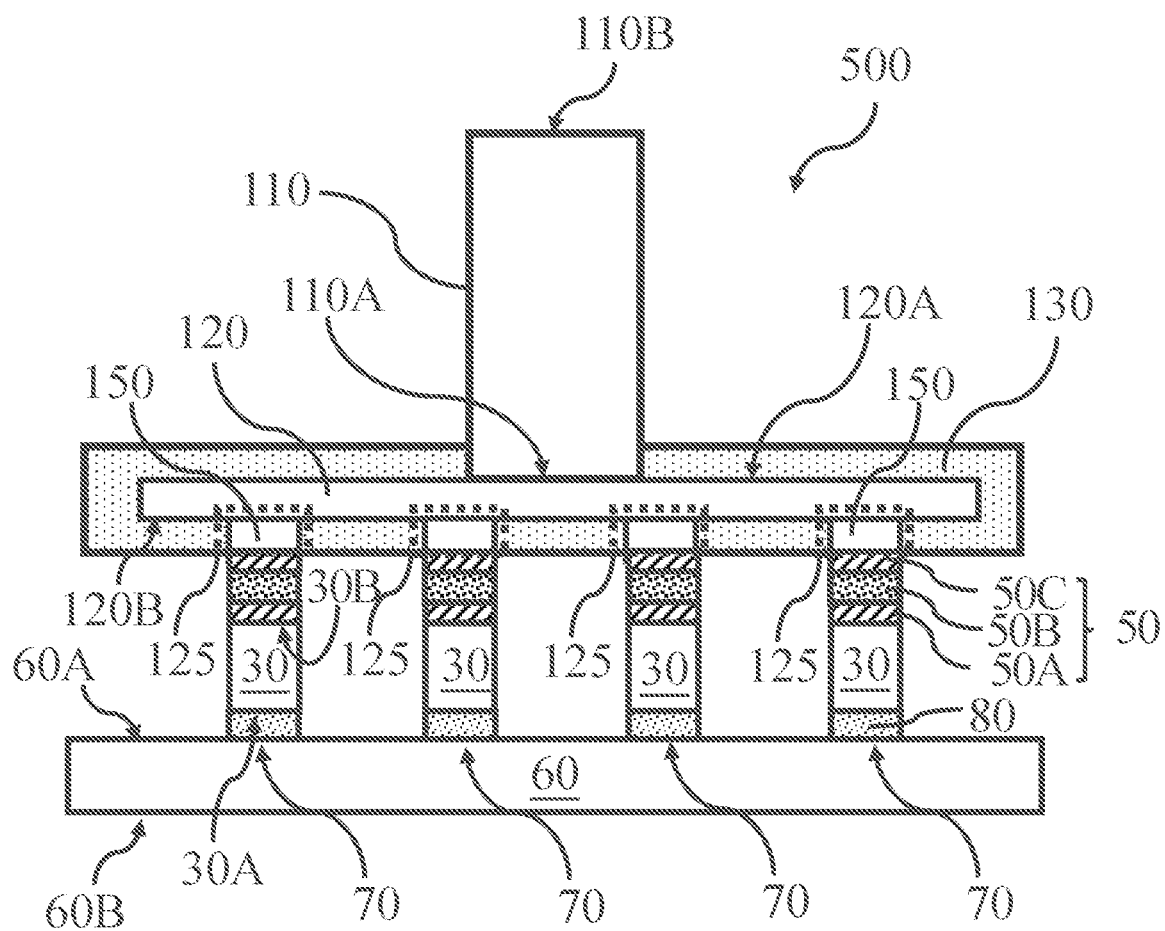
Figure 12E:
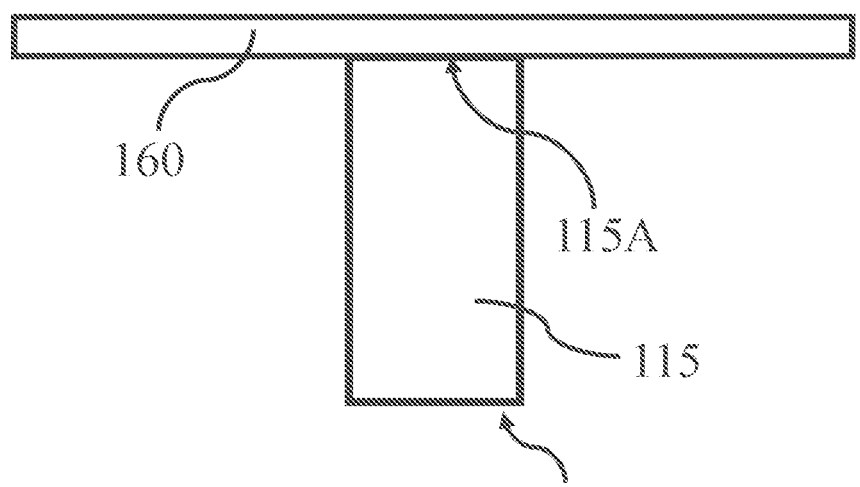

Next, referring to FIG. 12E. The first magnetic attracting substrate 120 was joined with the target substrate 60 to contact each of the microdevices 30 attracted by one of the magnetic attracting heads 150 in the microdevice alignment regions 125 to the conductive bonding layer 80 of the microdevice bonding regions 70 on the fifth surface 60A of the target substrate 60 through the bonding surface 30A thereof.

Figure 12F:
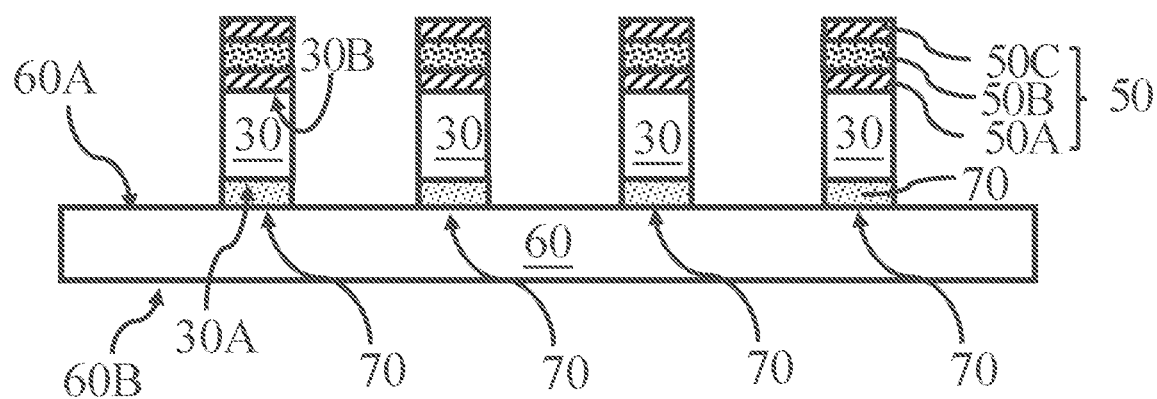

Finally, referring to FIG. 12F. A thermal treatment was applied to make each microdevice 30 bond to each conductive bonding layer 80 of each microdevice bonding region 70 through the bonding surface 30A thereof and separate from one of the alignment region 125 thereafter. Then, the process for transferring the microdevices 30 from the temporary carrier substrate 20 to the target substrate 60 was finished after each microdevice 30 was independently bonded to each conductive bonding layer 80 of each microdevice bonding region 70 on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80.

Accordingly, microdevices can be mass-transferred and self-aligned since each of the microdevices 30 on the temporary carrier substrate 20 cab be attracted by one of the magnetic attracting heads 150 in each of the alignment regions 125 through the magnetic attracting layer 50 of the magnetic attracting surface 30B thereof, and transferred to each microdevice bonding regions 70 formed on the target 60 and aligned to each alignment region 125 thereafter.

Embodiment 6

Figure 13:
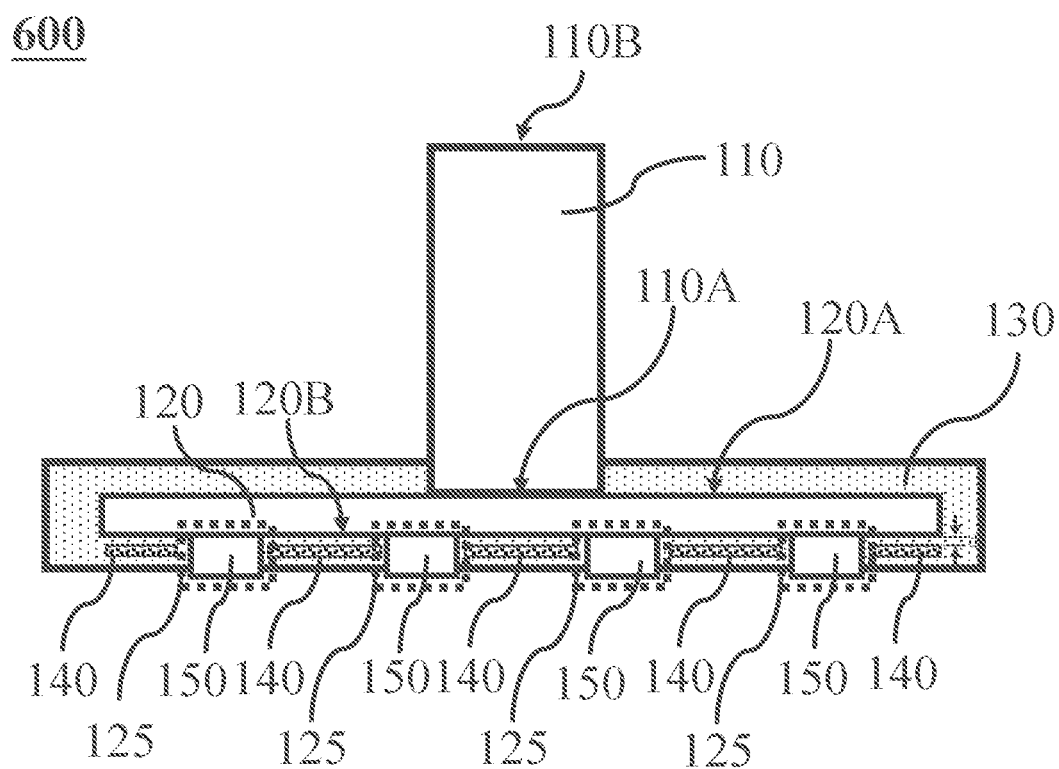
FIG. 13 is a cross-sectional view of an apparatus for transferring microdevice 600 of Embodiment 6 of this invention.
Figure 13:
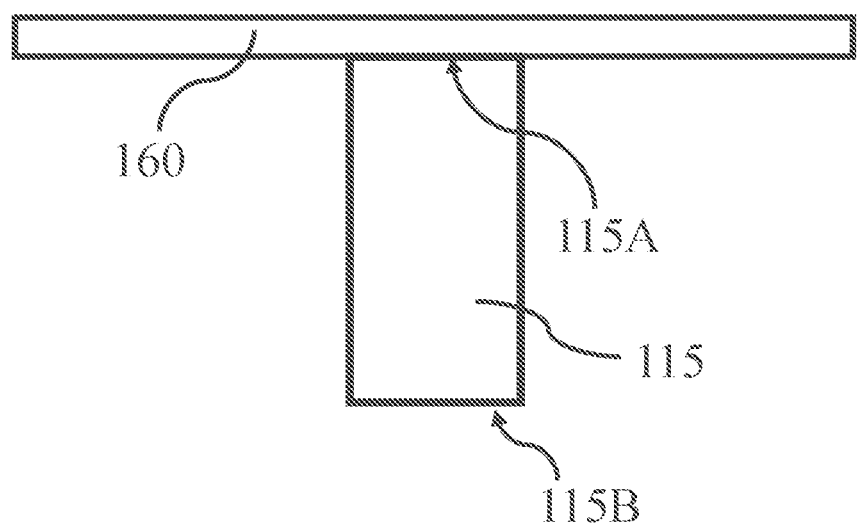

Please refer to FIGS. 13, 2A~2C, 3A~3B and 14A~14F. FIG. 13 is a cross-sectional view of an apparatus for transferring microdevice 600 of Embodiment 6 of this invention. FIG. 2A is a top view of a temporary carrier substrate 20 with a plurality of microdevices 30 to be transferred formed thereon. FIGS. 2B~2C are cross-sectional views of the temporary carrier substrate 20 along with the cross-sectional line II-II' shown in FIG. 2A. FIG. 3A is a top view of a target substrate 60 with a plurality of microdevice bonding regions 70 formed thereon, and each of the microdevice bonding regions 70 comprises a conductive bonding layer 80 formed thereon. FIG. 3B is a cross-sectional view of the target substrate 60 along with the cross-sectional line III-III' as shown in FIG. 3A. FIGS. 14A~14F are cross-sectional views showing the process according to the method for transferring microdevices of the Embodiment 6.

First, an apparatus for transferring microdevice 600 as shown in FIG. 13 was provided. The structure of the apparatus for transferring microdevice 600 is similar to that of the apparatus for transferring microdevice 200 as shown in FIGS. 5A~5C except that the apparatus for transferring microdevice 600 further comprises a second magnet 115 with a third terminal 115A and a fourth terminal 115B opposite to each other and a second magnetic attracting substrate 160, wherein the second magnetic attracting substrate 160 is contacted to the third terminal 115A of the second magnet 115, and the second magnetic substrate 160 is disposed under the first magnetic substrate 120. The second magnet 115 can be a permanent magnet or a electromagnet.

Next, a temporary carrier substrate 20 with a third surface 20A having a plurality of microdevices 30 spaced to each other and formed thereon and a fourth surface 20B opposite to each other as shown in FIGS. 2A~2C was provided. Each of the microdevices 30 comprises a bonding surface 30A and a magnetic attracting surface 30B opposite to the bonding surface 30A, wherein the bonding surface 30A comprises at least one bonding pad (not shown), and the magnetic attracting surface 30B comprises a magnetic attracting layer 50. The microdevices 30 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 3A~3B was provided. The fifth surface 60A comprises a plurality of microdevice bonding regions 70, and each of the microdevice bonding regions 70 has a conductive bonding layer 80 formed thereon. The conductive bonding layer 80 can be for example but not limited to a conductive glue, an anisotropic conductive film (ACF) or a thermal welding metal layer.

Figure 14A:
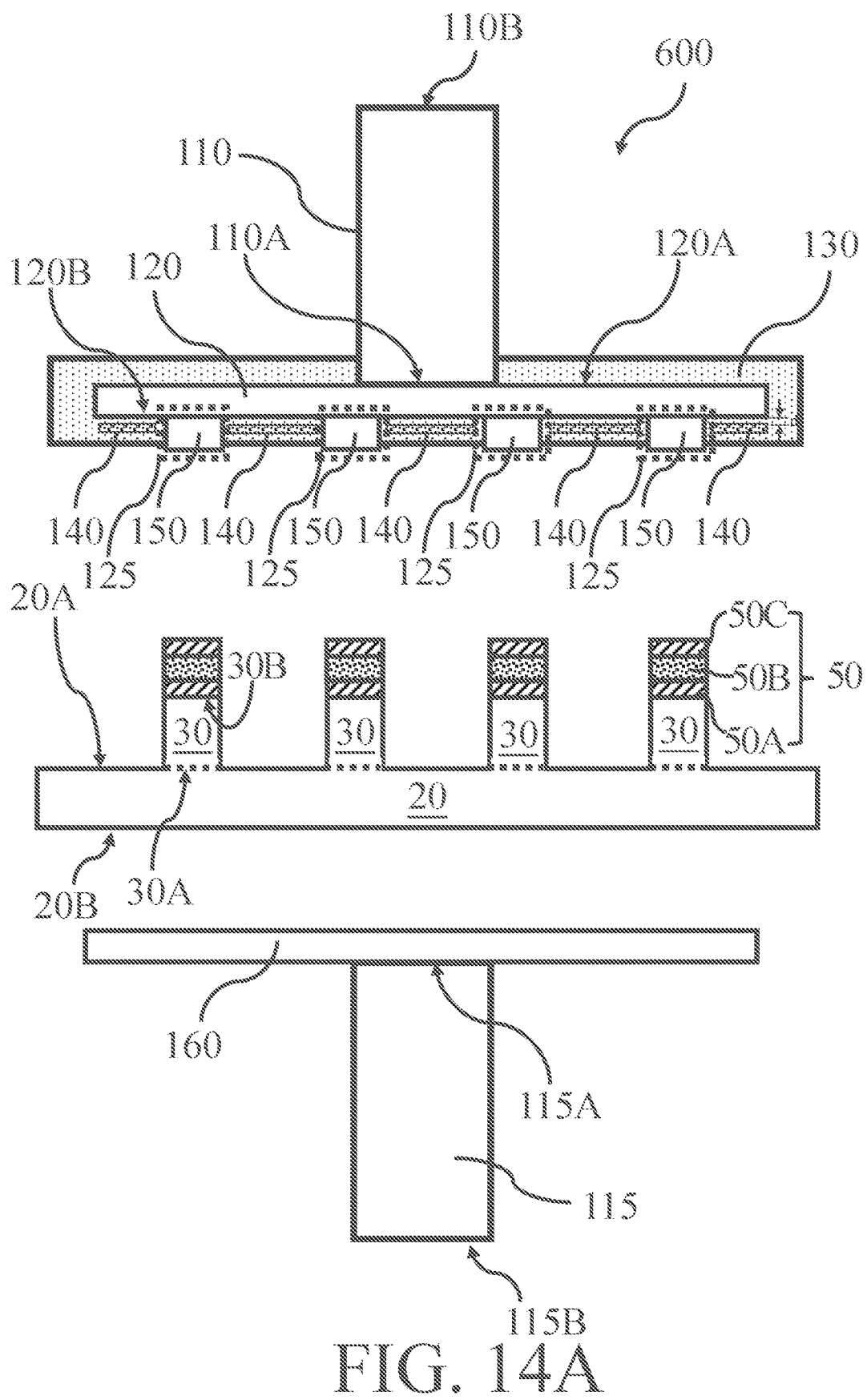
FIGS. 14A~14F are cross-sectional views showing the process according to the method for transferring microdevices of the Embodiment 6.

Next, referring to FIG. 14A. The temporary carrier substrate 20 was moved into the apparatus for transferring microdevice 600, wherein the temporary carrier substrate 20 was located between the first magnetic attracting substrate 120 and the second magnetic attracting substrate 160, and faced the second surface 120B of the first magnetic attracting substrate 120 by the third surface 20A to make each magnetic attracting layer 50B of the magnetic attracting surface 30B of each microdevice 30 on the third surface 20A of the temporary carrier substrate 20 face the microdevice alignment regions 125 of the first magnetic attracting substrate 120. According to one embodiment of this invention, a step of lift-off by laser or UV to lift off the microdevices 30 from the third surface 20A of the temporary carrier substrate 20 as shown in FIG. 2C was optionally proceeded before the step of moving the temporary carrier substrate 20 into the apparatus for transferring microdevice 600.

Figure 14B:
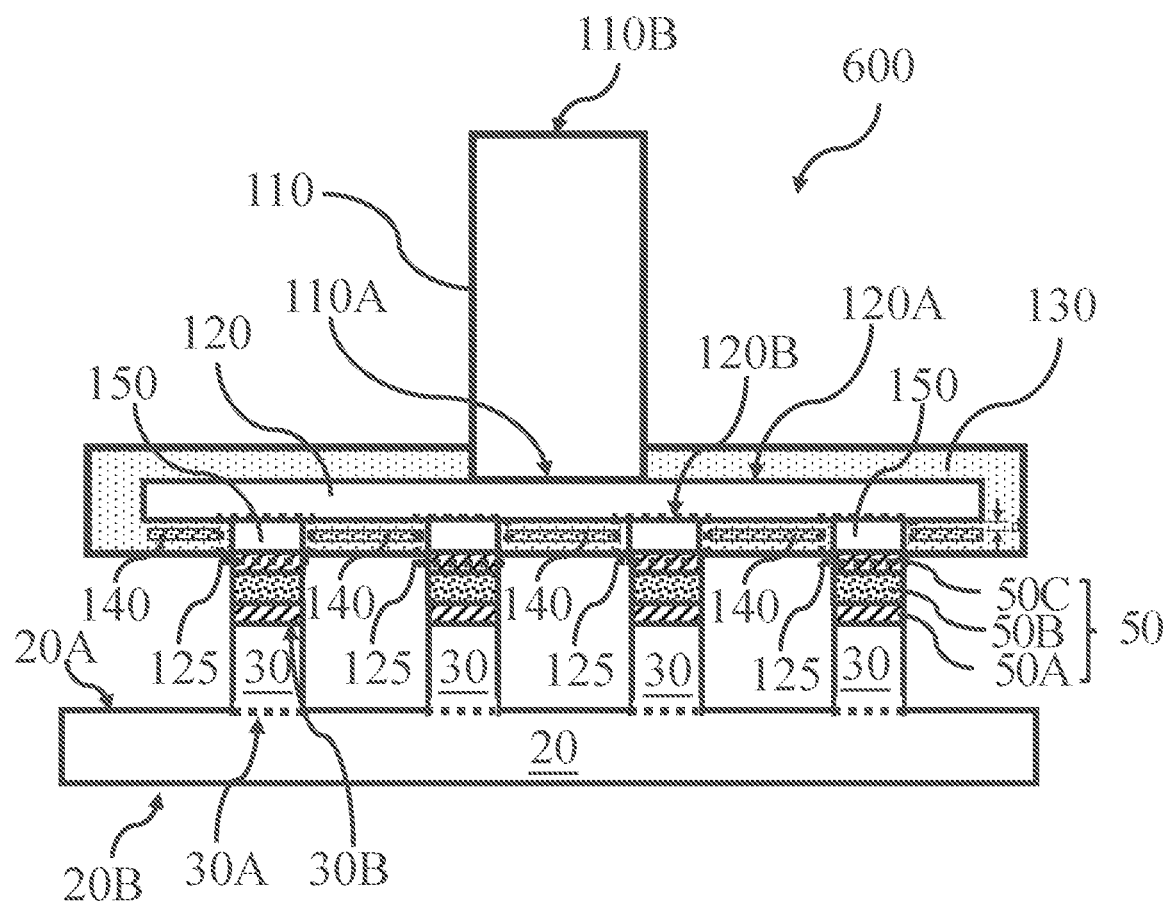
Figure 14B:
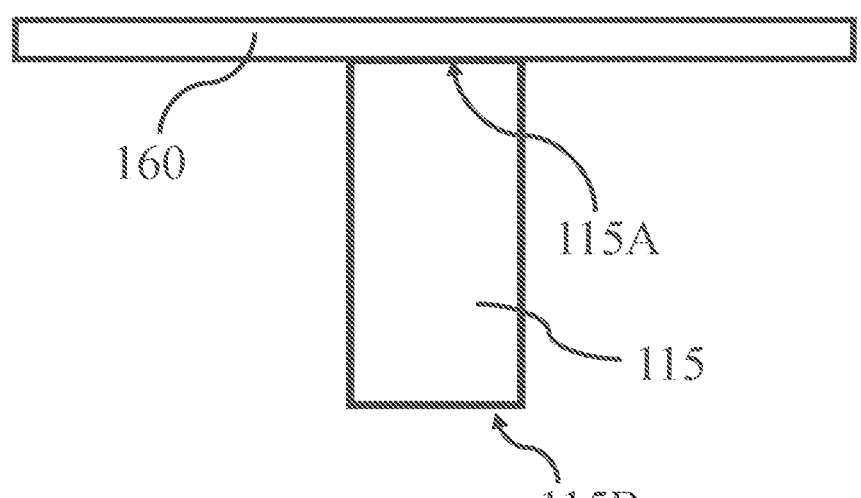
Figure 14C:
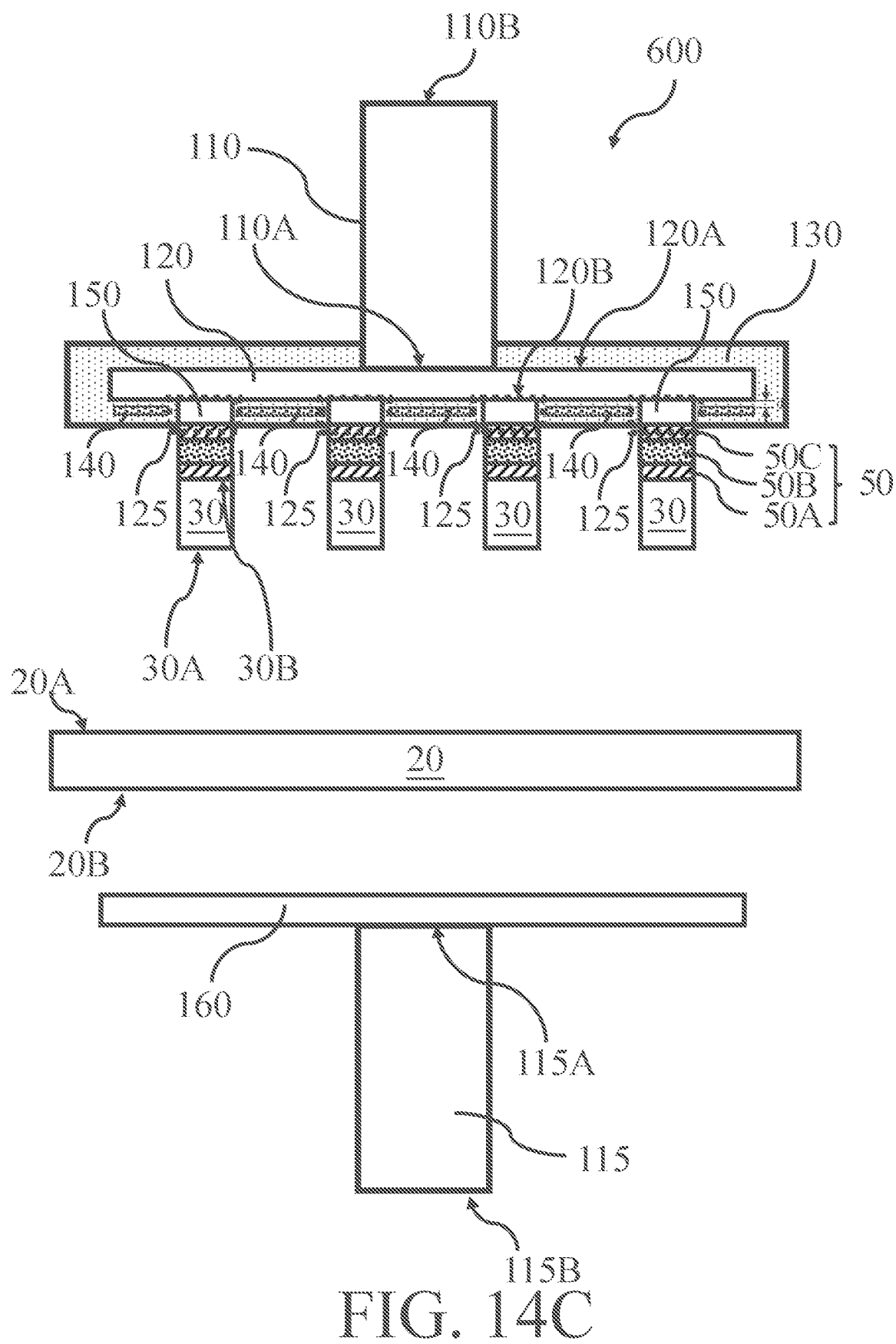

Next, referring to FIGS. 14B~14C. The magnetic field intensity of the first magnet 110 of the apparatus for transferring microdevice 600 was controlled to make each of the microdevices 30 be attracted by one of the magnetic attracting heads 150 in the microdevice alignment regions 125 through the magnetic attracting layer 50 of the magnetic attracting surface 30B thereof as shown in FIG. 14B and separated from the third surface 20A of the temporary carrier substrate 20 as shown in FIG. 14C. The microdevices 30 on the temporary carrier substrate 20 can sensing greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160. The microdevices 30 on the temporary carrier substrate 20 of this embodiment sensed greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160, and the magnetic field generated by the first magnetic substrate 120 and the second magnetic substrate 160 was stable, thereby the magnetic attracting layer 50 of the magnetic attracting surface 30B of each microdevice 30 was more precisely attracted by one of the magnetic attracting heads 150 in the alignment regions 125.

Figure 14D:
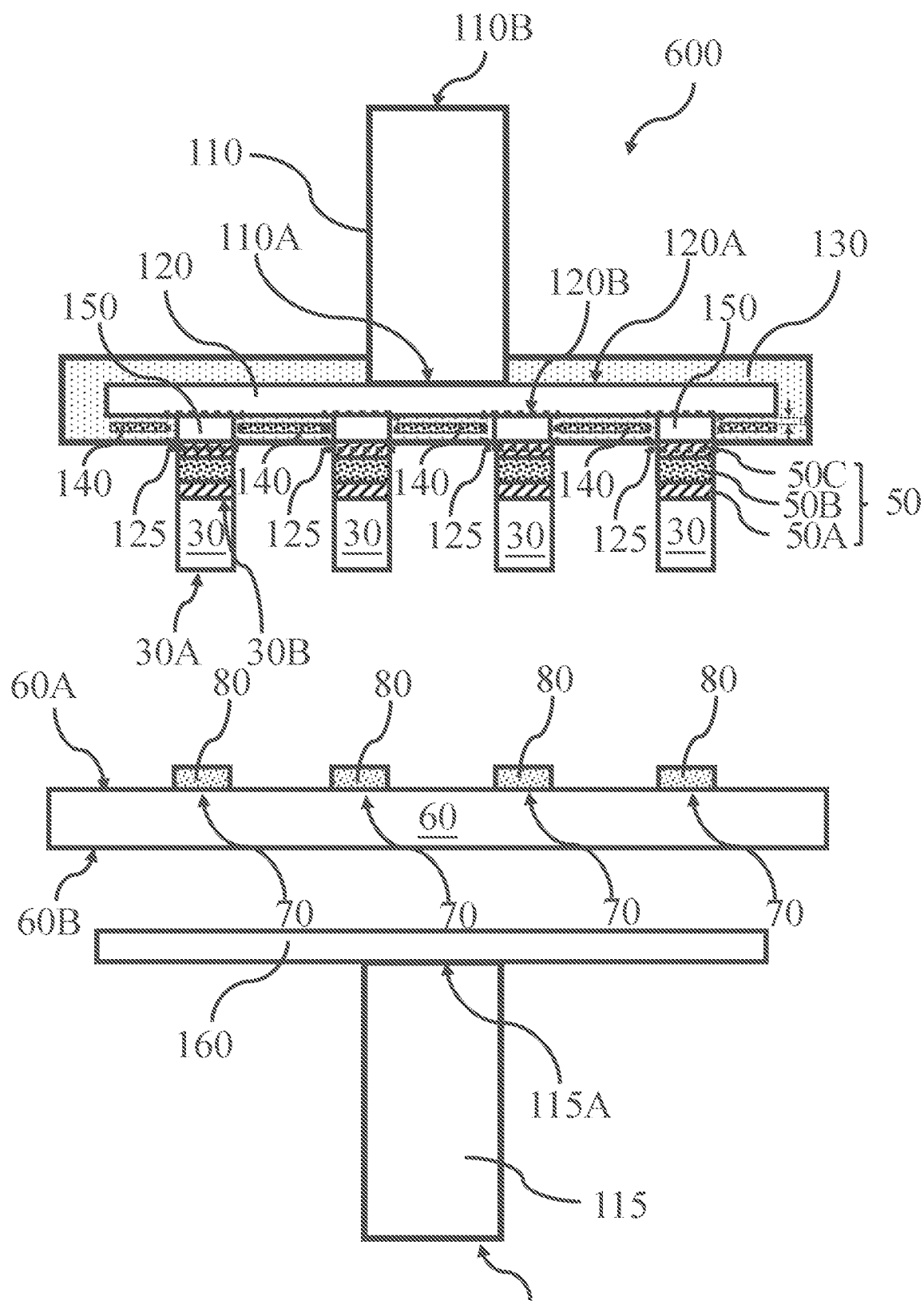

Next, referring to FIG. 14D. The target substrate 60 was moved into the apparatus for transferring microdevice 600 after the temporary carrier substrate 20 was moved out of the apparatus for transferring microdevice 600, wherein the target substrate 60 was located below the first magnetic attracting substrate 120 and faced the second surface 120B of the first magnetic attracting substrate 120 through the fifth surface 60A, and each of the microdevice bonding regions 70 on the fifth surface 60A of the target substrate 60 faced and aligned to each of the microdevice alignment regions 125 on the second surface 120B of the first magnetic attracting substrate 120.

Figure 14E:
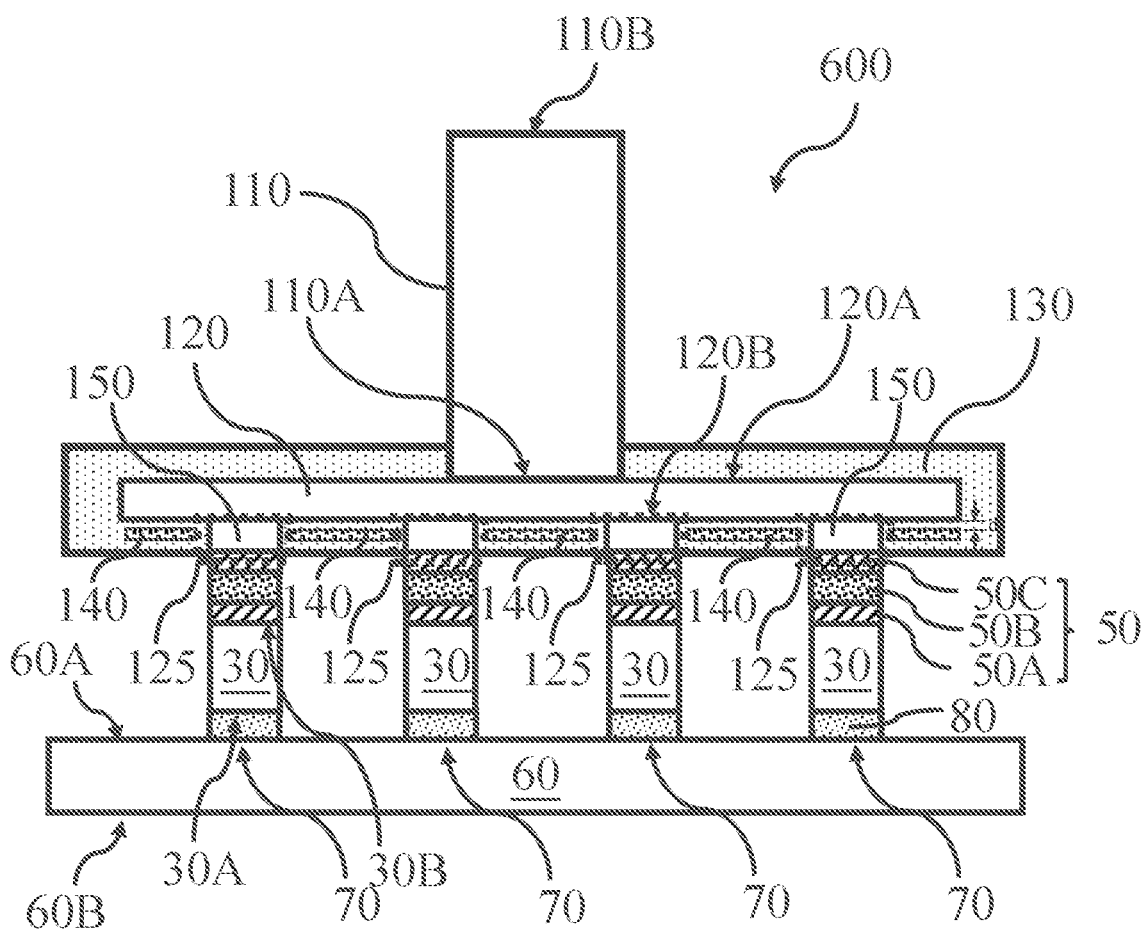
Figure 14E:
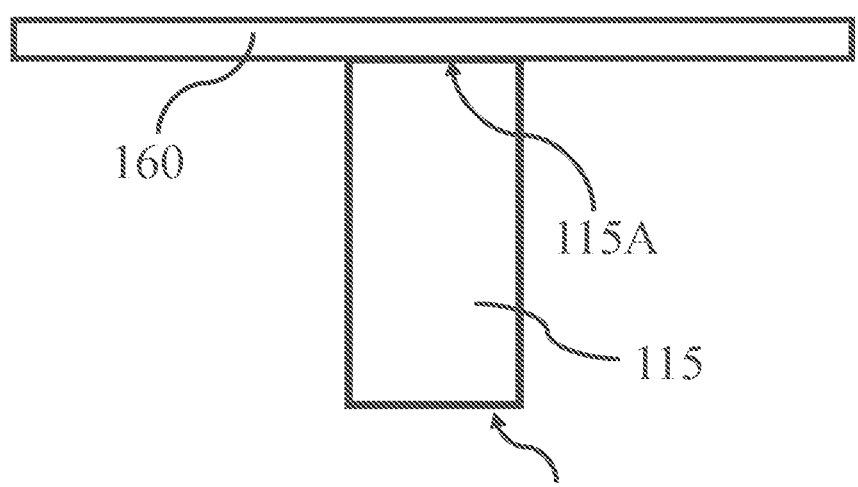

Next, referring to FIG. 14E. The first magnetic attracting substrate 120 was joined with the target substrate 60 to contact each of the microdevices 30 attracted by one of the magnetic attracting heads 150 in the microdevice alignment regions 125 to the conductive bonding layer 80 of the microdevice bonding regions 70 on the fifth surface 60A of the target substrate 60 through the bonding surface 30A thereof.

Figure 14F:
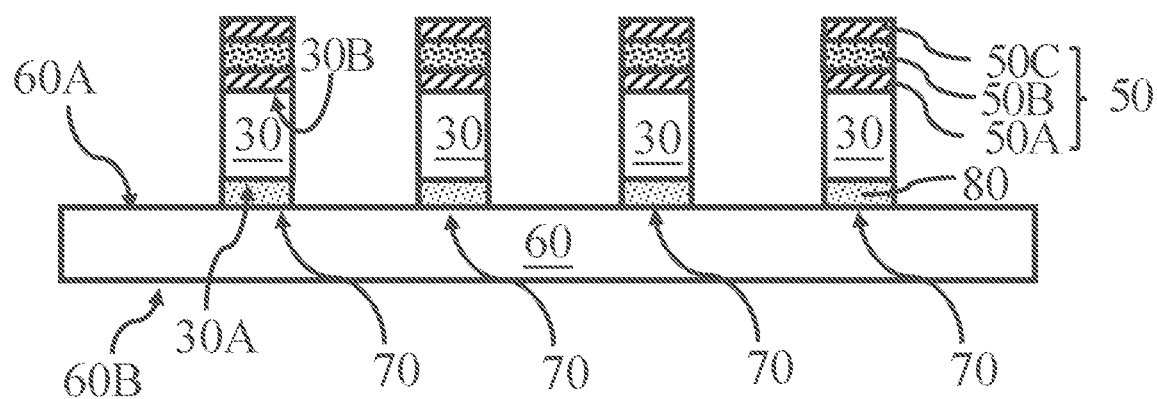

Finally, referring to FIG. 14F. A thermal treatment was applied to make each microdevice 30 bond to each conductive bonding layer 80 of each microdevice bonding region 70 through the bonding surface 30A thereof and separate from one of the alignment region 125 thereafter. Then, the process for transferring the microdevices 30 from the temporary carrier substrate 20 to the target substrate 60 was finished after each microdevice 30 was independently bonded to each conductive bonding layer 80 of each microdevice bonding region 70 on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80.

Accordingly, microdevices can be mass-transferred and self-aligned since each of the microdevices 30 on the temporary carrier substrate 20 cab be attracted by one of the magnetic attracting heads 150 in each of the alignment regions 125 through the magnetic attracting layer 50 of the magnetic attracting surface 30B thereof, and transferred to each microdevice bonding regions 70 formed on the target 60 and aligned to each alignment region 125 thereafter.

Embodiment 7

Figure 15:
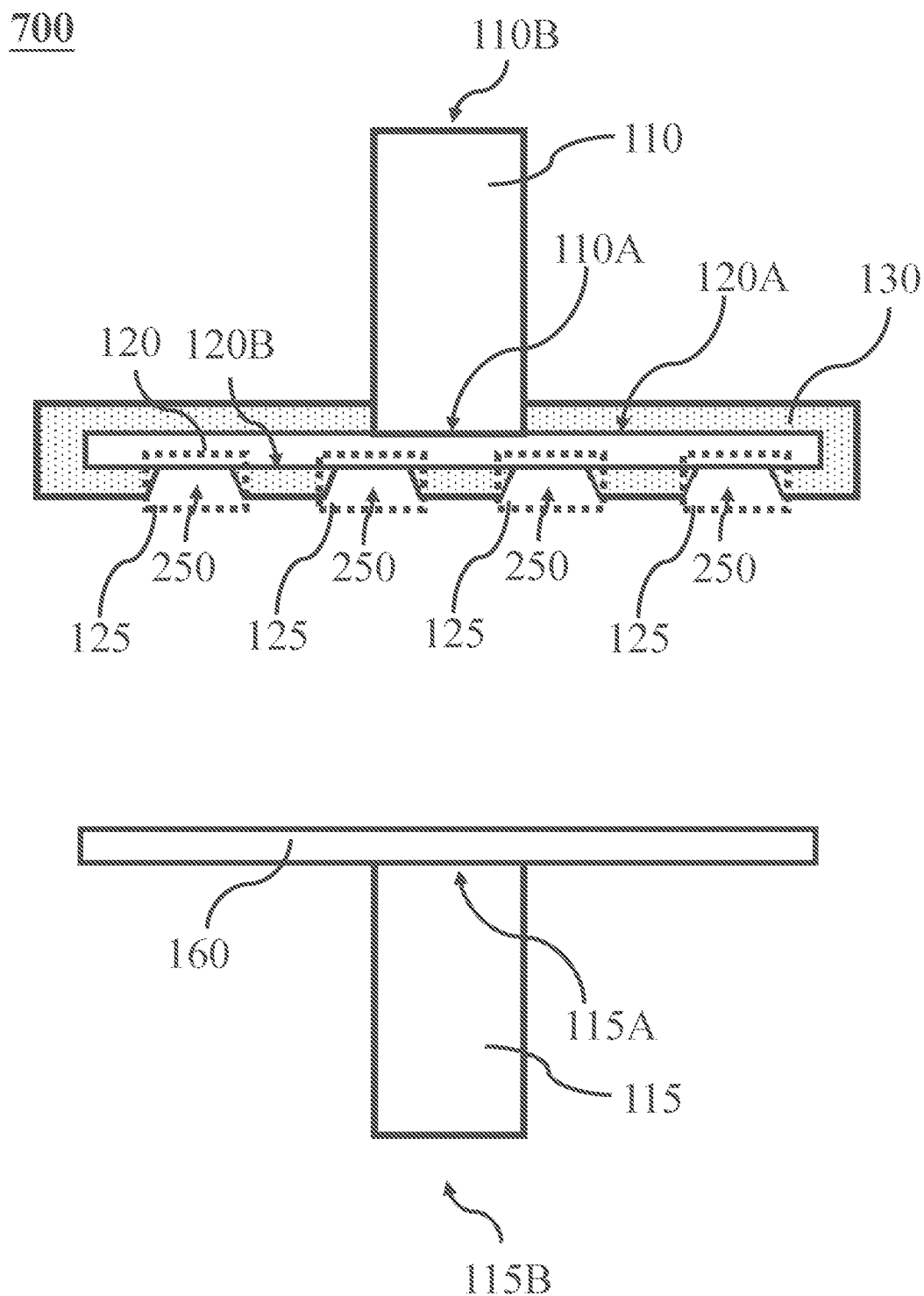
FIG. 15 is a cross-sectional view of an apparatus for transferring microdevice 700 of Embodiment 7 of this invention.

Please refer to FIGS. 15, 2A~2C, 3A~3B and 16A~16F. FIG. 15 is a cross-sectional view of an apparatus for transferring microdevice 600 of Embodiment 7 of this invention. FIG. 2A is a top view of a temporary carrier substrate 20 with a plurality of microdevices 30 to be transferred formed thereon. FIGS. 2B~2C are cross-sectional views of the temporary carrier substrate 20 along with the cross-sectional line II-II' shown in FIG. 2A. FIG. 3A is a top view of a target substrate 60 with a plurality of microdevice bonding regions 70 formed thereon, and each of the microdevice bonding regions 70 comprises a conductive bonding layer 80 formed thereon. FIG. 3B is a cross-sectional view of the target substrate 60 along with the cross-sectional line III-III' as shown in FIG. 3A. FIGS. 16A~16F are cross-sectional views showing the process according to the method for transferring microdevices of the Embodiment 7.

First, an apparatus for transferring microdevice 700 as shown in FIG. 15 was provided. The structure of the apparatus for transferring microdevice 700 is similar to that of the apparatus for transferring microdevice 300 as shown in FIGS. 7A~7C except that the apparatus for transferring microdevice 700 further comprises a second magnet 115 with a third terminal 115A and a fourth terminal 115B opposite to each other and a second magnetic attracting substrate 160, wherein the second magnetic attracting substrate 160 is contacted to the third terminal 115A of the second magnet 115, and the second magnetic substrate 160 is disposed under the first magnetic substrate 120. The second magnet 115 can be a permanent magnet or a electromagnet.

Next, a temporary carrier substrate 20 with a third surface 20A having a plurality of microdevices 30 spaced to each other and formed thereon and a fourth surface 20B opposite to each other as shown in FIGS. 2A~2C was provided. Each of the microdevices 30 comprises a bonding surface 30A and a magnetic attracting surface 30B opposite to the bonding surface 30A, wherein the bonding surface 30A comprises at least one bonding pad (not shown), and the magnetic attracting surface 30B comprises a magnetic attracting layer 50. The microdevices 30 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 3A~3B was provided. The fifth surface 60A comprises a plurality of microdevice bonding regions 70, and each of the microdevice bonding regions 70 has a conductive bonding layer 80 formed thereon. The conductive bonding layer 80 can be for example but not limited to a conductive glue, an anisotropic conductive film (ACF) or a thermal welding metal layer.

Figure 16A:
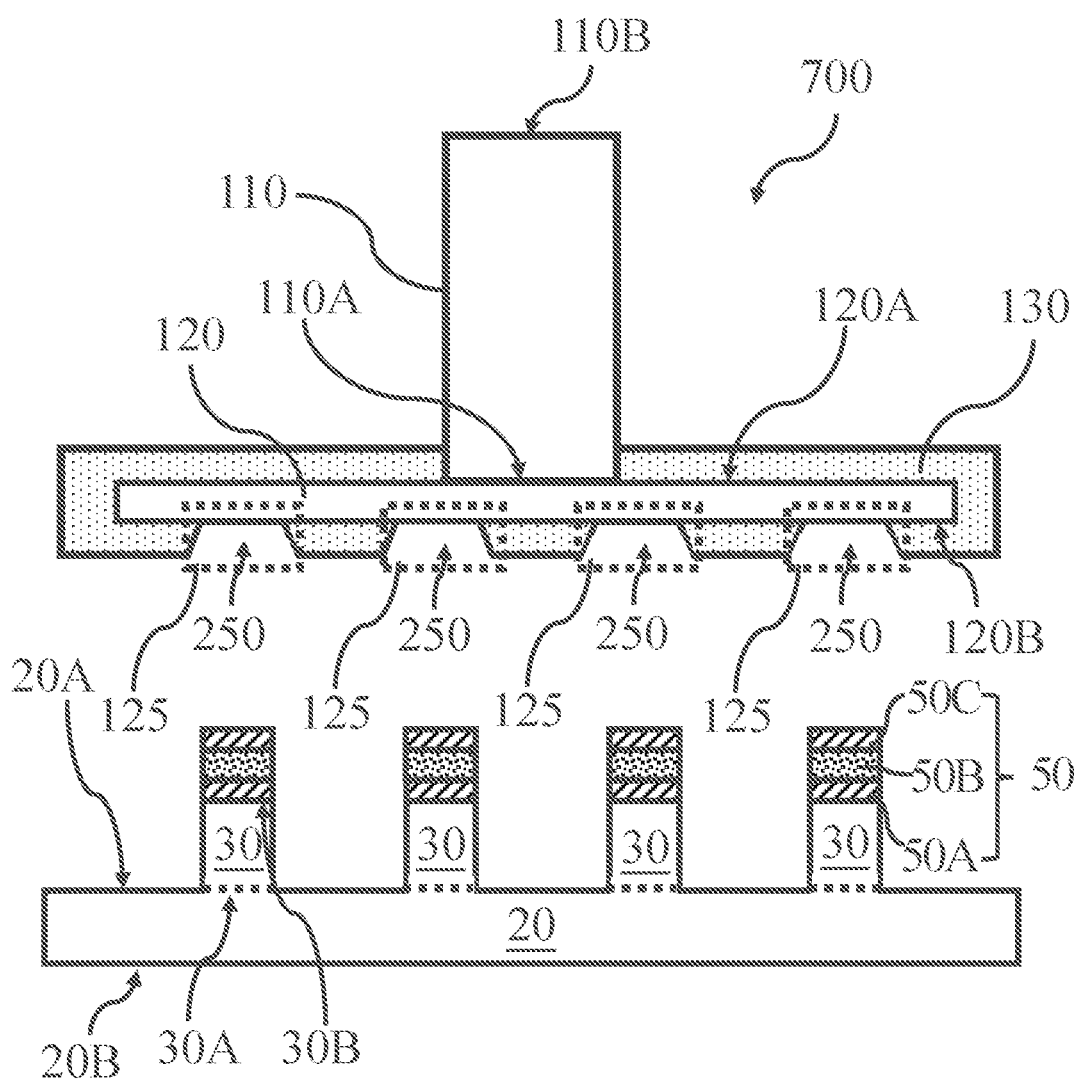
FIGS. 16A~16F are cross-sectional views showing the process according to the method for transferring microdevices of the Embodiment 7.

Next, referring to FIG. 16A. The temporary carrier substrate 20 was moved into the apparatus for transferring microdevice 700, wherein the temporary carrier substrate 20 was located between the first magnetic attracting substrate 120 and the second magnetic attracting substrate 160, and faced the second surface 120B of the first magnetic attracting substrate 120 by the third surface 20A to make each magnetic attracting layer 50B of the magnetic attracting surface 30B of each microdevice 30 on the third surface 20A of the temporary carrier substrate 20 face the microdevice alignment regions 125 of the first magnetic attracting substrate 120. According to one embodiment of this invention, a step of lift-off by laser or UV to lift off the microdevices 30 from the third surface 20A of the temporary carrier substrate 20 as shown in FIG. 2C was optionally proceeded before the step of moving the temporary carrier substrate 20 into the apparatus for transferring microdevice 700.

Figure 16B:
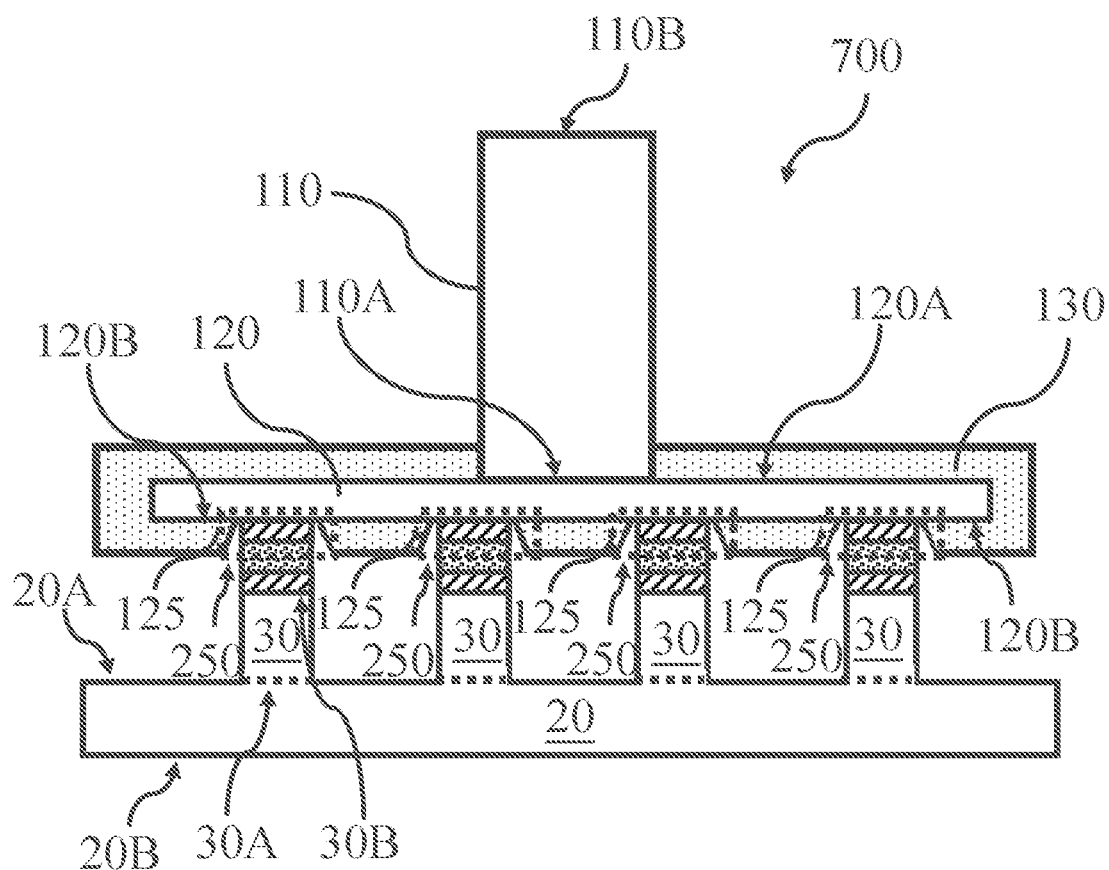
Figure 16B:
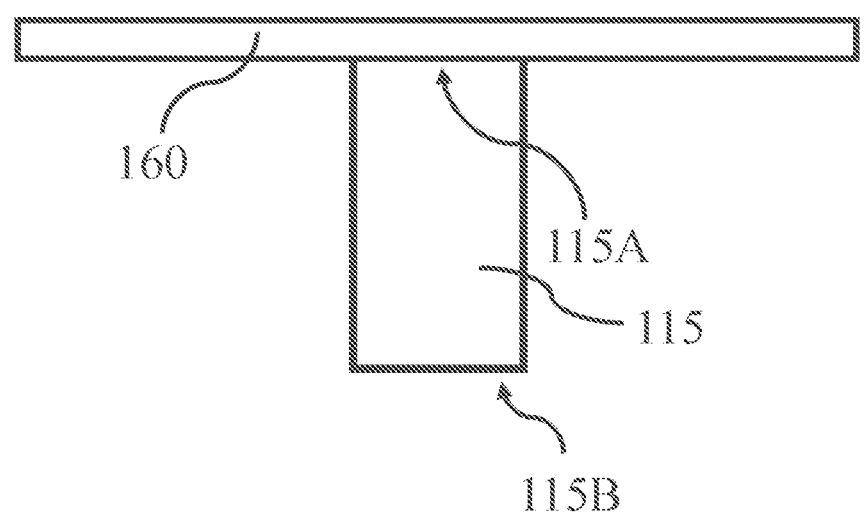
Figure 16C:
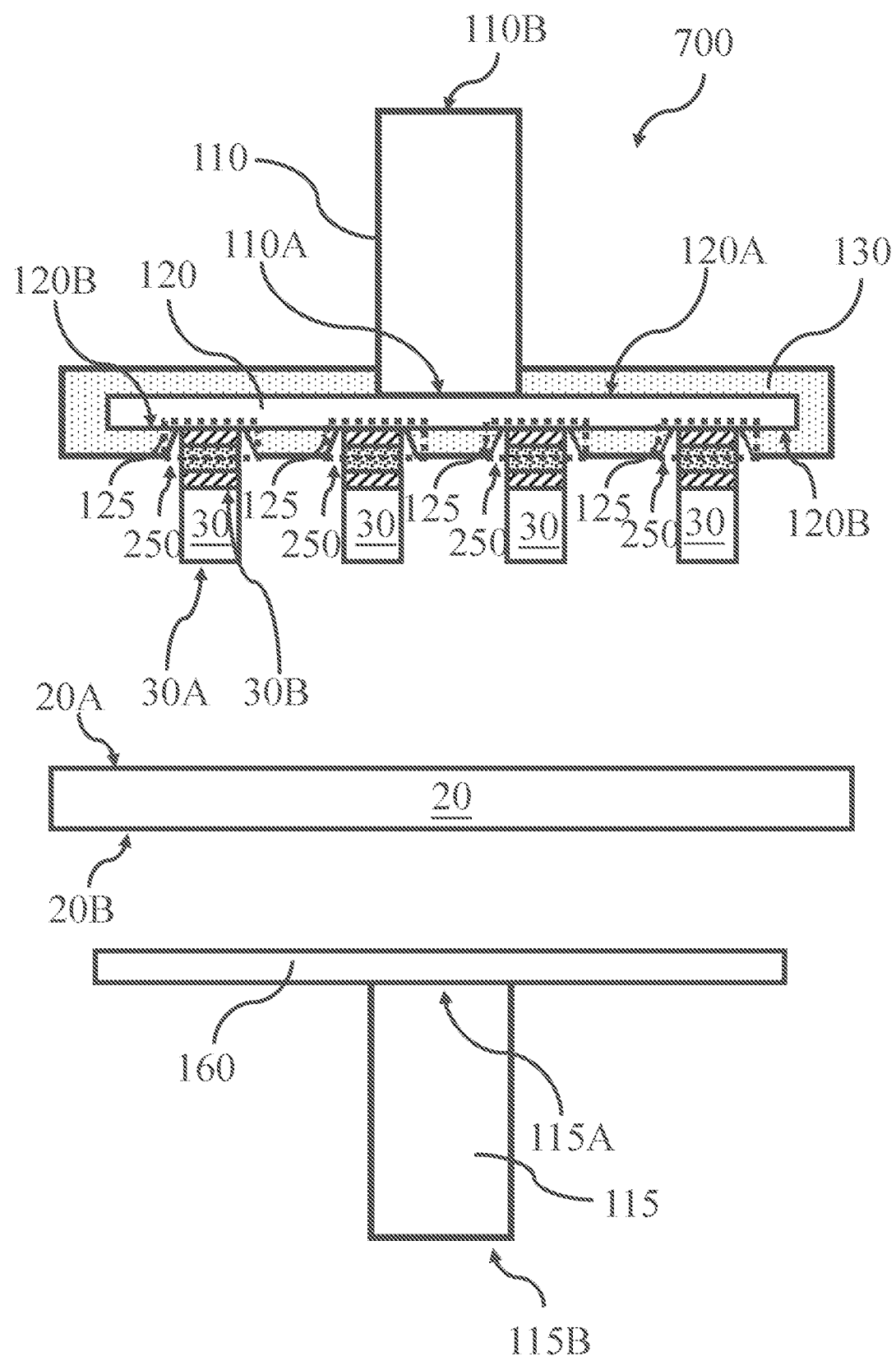

Next, referring to FIGS. 16B~16C. The magnetic field intensity of the first magnet 110 of the apparatus for transferring microdevice 700 was controlled to make each of the microdevices 30 be attracted by one of the magnetic attracting holes 250 in the microdevice alignment regions 125 through the magnetic attracting layer 50 of the magnetic attracting surface 30B thereof as shown in FIG. 16B and separated from the third surface 20A of the temporary carrier substrate 20 as shown in FIG. 16C. The microdevices 30 on the temporary carrier substrate 20 can sensing greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160. The microdevices 30 on the temporary carrier substrate 20 of this embodiment sensed greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160, and the magnetic field generated by the first magnetic substrate 120 and the second magnetic substrate 160 was stable, thereby the magnetic attracting layer 50 of the magnetic attracting surface 30B of each microdevice 30 was more precisely attracted by one of the magnetic attracting holes 250 in the alignment regions 125.

Figure 16D:
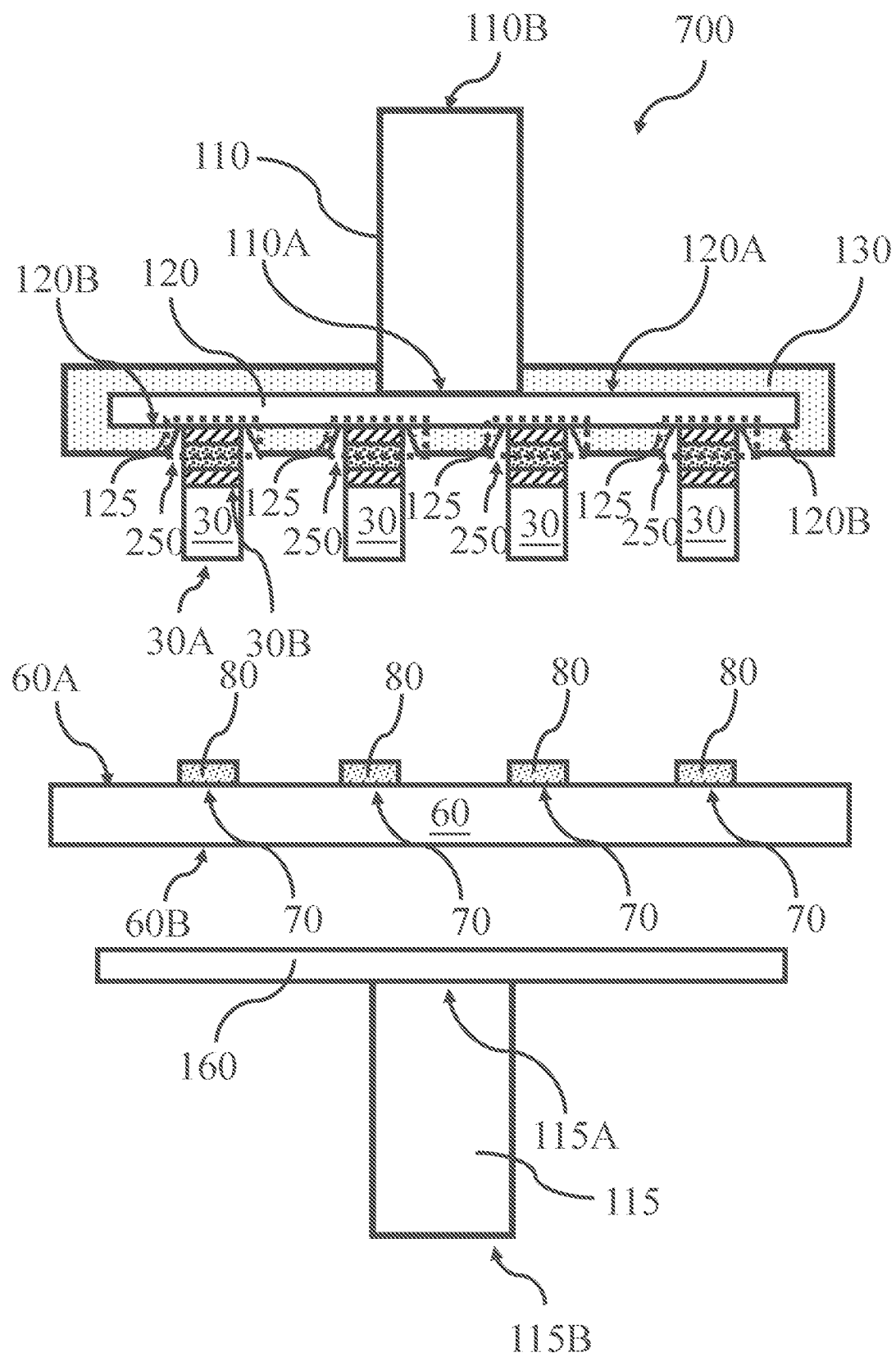

Next, referring to FIG. 16D. The target substrate 60 was moved into the apparatus for transferring microdevice 700 after the temporary carrier substrate 20 was moved out of the apparatus for transferring microdevice 700, wherein the target substrate 60 was located below the first magnetic attracting substrate 120 and faced the second surface 120B of the first magnetic attracting substrate 120 through the fifth surface 60A, and each of the microdevice bonding regions 70 on the fifth surface 60A of the target substrate 60 faced and aligned to each of the microdevice alignment regions 125 on the second surface 120B of the first magnetic attracting substrate 120.

Figure 16E:
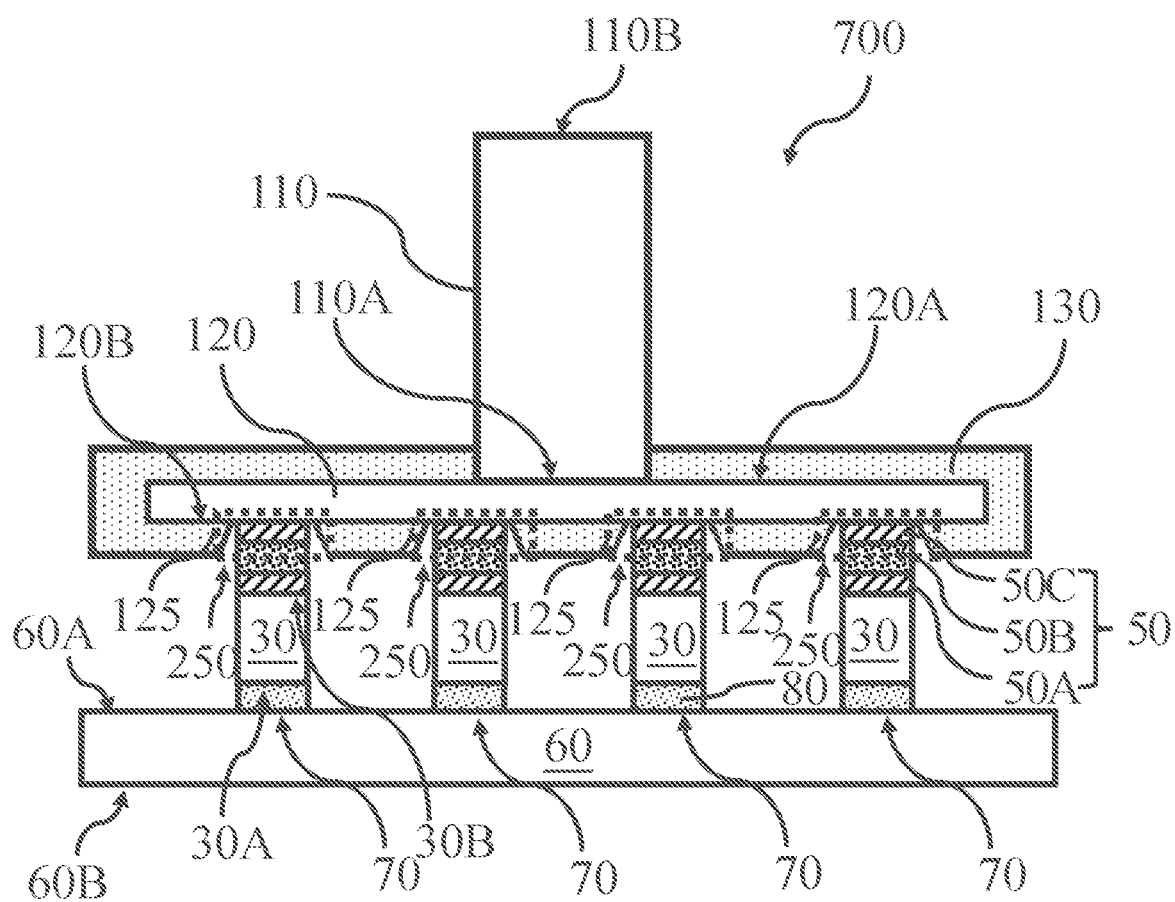
Figure 16E:
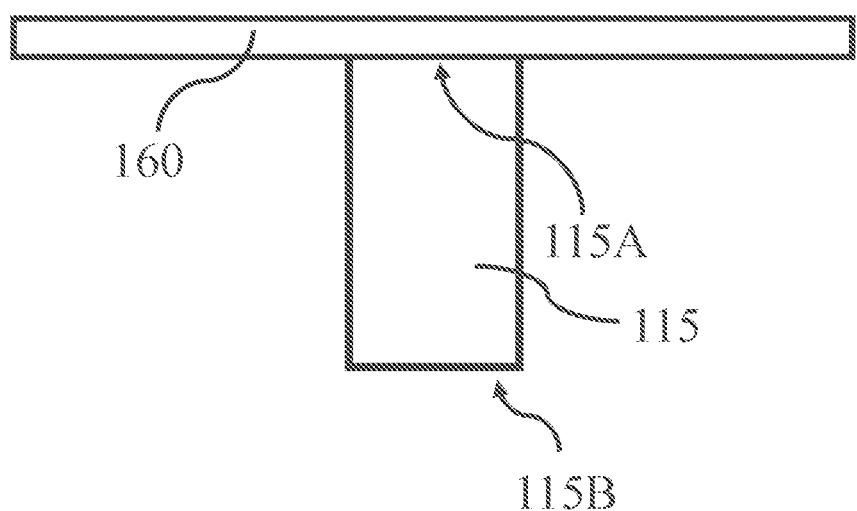

Next, referring to FIG. 16E. The first magnetic attracting substrate 120 was joined with the target substrate 60 to contact each of the microdevices 30 attracted by one of the magnetic attracting holes 250 in the microdevice alignment regions 125 to the conductive bonding layer 80 of the microdevice bonding regions 70 on the fifth surface 60A of the target substrate 60 through the bonding surface 30A thereof.

Figure 16F:
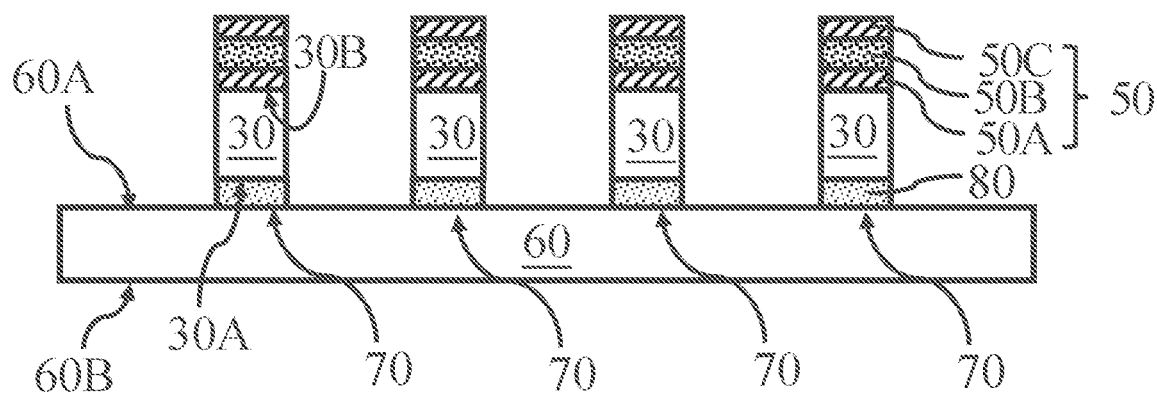

Finally, referring to FIG. 16F. A thermal treatment was applied to make each microdevice 30 bond to each conductive bonding layer 80 of each microdevice bonding region 70 through the bonding surface 30A thereof and separate from one of the alignment region 125 thereafter. Then, the process for transferring the microdevices 30 from the temporary carrier substrate 20 to the target substrate 60 was finished after each microdevice 30 was independently bonded to each conductive bonding layer 80 of each microdevice bonding region 70 on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80.

Accordingly, microdevices can be mass-transferred and self-aligned since each of the microdevices 30 on the temporary carrier substrate 20 cab be attracted by one of the magnetic attracting heads 150 in each of the alignment regions 125 through the magnetic attracting layer 50 of the magnetic attracting surface 30B thereof, and transferred to each microdevice bonding regions 70 formed on the target 60 and aligned to each alignment region 125 thereafter.

Embodiment 8

Figure 17:
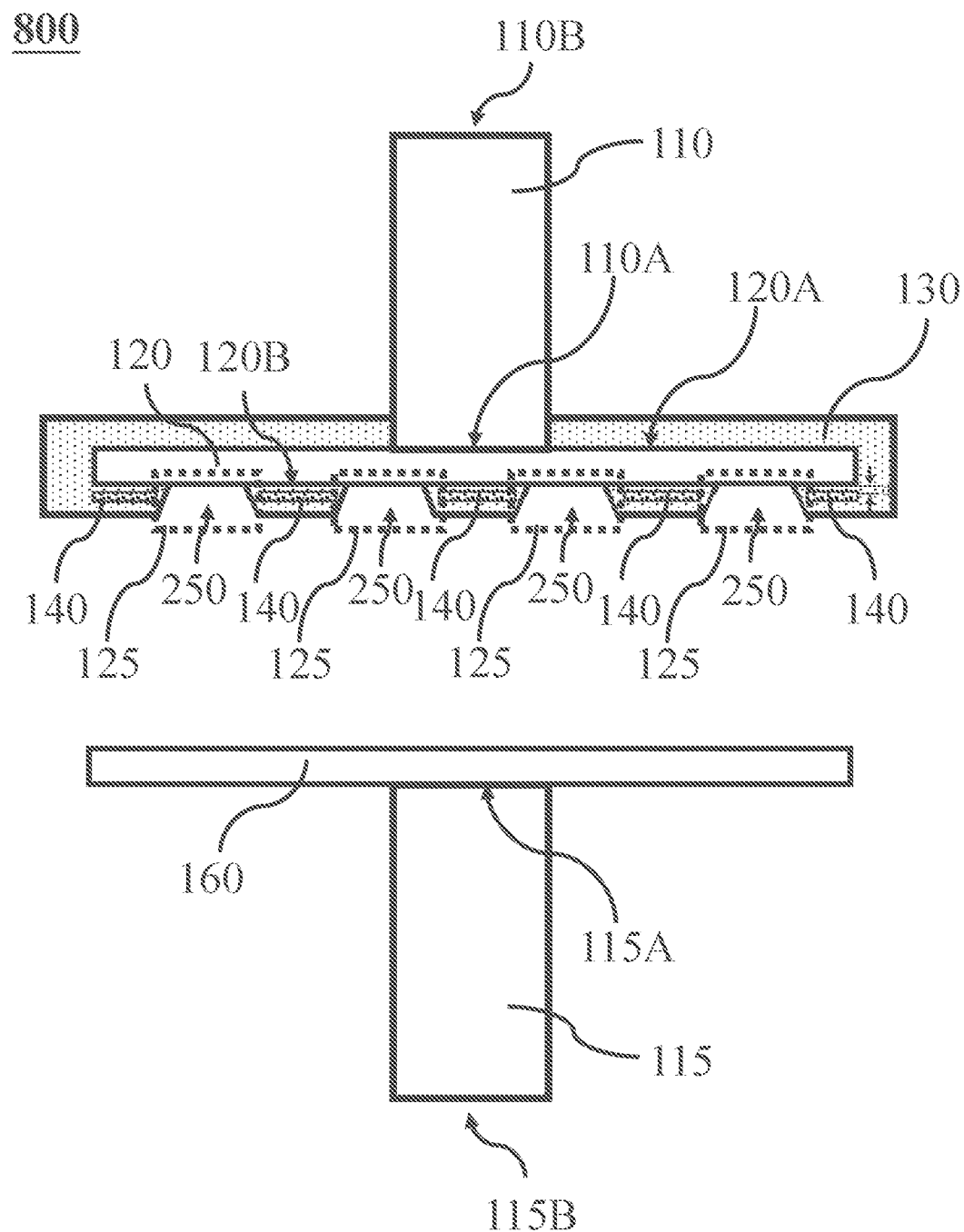
FIG. 17 is a cross-sectional view of an apparatus for transferring microdevice 800 of Embodiment 8 of this invention.

Please refer to FIGS. 17, 2A~2C, 3A~3B and 18A~18F. FIG. 17 is a cross-sectional view of an apparatus for transferring microdevice 800 of Embodiment 8 of this invention. FIG. 2A is a top view of a temporary carrier substrate 20 with a plurality of microdevices 30 to be transferred formed thereon. FIGS. 2B~2C are cross-sectional views of the temporary carrier substrate 20 along with the cross-sectional line II-IF shown in FIG. 2A. FIG. 3A is a top view of a target substrate 60 with a plurality of microdevice bonding regions 70 formed thereon, and each of the microdevice bonding regions 70 comprises a conductive bonding layer 80 formed thereon. FIG. 3B is a cross-sectional view of the target substrate 60 along with the cross-sectional line III-III' as shown in FIG. 3A. FIGS. 18A~18F are cross-sectional views showing the process according to the method for transferring microdevices of the Embodiment 8.

First, an apparatus for transferring microdevice 800 as shown in FIG. 17 was provided. The structure of the apparatus for transferring microdevice 800 is similar to that of the apparatus for transferring microdevice 400 as shown in FIGS. 9A~9C except that the apparatus for transferring microdevice 800 further comprises a second magnet 115 with a third terminal 115A and a fourth terminal 115B opposite to each other and a second magnetic attracting substrate 160, wherein the second magnetic attracting substrate 160 is contacted to the third terminal 115A of the second magnet 115, and the second magnetic substrate 160 is disposed under the first magnetic substrate 120. The second magnet 115 can be a permanent magnet or a electromagnet.

Next, a temporary carrier substrate 20 with a third surface 20A having a plurality of microdevices 30 spaced to each other and formed thereon and a fourth surface 20B opposite to each other as shown in FIGS. 2A~2C was provided. Each of the microdevices 30 comprises a bonding surface 30A and a magnetic attracting surface 30B opposite to the bonding surface 30A, wherein the bonding surface 30A comprises at least one bonding pad (not shown), and the magnetic attracting surface 30B comprises a magnetic attracting layer 50. The microdevices 30 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 3A~3B was provided. The fifth surface 60A comprises a plurality of microdevice bonding regions 70, and each of the microdevice bonding regions 70 has a conductive bonding layer 80 formed thereon. The conductive bonding layer 80 can be for example but not limited to a conductive glue, an anisotropic conductive film (ACF) or a thermal welding metal layer.

Figure 18A:
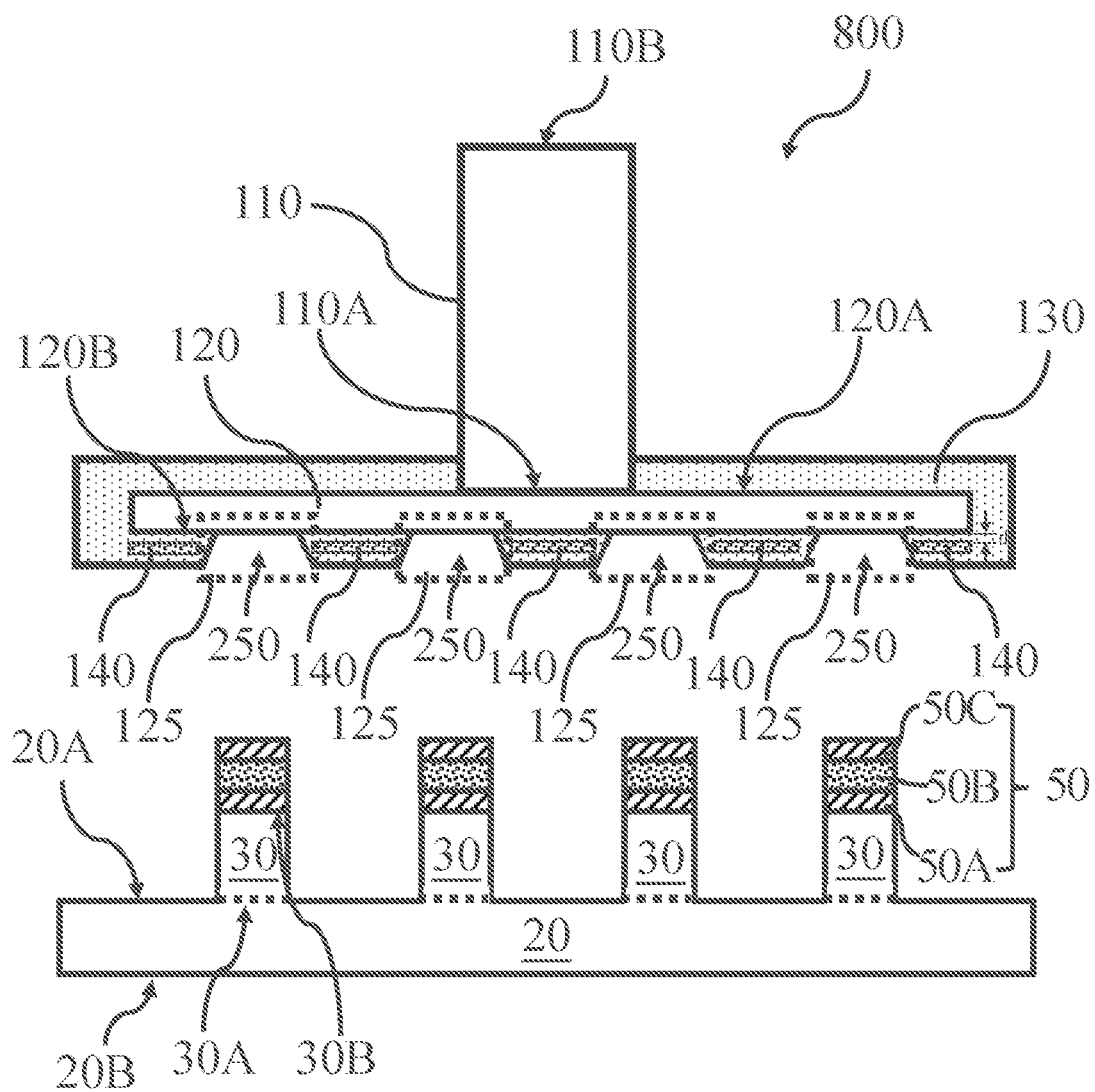
FIGS. 18A~18F are cross-sectional views showing the process according to the method for transferring microdevices of the Embodiment 8.

Next, referring to FIG. 18A. The temporary carrier substrate 20 was moved into the apparatus for transferring microdevice 800, wherein the temporary carrier substrate 20 was located between the first magnetic attracting substrate 120 and the second magnetic attracting substrate 160, and faced the second surface 120B of the first magnetic attracting substrate 120 by the third surface 20A to make each magnetic attracting layer 50B of the magnetic attracting surface 30B of each microdevice 30 on the third surface 20A of the temporary carrier substrate 20 face the microdevice alignment regions 125 of the first magnetic attracting substrate 120. According to one embodiment of this invention, a step of lift-off by laser or UV to lift off the microdevices 30 from the third surface 20A of the temporary carrier substrate 20 as shown in FIG. 2C was optionally proceeded before the step of moving the temporary carrier substrate 20 into the apparatus for transferring microdevice 800.

Figure 18B:
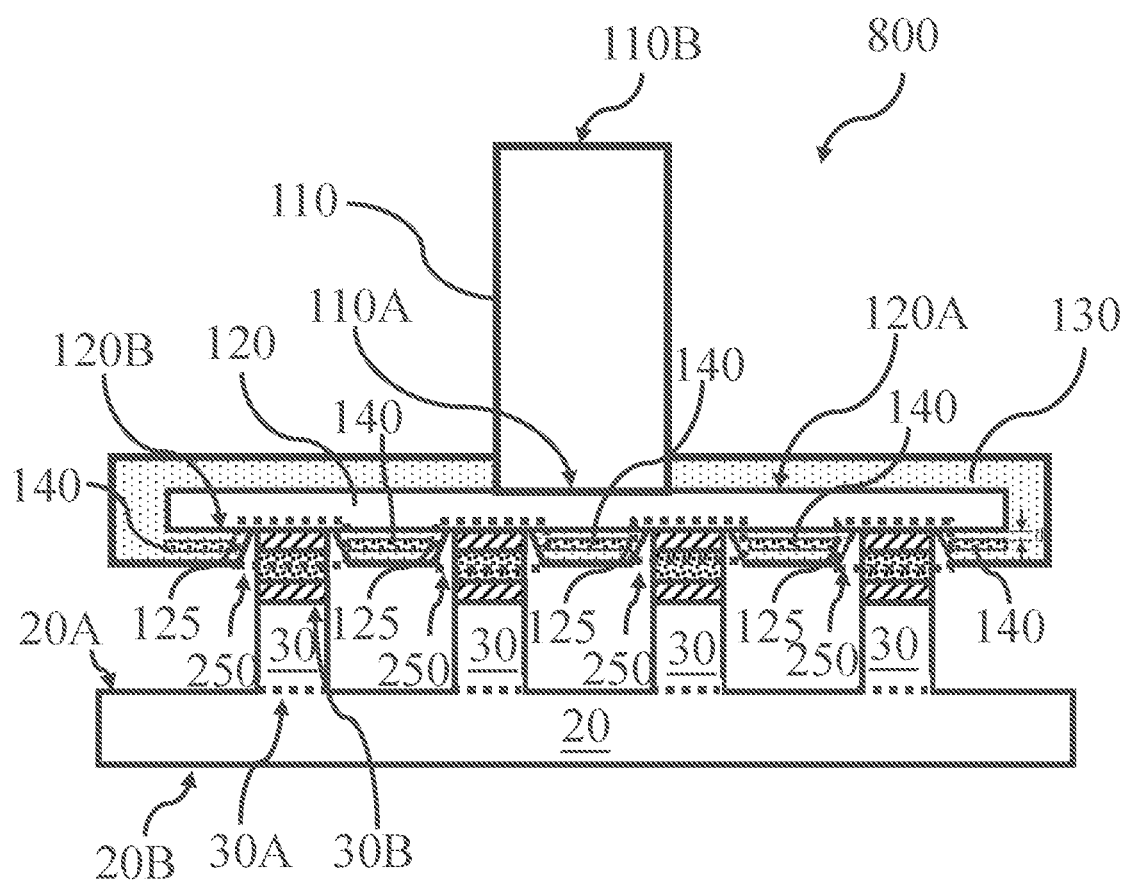
Figure 18B:
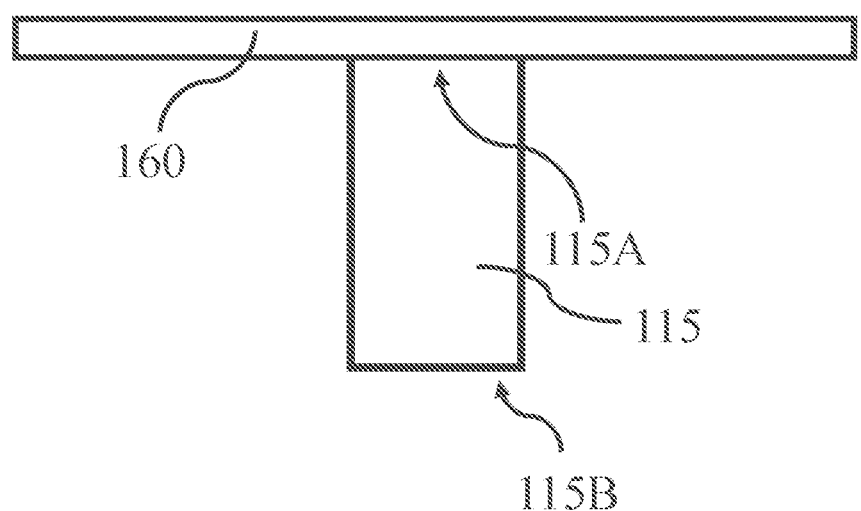
Figure 18C:
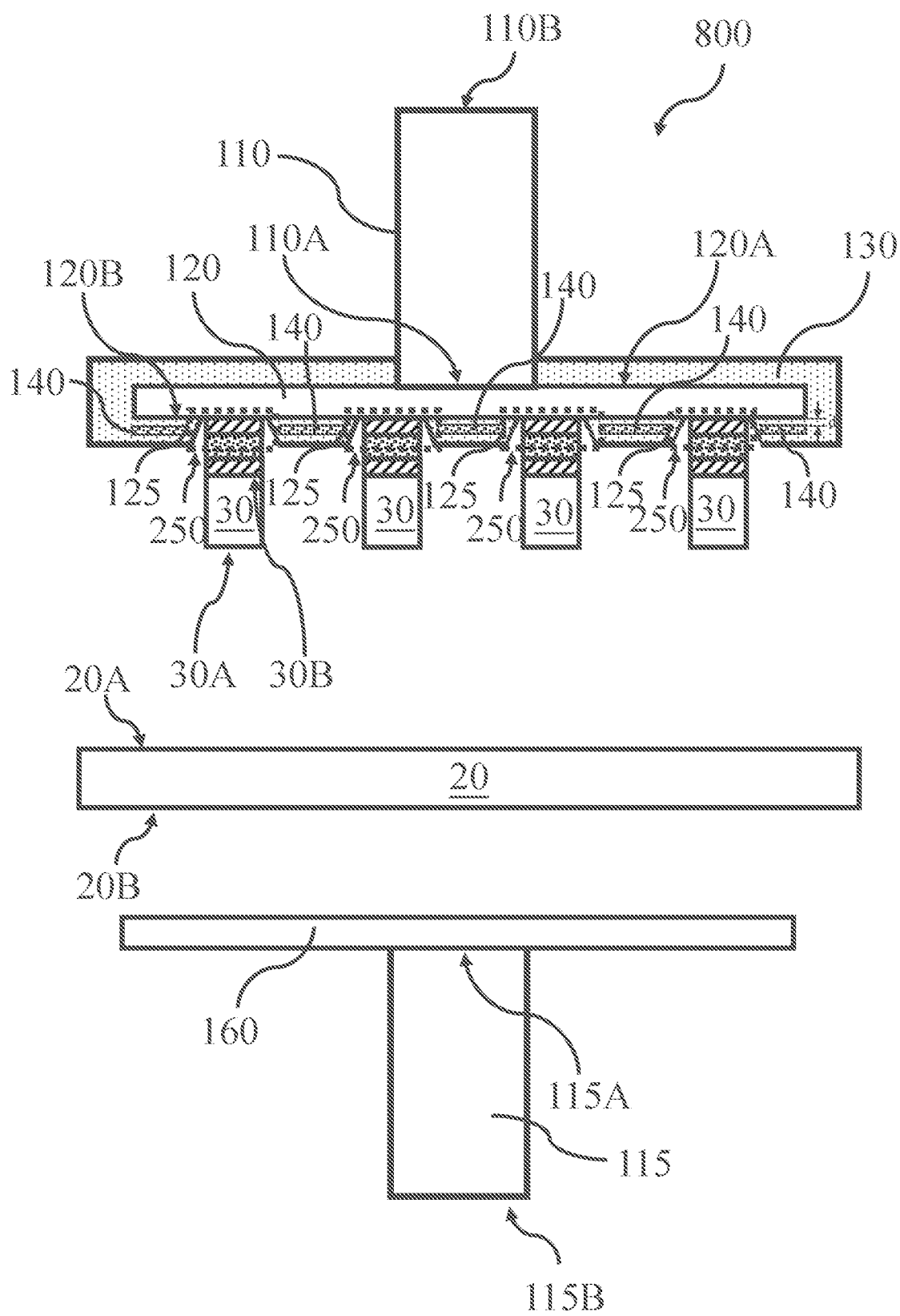

Next, referring to FIGS. 18B~18C. The magnetic field intensity of the first magnet 110 of the apparatus for transferring microdevice 800 was controlled to make each of the microdevices 30 be attracted by one of the magnetic attracting holes 250 in the microdevice alignment regions 125 through the magnetic attracting layer 50 of the magnetic attracting surface 30B thereof as shown in FIG. 18B and separated from the third surface 20A of the temporary carrier substrate 20 as shown in FIG. 18C. The microdevices 30 on the temporary carrier substrate 20 can sensing greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160. The microdevices 30 on the temporary carrier substrate 20 of this embodiment sensed greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160, and the magnetic field generated by the first magnetic substrate 120 and the second magnetic substrate 160 was stable, thereby the magnetic attracting layer 50 of the magnetic attracting surface 30B of each microdevice 30 was more precisely attracted by one of the magnetic attracting holes 250 in the alignment regions 125.

Figure 18D:
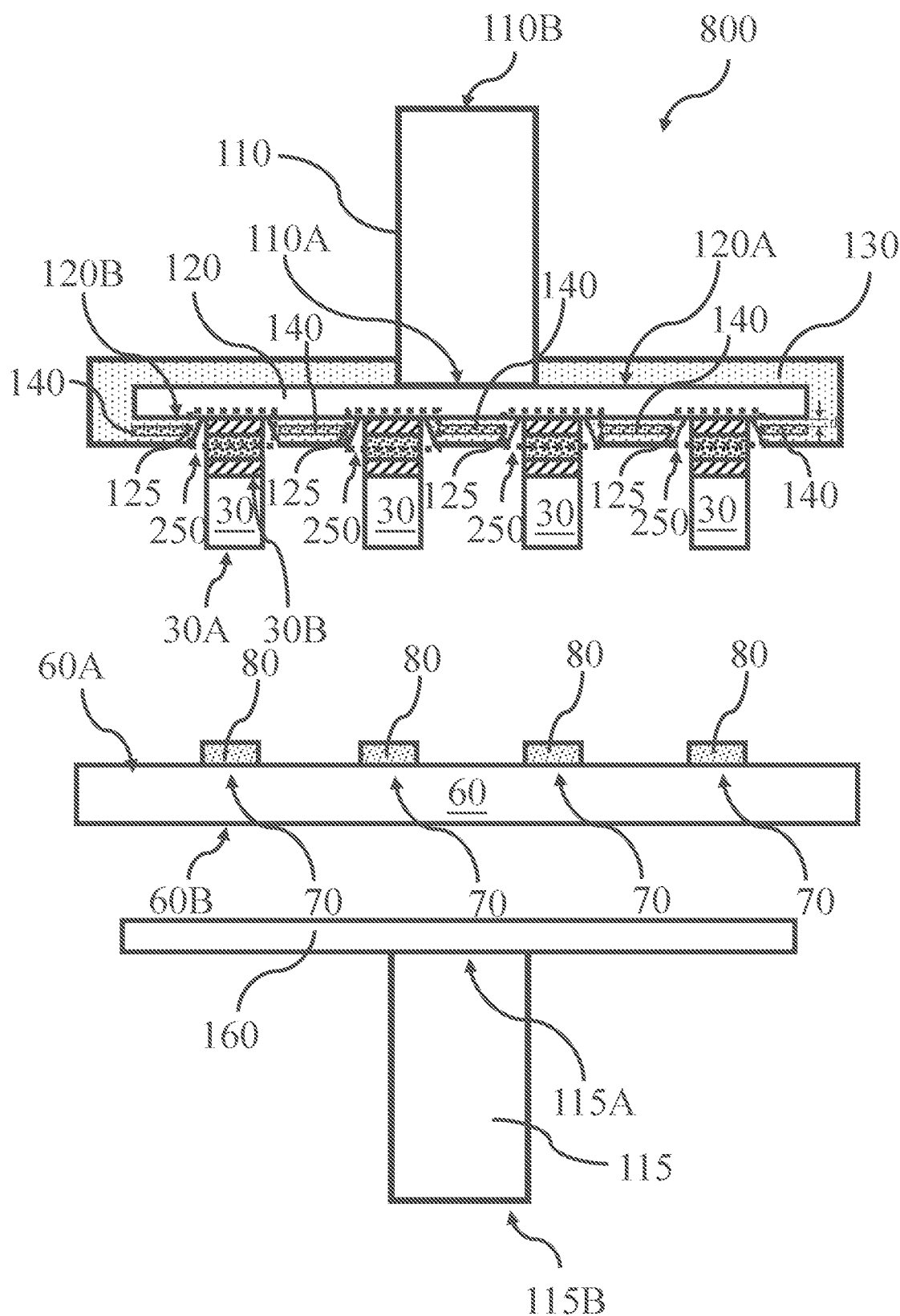

Next, referring to FIG. 18D. The target substrate 60 was moved into the apparatus for transferring microdevice 800 after the temporary carrier substrate 20 was moved out of the apparatus for transferring microdevice 800, wherein the target substrate 60 was located below the first magnetic attracting substrate 120 and faced the second surface 120B of the first magnetic attracting substrate 120 through the fifth surface 60A, and each of the microdevice bonding regions 70 on the fifth surface 60A of the target substrate 60 faced and aligned to each of the microdevice alignment regions 125 on the second surface 120B of the first magnetic attracting substrate 120.

Figure 18E:
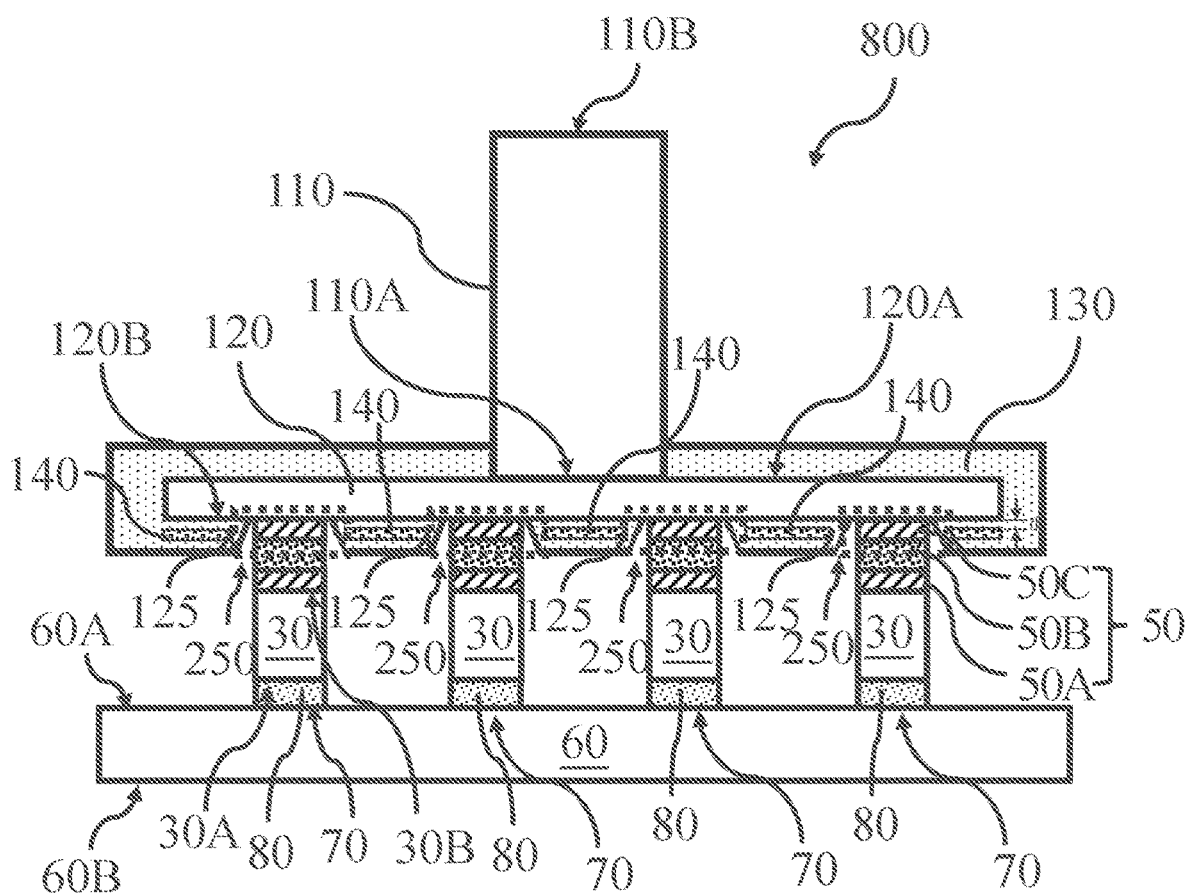
Figure 18E:
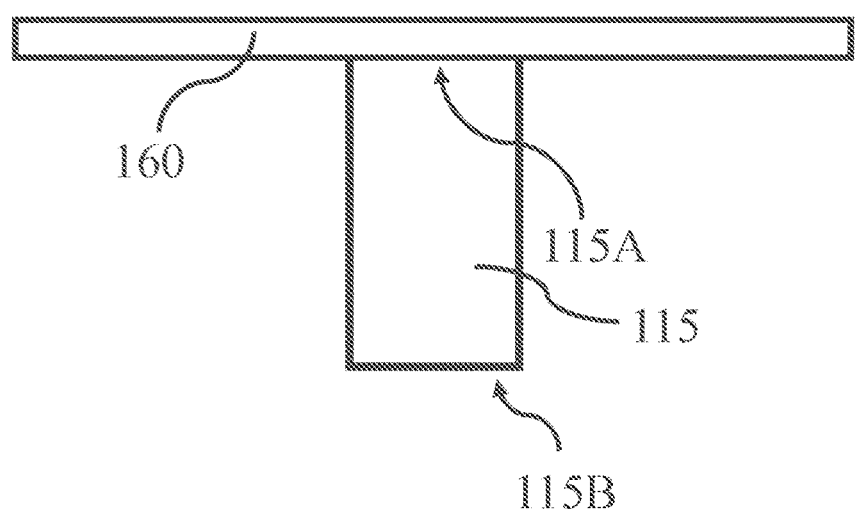

Next, referring to FIG. 18E. The first magnetic attracting substrate 120 was joined with the target substrate 60 to contact each of the microdevices 30 attracted by one of the magnetic attracting holes 250 in the microdevice alignment regions 125 to the conductive bonding layer 80 of the microdevice bonding regions 70 on the fifth surface 60A of the target substrate 60 through the bonding surface 30A thereof.

Figure 18F:
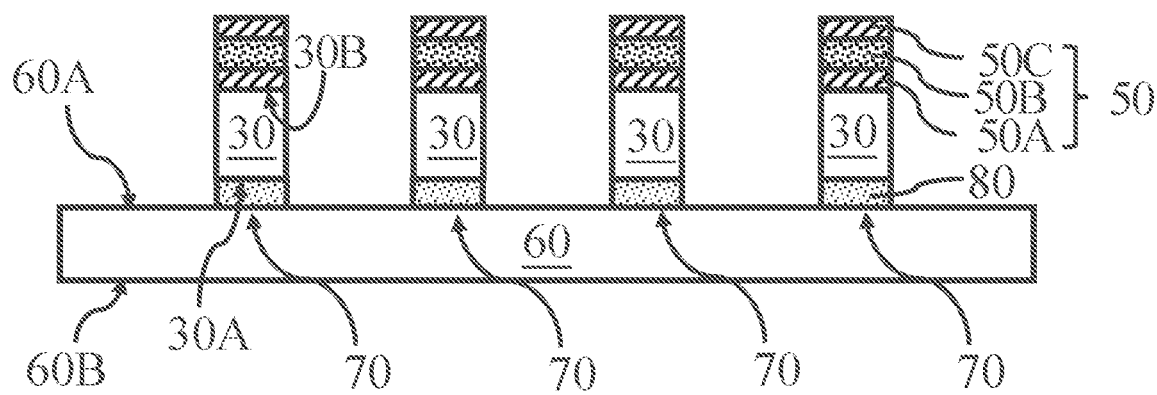

Finally, referring to FIG. 18F. A thermal treatment was applied to make each microdevice 30 bond to each conductive bonding layer 80 of each microdevice bonding region 70 through the bonding surface 30A thereof and separate from one of the alignment region 125 thereafter. Then, the process for transferring the microdevices 30 from the temporary carrier substrate 20 to the target substrate 60 was finished after each microdevice 30 was independently bonded to each conductive bonding layer 80 of each microdevice bonding region 70 on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80.

Accordingly, microdevices can be mass-transferred and self-aligned since each of the microdevices 30 on the temporary carrier substrate 20 cab be attracted by one of the magnetic attracting holes 250 in each of the alignment regions 125 through the magnetic attracting layer 50 of the magnetic attracting surface 30B thereof, and transferred to each microdevice bonding regions 70 formed on the target 60 and aligned to each alignment region 125 thereafter.

Embodiment 9

Figure 19A:
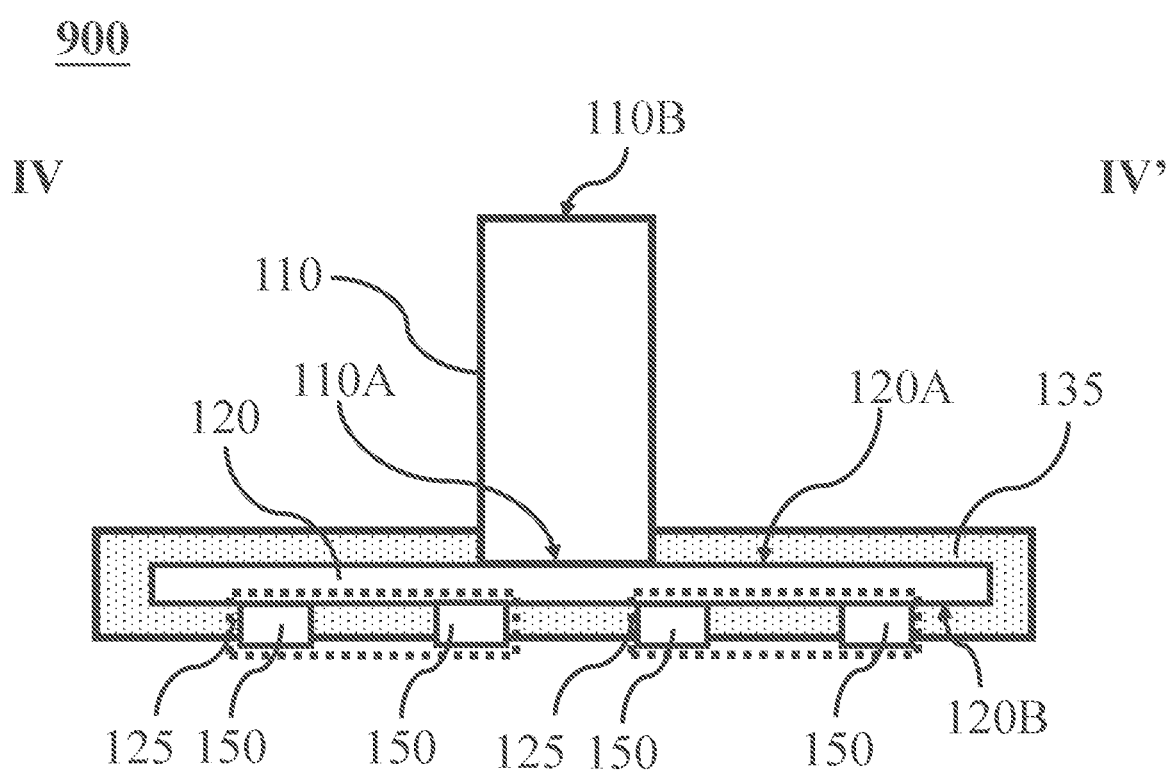
FIGS. 19A~19C are respectively a cross-sectional view, a top view and a bottom view of an apparatus for transferring microdevice 900 of Embodiment 9 of this invention.
Figure 19B:
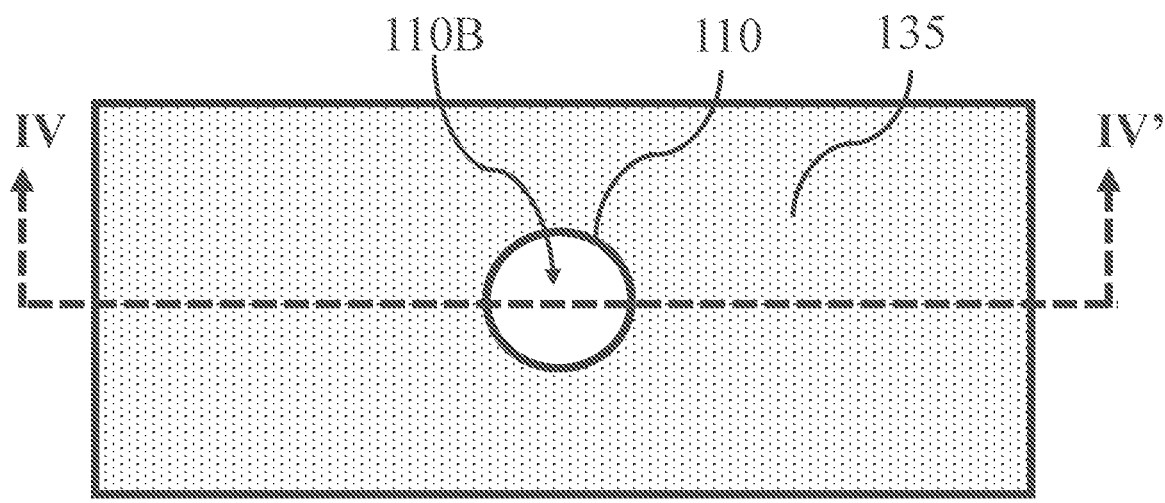
Figure 19C:
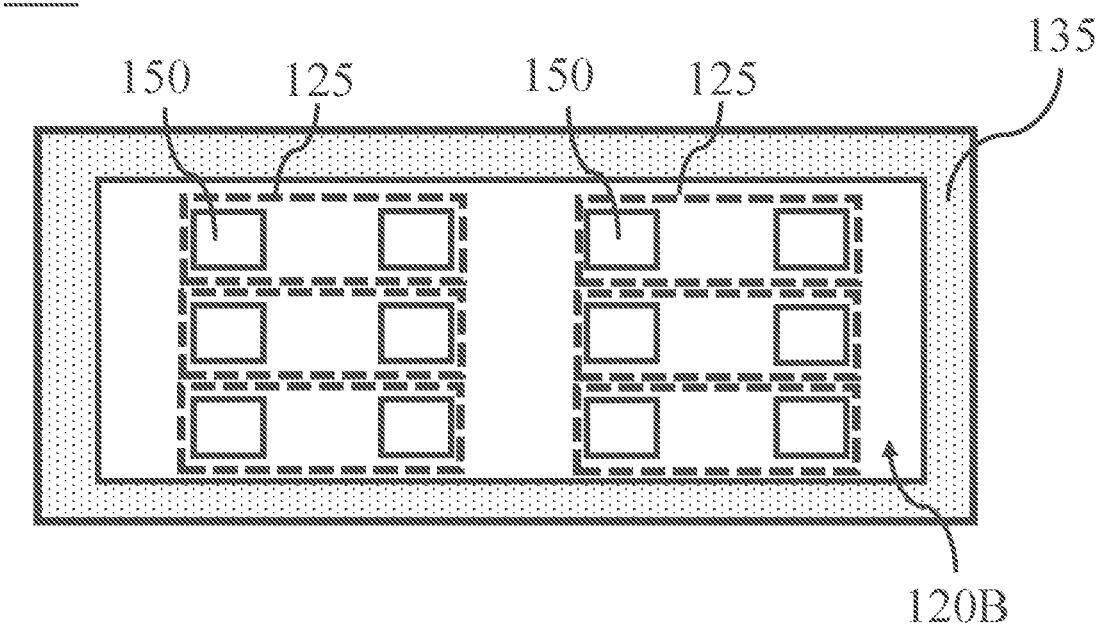
Figure 20A:
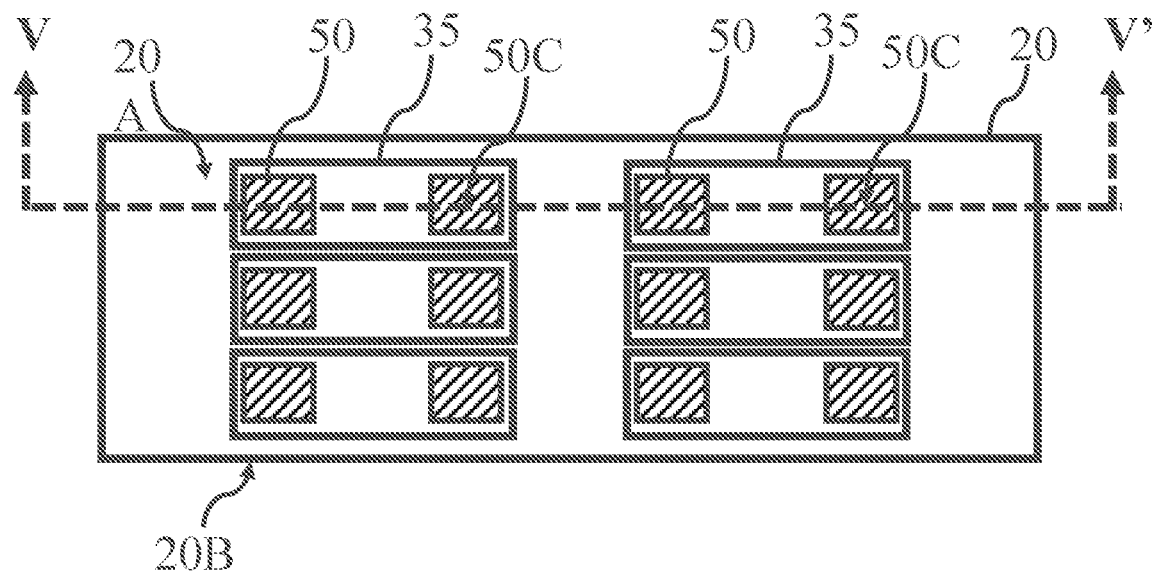
FIG. 20A is a top view of a temporary carrier substrate 20 with a plurality of microdevices 35 to be transferred formed thereon.
Figure 20B:
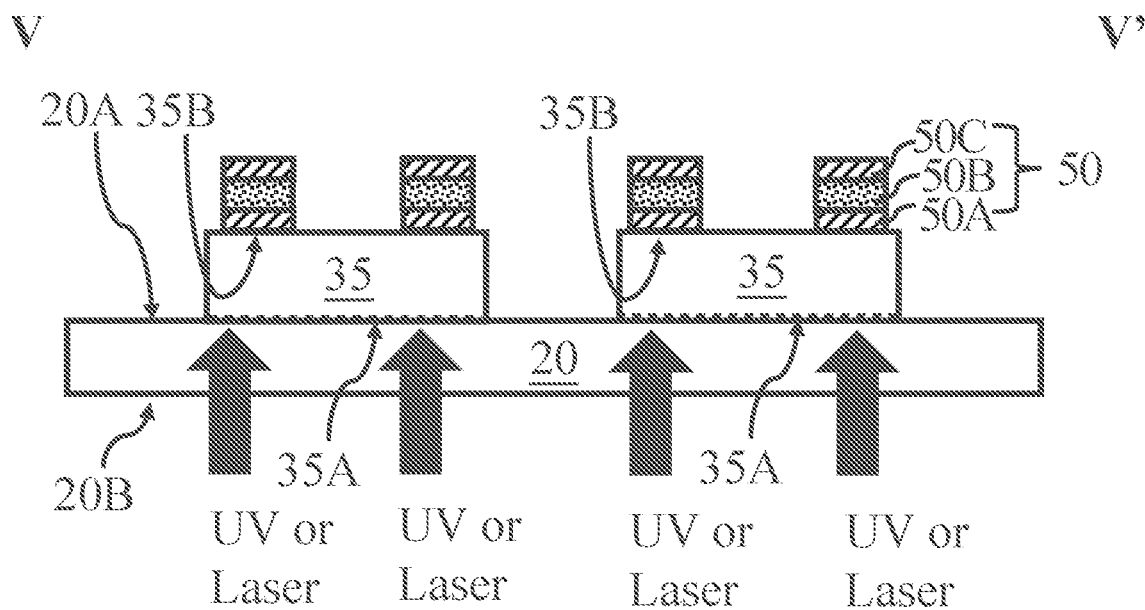
FIG. 20B is a cross-sectional view of the temporary carrier substrate 20 along with the cross-sectional line V-V' shown in FIG. 20A.
Figure 21A:
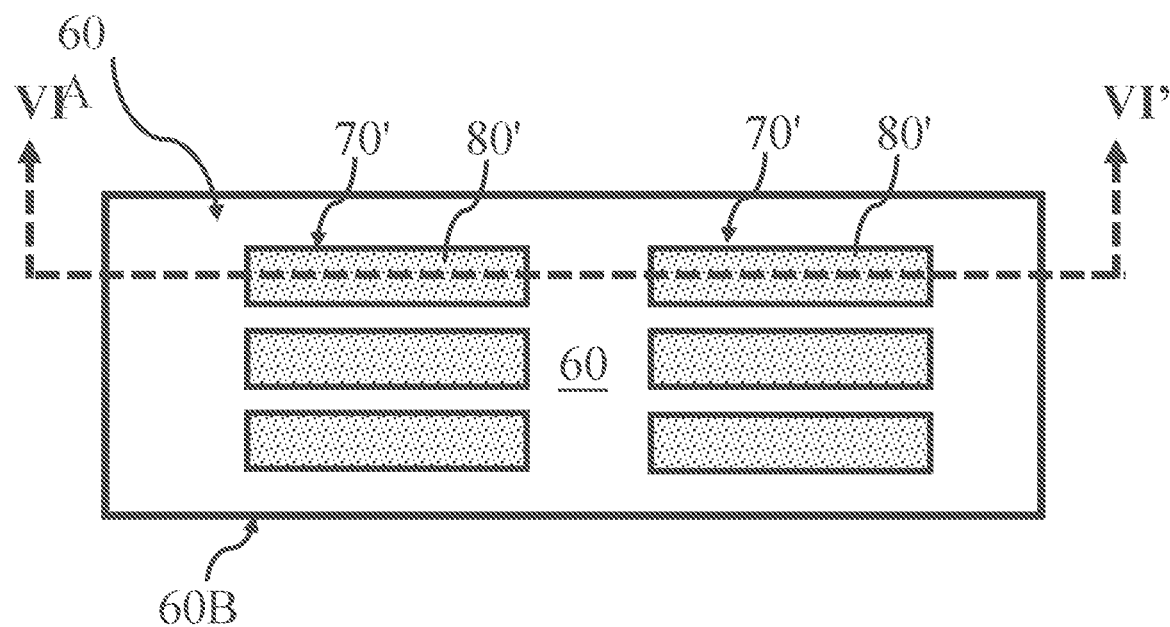
FIG. 21A is a top view of a target substrate 60 with a plurality of microdevice bonding regions 70' formed thereon, and each of the microdevice bonding regions 70' comprises a conductive bonding layer 80' formed thereon.
Figure 21B:
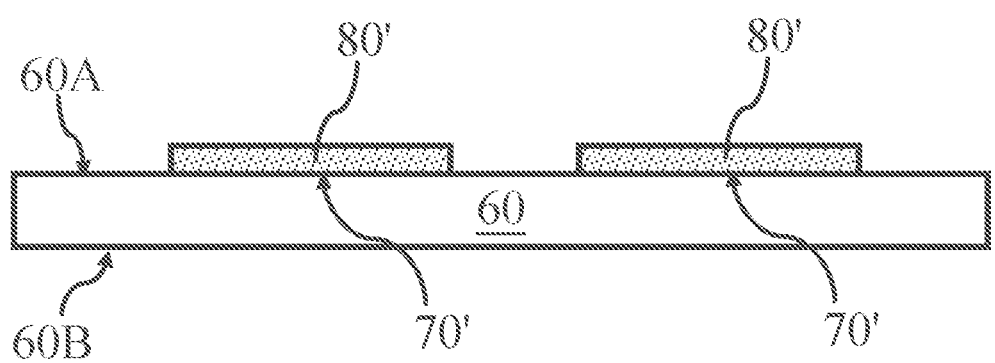
FIG. 21B is a cross-sectional view of the target substrate 60 along with the cross-sectional line IV-IV' as shown in FIG. 21A.

Please refer to FIGS. 19A~19C, 20A~20B, 21A~21B and 22A~22F. FIGS. 19A~19C are respectively a cross-sectional view, a top view and a bottom view of an apparatus for transferring microdevice 900 of Embodiment 9 of this invention. FIG. 19A is a cross-sectional view along with the cross-section line IV-IV' shown in FIG. 19B. FIG. 20A is a top view of a temporary carrier substrate 20 with a plurality of microdevices 35 to be transferred formed thereon. FIG. 20B is a cross-sectional view of the temporary carrier substrate 20 along with the cross-sectional line V-V' shown in FIG. 20A. FIG. 21A is a top view of a target substrate 60 with a plurality of microdevice bonding regions 70' formed thereon, and each of the microdevice bonding regions 70' comprises a conductive bonding layer 80' formed thereon. FIG. 21B is a cross-sectional view of the target substrate 60 along with the cross-sectional line VI-VI' as shown in FIG. 21A. FIGS. 22A~22F are cross-sectional views showing the process according to the method for transferring microdevices of the Embodiment 9.

The apparatus for transferring microdevice 900 as shown in FIGS. 19A~19C was provided. The apparatus for transferring microdevice 900 comprises a first magnet 110 with a first terminal 110A and a second terminal 110B opposite to each other; a first magnetic attracting substrate 120 with a first surface 120A and a second surface 120B opposite to each other disposed under the first magnet 110, wherein the first surface 120A of the first magnetic attracting substrate 120 is contacted to the first terminal 110A of the first magnet 110, and the second surface 120B of the first magnetic attracting substrate 120 comprises a plurality of microdevice alignment regions 125, and each of the microdevice alignment regions 125 comprises two or more magnetic attracting heads 150 protruding out of the second surface 120B; and an insulating layer 130 enveloped the first magnetic attracting substrate 120 but partially exposed the magnetic attracting heads 150 in each of the microdevice alignment regions 125. The first magnet 110 can be a permanent magnet or a electromagnet.

Next, a temporary carrier substrate 20 with a third surface 20A having a plurality of microdevices 35 spaced to each other and formed thereon and a fourth surface 20B opposite to each other as shown in FIGS. 20A~20B was provided. Each of the microdevices 35 comprises a bonding surface 35A and a magnetic attracting surface 35B opposite to the bonding surface 35A, wherein the bonding surface 35A comprises at least one bonding pad (not shown), and the magnetic attracting surface 35B comprises two or more magnetic attracting layers 50. The microdevices 35 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 21A~21B was provided. The fifth surface 60A comprises a plurality of microdevice bonding regions 70', and each of the microdevice bonding regions 70' has a conductive bonding layer 80' formed thereon. The conductive bonding layer 80' can be for example but not limited to a conductive glue, an anisotropic conductive film (ACF) or a thermal welding metal layer.

Figure 22A:
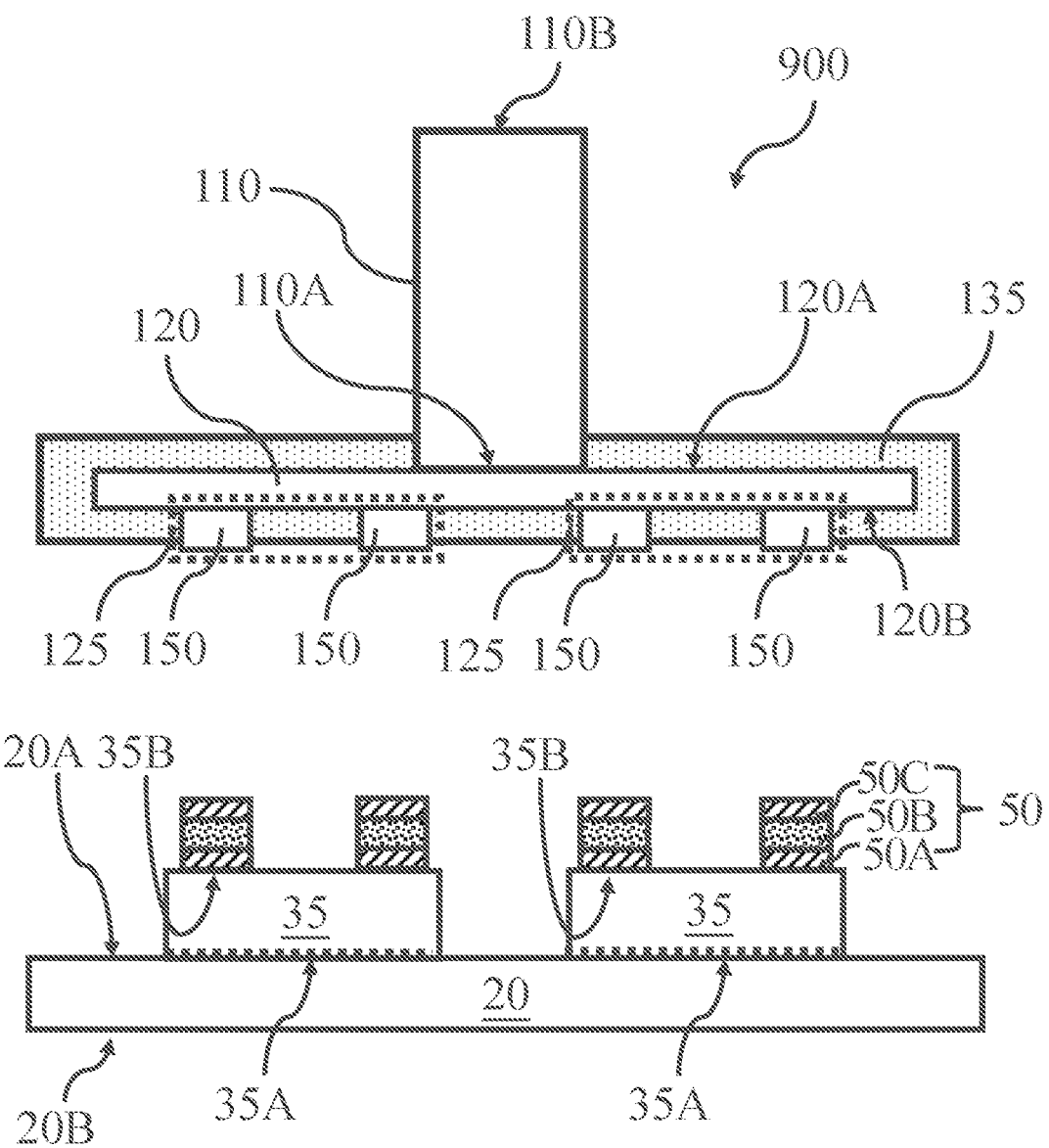
FIGS. 22A~22F are cross-sectional views showing the process according to the method for transferring microdevices of the Embodiment 9.

Next, referring to FIG. 22A. The temporary carrier substrate 20 was moved into the apparatus for transferring microdevice 900, wherein the temporary carrier substrate 20 was located below the first magnetic attracting substrate 120 and faced the second surface 120B of the first magnetic attracting substrate 120 by the third surface 20A to make each magnetic attracting layer 50B of the magnetic attracting surface 35B of each microdevice 35 on the third surface 20A of the temporary carrier substrate 20 face the microdevice alignment regions 125 of the first magnetic attracting substrate 120. According to one embodiment of this invention, a step of lift-off by laser or UV to lift off the microdevices 35 from the third surface 20A of the temporary carrier substrate 20 as shown in FIG. 20B was optionally proceeded before the step of moving the temporary carrier substrate 20 into the apparatus for transferring microdevice 900.

Figure 22B:
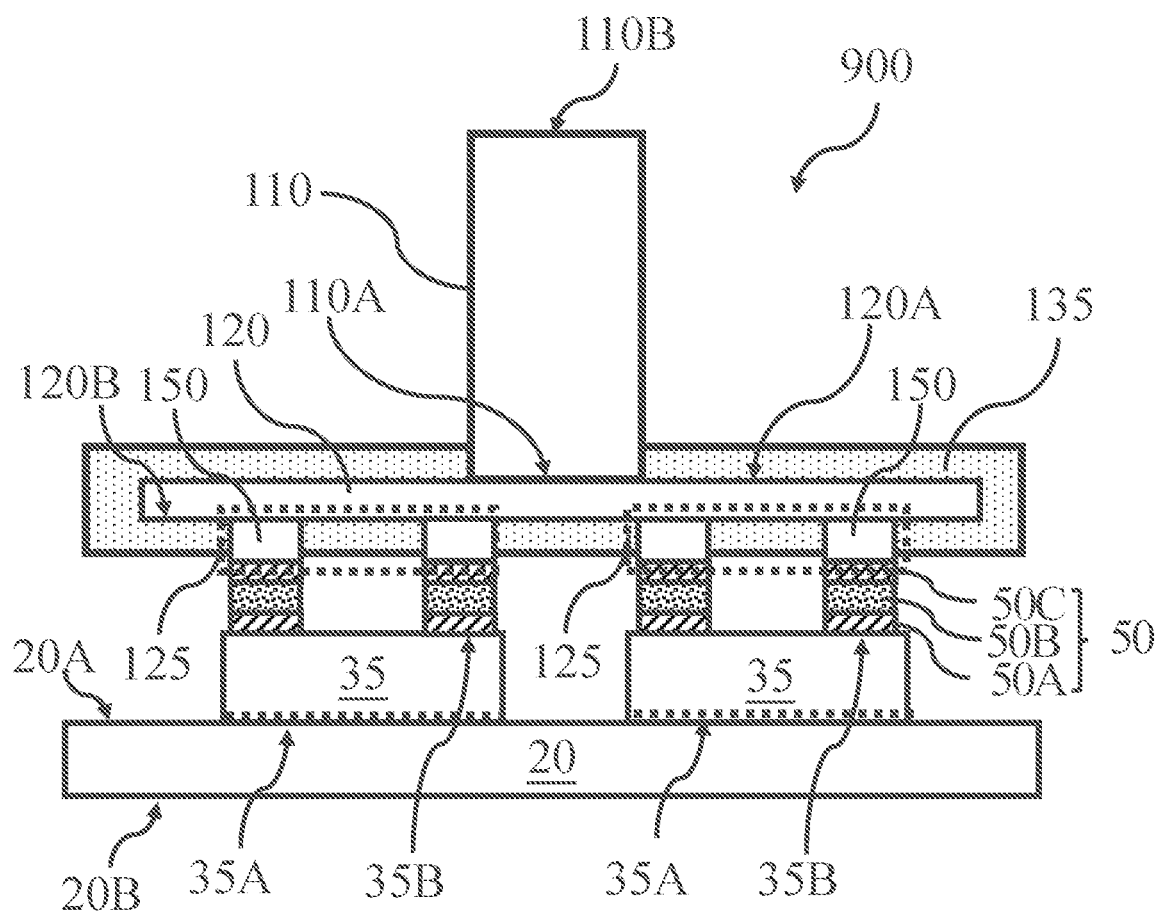
Figure 22C:
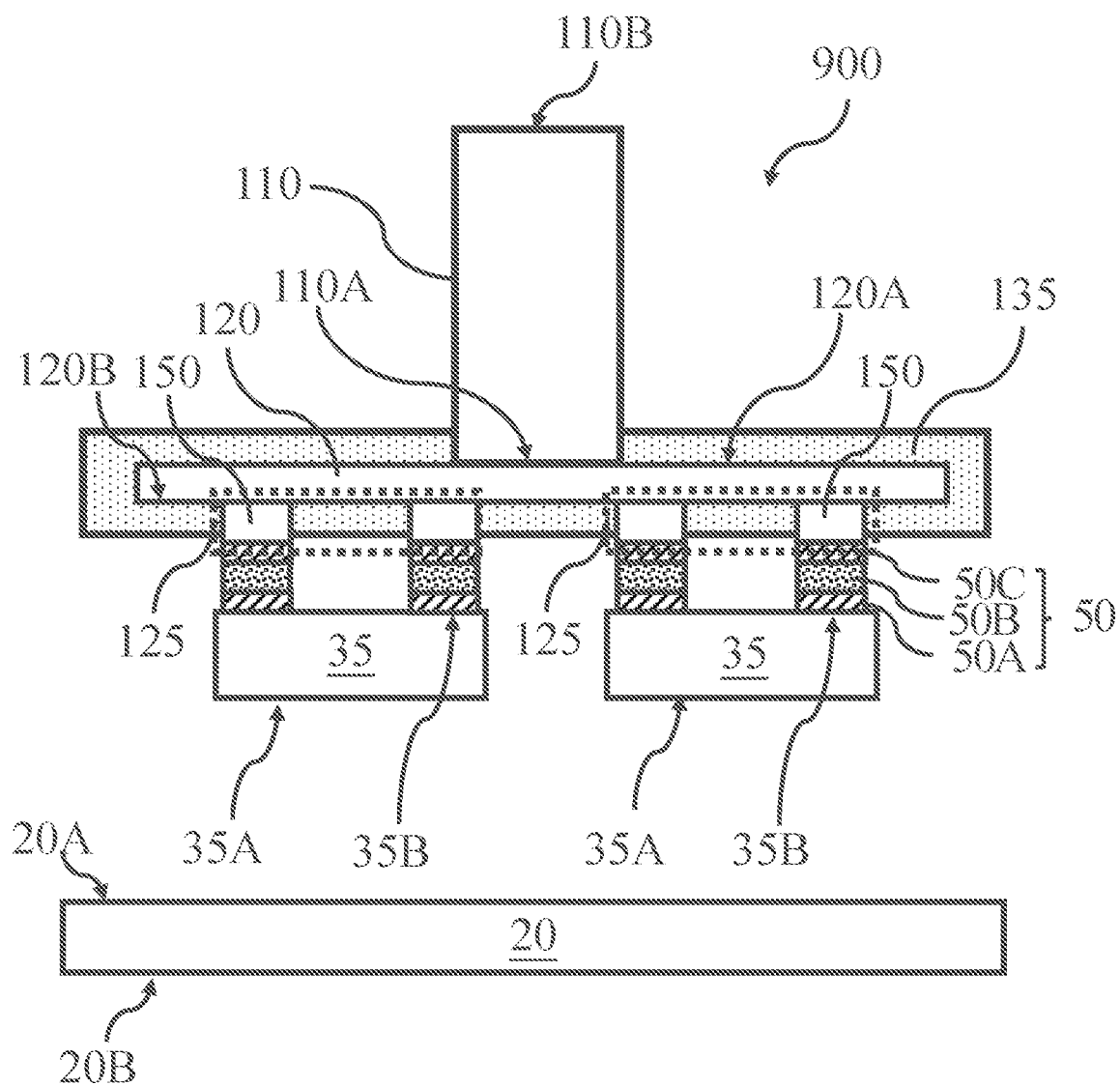

Next, referring to FIGS. 22B~22C. The magnetic field intensity of the first magnet 110 of the apparatus for transferring microdevice 900 was controlled to make each of the microdevices 35 be attracted by the magnetic attracting heads 150 in each of the microdevice alignment regions 125 through the magnetic attracting layer 50 of the magnetic attracting surface 35B thereof as shown in FIG. 22B and separated from the third surface 20A of the temporary carrier substrate 20 as shown in FIG. 22C.

Figure 22D:
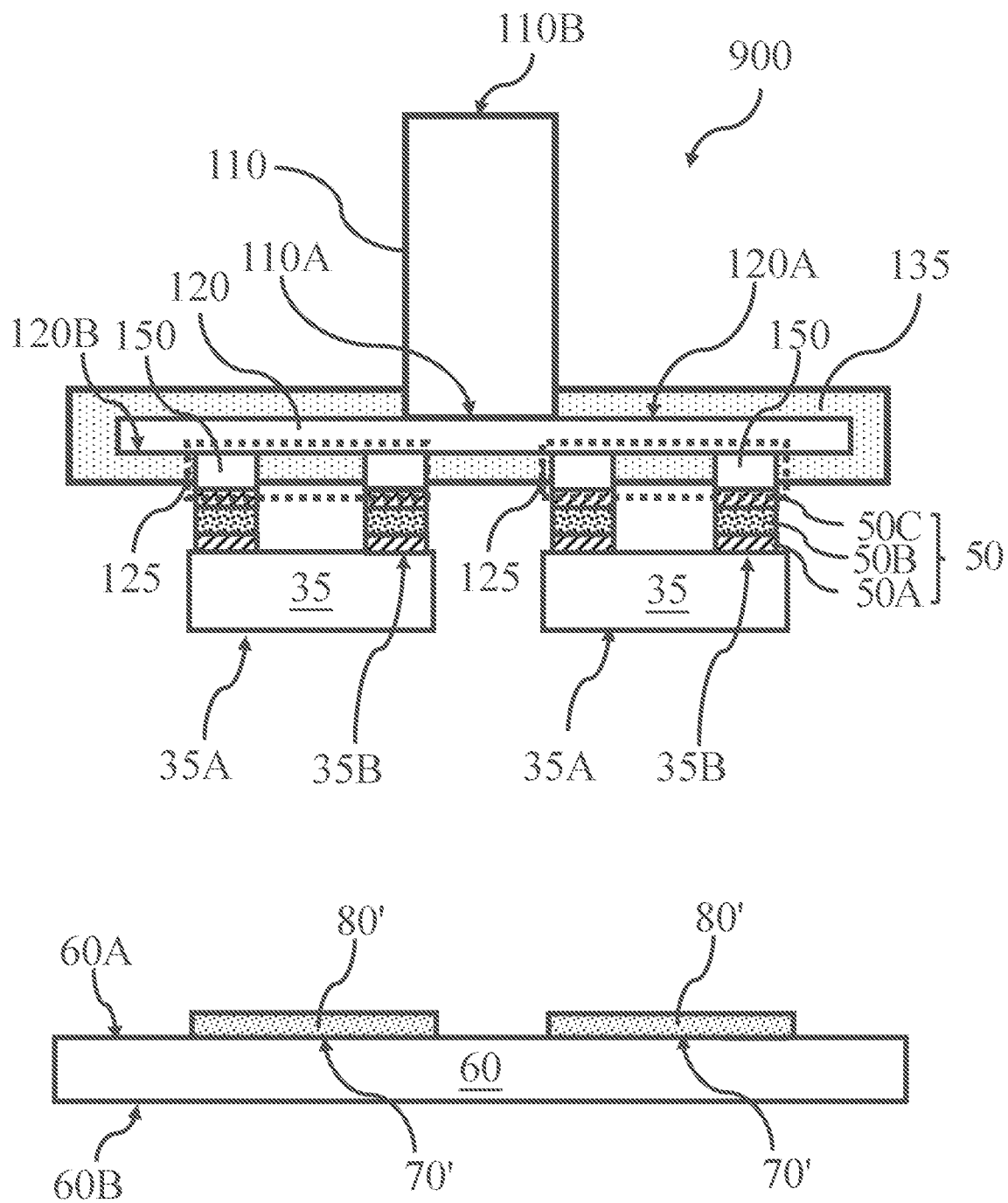

Next, referring to FIG. 22D. The target substrate 60 was moved into the apparatus for transferring microdevice 900 after the temporary carrier substrate 20 was moved out of the apparatus for transferring microdevice 900, wherein the target substrate 60 was located below the first magnetic attracting substrate 120 and faced the second surface 120B of the first magnetic attracting substrate 120 through the fifth surface 60A, and each of the microdevice bonding regions 70' on the fifth surface 60A of the target substrate 60 faced and aligned to each of the microdevice alignment regions 125 on the second surface 120B of the first magnetic attracting substrate 120.

Figure 22E:
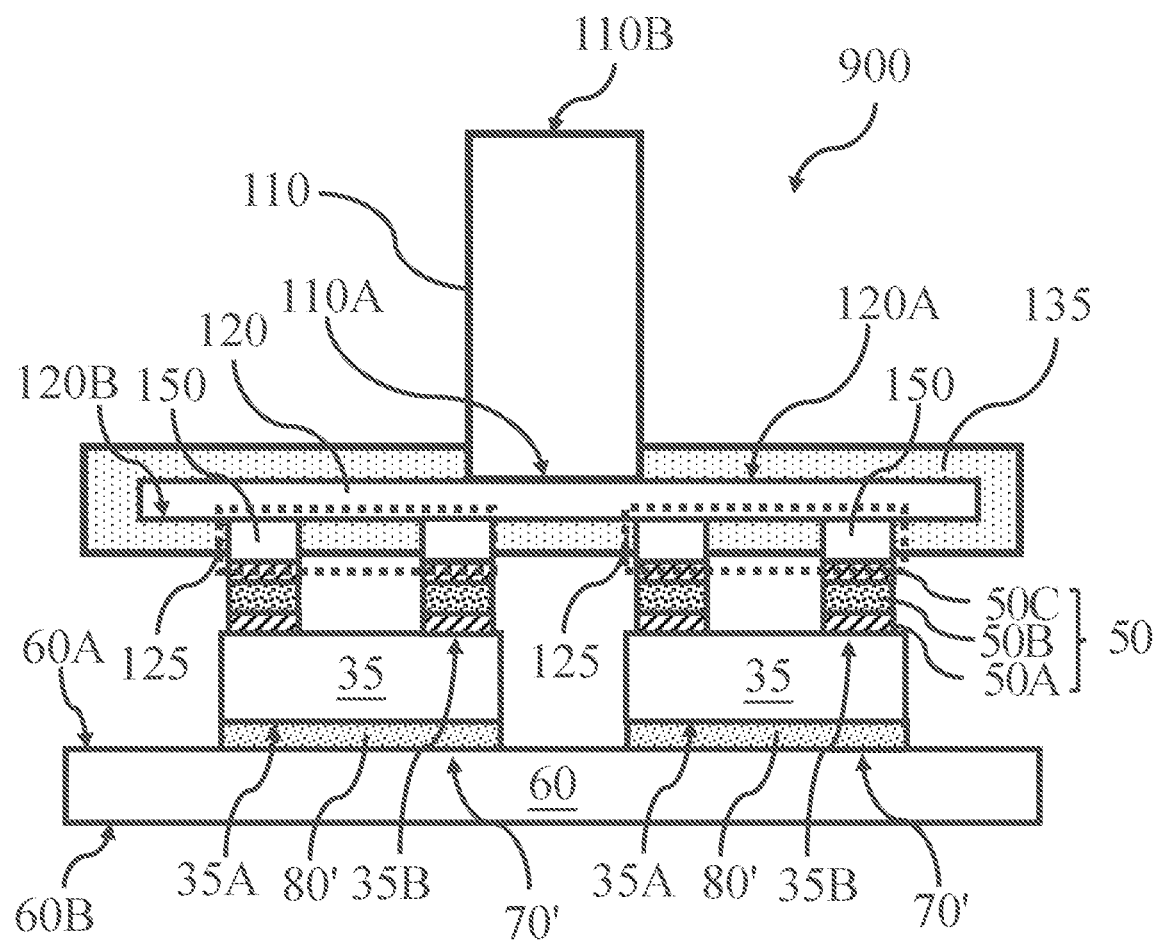

Next, referring to FIG. 22E. The first magnetic attracting substrate 120 was joined with the target substrate 60 to contact each of the microdevices 35 attracted by the magnetic attracting heads 150 in one of the microdevice alignment regions 125 to the conductive bonding layer 80' of the microdevice bonding regions 70' on the fifth surface 60A of the target substrate 60 through the bonding surface 35A thereof.

Figure 22F:
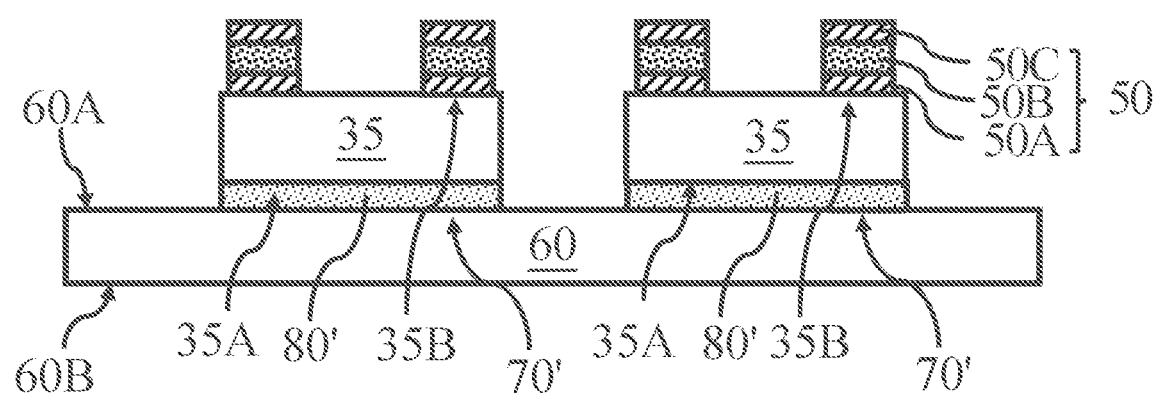

Finally, referring to FIG. 22F. A thermal treatment was applied to make each microdevice 35 bond to each conductive bonding layer 80' of each microdevice bonding region 70' through the bonding surface 35A thereof and separate from one of the alignment region 125 thereafter. Then, the process for transferring the microdevices 35 from the temporary carrier substrate 20 to the target substrate 60 was finished after each microdevice 35 was independently bonded to each conductive bonding layer 80' of each microdevice bonding region 70' on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80'.

Accordingly, microdevices can be mass-transferred and self-aligned since each of the microdevices 35 on the temporary carrier substrate 20 cab be attracted by the magnetic attracting heads 150 in each of the alignment regions 125 through the magnetic attracting layer 50 of the magnetic attracting surface 35B thereof, and transferred to each microdevice bonding regions 70' formed on the target 60 and aligned to each alignment region 125 thereafter.

Embodiment 10

Figure 23A:
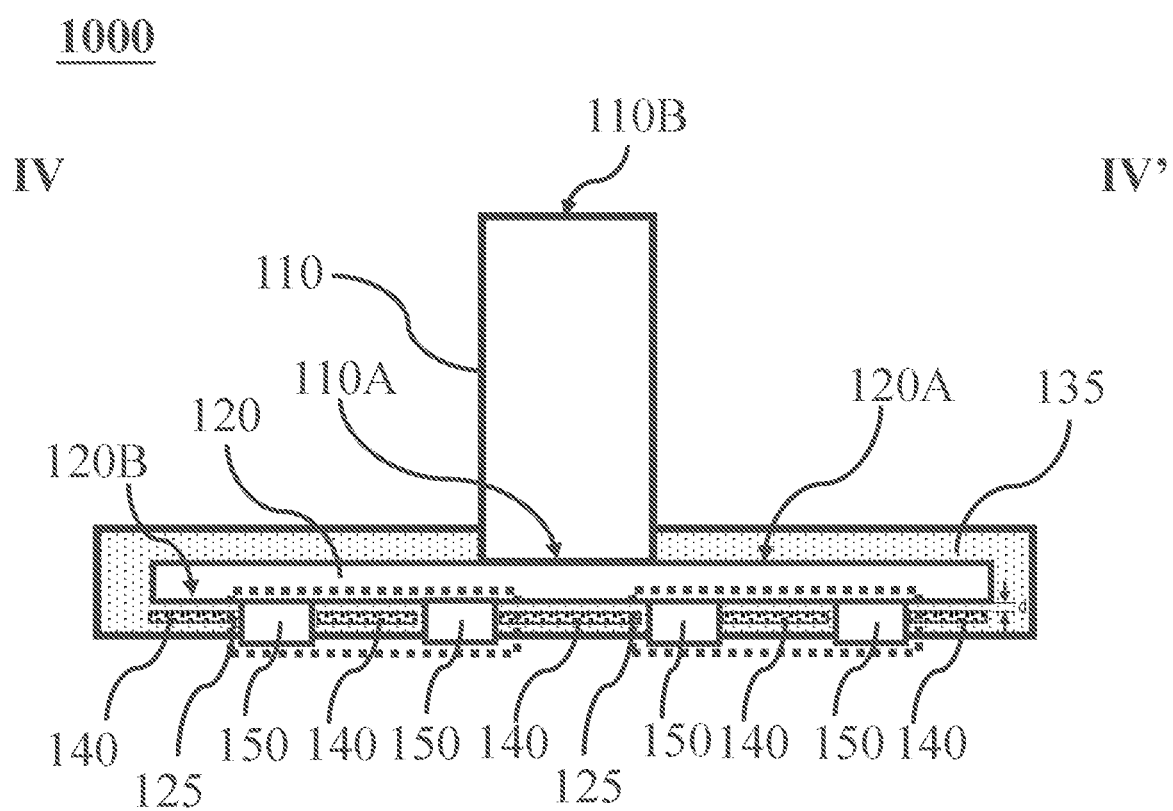
FIGS. 23A~23C are respectively a cross-sectional view, a top view and a bottom view of an apparatus for transferring microdevice 1000 of Embodiment 10 of this invention.
Figure 23B:
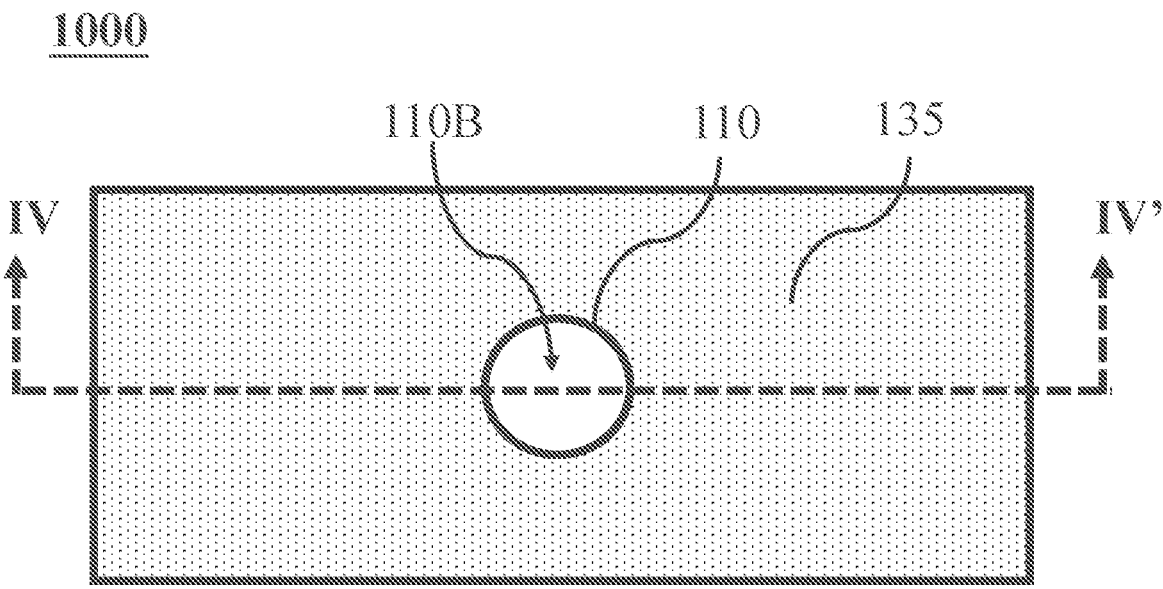
Figure 23C:
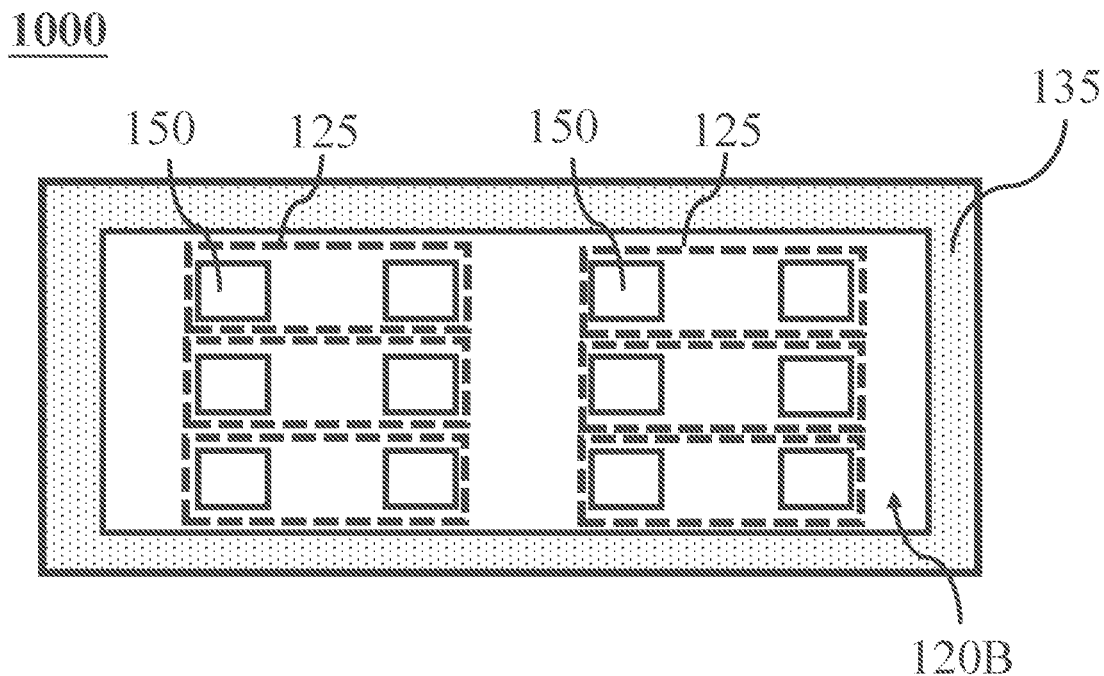

Please refer to FIGS. 23A~23C, 20A~20B, 21A~21B and 24A~24F. FIGS. 23A~23C are respectively a cross-sectional view, a top view and a bottom view of an apparatus for transferring microdevice 1000 of Embodiment 10 of this invention. FIG. 23A is a cross-sectional view along with the cross-section line IV-IV' shown in FIG. 23B. FIG. 20A is a top view of a temporary carrier substrate 20 with a plurality of microdevices 35 to be transferred formed thereon. FIG. 20B is a cross-sectional view of the temporary carrier substrate 20 along with the cross-sectional line V-V' shown in FIG. 20A. FIG. 21A is a top view of a target substrate 60 with a plurality of microdevice bonding regions 70' formed thereon, and each of the microdevice bonding regions 70' comprises a conductive bonding layer 80' formed thereon. FIG. 21B is a cross-sectional view of the target substrate 60 along with the cross-sectional line VI-VI' as shown in FIG. 21A. FIGS. 24A~24F are cross-sectional views showing the process according to the method for transferring microdevices of the Embodiment 10.

The apparatus for transferring microdevice 1000 as shown in FIGS. 23A~23C was provided. The structure of the apparatus for transferring microdevice 1000 is similar to the apparatus for transferring microdevice 900 shown in FIGS. 19A~19C except that the insulating layer 130 of the apparatus for transferring microdevice 1000 further comprises a magnetic shielding layer 140 disposed adjacent to the second surface 120B of the first magnetic attracting substrate 120 spaced with a distance d (d>0), wherein the magnetic shielding layer 140 surrounds each of the magnetic attracting heads 150 in each of the microdevice alignment regions 125.

Next, a temporary carrier substrate 20 with a third surface 20A having a plurality of microdevices 35 spaced to each other and formed thereon and a fourth surface 20B opposite to each other as shown in FIGS. 20A~20B was provided. Each of the microdevices 35 comprises a bonding surface 35A and a magnetic attracting surface 35B opposite to the bonding surface 35A, wherein the bonding surface 35A comprises at least one bonding pad (not shown), and the magnetic attracting surface 35B comprises two or more magnetic attracting layers 50. The microdevices 35 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 21A~21B was provided. The fifth surface 60A comprises a plurality of microdevice bonding regions 70', and each of the microdevice bonding regions 70' has a conductive bonding layer 80' formed thereon. The conductive bonding layer 80' can be for example but not limited to a conductive glue, an anisotropic conductive film (ACF) or a thermal welding metal layer.

Figure 24A:
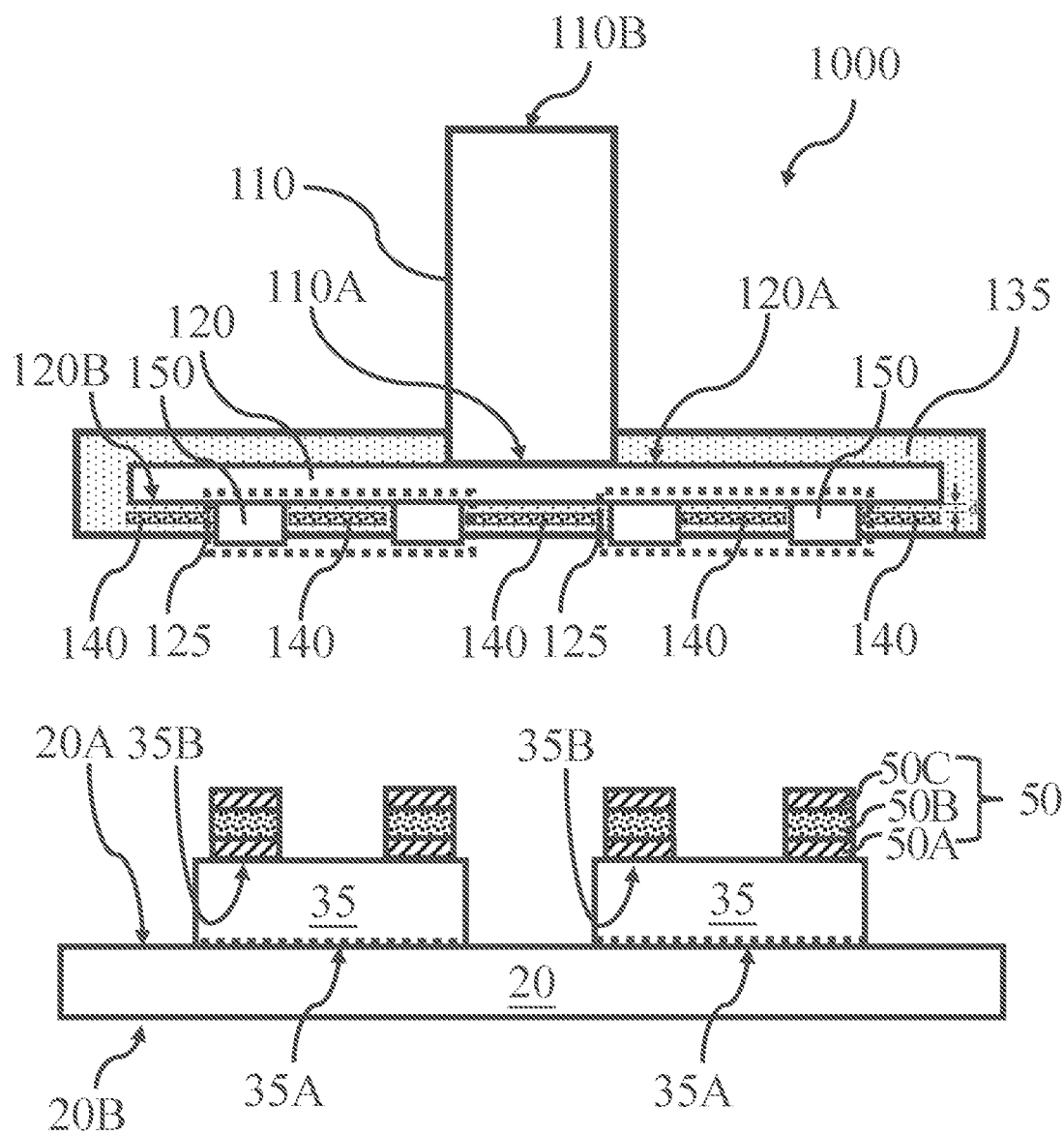
FIGS. 24A~24F are cross-sectional views showing the process according to the method for transferring microdevices of the Embodiment 10.

Next, referring to FIG. 24A. The temporary carrier substrate 20 was moved into the apparatus for transferring microdevice 1000, wherein the temporary carrier substrate 20 was located below the first magnetic attracting substrate 120 and faced the second surface 120B of the first magnetic attracting substrate 120 by the third surface 20A to make each magnetic attracting layer 50B of the magnetic attracting surface 35B of each microdevice 35 on the third surface 20A of the temporary carrier substrate 20 face the microdevice alignment regions 125 of the first magnetic attracting substrate 120. According to one embodiment of this invention, a step of lift-off by laser or UV to lift off the microdevices 35 from the third surface 20A of the temporary carrier substrate 20 as shown in FIG. 20B was optionally proceeded before the step of moving the temporary carrier substrate 20 into the apparatus for transferring microdevice 1000.

Figure 24B:
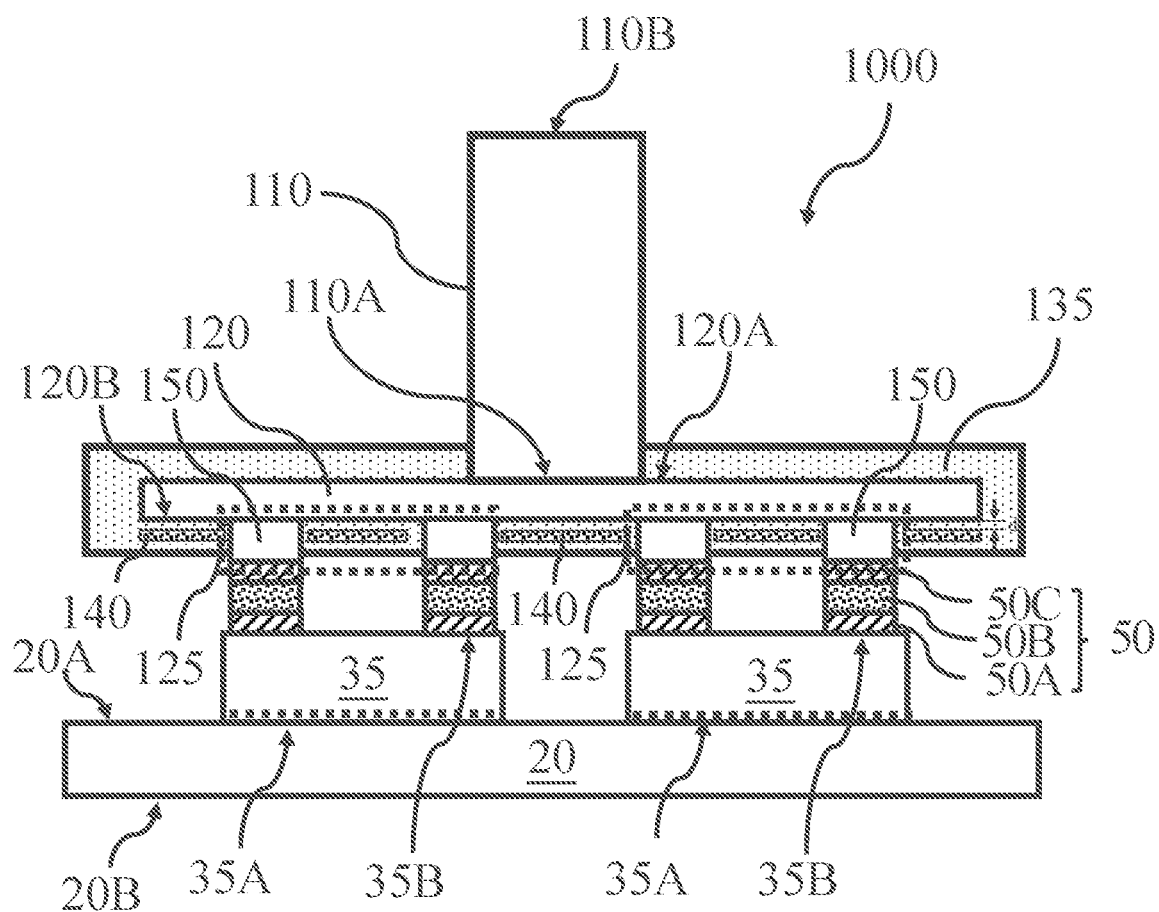
Figure 24C:
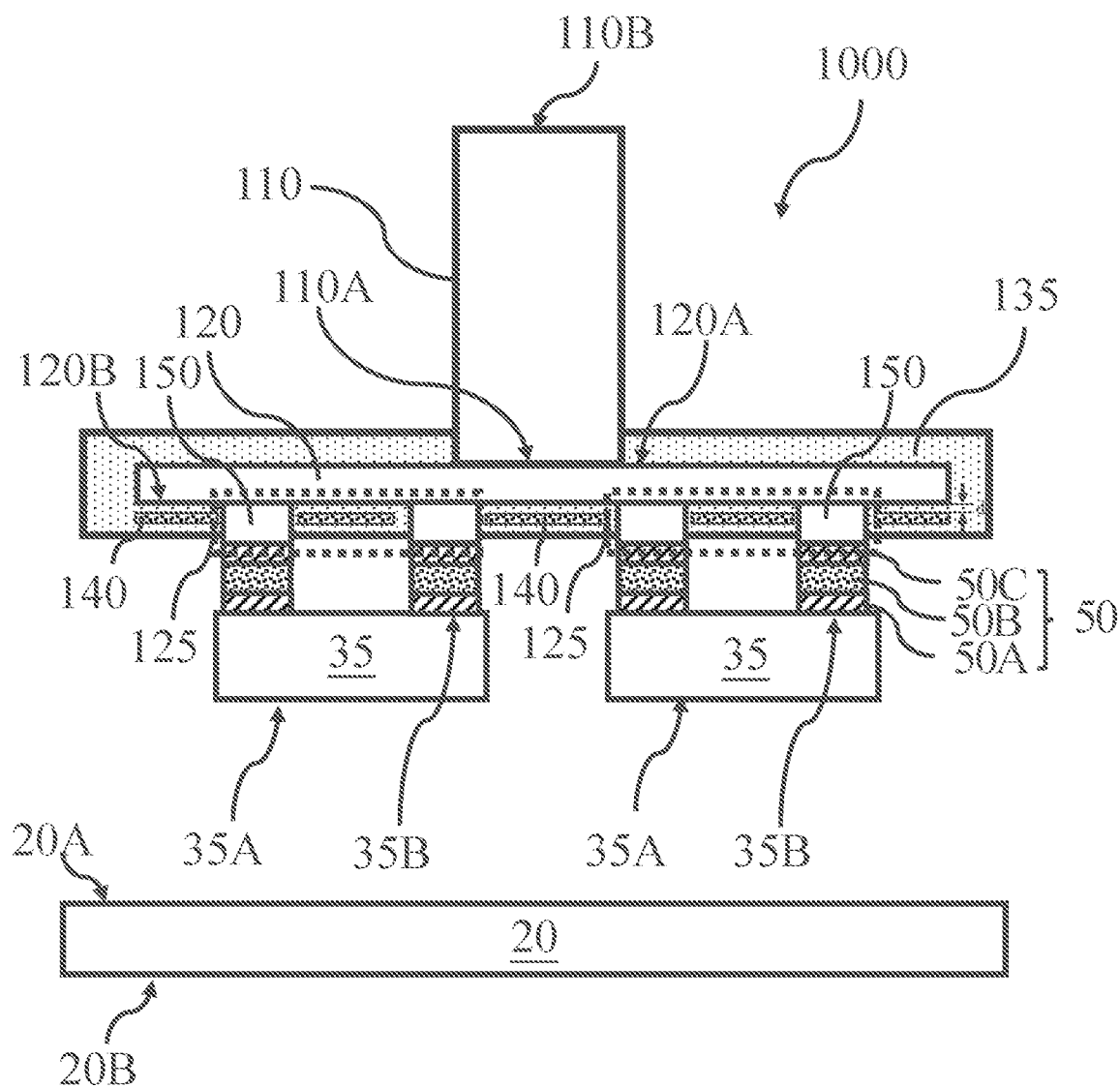

Next, referring to FIGS. 24B~24C. The magnetic field intensity of the first magnet 110 of the apparatus for transferring microdevice 1000 was controlled to make each of the microdevices 35 be attracted by the magnetic attracting heads 150 in each of the microdevice alignment regions 125 through the magnetic attracting layer 50 of the magnetic attracting surface 35B thereof as shown in FIG. 24B and separated from the third surface 20A of the temporary carrier substrate 20 as shown in FIG. 24C.

Figure 24D:
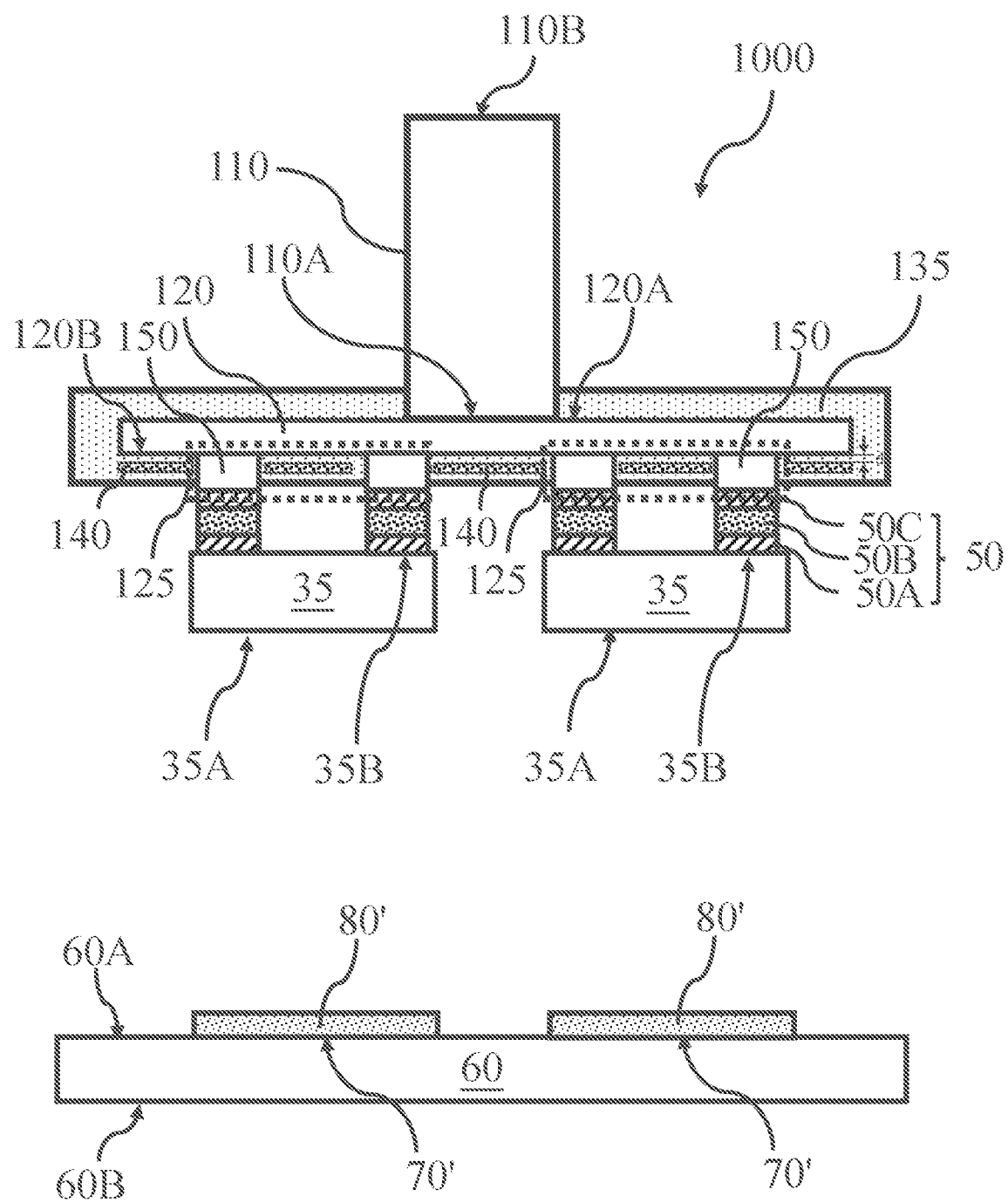

Next, referring to FIG. 24D. The target substrate 60 was moved into the apparatus for transferring microdevice 1000 after the temporary carrier substrate 20 was moved out of the apparatus for transferring microdevice 1000, wherein the target substrate 60 was located below the first magnetic attracting substrate 120 and faced the second surface 120B of the first magnetic attracting substrate 120 through the fifth surface 60A, and each of the microdevice bonding regions 70' on the fifth surface 60A of the target substrate 60 faced and aligned to each of the microdevice alignment regions 125 on the second surface 120B of the first magnetic attracting substrate 120.

Figure 24E:
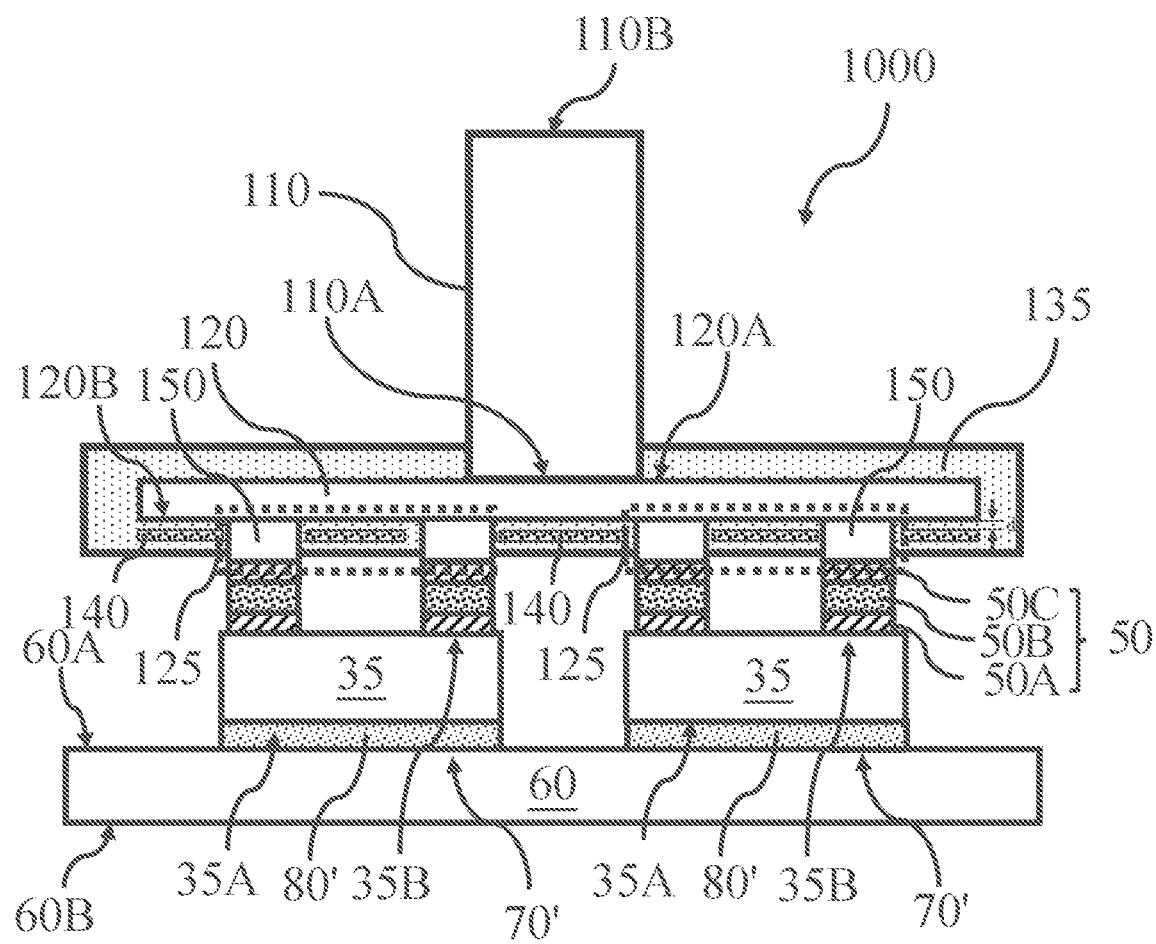

Next, referring to FIG. 24E. The first magnetic attracting substrate 120 was joined with the target substrate 60 to contact each of the microdevices 35 attracted by the magnetic attracting heads 150 in one of the microdevice alignment regions 125 to the conductive bonding layer 80' of the microdevice bonding regions 70' on the fifth surface 60A of the target substrate 60 through the bonding surface 35A thereof.

Figure 24F:
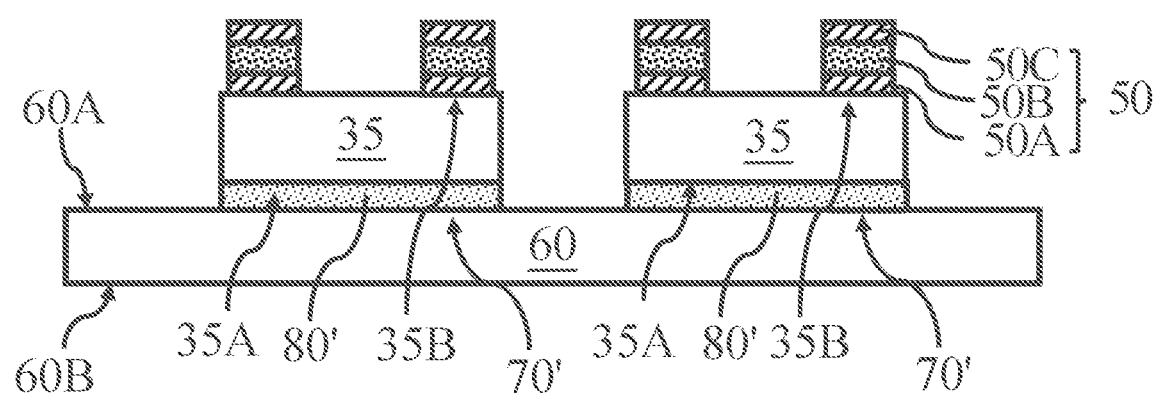

Finally, referring to FIG. 24F. A thermal treatment was applied to make each microdevice 35 bond to each conductive bonding layer 80' of each microdevice bonding region 70' through the bonding surface 35A thereof and separate from one of the alignment region 125 thereafter. Then, the process for transferring the microdevices 35 from the temporary carrier substrate 20 to the target substrate 60 was finished after each microdevice 35 was independently bonded to each conductive bonding layer 80' of each microdevice bonding region 70' on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80'.

Accordingly, microdevices can be mass-transferred and self-aligned since each of the microdevices 35 on the temporary carrier substrate 20 cab be attracted by the magnetic attracting heads 150 in each of the alignment regions 125 through the magnetic attracting layer 50 of the magnetic attracting surface 35B thereof, and transferred to each microdevice bonding regions 70' formed on the target 60 and aligned to each alignment region 125 thereafter.

Embodiment 11

Figure 25A:
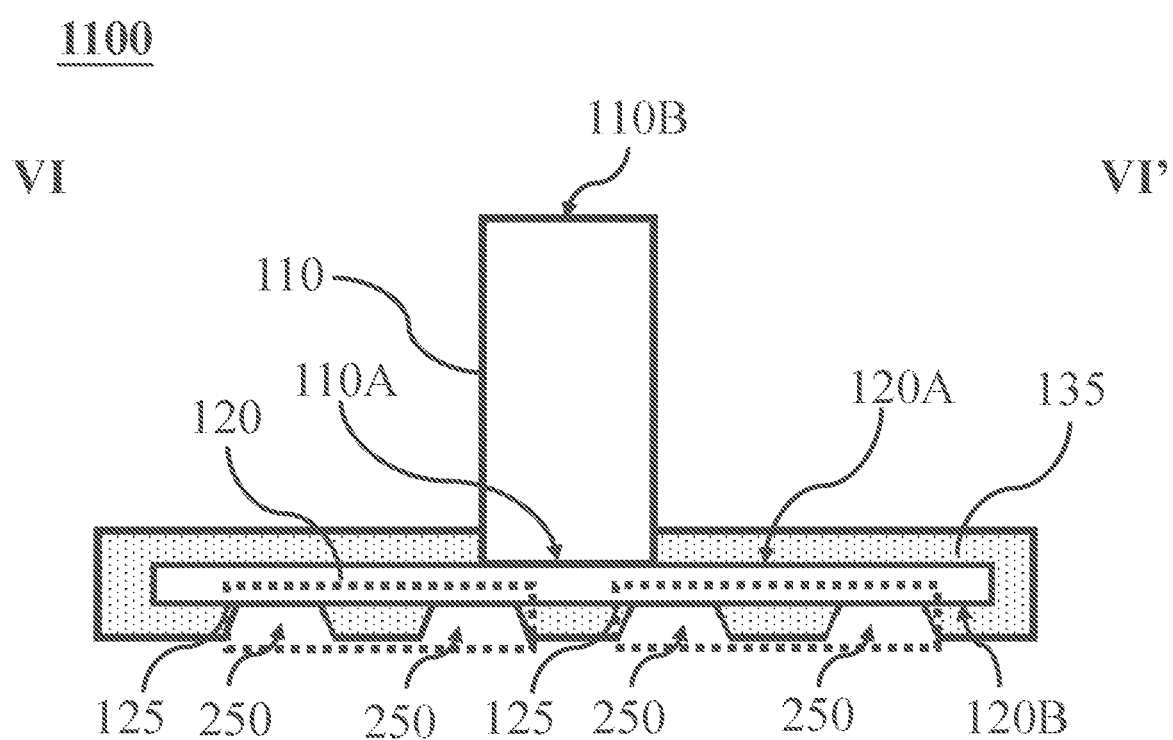
FIGS. 25A~25C are respectively a cross-sectional view, a top view and a bottom view of an apparatus for transferring microdevice 1100 of Embodiment 11 of this invention.
Figure 25B:
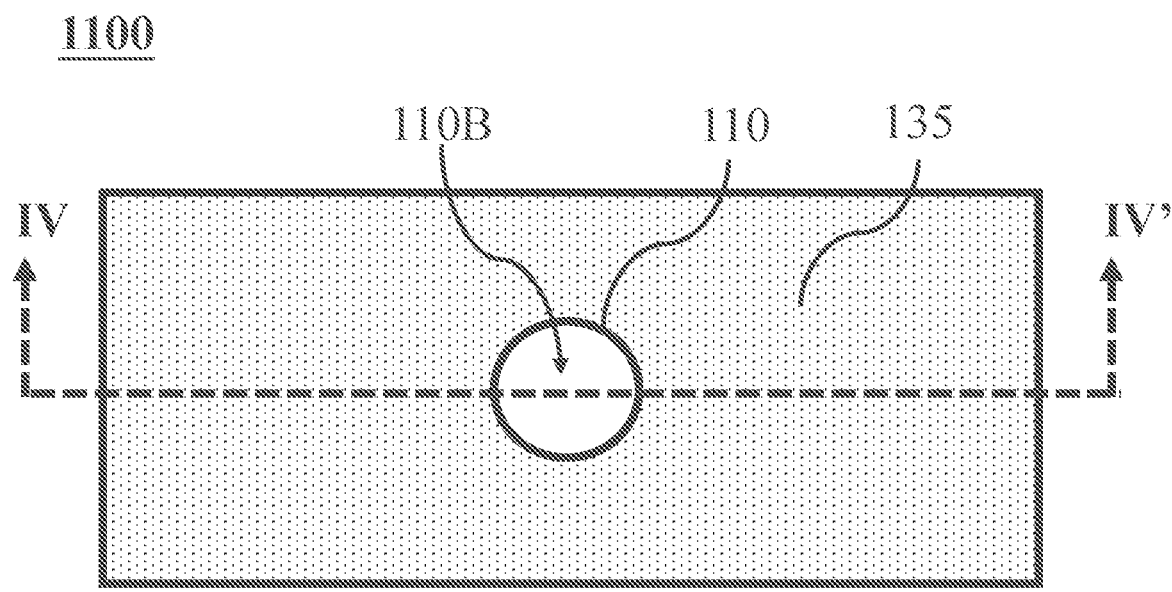
Figure 25C:
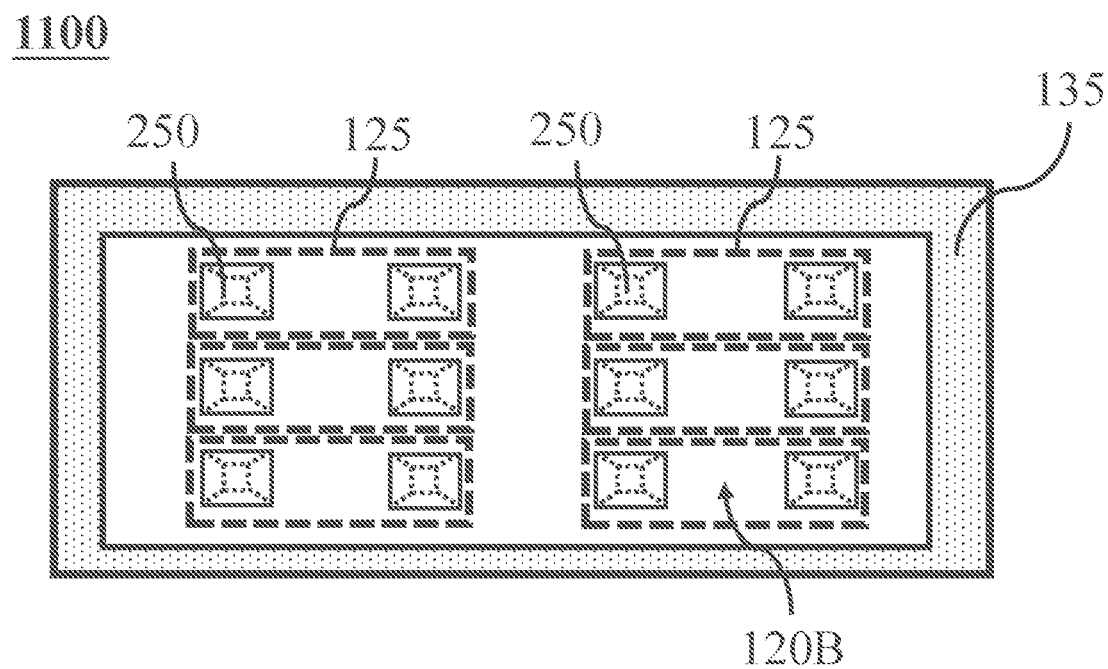

Please refer to FIGS. 25A~25C, 20A~20B, 21A~21B and 26A~26F. FIGS. 25A~25C are respectively a cross-sectional view, a top view and a bottom view of an apparatus for transferring microdevice 1100 of Embodiment 11 of this invention. FIG. 25A is a cross-sectional view along with the cross-section line IV-IV' shown in FIG. 25B. FIG. 20A is a top view of a temporary carrier substrate 20 with a plurality of microdevices 35 to be transferred formed thereon. FIG. 20B is a cross-sectional view of the temporary carrier substrate 20 along with the cross-sectional line V-V' shown in FIG. 20A. FIG. 21A is a top view of a target substrate 60 with a plurality of microdevice bonding regions 70' formed thereon, and each of the microdevice bonding regions 70' comprises a conductive bonding layer 80' formed thereon. FIG. 21B is a cross-sectional view of the target substrate 60 along with the cross-sectional line VI-VI' as shown in FIG. 21A. FIGS. 26A~26F are cross-sectional views showing the process according to the method for transferring microdevices of the Embodiment 11.

The apparatus for transferring microdevice 1100 as shown in FIGS. 25A~25C was provided. The apparatus for transferring microdevice 1100 comprises a first magnet 110 with a first terminal 110A and a second terminal 110B opposite to each other; a first magnetic attracting substrate 120 with a first surface 120A and a second surface 120B opposite to each other disposed under the first magnet 110, wherein the first surface 120A of the first magnetic attracting substrate 120 is contacted to the first terminal 110A of the first magnet 110, and the second surface 120B of the first magnetic attracting substrate 120 comprises a plurality of microdevice alignment regions 125; and an insulating layer 130 enveloped the first magnetic attracting substrate 120, wherein each of the microdevice alignment region 125 comprises two or more magnetic attracting holes 250 exposing the second substrate 120B of the first magnetic attracting substrate 120. The first magnet 110 can be a permanent magnet or a electromagnet.

Next, a temporary carrier substrate 20 with a third surface 20A having a plurality of microdevices 35 spaced to each other and formed thereon and a fourth surface 20B opposite to each other as shown in FIGS. 20A~20B was provided. Each of the microdevices 35 comprises a bonding surface 35A and a magnetic attracting surface 35B opposite to the bonding surface 35A, wherein the bonding surface 35A comprises at least one bonding pad (not shown), and the magnetic attracting surface 35B comprises two or more magnetic attracting layers 50. The microdevices 35 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 21A~21B was provided. The fifth surface 60A comprises a plurality of microdevice bonding regions 70', and each of the microdevice bonding regions 70' has a conductive bonding layer 80' formed thereon. The conductive bonding layer 80' can be for example but not limited to a conductive glue, an anisotropic conductive film (ACF) or a thermal welding metal layer.

Figure 26A:
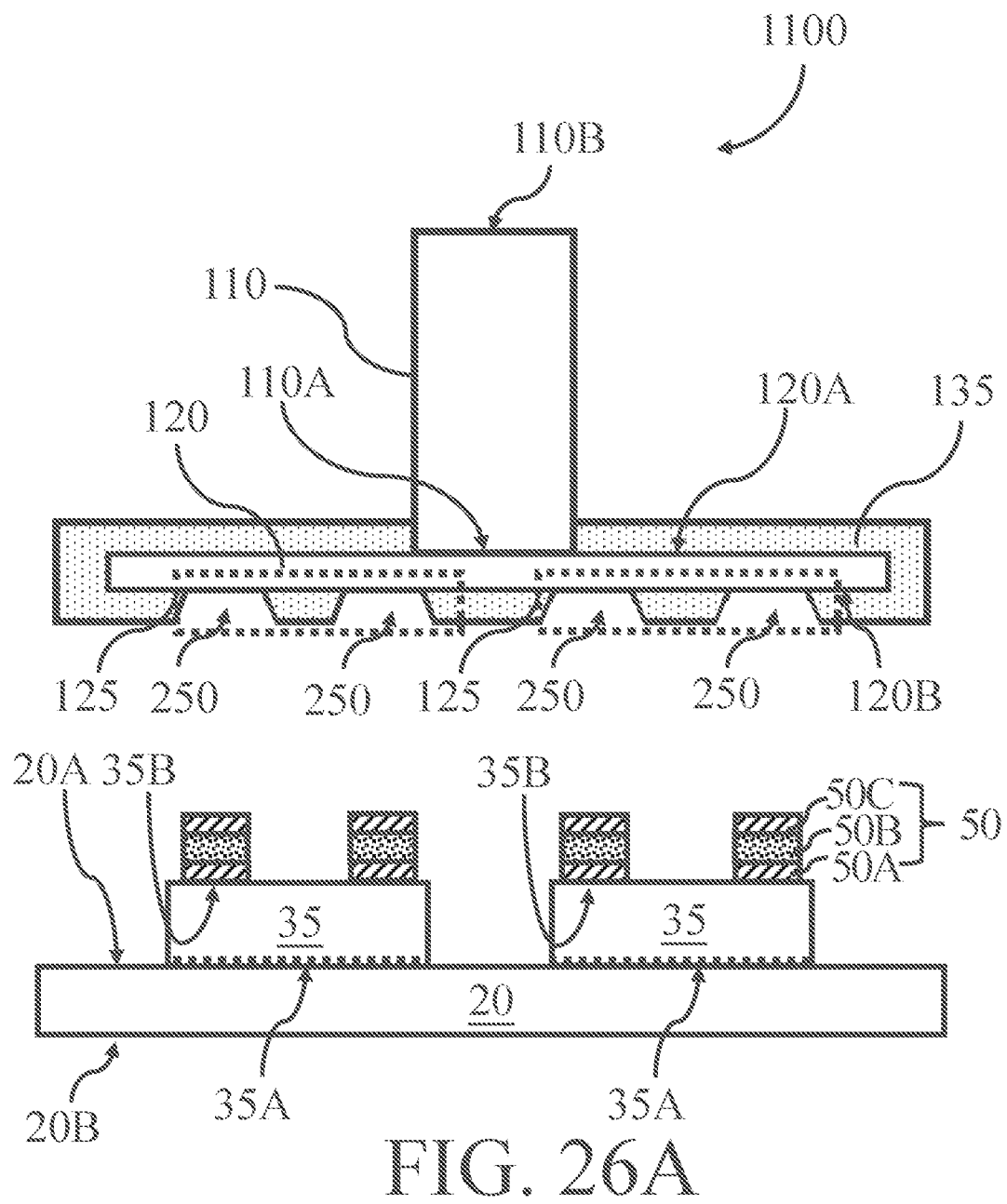
FIGS. 26A~26F are cross-sectional views showing the process according to the method for transferring microdevices of the Embodiment 11.

Next, referring to FIG. 26A. The temporary carrier substrate 20 was moved into the apparatus for transferring microdevice 1100, wherein the temporary carrier substrate 20 was located below the first magnetic attracting substrate 120 and faced the second surface 120B of the first magnetic attracting substrate 120 by the third surface 20A to make each magnetic attracting layer 50B of the magnetic attracting surface 35B of each microdevice 35 on the third surface 20A of the temporary carrier substrate 20 face the microdevice alignment regions 125 of the first magnetic attracting substrate 120. According to one embodiment of this invention, a step of lift-off by laser or UV to lift off the microdevices 35 from the third surface 20A of the temporary carrier substrate 20 as shown in FIG. 20B was optionally proceeded before the step of moving the temporary carrier substrate 20 into the apparatus for transferring microdevice 1100.

Figure 26B:
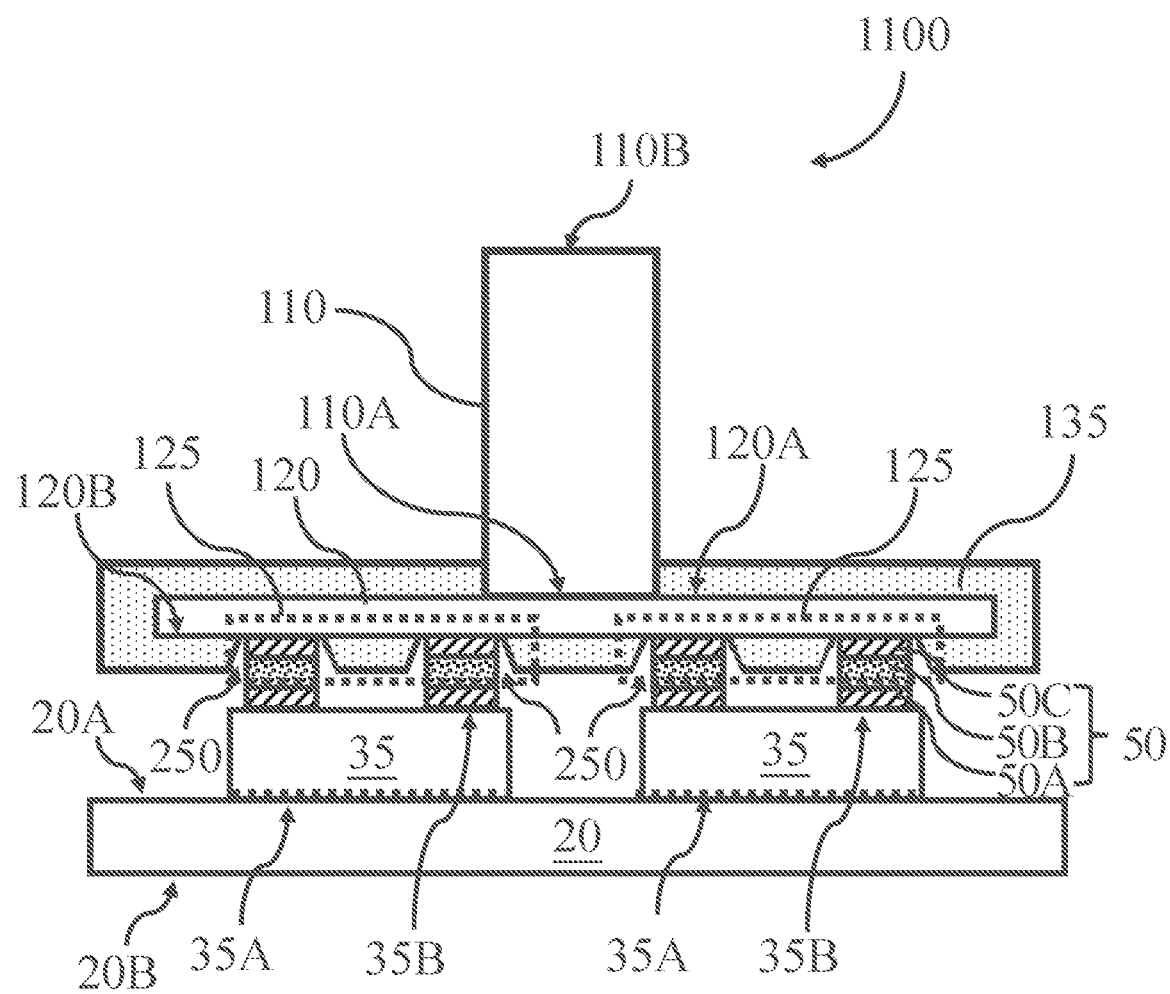
Figure 26C:
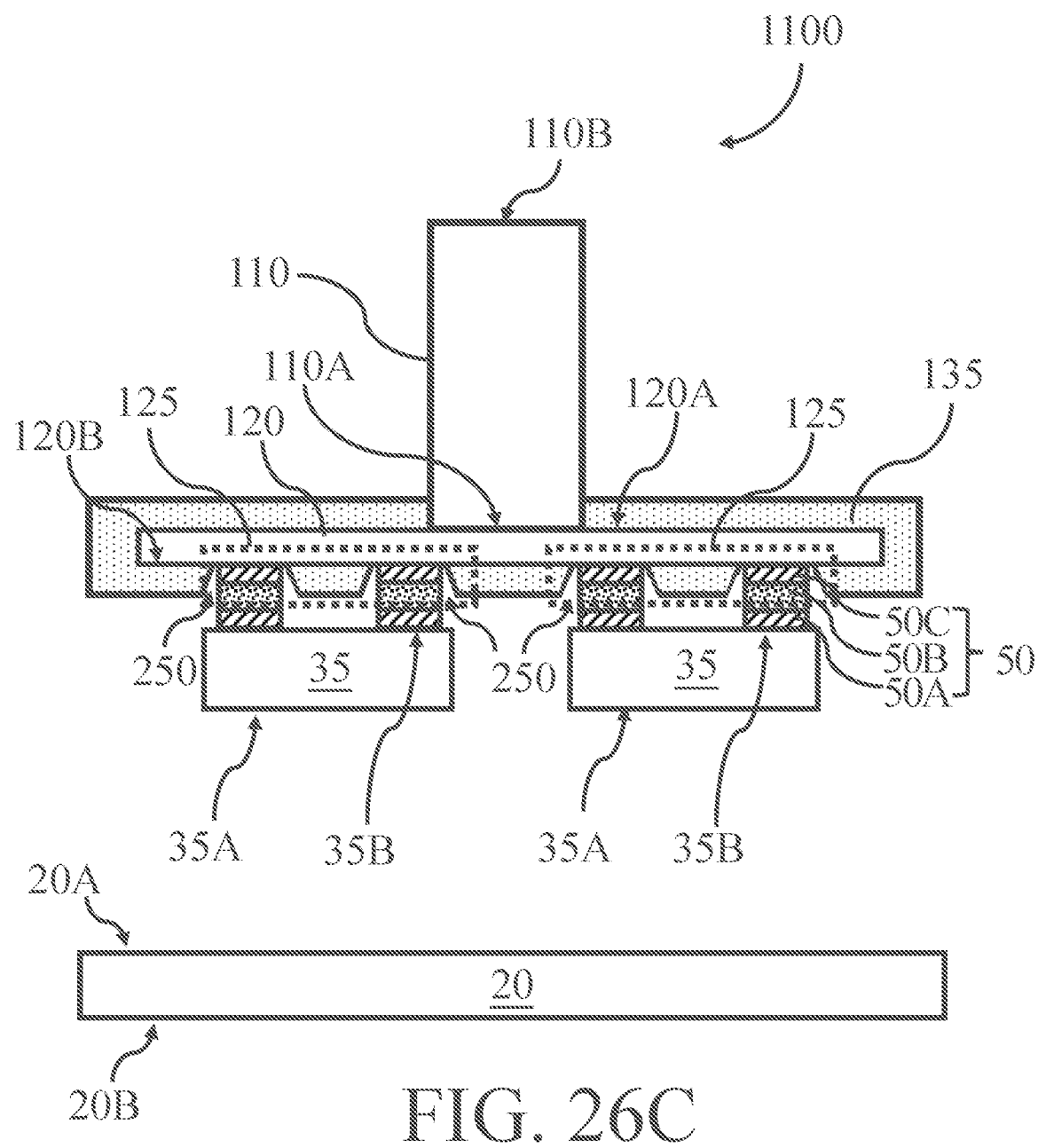

Next, referring to FIGS. 26B~26C. The magnetic field intensity of the first magnet 110 of the apparatus for transferring microdevice 1100 was controlled to make each of the microdevices 35 be attracted by the magnetic attracting holes 250 in each of the microdevice alignment regions 125 through the magnetic attracting layer 50 of the magnetic attracting surface 35B thereof as shown in FIG. 26B and separated from the third surface 20A of the temporary carrier substrate 20 as shown in FIG. 26C.

Figure 26D:
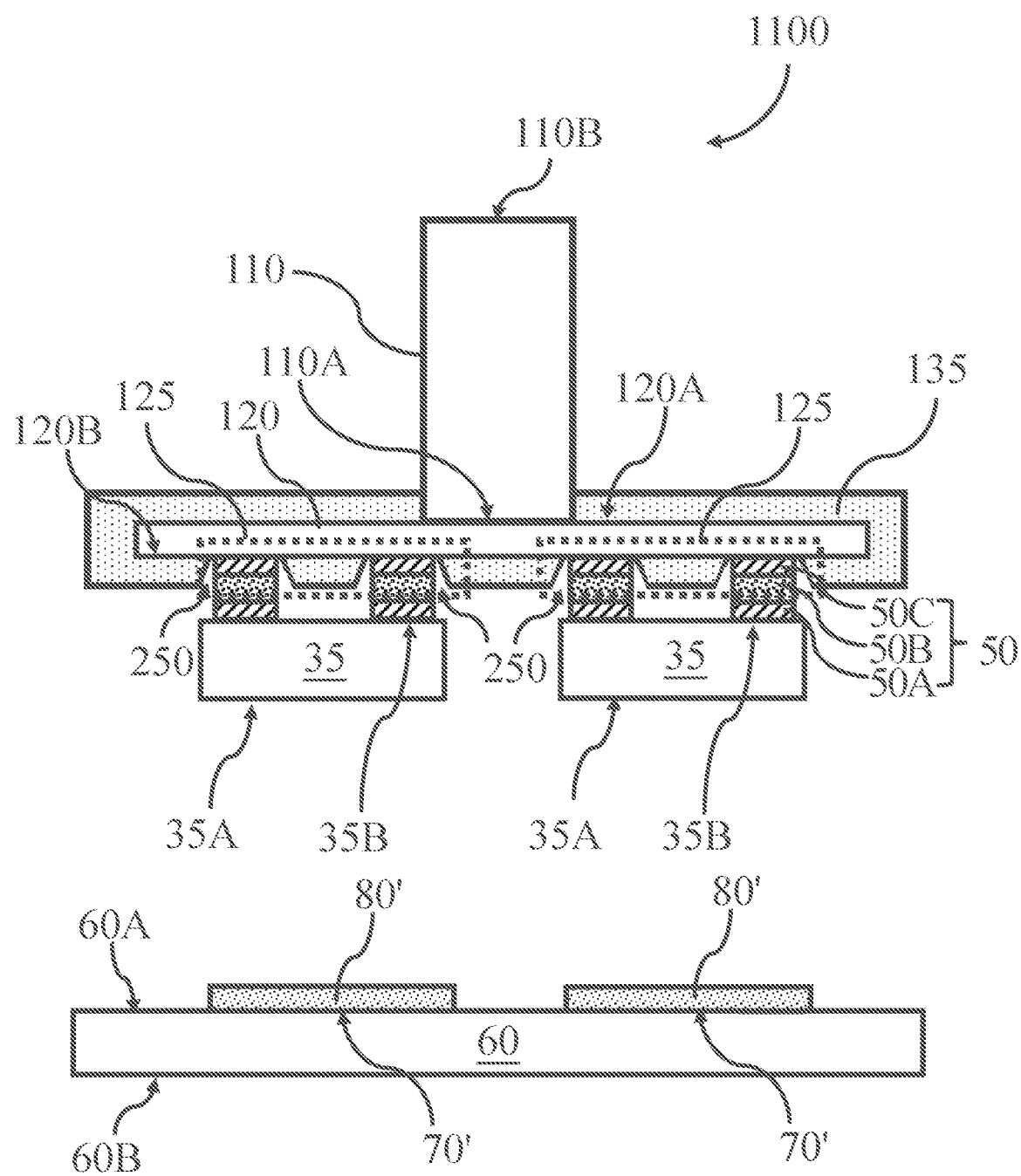

Next, referring to FIG. 26D. The target substrate 60 was moved into the apparatus for transferring microdevice 1100 after the temporary carrier substrate 20 was moved out of the apparatus for transferring microdevice 1100, wherein the target substrate 60 was located below the first magnetic attracting substrate 120 and faced the second surface 120B of the first magnetic attracting substrate 120 through the fifth surface 60A, and each of the microdevice bonding regions 70' on the fifth surface 60A of the target substrate 60 faced and aligned to each of the microdevice alignment regions 125 on the second surface 120B of the first magnetic attracting substrate 120.

Figure 26E:
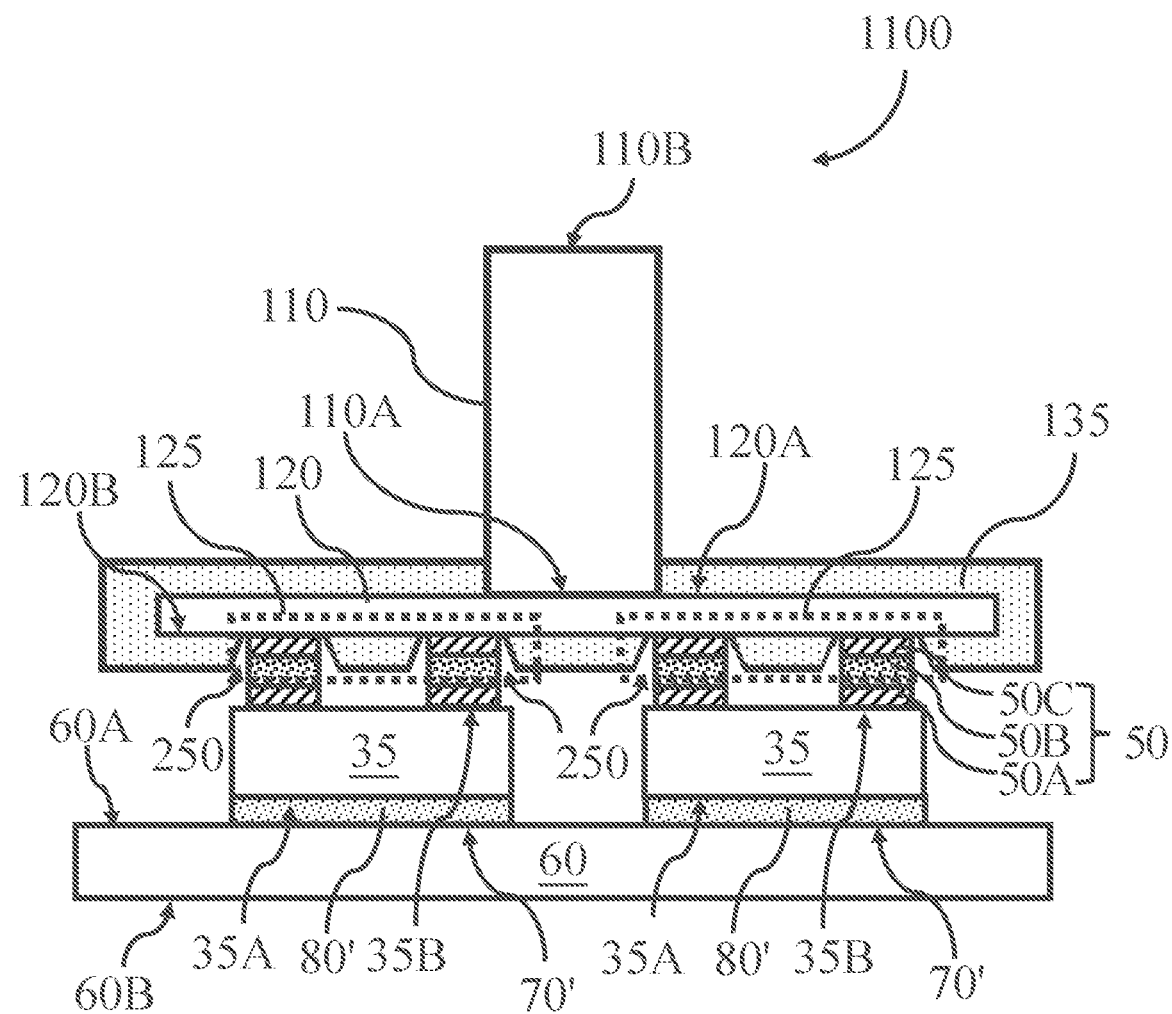

Next, referring to FIG. 26E. The first magnetic attracting substrate 120 was joined with the target substrate 60 to contact each of the microdevices 35 attracted by the magnetic attracting holes 250 in one of the microdevice alignment regions 125 to the conductive bonding layer 80' of the microdevice bonding regions 70' on the fifth surface 60A of the target substrate 60 through the bonding surface 35A thereof.

Figure 26F:
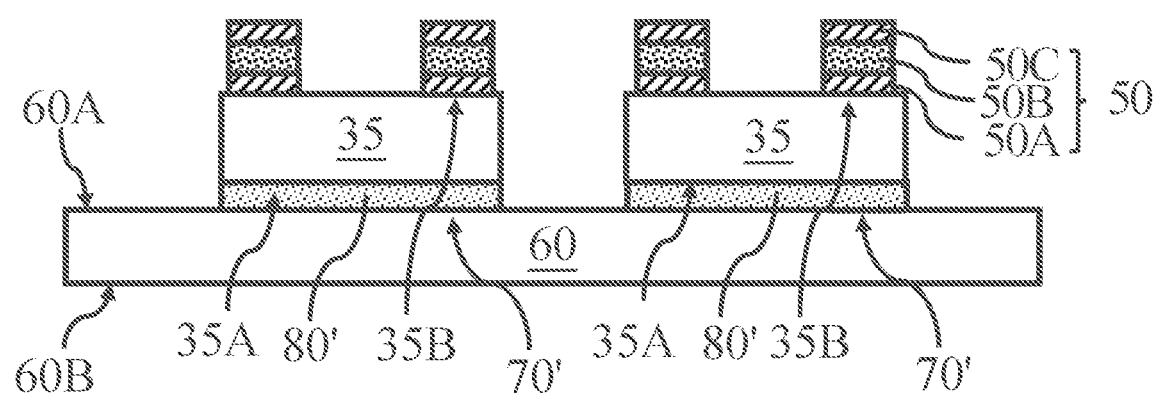

Finally, referring to FIG. 26F. A thermal treatment was applied to make each microdevice 35 bond to each conductive bonding layer 80' of each microdevice bonding region 70' through the bonding surface 35A thereof and separate from one of the alignment region 125 thereafter. Then, the process for transferring the microdevices 35 from the temporary carrier substrate 20 to the target substrate 60 was finished after each microdevice 35 was independently bonded to each conductive bonding layer 80' of each microdevice bonding region 70' on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80'.

Accordingly, microdevices can be mass-transferred and self-aligned since each of the microdevices 35 on the temporary carrier substrate 20 cab be attracted by the magnetic attracting holes 250 in each of the alignment regions 125 through the magnetic attracting layer 50 of the magnetic attracting surface 35B thereof, and transferred to each microdevice bonding regions 70' formed on the target 60 and aligned to each alignment region 125 thereafter.

Embodiment 12

Figure 27A:
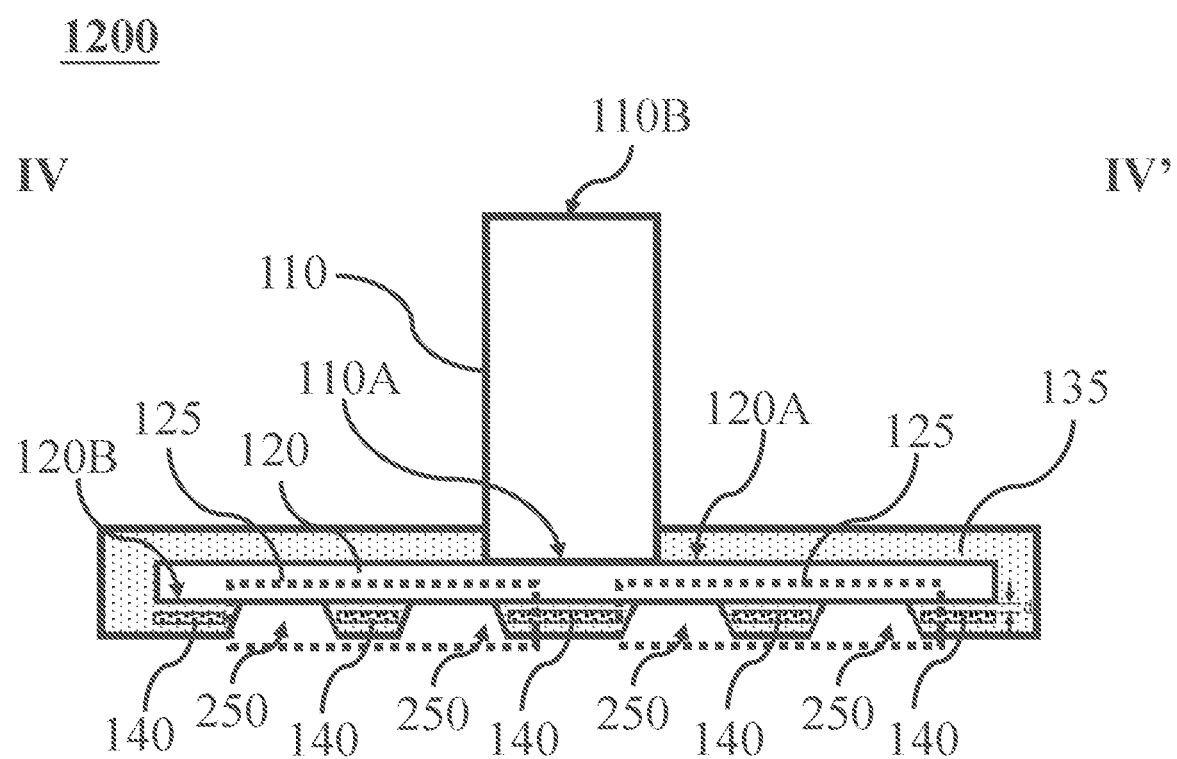
FIGS. 27A~27C are respectively a cross-sectional view, a top view and a bottom view of an apparatus for transferring microdevice 1200 of Embodiment 12 of this invention.
Figure 27B:
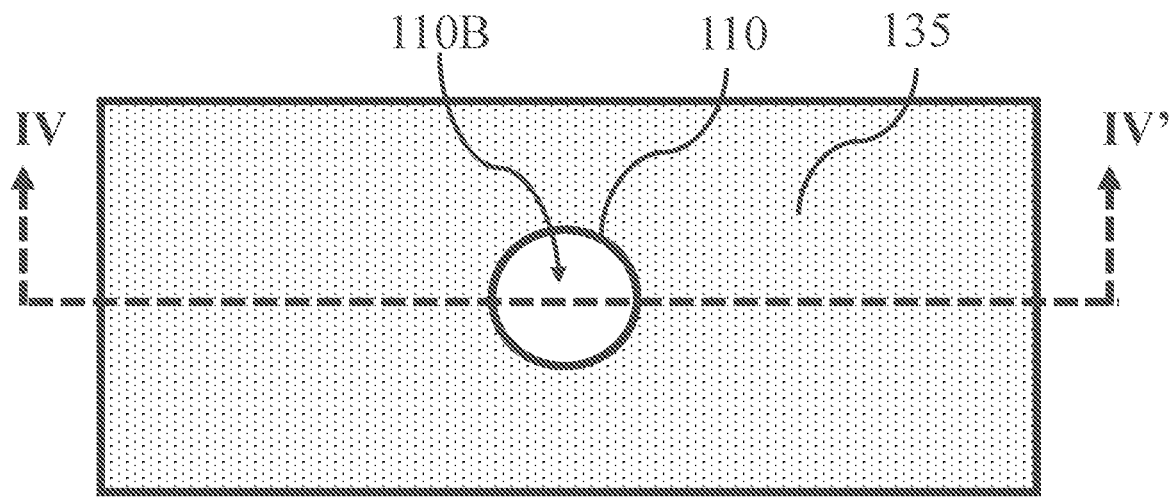
Figure 27C:
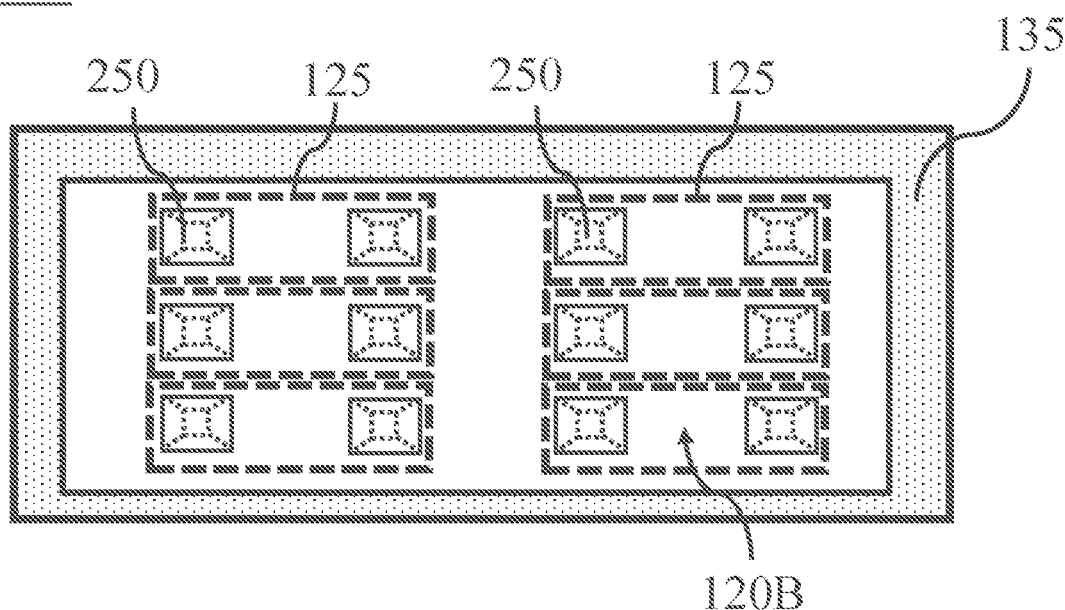

Please refer to FIGS. 27A~27C, 20A~20B, 21A~21B and 28A~28F. FIGS. 27A~27C are respectively a cross-sectional view, a top view and a bottom view of an apparatus for transferring microdevice 1200 of Embodiment 12 of this invention. FIG. 27A is a cross-sectional view along with the cross-section line IV-IV' shown in FIG. 27B. FIG. 20A is a top view of a temporary carrier substrate 20 with a plurality of microdevices 35 to be transferred formed thereon. FIG. 20B is a cross-sectional view of the temporary carrier substrate 20 along with the cross-sectional line V-V' shown in FIG. 20A. FIG. 21A is a top view of a target substrate 60 with a plurality of microdevice bonding regions 70' formed thereon, and each of the microdevice bonding regions 70' comprises a conductive bonding layer 80' formed thereon. FIG. 21B is a cross-sectional view of the target substrate 60 along with the cross-sectional line VI-VI' as shown in FIG. 21A. FIGS. 28A~28F are cross-sectional views showing the process according to the method for transferring microdevices of the Embodiment 12.

The apparatus for transferring microdevice 1200 as shown in FIGS. 27A~27C was provided. The structure of the apparatus for transferring microdevice 1200 is similar to the apparatus for transferring microdevice 1100 shown in FIGS. 25A~25C except that the insulating layer 130 of the apparatus for transferring microdevice 1200 further comprises a magnetic shielding layer 140 disposed adjacent to the second surface 120B of the first magnetic attracting substrate 120 spaced with a distance d (d>0), wherein the magnetic shielding layer 140 surrounds the magnetic attracting holes 250 in each of the microdevice alignment regions 125.

Next, a temporary carrier substrate 20 with a third surface 20A having a plurality of microdevices 35 spaced to each other and formed thereon and a fourth surface 20B opposite to each other as shown in FIGS. 20A~20B was provided. Each of the microdevices 35 comprises a bonding surface 35A and a magnetic attracting surface 35B opposite to the bonding surface 35A, wherein the bonding surface 35A comprises at least one bonding pad (not shown), and the magnetic attracting surface 35B comprises two or more magnetic attracting layers 50. The microdevices 35 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 21A~21B was provided. The fifth surface 60A comprises a plurality of microdevice bonding regions 70', and each of the microdevice bonding regions 70' has a conductive bonding layer 80' formed thereon. The conductive bonding layer 80' can be for example but not limited to a conductive glue, an anisotropic conductive film (ACF) or a thermal welding metal layer.

Figure 28A:
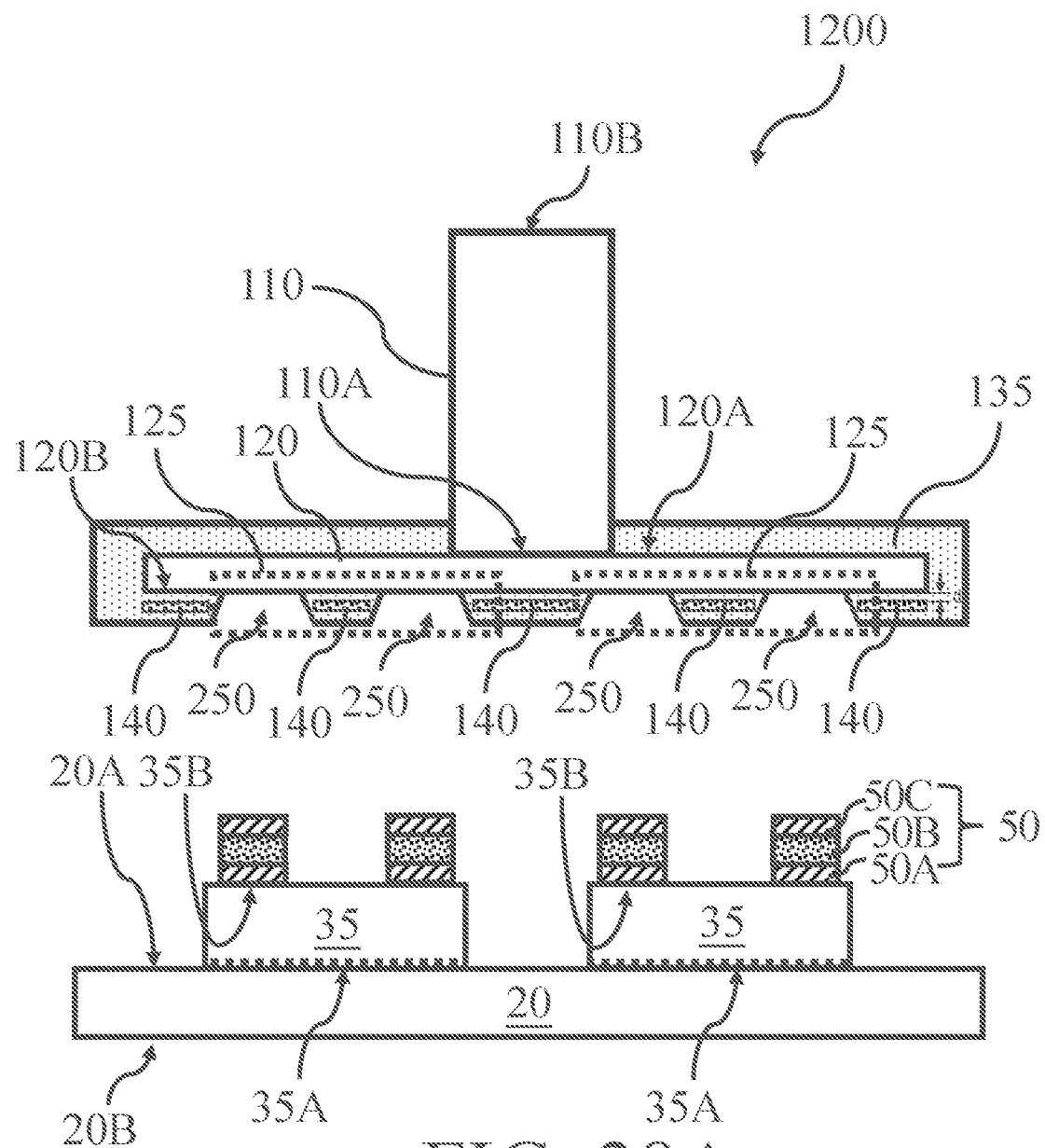
FIGS. 28A~28F are cross-sectional views showing the process according to the method for transferring microdevices of the Embodiment 12.

Next, referring to FIG. 28A. The temporary carrier substrate 20 was moved into the apparatus for transferring microdevice 1200, wherein the temporary carrier substrate 20 was located below the first magnetic attracting substrate 120 and faced the second surface 120B of the first magnetic attracting substrate 120 by the third surface 20A to make each magnetic attracting layer 50B of the magnetic attracting surface 35B of each microdevice 35 on the third surface 20A of the temporary carrier substrate 20 face the microdevice alignment regions 125 of the first magnetic attracting substrate 120. According to one embodiment of this invention, a step of lift-off by laser or UV to lift off the microdevices 35 from the third surface 20A of the temporary carrier substrate 20 as shown in FIG. 20B was optionally proceeded before the step of moving the temporary carrier substrate 20 into the apparatus for transferring microdevice 1200.

Figure 28B:
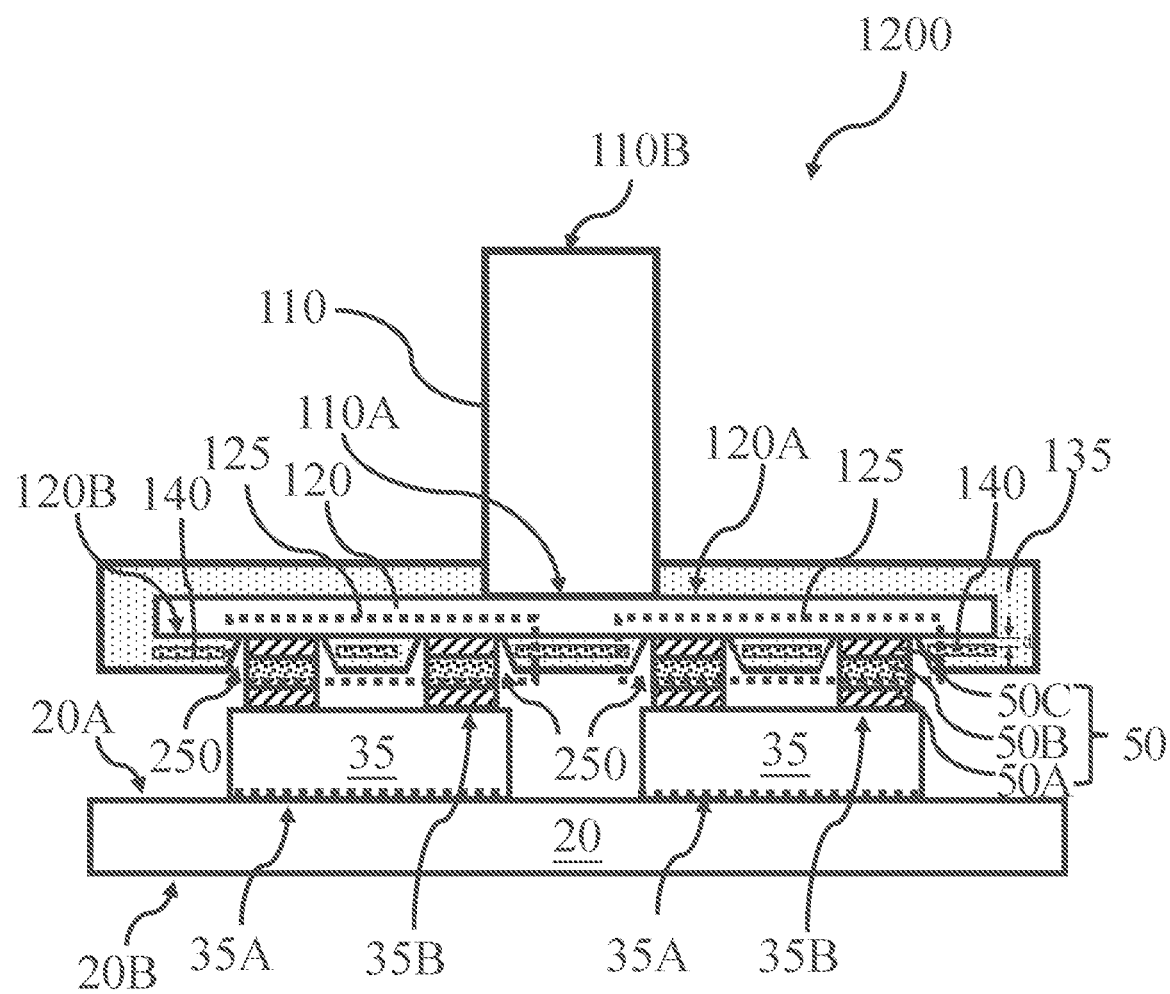
Figure 28C:
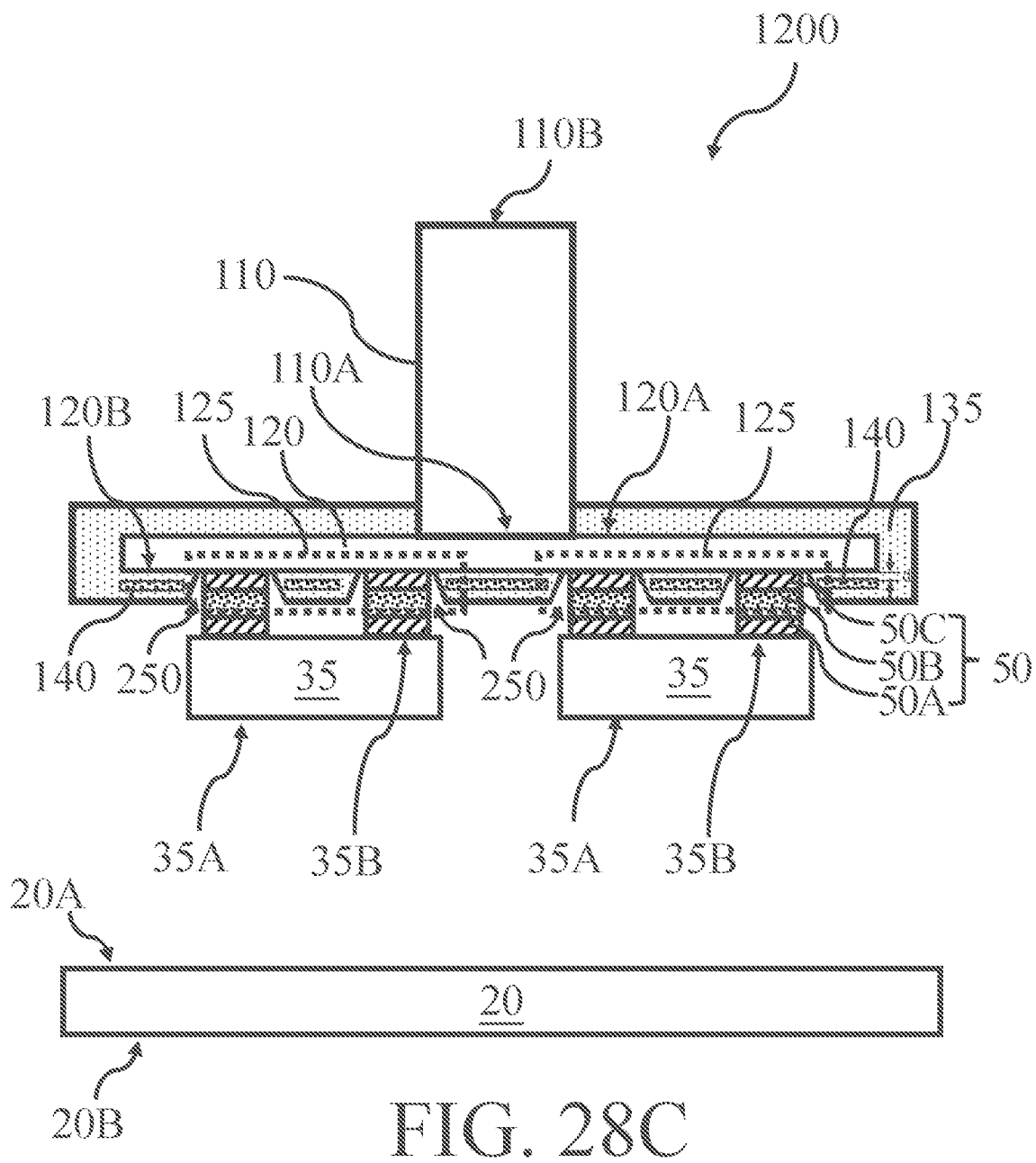

Next, referring to FIGS. 28B~28C. The magnetic field intensity of the first magnet 110 of the apparatus for transferring microdevice 1200 was controlled to make each of the microdevices 35 be attracted by the magnetic attracting holes 250 in each of the microdevice alignment regions 125 through the magnetic attracting layer 50 of the magnetic attracting surface 35B thereof as shown in FIG. 28B and separated from the third surface 20A of the temporary carrier substrate 20 as shown in FIG. 28C.

Figure 28D:
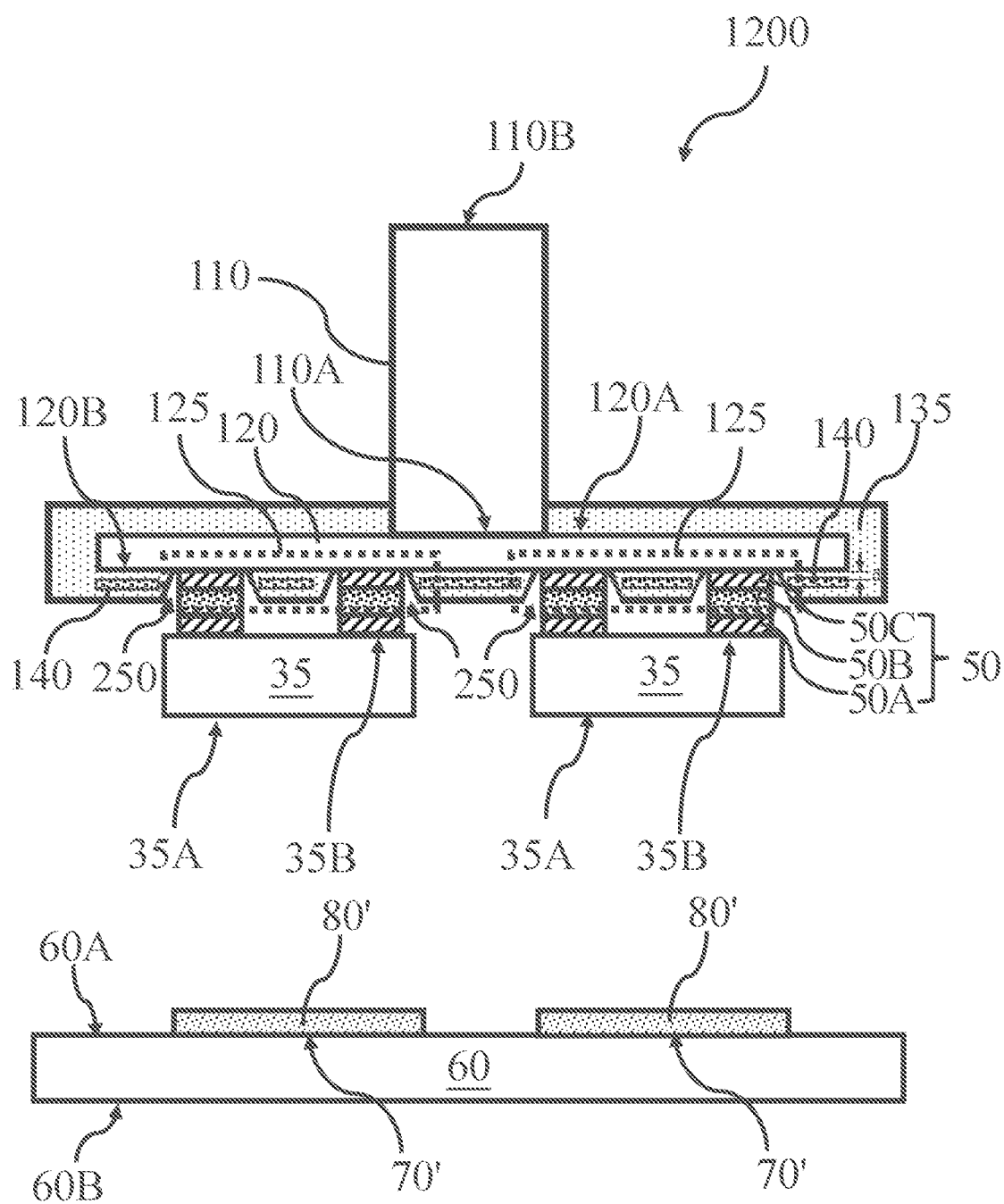

Next, referring to FIG. 28D. The target substrate 60 was moved into the apparatus for transferring microdevice 1200 after the temporary carrier substrate 20 was moved out of the apparatus for transferring microdevice 1200, wherein the target substrate 60 was located below the first magnetic attracting substrate 120 and faced the second surface 120B of the first magnetic attracting substrate 120 through the fifth surface 60A, and each of the microdevice bonding regions 70' on the fifth surface 60A of the target substrate 60 faced and aligned to each of the microdevice alignment regions 125 on the second surface 120B of the first magnetic attracting substrate 120.

Figure 28E:
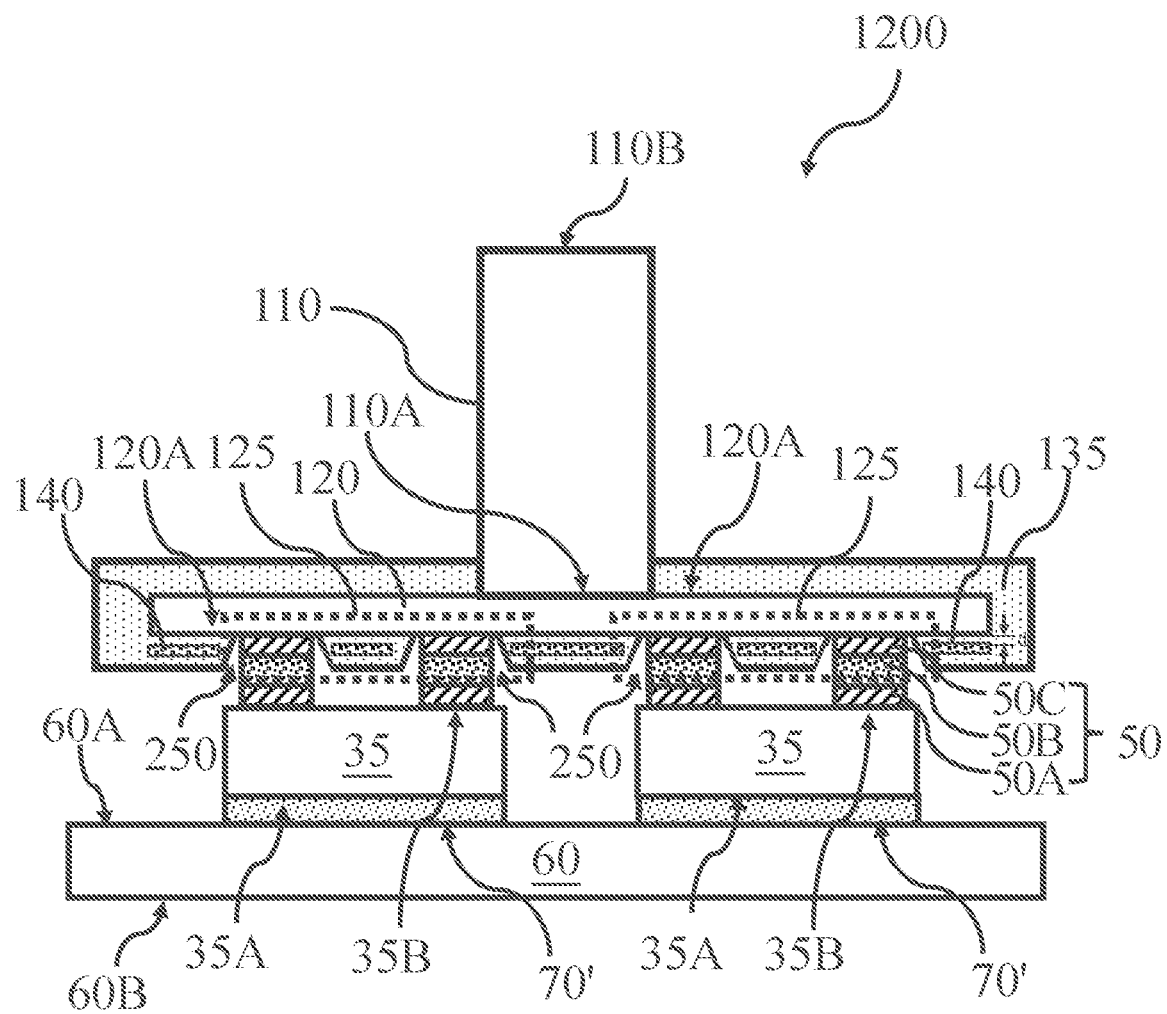

Next, referring to FIG. 28E. The first magnetic attracting substrate 120 was joined with the target substrate 60 to contact each of the microdevices 35 attracted by the magnetic attracting holes 250 in one of the microdevice alignment regions 125 to the conductive bonding layer 80' of the microdevice bonding regions 70' on the fifth surface 60A of the target substrate 60 through the bonding surface 35A thereof.

Figure 28F:
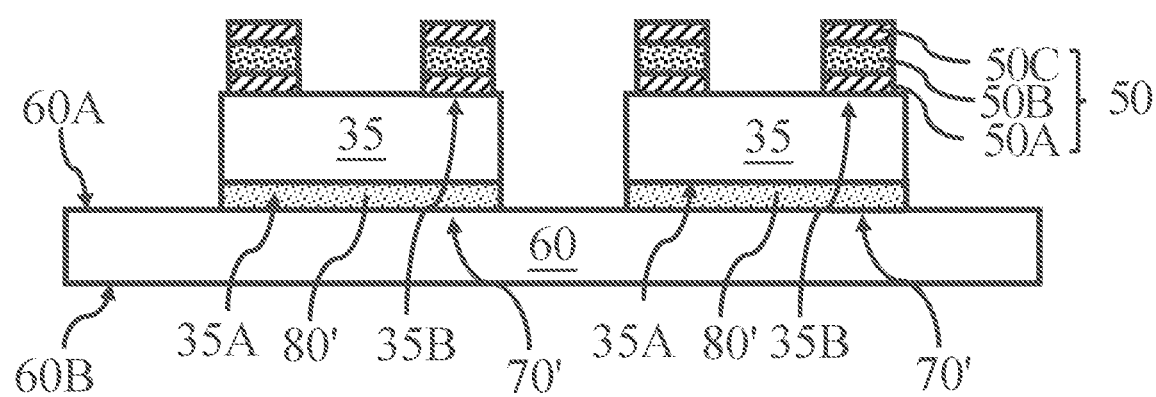

Finally, referring to FIG. 28F. A thermal treatment was applied to make each microdevice 35 bond to each conductive bonding layer 80' of each microdevice bonding region 70' through the bonding surface 35A thereof and separate from one of the alignment region 125 thereafter. Then, the process for transferring the microdevices 35 from the temporary carrier substrate 20 to the target substrate. 60 was finished after each microdevice 35 was independently bonded to each conductive bonding layer 80' of each microdevice bonding region 70' on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80'.

Accordingly, microdevices can be mass-transferred and self-aligned since each of the microdevices 35 on the temporary carrier substrate 20 cab be attracted by the magnetic attracting holes 250 in each of the alignment regions 125 through the magnetic attracting layer 50 of the magnetic attracting surface 35B thereof, and transferred to each microdevice bonding regions 70' formed on the target 60 and aligned to each alignment region 125 thereafter.

Embodiment 13

Figure 29:
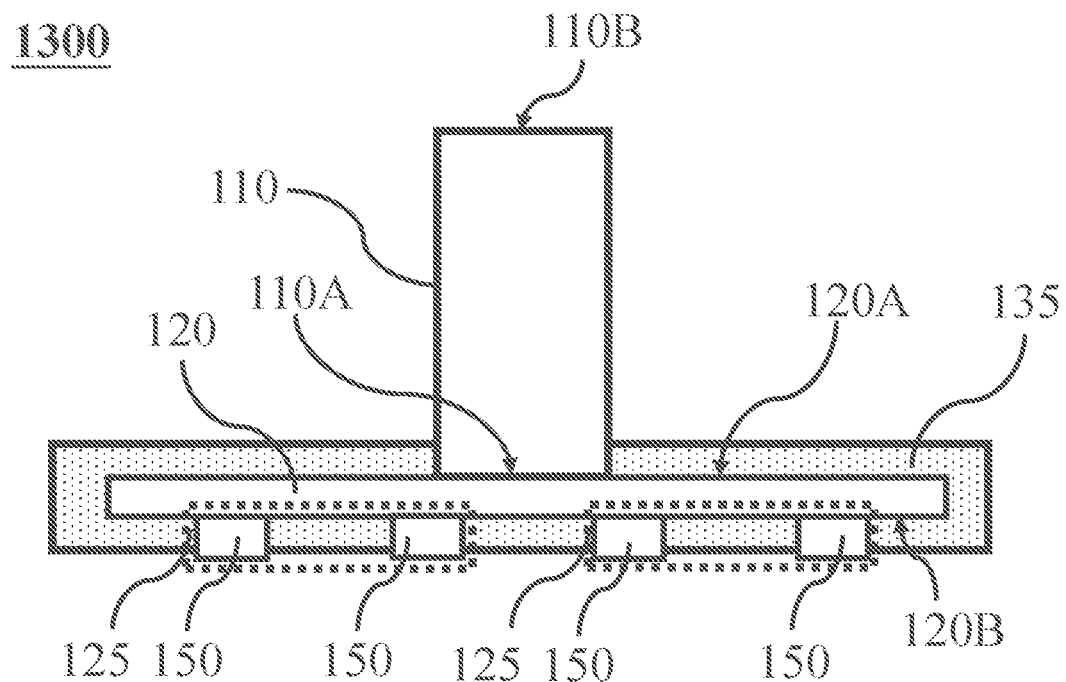
FIG. 29 is a cross-sectional view of an apparatus for transferring microdevice 1300 of Embodiment 13 of this invention.
Figure 29:
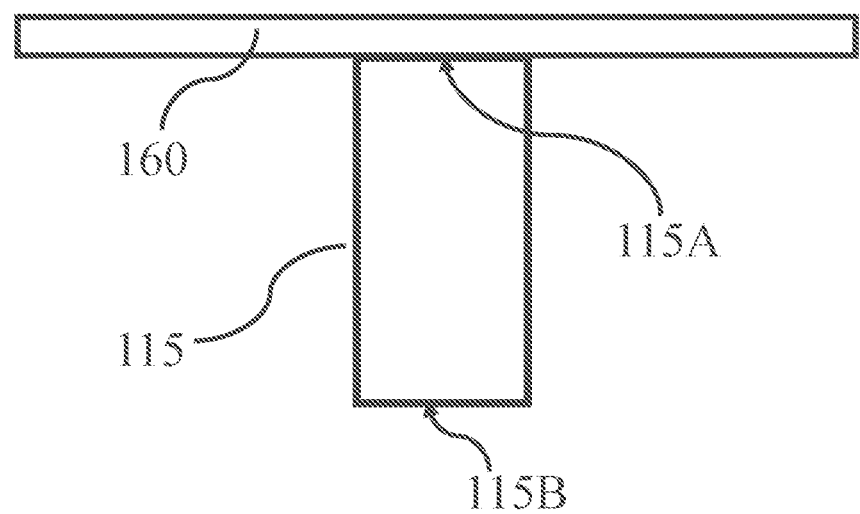

Please refer to FIGS. 29, 20A~20B, 21A~21B and 30A~30F. FIG. 29 is a cross-sectional view of an apparatus for transferring microdevice 1300 of Embodiment 13 of this invention. FIG. 20A is a top view of a temporary carrier substrate 20 with a plurality of microdevices 35 to be transferred formed thereon. FIG. 20B is a cross-sectional view of the temporary carrier substrate 20 along with the cross-sectional line V-V' shown in FIG. 20A. FIG. 21A is a top view of a target substrate 60 with a plurality of microdevice bonding regions 70' formed thereon, and each of the microdevice bonding regions 70' comprises a conductive bonding layer 80' formed thereon. FIG. 21B is a cross-sectional view of the target substrate 60 along with the cross-sectional line VI-VI' as shown in FIG. 21A. FIGS. 30A~30F are cross-sectional views showing the process according to the method for transferring microdevices of the Embodiment 13.

First, an apparatus for transferring microdevice 1300 as shown in FIG. 29 was provided. The structure of the apparatus for transferring microdevice 1300 is similar to that of the apparatus for transferring microdevice 900 as shown in FIGS. 19A~19C except that the apparatus for transferring microdevice 1300 further comprises a second magnet 115 with a third terminal 115A and a fourth terminal 115B opposite to each other and a second magnetic attracting substrate 160, wherein the second magnetic attracting substrate 160 is contacted to the third terminal 115A of the second magnet 115, and the second magnetic substrate 160 is disposed under the first magnetic substrate 120. The second magnet 115 can be a permanent magnet or a electromagnet.

Next, a temporary carrier substrate 20 with a third surface 20A having a plurality of microdevices 35 spaced to each other and formed thereon and a fourth surface 20B opposite to each other as shown in FIGS. 20A~20B was provided. Each of the microdevices 35 comprises a bonding surface 35A and a magnetic attracting surface 35B opposite to the bonding surface 35A, wherein the bonding surface 35A comprises at least one bonding pad (not shown), and the magnetic attracting surface 35B comprises two or more magnetic attracting layers 50. The microdevices 35 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 21A~21B was provided. The fifth surface 60A comprises a plurality of microdevice bonding regions 70', and each of the microdevice bonding regions 70' has a conductive bonding layer 80' formed thereon. The conductive bonding layer 80' can be for example but not limited to a conductive glue, an anisotropic conductive film (ACF) or a thermal welding metal layer.

Figure 30A:
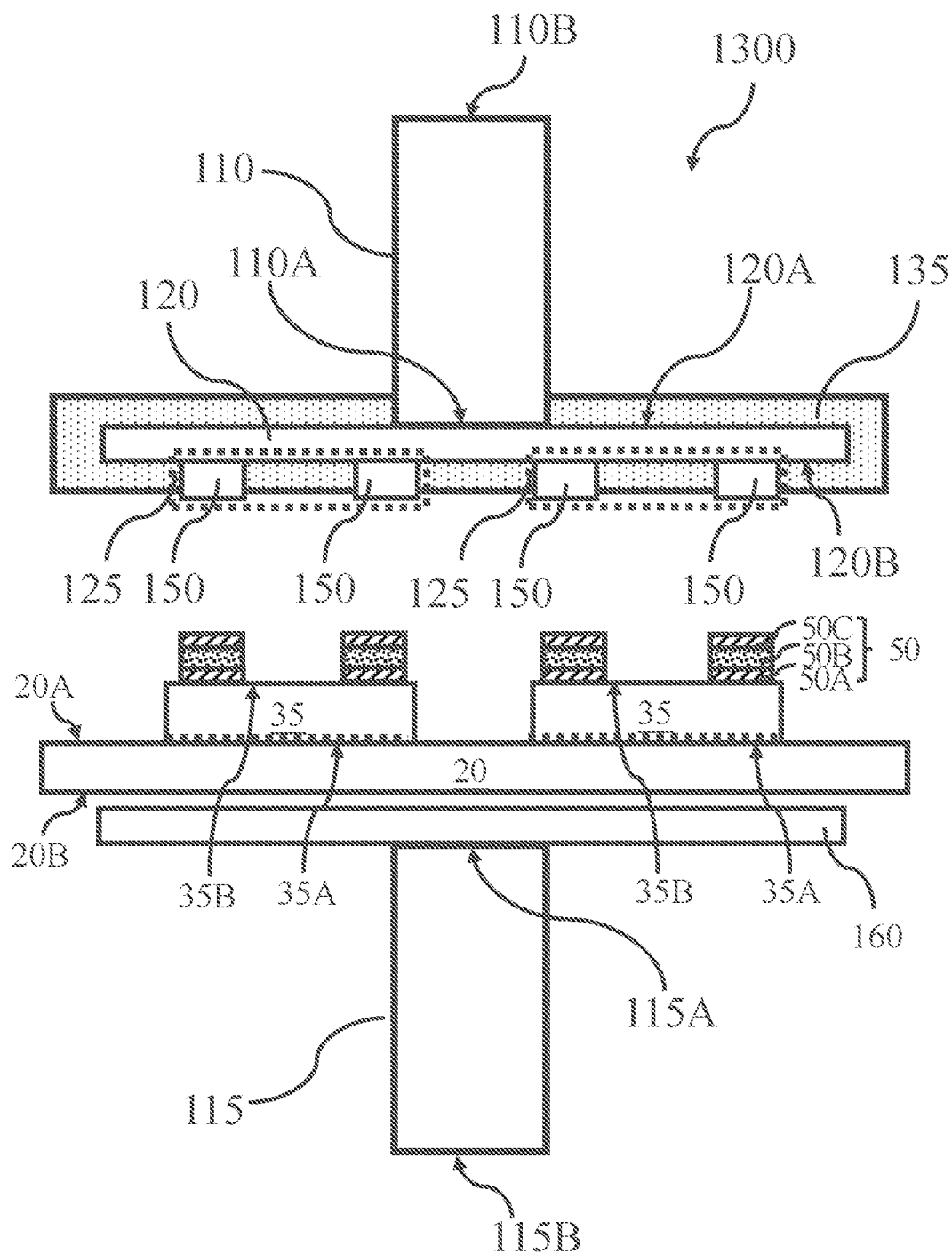
FIGS. 30A~30F are cross-sectional views showing the process according to the method for transferring microdevices of the Embodiment 13.

Next, referring to FIG. 30A. The temporary carrier substrate 20 was moved into the apparatus for transferring microdevice 1300, wherein the temporary carrier substrate 20 was located between the first magnetic attracting substrate 120 and the second magnetic attracting substrate 160, and faced the second surface 120B of the first magnetic attracting substrate 120 by the third surface 20A to make each magnetic attracting layer 50B of the magnetic attracting surface 35B of each microdevice 35 on the third surface 20A of the temporary carrier substrate 20 face the microdevice alignment regions 125 of the first magnetic attracting substrate 120. According to one embodiment of this invention, a step of lift-off by laser or UV to lift off the microdevices 35 from the third surface 20A of the temporary carrier substrate 20 as shown in FIG. 20B was optionally proceeded before the step of moving the temporary carrier substrate 20 into the apparatus for transferring microdevice 1300.

Figure 30B:
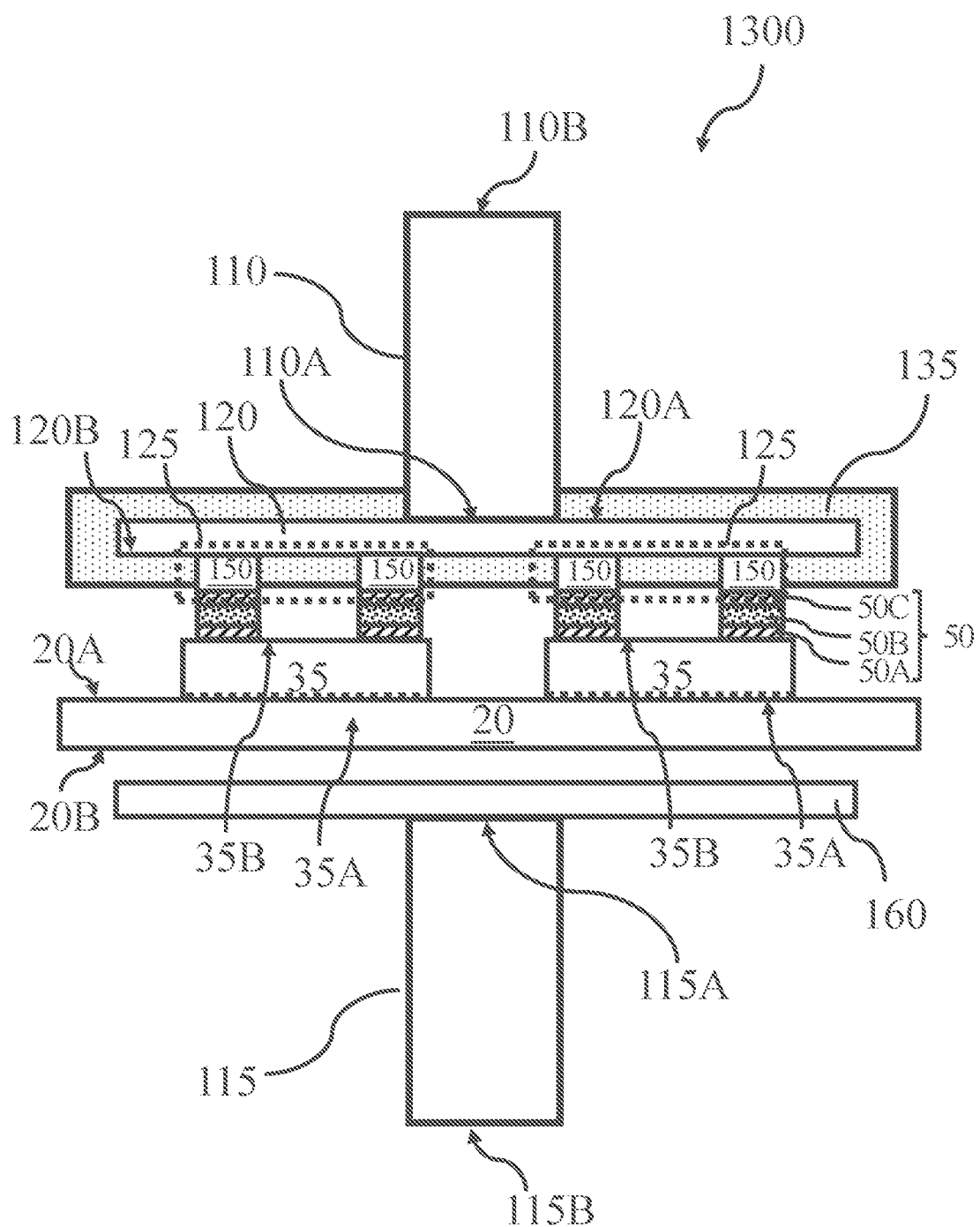
Figure 30C:
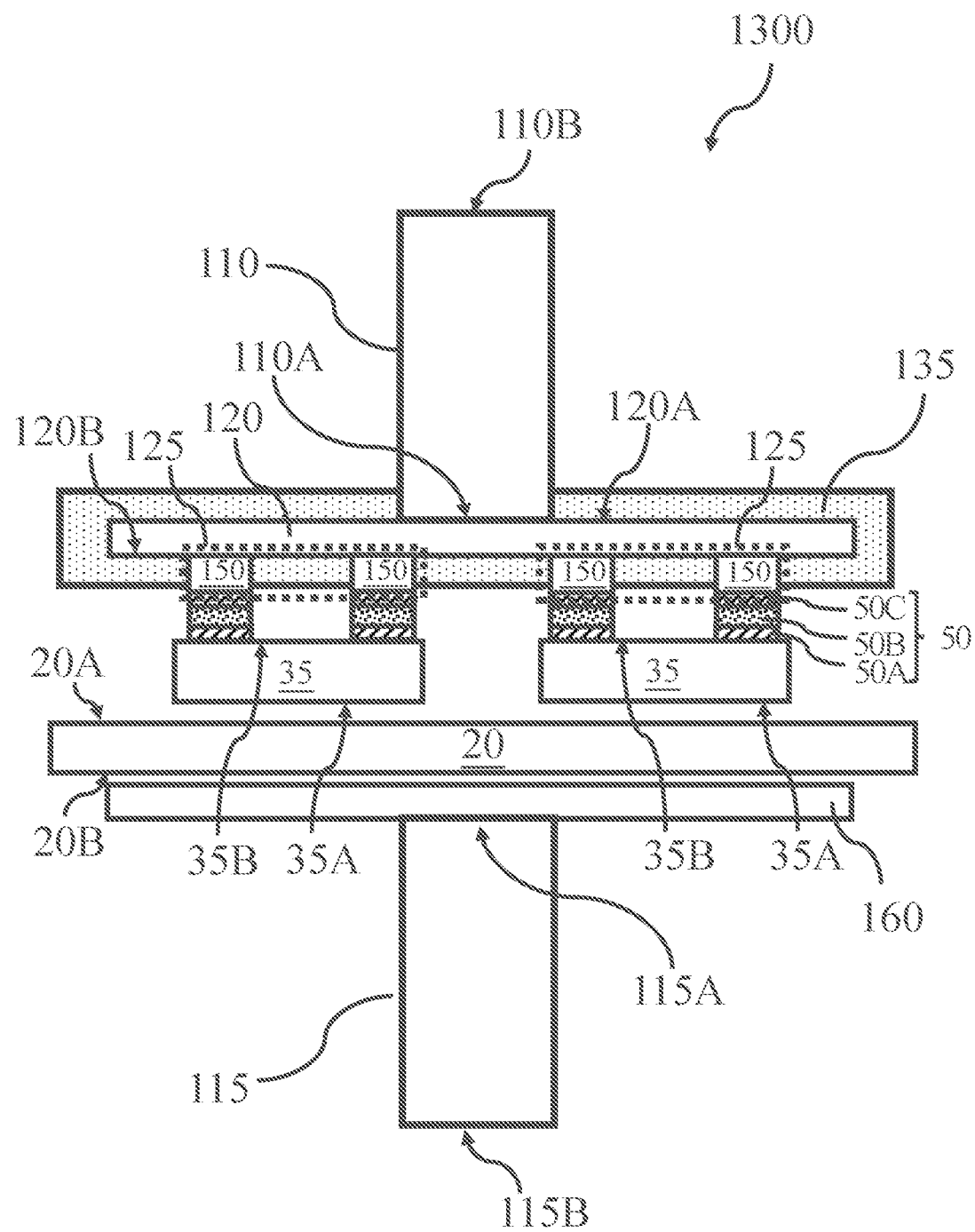

Next, referring to FIGS. 30B~30C. The magnetic field intensity of the first magnet 110 and the second magnet 115 of the apparatus for transferring microdevice 1300 were controlled to make each of the microdevices 35 be attracted by the magnetic attracting heads 150 in each of the microdevice alignment regions 125 through the magnetic attracting layer 50 of the magnetic attracting surface 35B thereof as shown in FIG. 30B and separated from the third surface 20A of the temporary carrier substrate 20 as shown in FIG. 30C. The microdevices 35 on the temporary carrier substrate 20 can sensing greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160. The microdevices 35 on the temporary carrier substrate 20 of this embodiment sensed greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160, and the magnetic field generated by the first magnetic substrate 120 and the second magnetic substrate 160 was stable, thereby the magnetic attracting layer 50 of the magnetic attracting surface 35B of each microdevice 35 was more precisely attracted by one of the magnetic attracting heads 150 in the alignment regions 125.

Figure 30D:
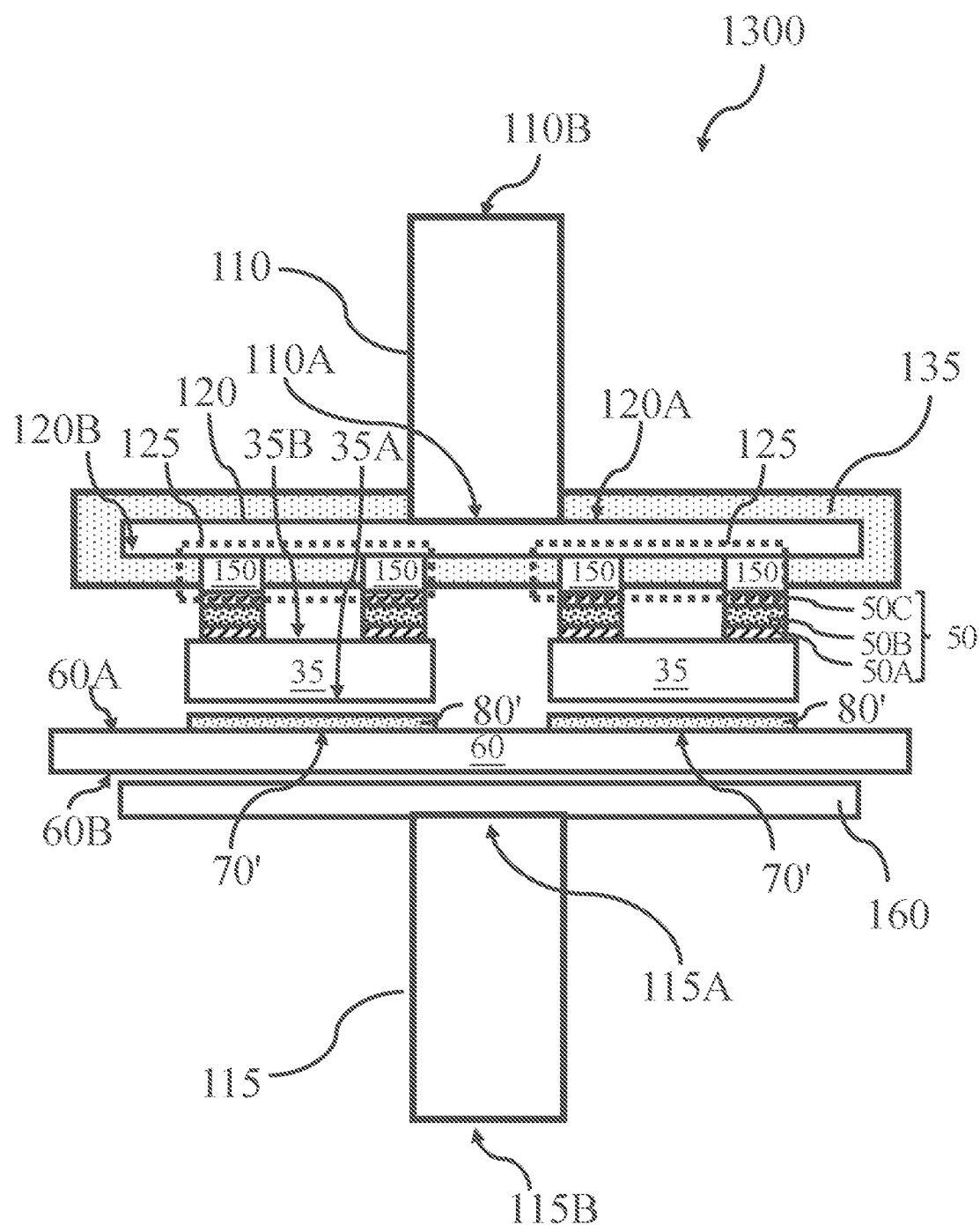

Next, referring to FIG. 30D. The target substrate 60 was moved into the apparatus for transferring microdevice 1300 after the temporary carrier substrate 20 was moved out of the apparatus for transferring microdevice 1300, wherein the target substrate 60 was located below the first magnetic attracting substrate 120 and faced the second surface 120B of the first magnetic attracting substrate 120 through the fifth surface 60A, and each of the microdevice bonding regions 70' on the fifth surface 60A of the target substrate 60 faced and aligned to each of the microdevice alignment regions 125 on the second surface 120B of the first magnetic attracting substrate 120.

Figure 30E:
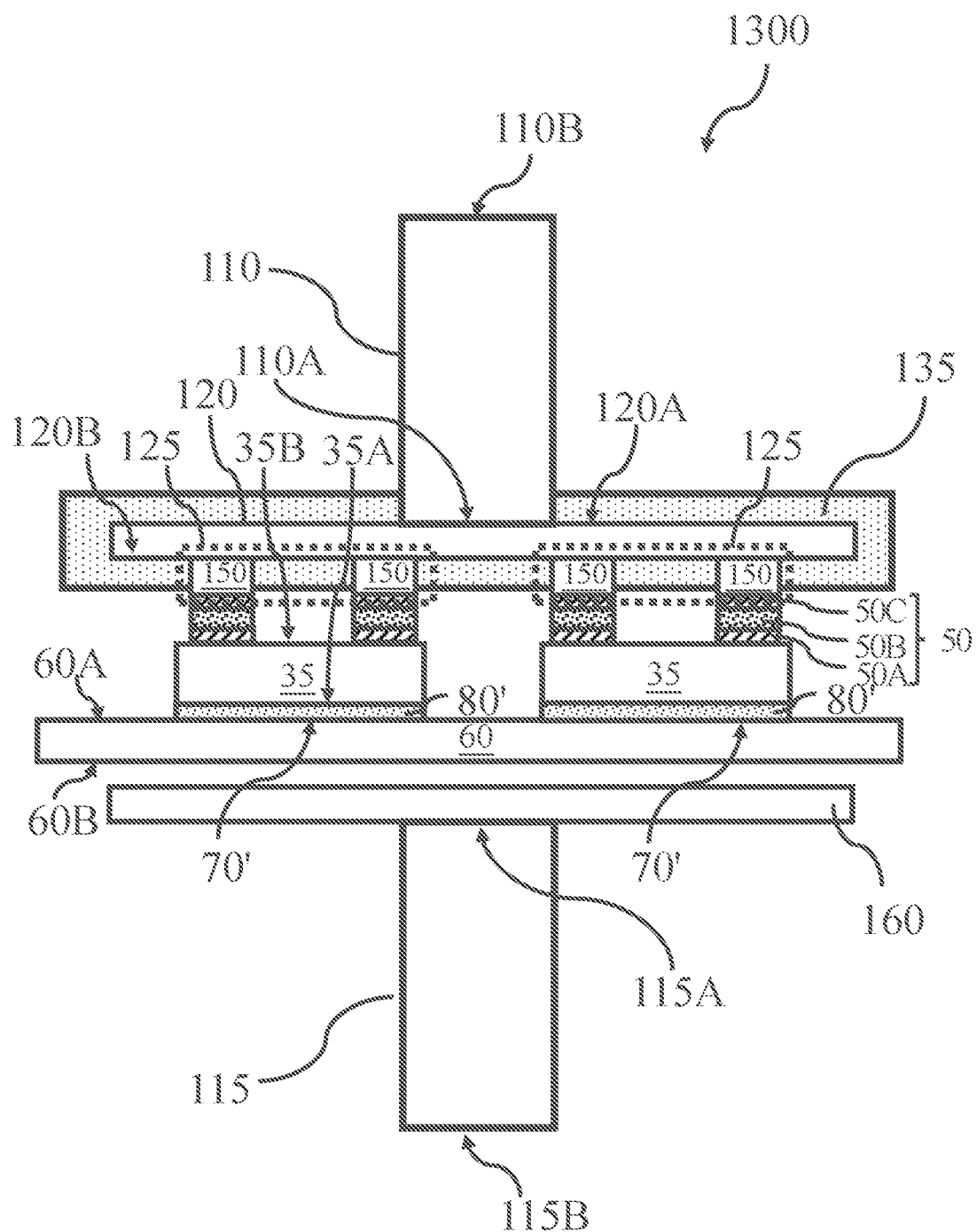

Next, referring to FIG. 30E. The first magnetic attracting substrate 120 was joined with the target substrate 60 to contact each of the microdevices 35 attracted by the magnetic attracting heads 150 in one of the microdevice alignment regions 125 to the conductive bonding layer 80' of the microdevice bonding regions 70' on the fifth surface 60A of the target substrate 60 through the bonding surface 35A thereof.

Figure 30F:
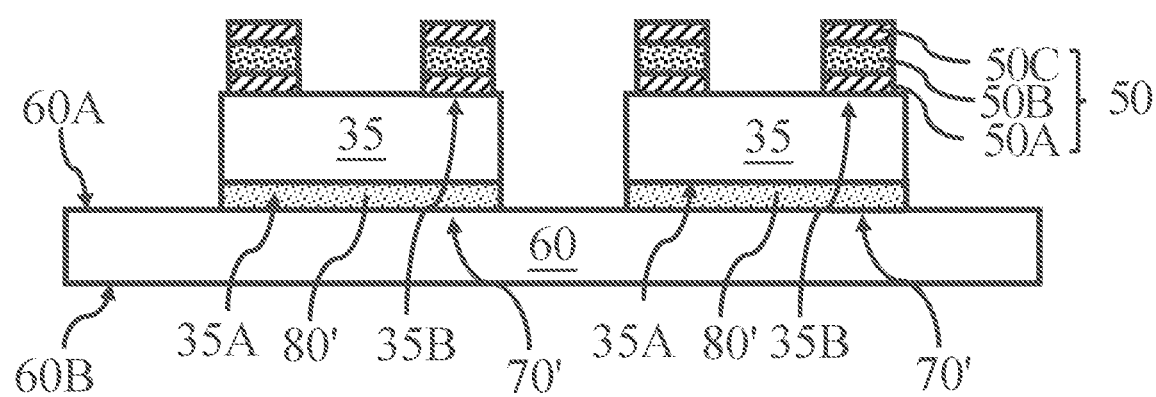

Finally, referring to FIG. 30F. A thermal treatment was applied to make each microdevice 35 bond to each conductive bonding layer 80' of each microdevice bonding region 70' through the bonding surface 35A thereof and separate from one of the alignment region 125 thereafter. Then, the process for transferring the microdevices 35 from the temporary carrier substrate 20 to the target substrate 60 was finished after each microdevice 35 was independently bonded to each conductive bonding layer 80' of each microdevice bonding region 70' on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80'.

Accordingly, microdevices can be mass-transferred and self-aligned since each of the microdevices 35 on the temporary carrier substrate 20 cab be attracted by the magnetic attracting heads 150 in each of the alignment regions 125 through the magnetic attracting layer 50 of the magnetic attracting surface 35B thereof, and transferred to each microdevice bonding regions 70' formed on the target 60 and aligned to each alignment region 125 thereafter.

Embodiment 14

Figure 31:
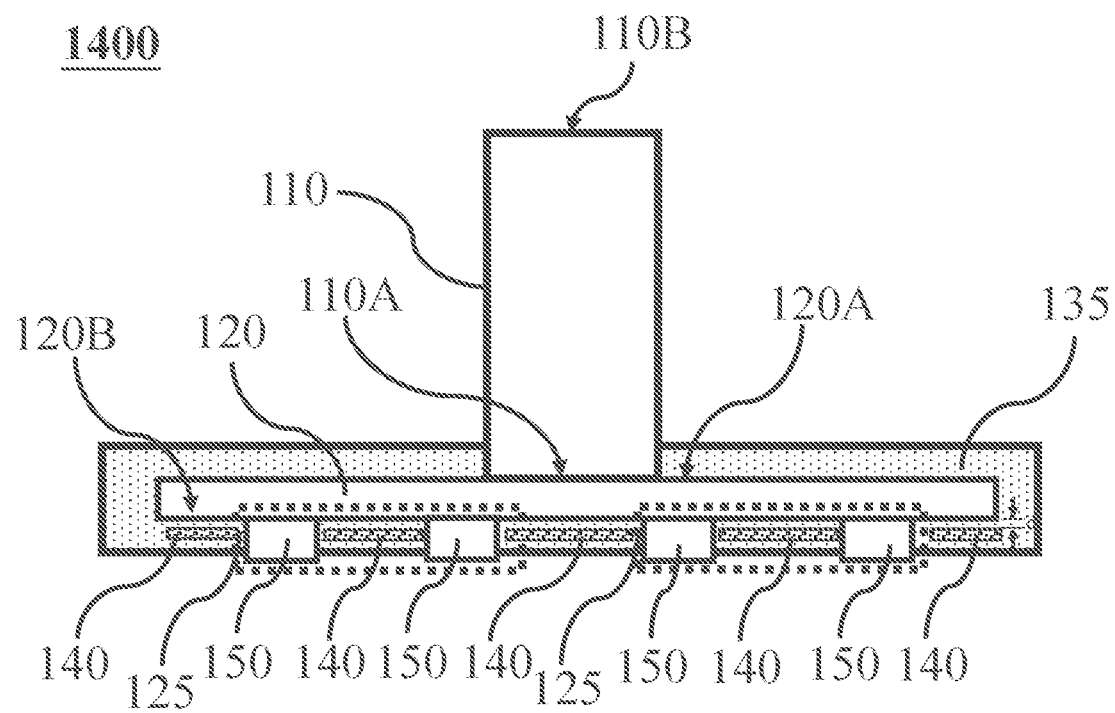
FIG. 31 is a cross-sectional view of an apparatus for transferring microdevice 1400 of Embodiment 14 of this invention.
Figure 31:
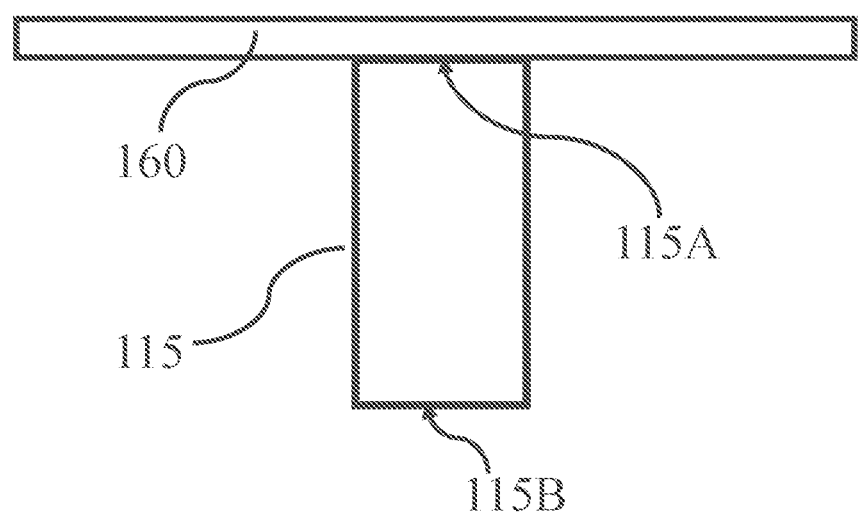

Please refer to FIGS. 31, 20A~20B, 21A~21B and 32A~32F. FIG. 31 is a cross-sectional view of an apparatus for transferring microdevice 1400 of Embodiment 14 of this invention. FIG. 20A is a top view of a temporary carrier substrate 20 with a plurality of microdevices 35 to be transferred formed thereon. FIG. 20B is a cross-sectional view of the temporary carrier substrate 20 along with the cross-sectional line V-V' shown in FIG. 20A. FIG. 21A is a top view of a target substrate 60 with a plurality of microdevice bonding regions 70' formed thereon, and each of the microdevice bonding regions 70' comprises a conductive bonding layer 80' formed thereon. FIG. 21B is a cross-sectional view of the target substrate 60 along with the cross-sectional line VI-VI' as shown in FIG. 21A. FIGS. 32A~32F are cross-sectional views showing the process according to the method for transferring microdevices of the Embodiment 14.

First, an apparatus for transferring microdevice 1400 as shown in FIG. 31 was provided. The structure of the apparatus for transferring microdevice 1400 is similar to that of the apparatus for transferring microdevice 1000 as shown in FIGS. 23A~23C except that the apparatus for transferring microdevice 1400 further comprises a second magnet 115 with a third terminal 115A and a fourth terminal 115B opposite to each other and a second magnetic attracting substrate 160, wherein the second magnetic attracting substrate 160 is contacted to the third terminal 115A of the second magnet 115, and the second magnetic substrate 160 is disposed under the first magnetic substrate 120. The second magnet 115 can be a permanent magnet or a electromagnet.

Next, a temporary carrier substrate 20 with a third surface 20A having a plurality of microdevices 35 spaced to each other and formed thereon and a fourth surface 20B opposite to each other as shown in FIGS. 20A~20B was provided. Each of the microdevices 35 comprises a bonding surface 35A and a magnetic attracting surface 35B opposite to the bonding surface 35A, wherein the bonding surface 35A comprises at least one bonding pad (not shown), and the magnetic attracting surface 35B comprises two or more magnetic attracting layers 50. The microdevices 35 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 21A~21B was provided. The fifth surface 60A comprises a plurality of microdevice bonding regions 70', and each of the microdevice bonding regions 70' has a conductive bonding layer 80' formed thereon. The conductive bonding layer 80' can be for example but not limited to a conductive glue, an anisotropic conductive film (ACF) or a thermal welding metal layer.

Figure 32A:
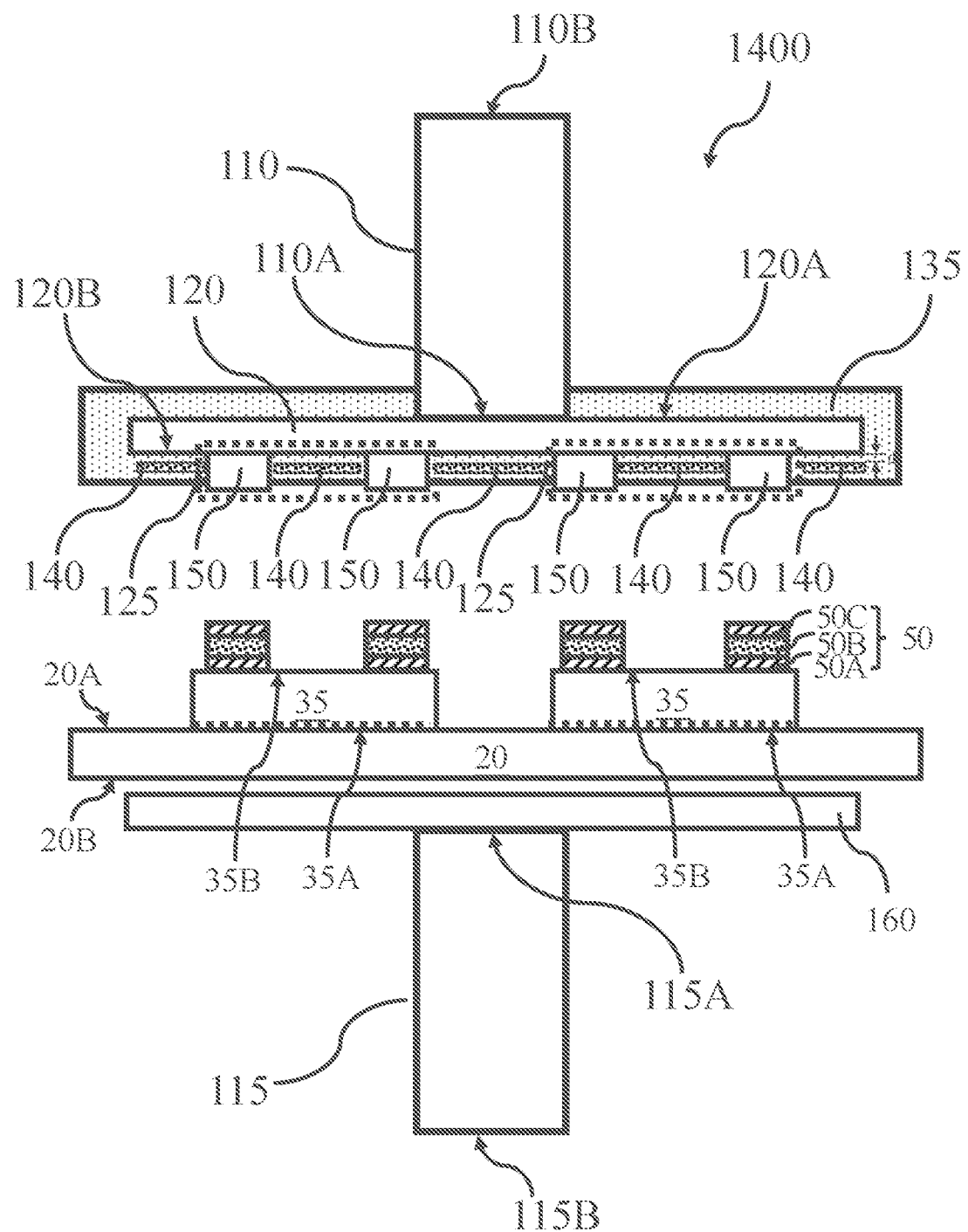
FIGS. 32A~32F are cross-sectional views showing the process according to the method for transferring microdevices of the Embodiment 14.

Next, referring to FIG. 32A. The temporary carrier substrate 20 was moved into the apparatus for transferring microdevice 1400, wherein the temporary carrier substrate 20 was located between the first magnetic attracting substrate 120 and the second magnetic attracting substrate 160, and faced the second surface 120B of the first magnetic attracting substrate 120 by the third surface 20A to make each magnetic attracting layer 50B of the magnetic attracting surface 35B of each microdevice 35 on the third surface 20A of the temporary carrier substrate 20 face the microdevice alignment regions 125 of the first magnetic attracting substrate 120. According to one embodiment of this invention, a step of lift-off by laser or UV to lift off the microdevices 35 from the third surface 20A of the temporary carrier substrate 20 as shown in FIG. 20B was optionally proceeded before the step of moving the temporary carrier substrate 20 into the apparatus for transferring microdevice 1400.

Figure 32B:
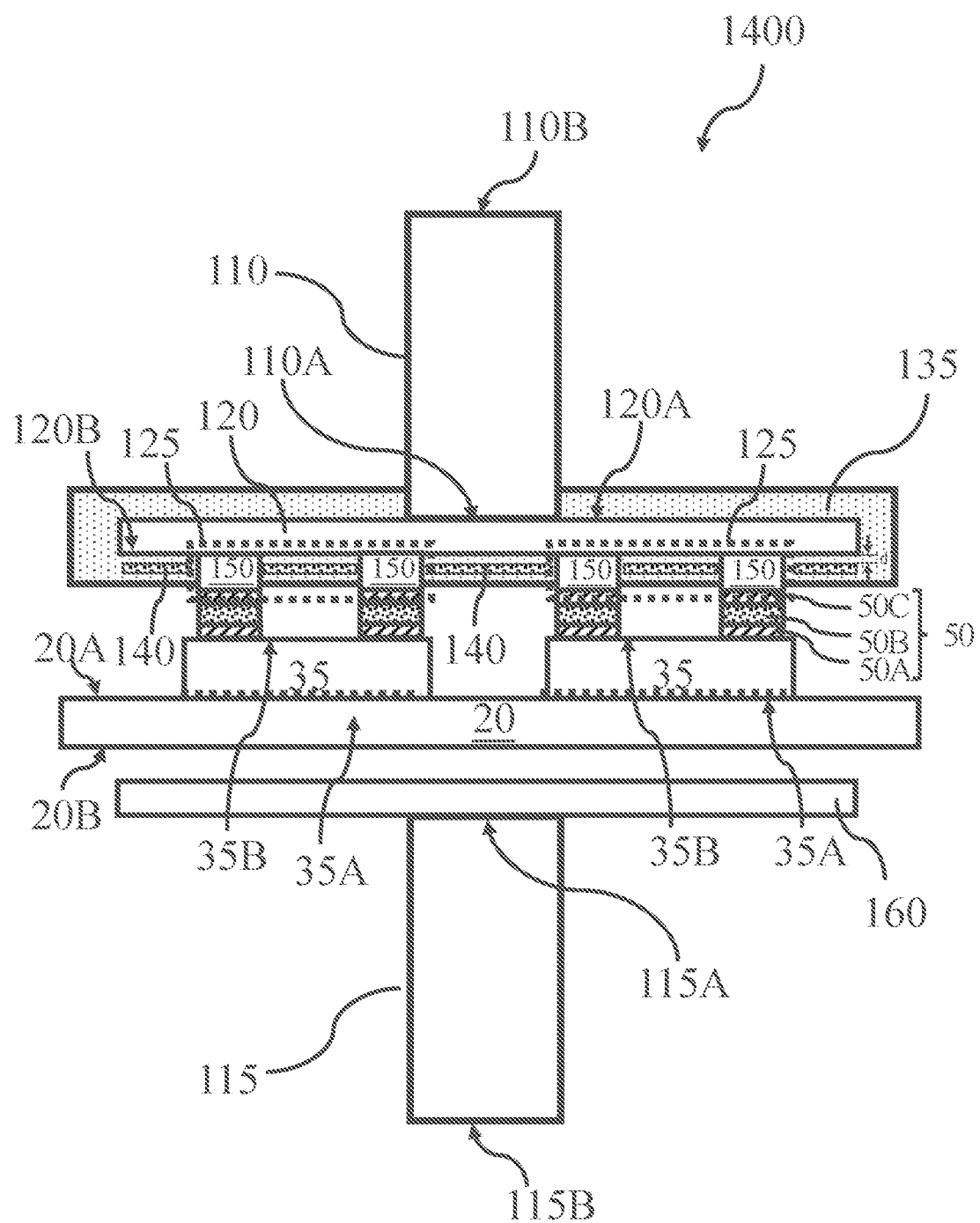
Figure 32C:
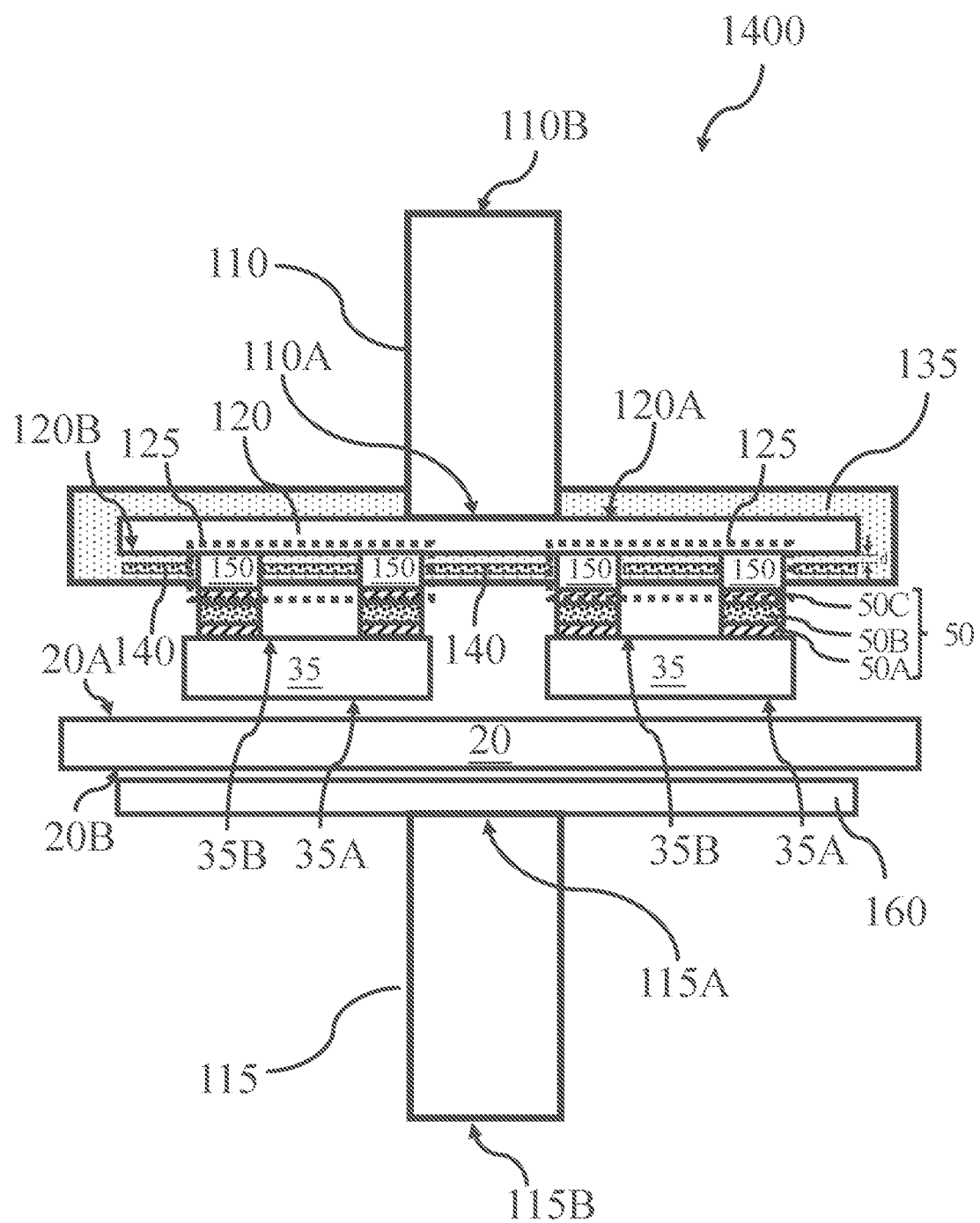

Next, referring to FIGS. 32B~32C. The magnetic field intensity of the first magnet 110 and the second magnet 115 of the apparatus for transferring microdevice 1400 were controlled to make each of the microdevices 35 be attracted by the magnetic attracting heads 150 in each of the microdevice alignment regions 125 through the magnetic attracting layer 50 of the magnetic attracting surface 35B thereof as shown in FIG. 32B and separated from the third surface 20A of the temporary carrier substrate 20 as shown, in FIG. 32C. The microdevices 35 on the temporary carrier substrate 20 can sensing greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160. The microdevices 35 on the temporary carrier substrate 20 of this embodiment sensed greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160, and the magnetic field generated by the first magnetic substrate 120 and the second magnetic substrate 160 was stable, thereby the magnetic attracting layer 50 of the magnetic attracting surface 35B of each microdevice 35 was more precisely attracted by one of the magnetic attracting heads 150 in the alignment regions 125.

Figure 32D:
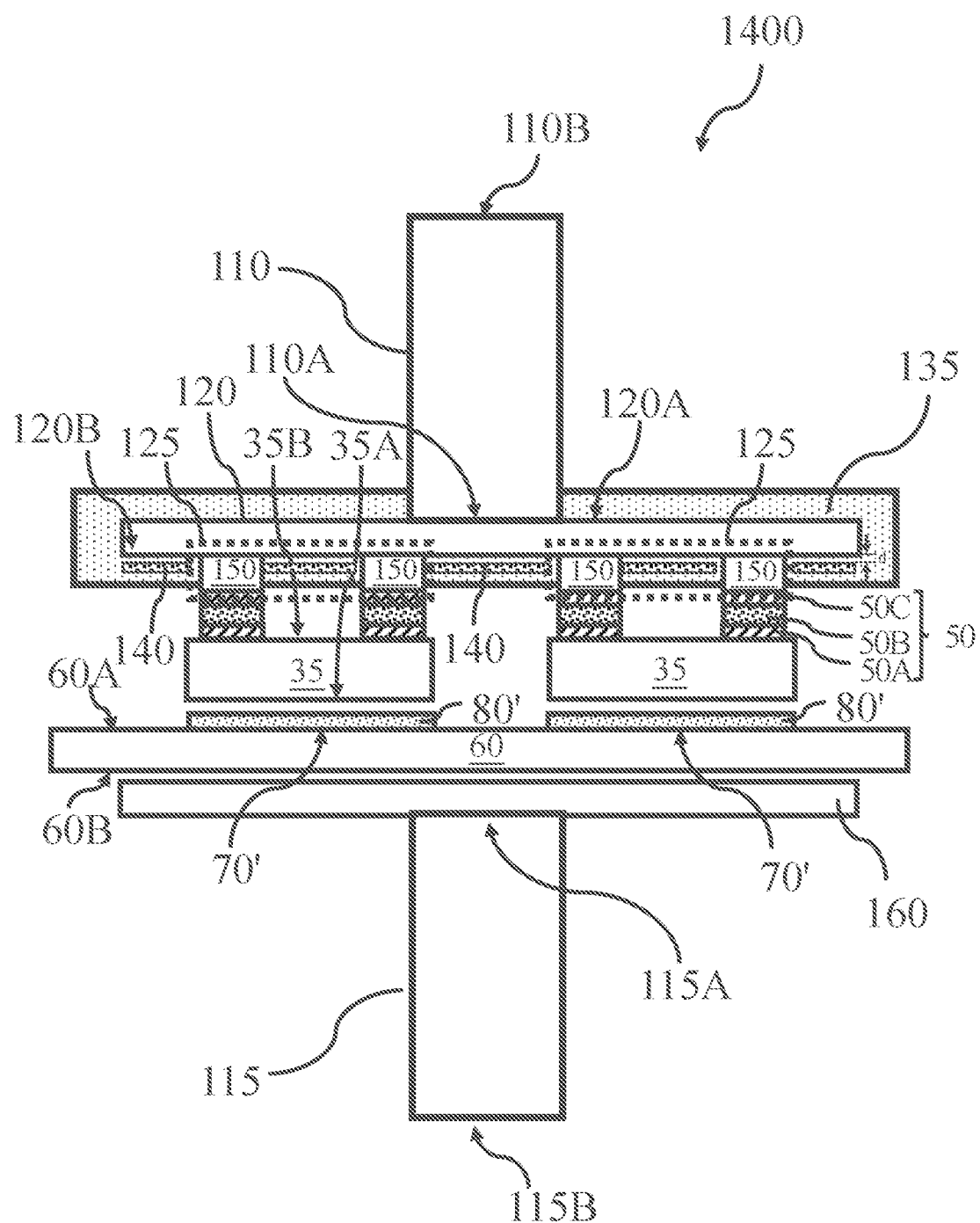

Next, referring to FIG. 32D. The target substrate 60 was moved into the apparatus for transferring microdevice 1400 after the temporary carrier substrate 20 was moved out of the apparatus for transferring microdevice 1400, wherein the target substrate 60 was located below the first magnetic attracting substrate 120 and faced the second surface 120B of the first magnetic attracting substrate 120 through the fifth surface 60A, and each of the microdevice bonding regions 70' on the fifth surface 60A of the target substrate 60 faced and aligned to each of the microdevice alignment regions 125 on the second surface 120B of the first magnetic attracting substrate 120.

Figure 32E:
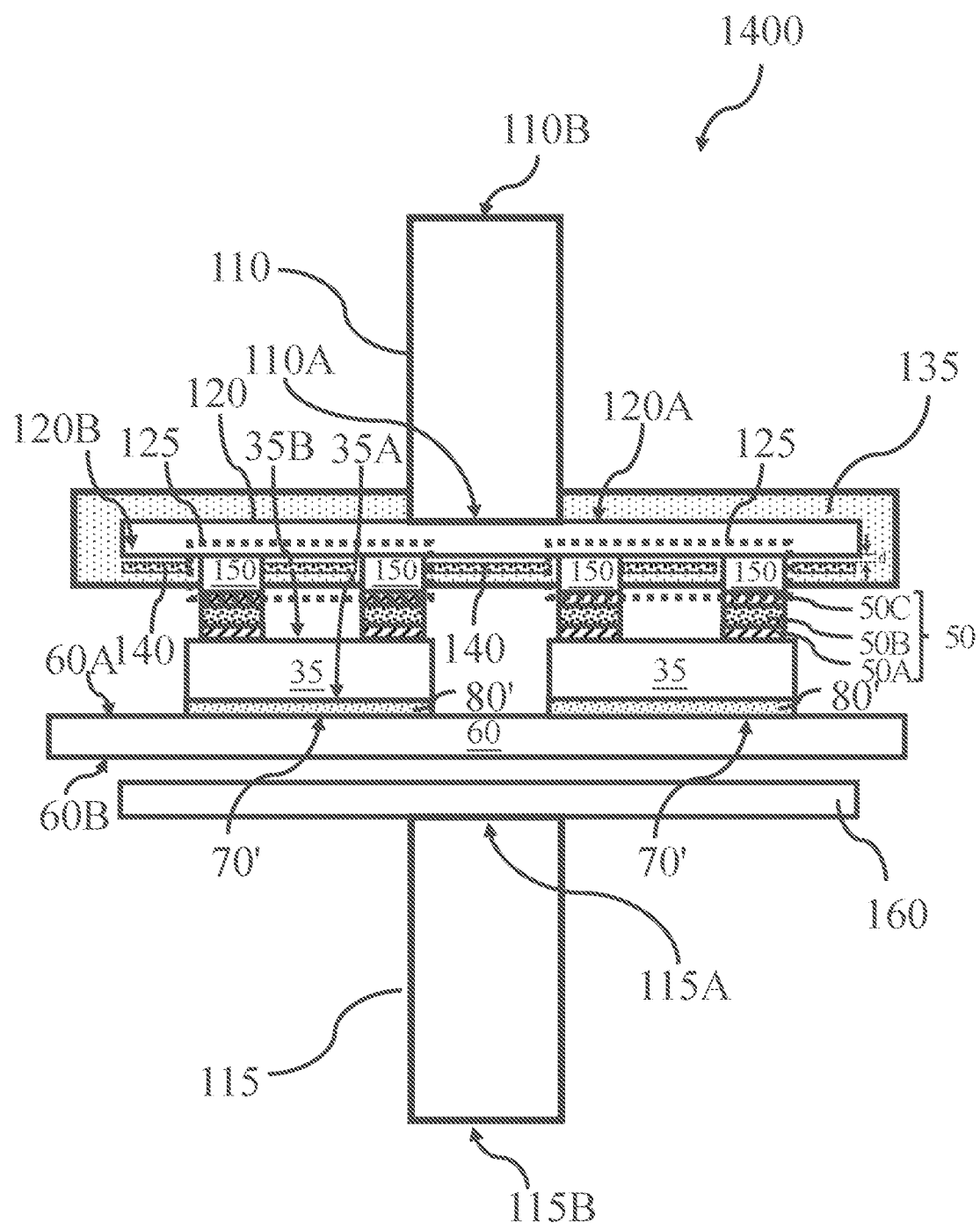

Next, referring to FIG. 32E. The first magnetic attracting substrate 120 was joined with the target substrate 60 to contact each of the microdevices 35 attracted by the magnetic attracting heads 150 in one of the microdevice alignment regions 125 to the conductive bonding layer 80' of the microdevice bonding regions 70' on the fifth surface 60A of the target substrate 60 through the bonding surface 35A thereof.

Figure 32F:
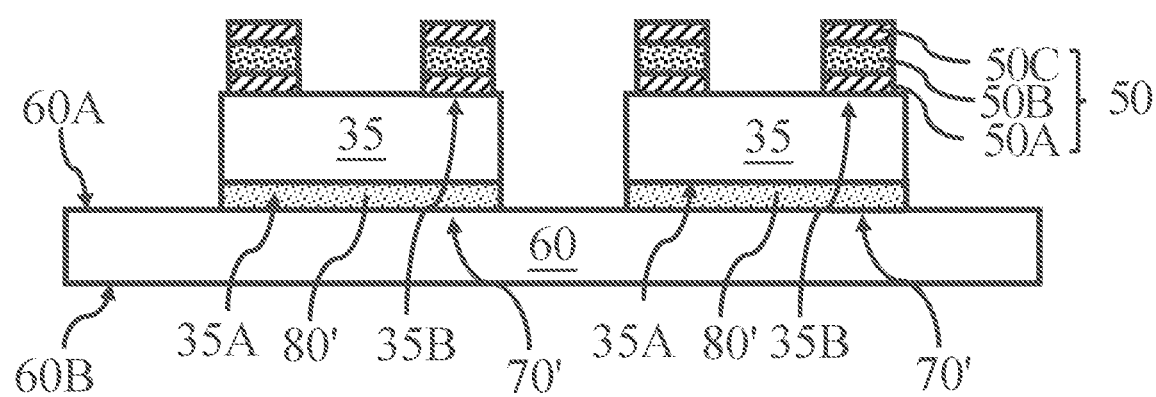

Finally, referring to FIG. 32F. A thermal treatment was applied to make each microdevice 35 bond to each conductive bonding layer 80' of each microdevice bonding region 70' through the bonding surface 35A thereof and separate from one of the alignment region 125 thereafter. Then, the process for transferring the microdevices 35 from the temporary carrier substrate 20 to the target substrate 60 was finished after each microdevice 35 was independently bonded to each conductive bonding layer 80' of each microdevice bonding region 70' on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80'.

Accordingly, microdevices can be mass-transferred and self-aligned since each of the microdevices 35 on the temporary carrier substrate 20 cab be attracted by the magnetic attracting heads 150 in each of the alignment regions 125 through the magnetic attracting layer 50 of the magnetic attracting surface 35B thereof, and transferred to each microdevice bonding regions 70' formed on the target 60 and aligned to each alignment region 125 thereafter.

Embodiment 15

Figure 33:
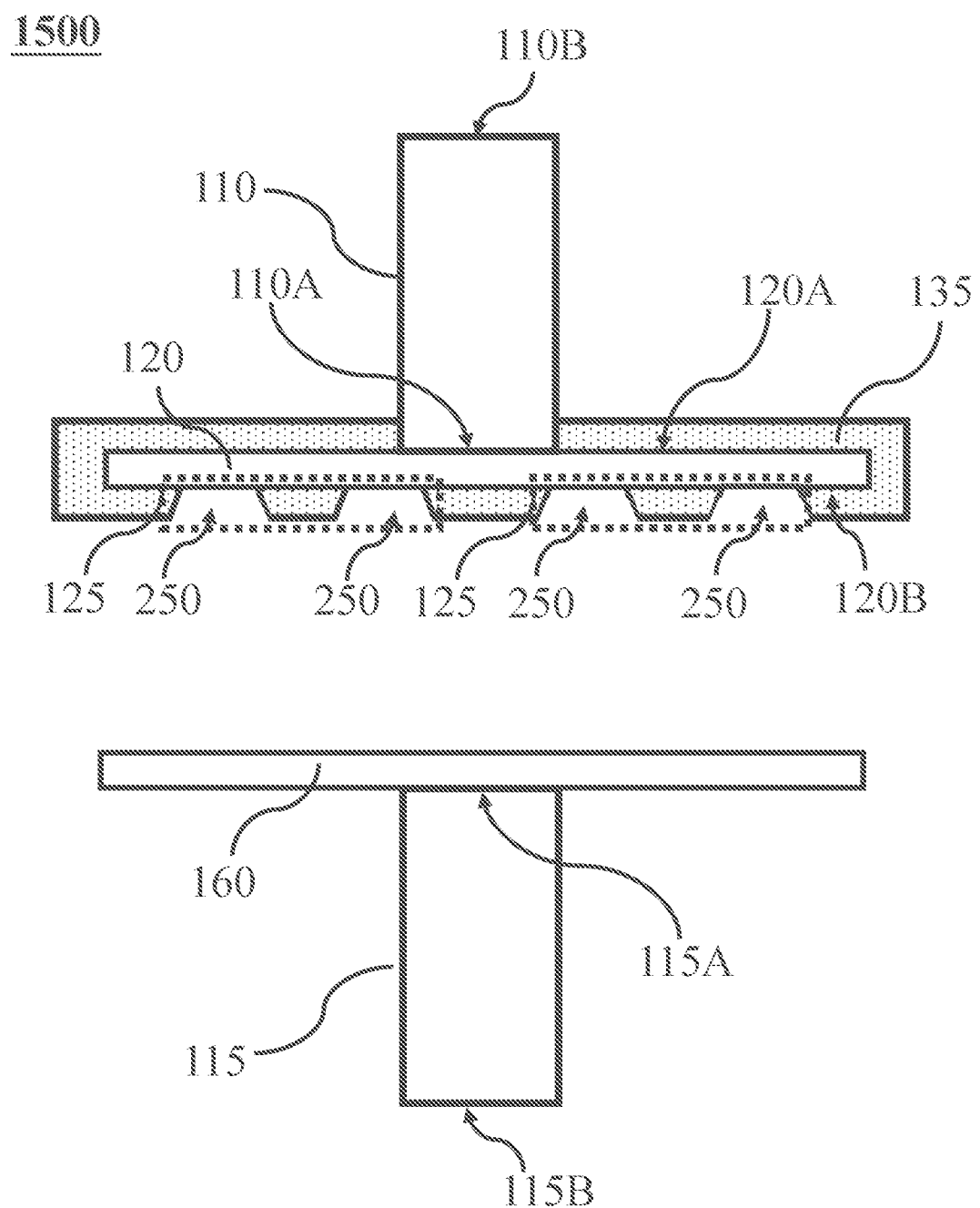
FIG. 33 is a cross-sectional view of an apparatus for transferring microdevice 1500 of Embodiment 15 of this invention.

Please refer to FIGS. 33, 20A~20B, 21A~21B and 34A~34F. FIG. 33 is a cross-sectional view of an apparatus for transferring microdevice 1500 of Embodiment 15 of this invention. FIG. 20A is a top view of a temporary carrier substrate 20 with a plurality of microdevices 35 to be transferred formed thereon. FIG. 20B is a cross-sectional view of the temporary carrier substrate 20 along with the cross-sectional line V-V' shown in FIG. 20A. FIG. 21A is a top view of a target substrate 60 with a plurality of microdevice bonding regions 70' formed thereon, and each of the microdevice bonding regions 70' comprises a conductive bonding layer 80' formed thereon. FIG. 21B is a cross-sectional view of the target substrate 60 along with the cross-sectional line VI-VI' as shown in FIG. 21A. FIGS. 34A~34F are cross-sectional views showing the process according to the method for transferring microdevices of the Embodiment 15.

First, an apparatus for transferring microdevice 1500 as shown in FIG. 33 was provided. The structure of the apparatus for transferring microdevice 1500 is similar to that of the apparatus for transferring microdevice 1100 as shown in FIGS. 25A~25C except that the apparatus for transferring microdevice 1500 further comprises a second magnet 115 with a third terminal 115A and a fourth terminal 115B opposite to each other and a second magnetic attracting substrate 160, wherein the second magnetic attracting substrate 160 is contacted to the third terminal 115A of the second magnet 115, and the second magnetic substrate 160 is disposed under the first magnetic substrate 120. The second magnet 115 can be a permanent magnet or a electromagnet.

Next, a temporary carrier substrate 20 with a third surface 20A having a plurality of microdevices 35 spaced to each other and formed thereon and a fourth surface 20B opposite to each other as shown in FIGS. 20A~20B was provided. Each of the microdevices 35 comprises a bonding surface 35A and a magnetic attracting surface 35B opposite to the bonding surface 35A, wherein the bonding surface 35A comprises at least one bonding pad (not shown), and the magnetic attracting surface 35B comprises two or more magnetic attracting layers 50. The microdevices 35 can be for example but not limited to semiconductor devices, light emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 21A~21B was provided. The fifth surface 60A comprises a plurality of microdevice bonding regions 70', and each of the microdevice bonding regions 70' has a conductive bonding layer 80' formed thereon. The conductive bonding layer 80' can be for example but not limited to a conductive glue, an anisotropic conductive film (ACF) or a thermal welding metal layer.

Figure 34A:
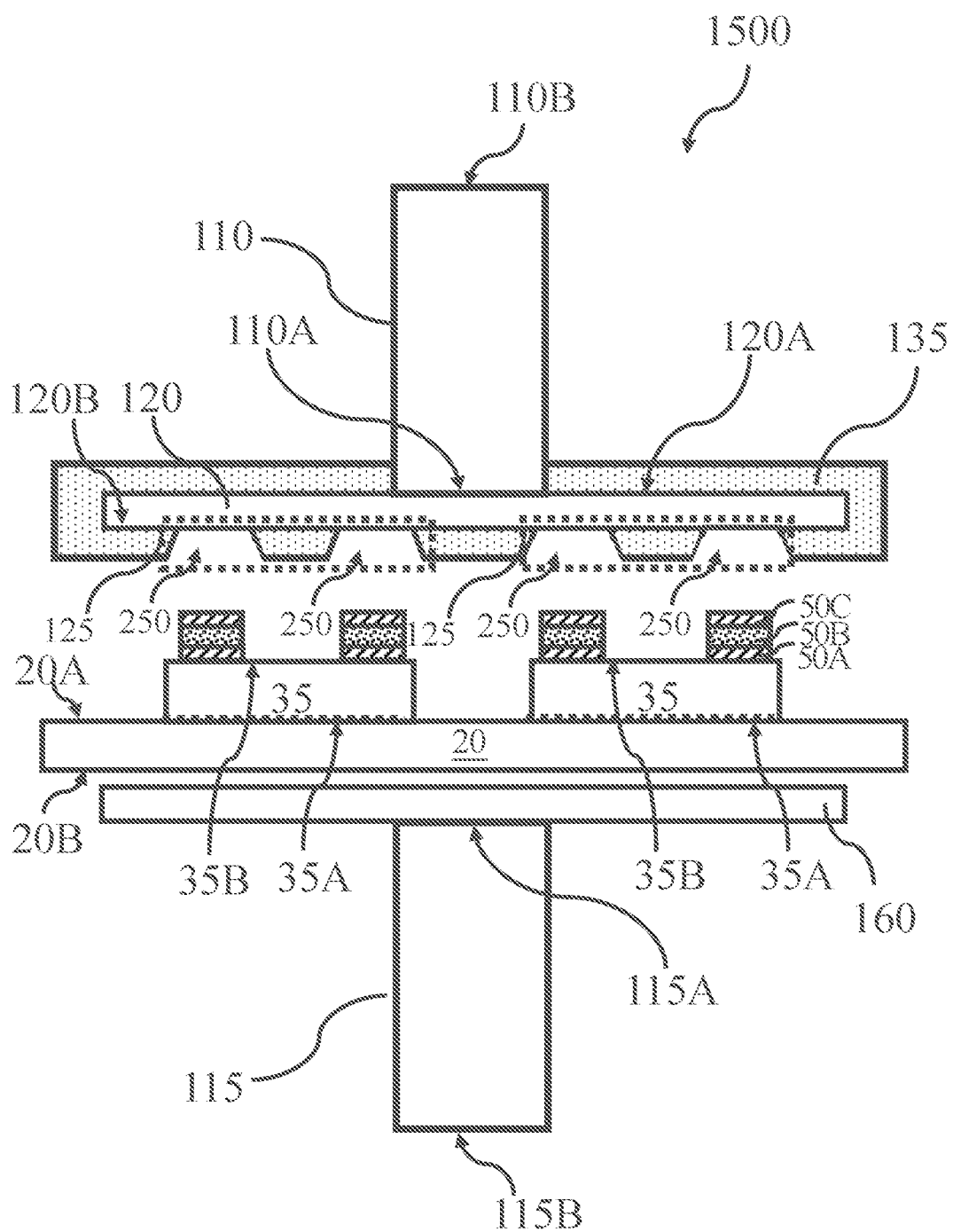
FIGS. 34A~34F are cross-sectional views showing the process according to the method for transferring microdevices of the Embodiment 15.

Next, referring to FIG. 34A. The temporary carrier substrate 20 was moved into the apparatus for transferring microdevice 1500, wherein the temporary carrier substrate 20 was located between the first magnetic attracting substrate 120 and the second magnetic attracting substrate 160, and faced the second surface 120B of the first magnetic attracting substrate 120 by the third surface 20A to make each magnetic attracting layer 50B of the magnetic attracting surface 35B of each microdevice 35 on the third surface 20A of the temporary carrier substrate 20 face the microdevice alignment regions 125 of the first magnetic attracting substrate 120. According to one embodiment of this invention, a step of lift-off by laser or UV to lift off the microdevices 35 from the third surface 20A of the temporary carrier substrate 20 as shown in FIG. 20B was optionally proceeded before the step of moving the temporary carrier substrate 20 into the apparatus for transferring microdevice 1500.

Figure 34B:
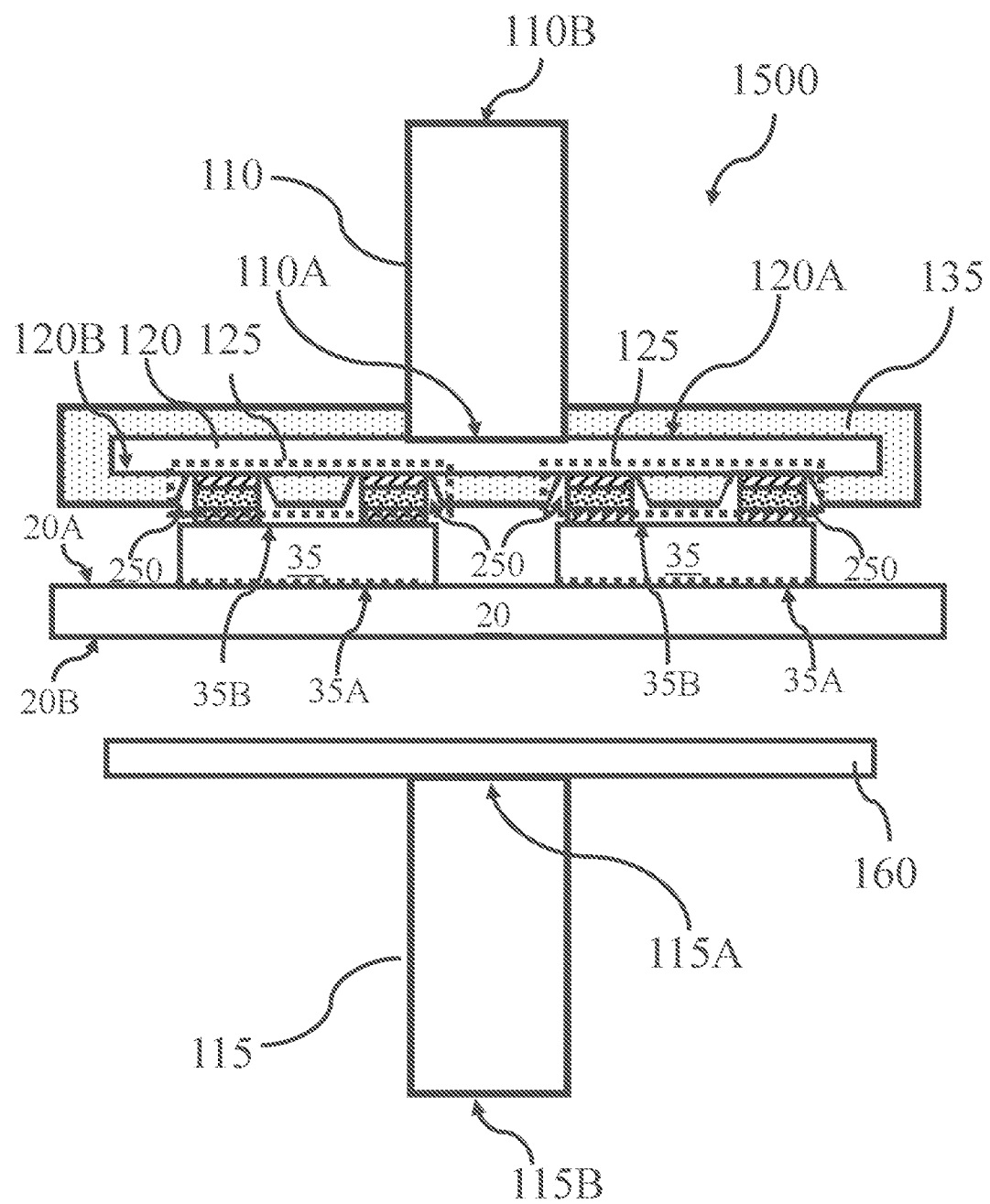
Figure 34C:
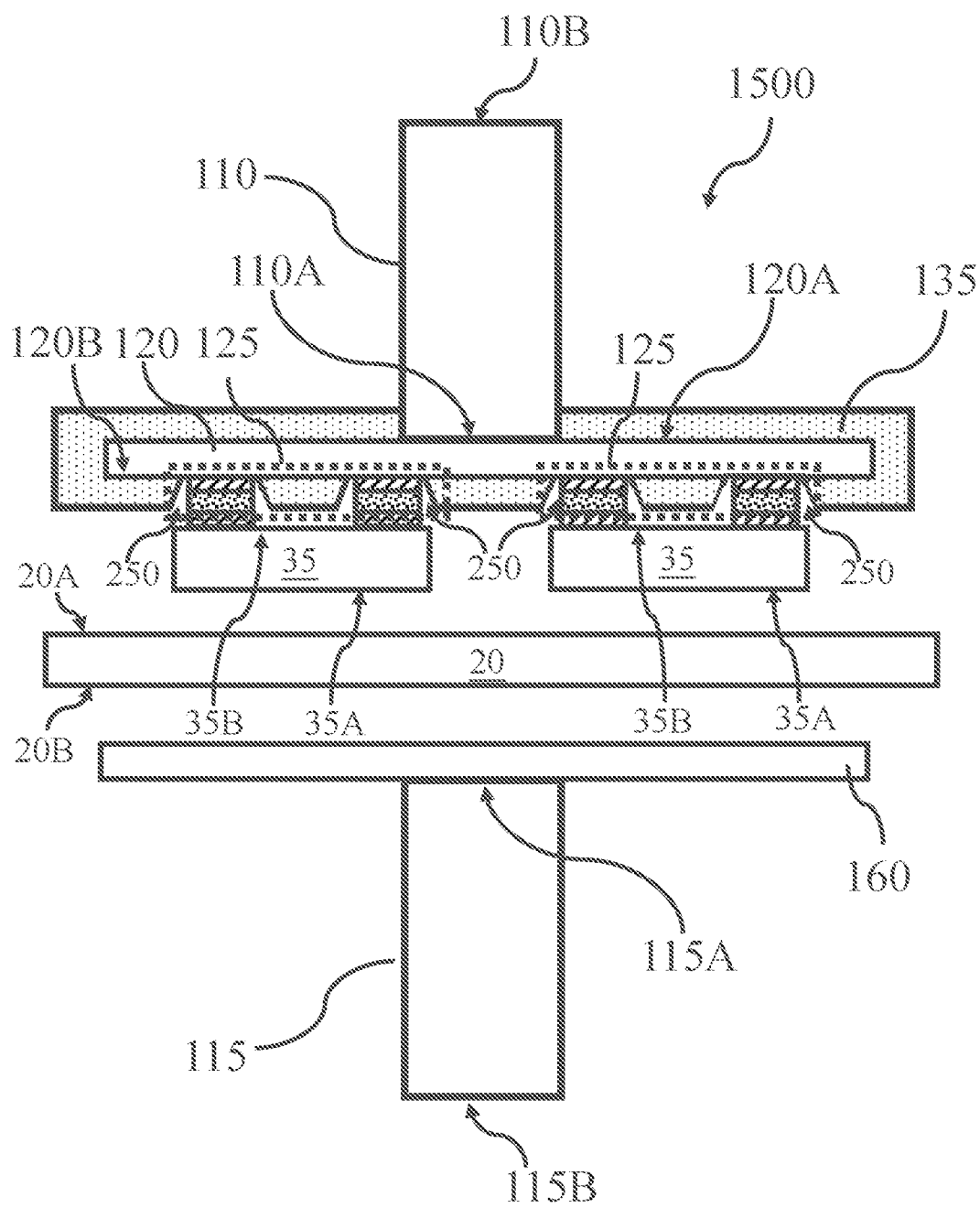

Next, referring to FIGS. 34B~34C. The magnetic field intensity of the first magnet 110 and the second magnet 115 of the apparatus for transferring microdevice 1500 were controlled to make each of the microdevices 35 be attracted by the magnetic attracting holes 250 in each of the microdevice alignment regions 125 through the magnetic attracting layer 50 of the magnetic attracting surface 35B thereof as shown in FIG. 34B and separated from the third surface 20A of the temporary carrier substrate 20 as shown in FIG. 34C. The microdevices 35 on the temporary carrier substrate 20 can sensing greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160. The microdevices 35 on the temporary carrier substrate 20 of this embodiment sensed greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160, and the magnetic field generated by the first magnetic substrate 120 and the second magnetic substrate 160 was stable, thereby the magnetic attracting layer 50 of the magnetic attracting surface 35B of each microdevice 35 was more precisely attracted by one of the magnetic attracting heads 150 in the alignment regions 125.

Figure 34D:
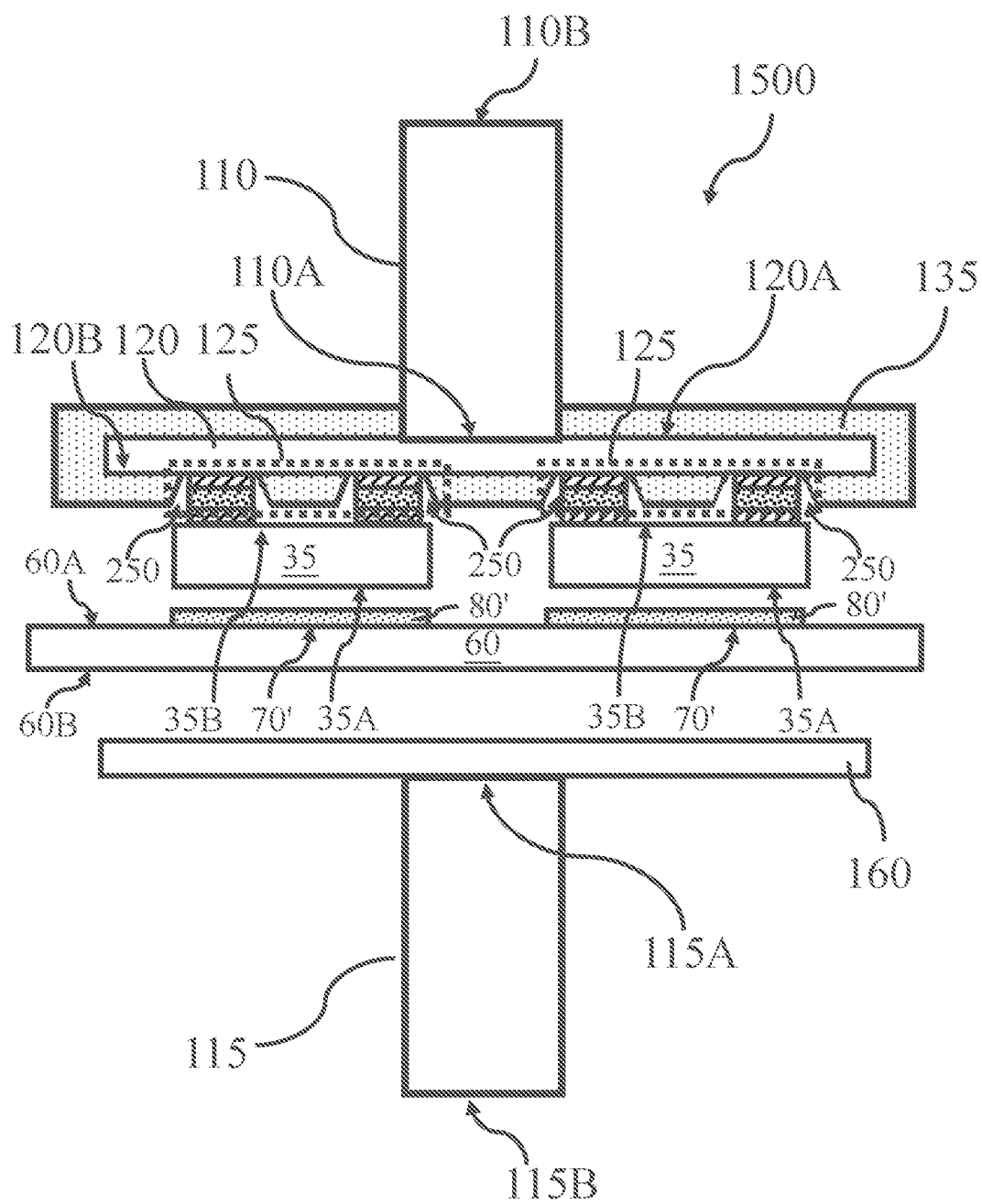

Next, referring to FIG. 34D. The target substrate 60 was moved into the apparatus for transferring microdevice 1500 after the temporary carrier substrate 20 was moved out of the apparatus for transferring microdevice 1500, wherein the target substrate 60 was located below the first magnetic attracting substrate 120 and faced the second surface 120B of the first magnetic attracting substrate 120 through the fifth surface 60A, and each of the microdevice bonding regions 70' on the fifth surface 60A of the target substrate 60 faced and aligned to each of the microdevice alignment regions 125 on the second surface 120B of the first magnetic attracting substrate 120.

Figure 34E:
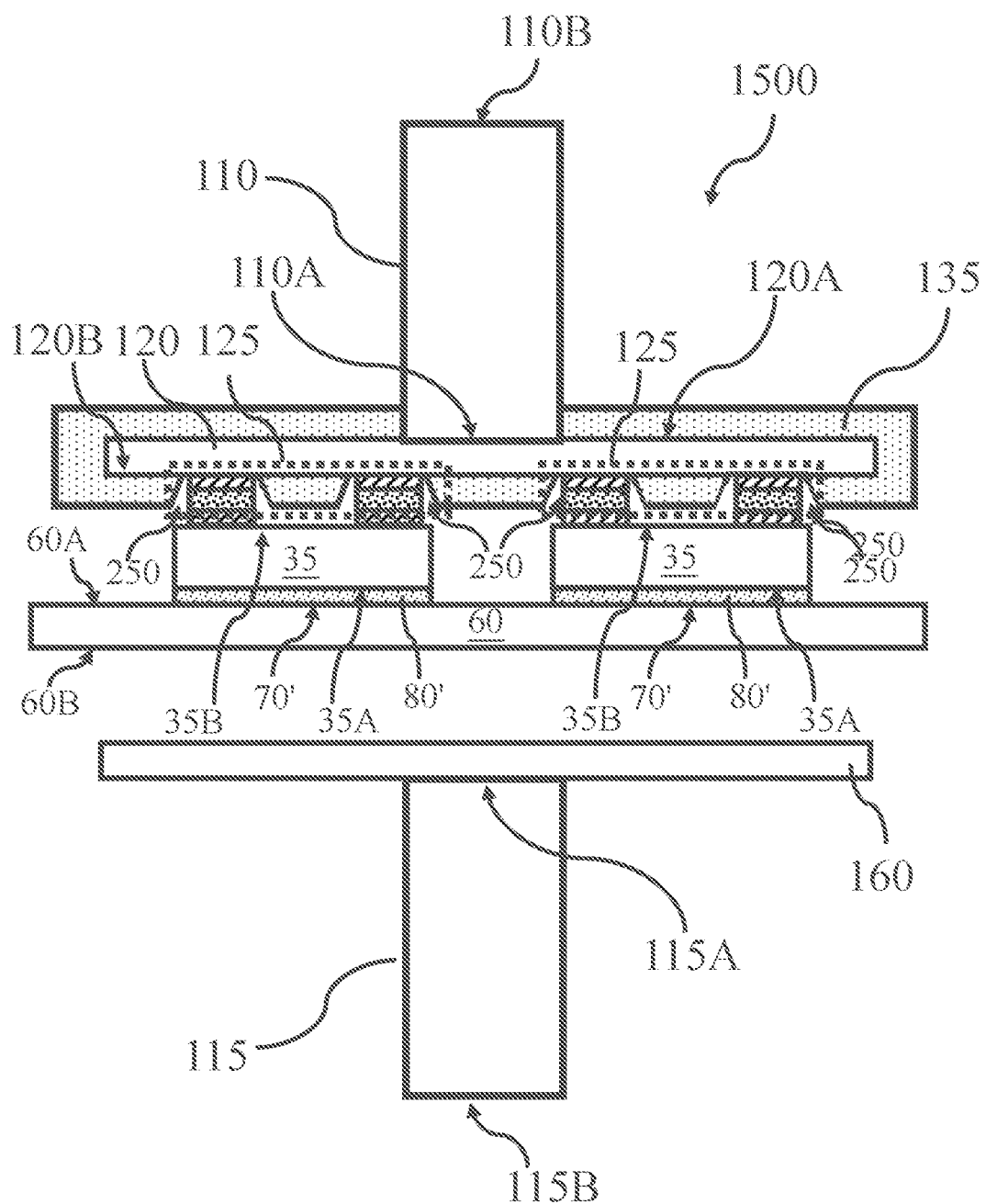

Next, referring to FIG. 34E. The first magnetic attracting substrate 120 was joined with the target substrate 60 to contact each of the microdevices 35 attracted by the magnetic attracting holes 250 in one of the microdevice alignment regions 125 to the conductive bonding layer 80' of the microdevice bonding regions 70' on the fifth surface 60A of the target substrate 60 through the bonding surface 35A thereof.

Figure 34F:
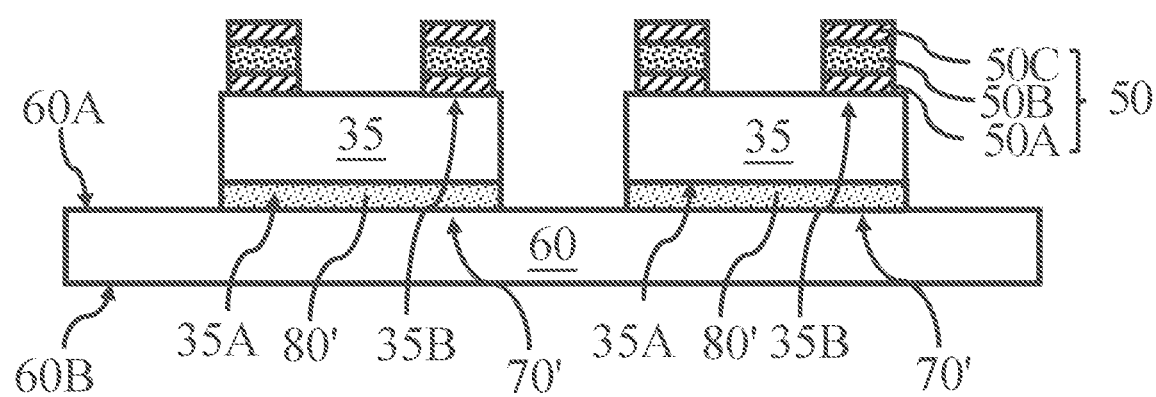

Finally, referring to FIG. 34F. A thermal treatment was applied to make each microdevice 35 bond to each conductive bonding layer 80' of each microdevice bonding region 70' through the bonding surface 35A thereof and separate from one of the alignment region 125 thereafter. Then, the process for transferring the microdevices 35 from the temporary carrier substrate 20 to the target substrate 60 was finished after each microdevice 35 was independently bonded to each conductive bonding layer 80' of each microdevice bonding region 70' on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80'.

Accordingly, microdevices can be mass-transferred and self-aligned since each of the microdevices 35 on the temporary carrier substrate 20 cab be attracted by the magnetic attracting holes 250 in each of the alignment regions 125 through the magnetic attracting layer 50 of the magnetic attracting surface 35B thereof, and transferred to each microdevice bonding regions 70' formed on the target 60 and aligned to each alignment region 125 thereafter.

Embodiment 16

Figure 35:
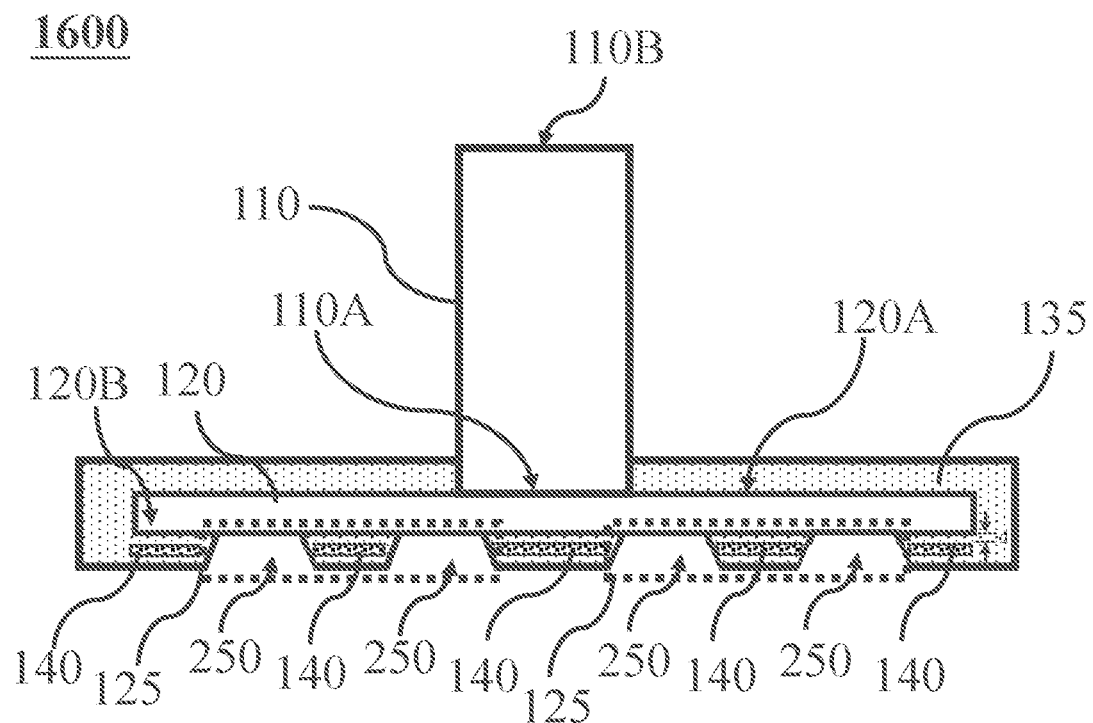
FIG. 35 is a cross-sectional view of an apparatus for transferring microdevice 1600 of Embodiment 16 of this invention.
Figure 35:
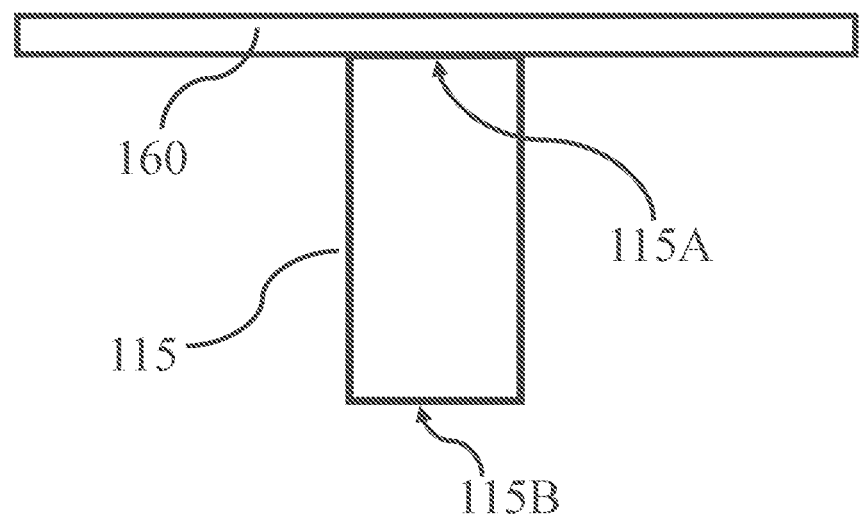

Please refer to FIGS. 35, 20A~20B, 21A~21B and 36A~36F. FIG. 35 is a cross-sectional view of an apparatus for transferring microdevice 1600 of Embodiment 16 of this invention. FIG. 20A is a top view of a temporary carrier substrate 20 with a plurality of microdevices 35 to be transferred formed thereon. FIG. 20B is a cross-sectional view of the temporary carrier substrate 20 along with the cross-sectional line V-V' shown in FIG. 20A. FIG. 21A is a top view of a target substrate 60 with a plurality of microdevice bonding regions 70' formed thereon, and each of the microdevice bonding regions 70' comprises a conductive bonding layer 80' formed thereon. FIG. 21B is a cross-sectional view of the target substrate 60 along with the cross-sectional line VI-VI' as shown in FIG. 21A. FIGS. 36A~36F are cross-sectional views showing the process according to the method for transferring microdevices of the Embodiment 16.

First, an apparatus for transferring microdevice 1600 as shown in FIG. 35 was provided. The structure of the apparatus for transferring microdevice 1600 is similar to that of the apparatus for transferring microdevice 1200 as shown in FIGS. 27A~27C except that the apparatus for transferring microdevice 1600 further comprises a second magnet 115 with a third terminal 115A and a fourth terminal 115B opposite to each other and a second magnetic attracting substrate 160, wherein the second magnetic attracting substrate 160 is contacted to the third terminal 115A of the second magnet 115, and the second magnetic substrate 160 is disposed under the first magnetic substrate 120. The second magnet 115 can be a permanent magnet or a electromagnet.

Next, a temporary carrier substrate 20 with a third surface 20A having a plurality of microdevices 35 spaced to each other and formed thereon and a fourth surface 20B opposite to each other as shown in FIGS. 20A~20B was provided. Each of the microdevices 35 comprises a bonding surface 35A and a magnetic attracting surface 35B opposite to the bonding surface 35A, wherein the bonding surface 35A comprises at least one bonding pad (not shown), and the magnetic attracting surface 35B comprises two or more magnetic attracting layers 50. The microdevices 35 can be for example but not limited to semiconductor devices, light-emitting diode dies or micro light emitting diode dies. The magnetic attracting layer 50 can further comprises a top metal layer 50C and a bottom metal layer 50A to sandwiched the magnetic material layer 50B therebetween. The bottom metal layer 50A, the magnetic material layer 50B and the top metal layer 50C can all be formed by plating, physical deposition or chemical vapor deposition in order. The bottom metal layer 50A and the top metal layer 50C can be metallic copper layers, and the magnetic material layer 50B can be selected from at least one of the group consisting of iron, cobalt, nickel and alloy thereof.

Next, a target substrate 60 with a fifth surface 60A and a sixth surface 60B opposite to each other as shown in FIGS. 21A~21B was provided. The fifth surface 60A comprises a plurality of microdevice bonding regions 70', and each of the microdevice bonding regions 70' has a conductive bonding layer 80' formed thereon. The conductive bonding layer 80' can be for example but not limited to a conductive glue, an anisotropic conductive film (ACF) or a thermal welding metal layer.

Figure 36A:
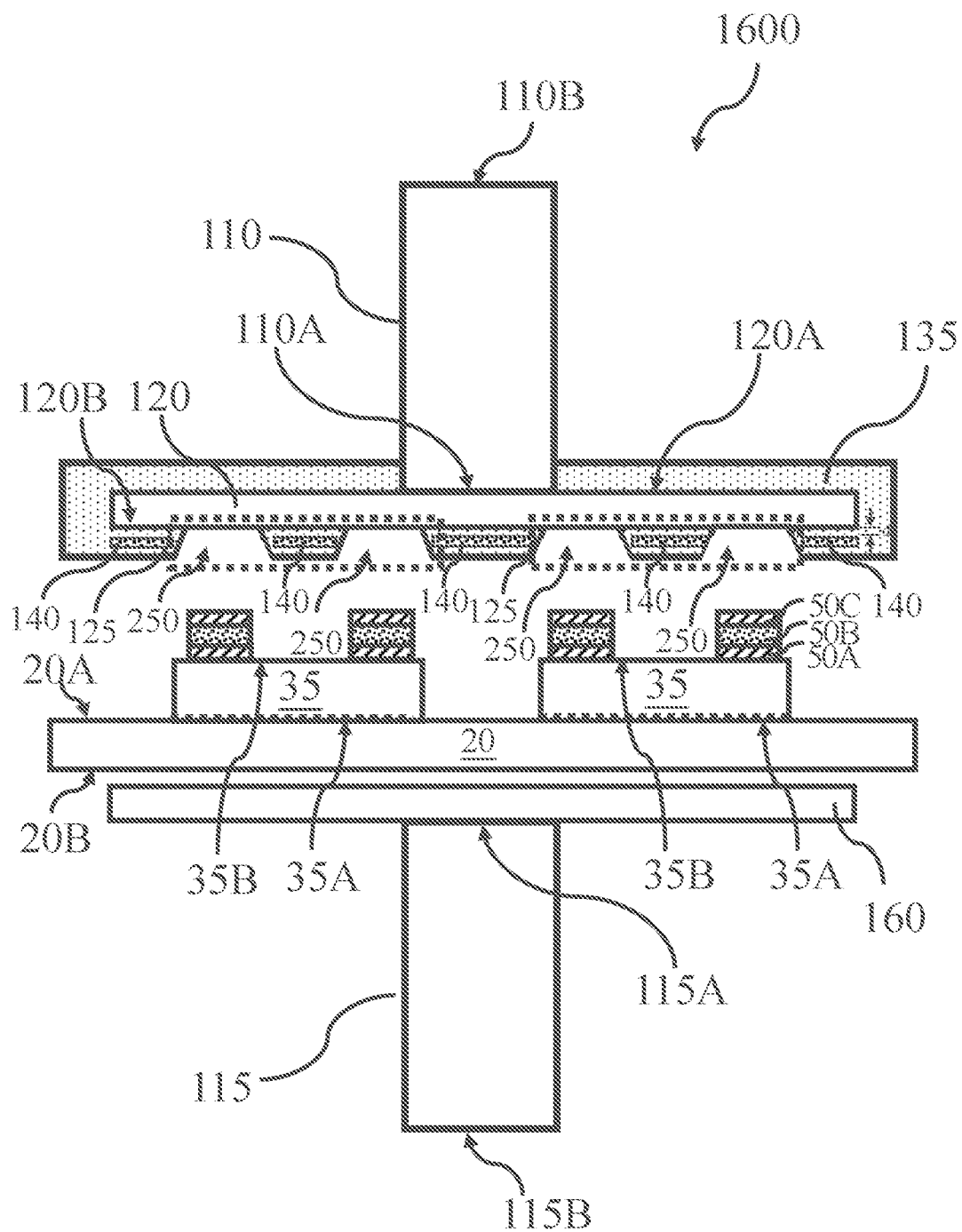
FIGS. 36A~36F are cross-sectional views showing the process according to the method for transferring microdevices of the Embodiment 16.

Next, referring to FIG. 36A. The temporary carrier substrate 20 was moved into the apparatus for transferring microdevice 1600, wherein the temporary carrier substrate 20 was located between the first magnetic attracting substrate 120 and the second magnetic attracting substrate 160, and faced the second surface 120B of the first magnetic attracting substrate 120 by the third surface 20A to make each magnetic attracting layer 50B of the magnetic attracting surface 35B of each microdevice 35 on the third surface 20A of the temporary carrier substrate 20 face the microdevice alignment regions 125 of the first magnetic attracting substrate 120. According to one embodiment of this invention, a step of lift-off by laser or UV to lift off the microdevices 35 from the third surface 20A of the temporary carrier substrate 20 as shown in FIG. 20B was optionally proceeded before the step of moving the temporary carrier substrate 20 into the apparatus for transferring microdevice 1500.

Figure 36B:
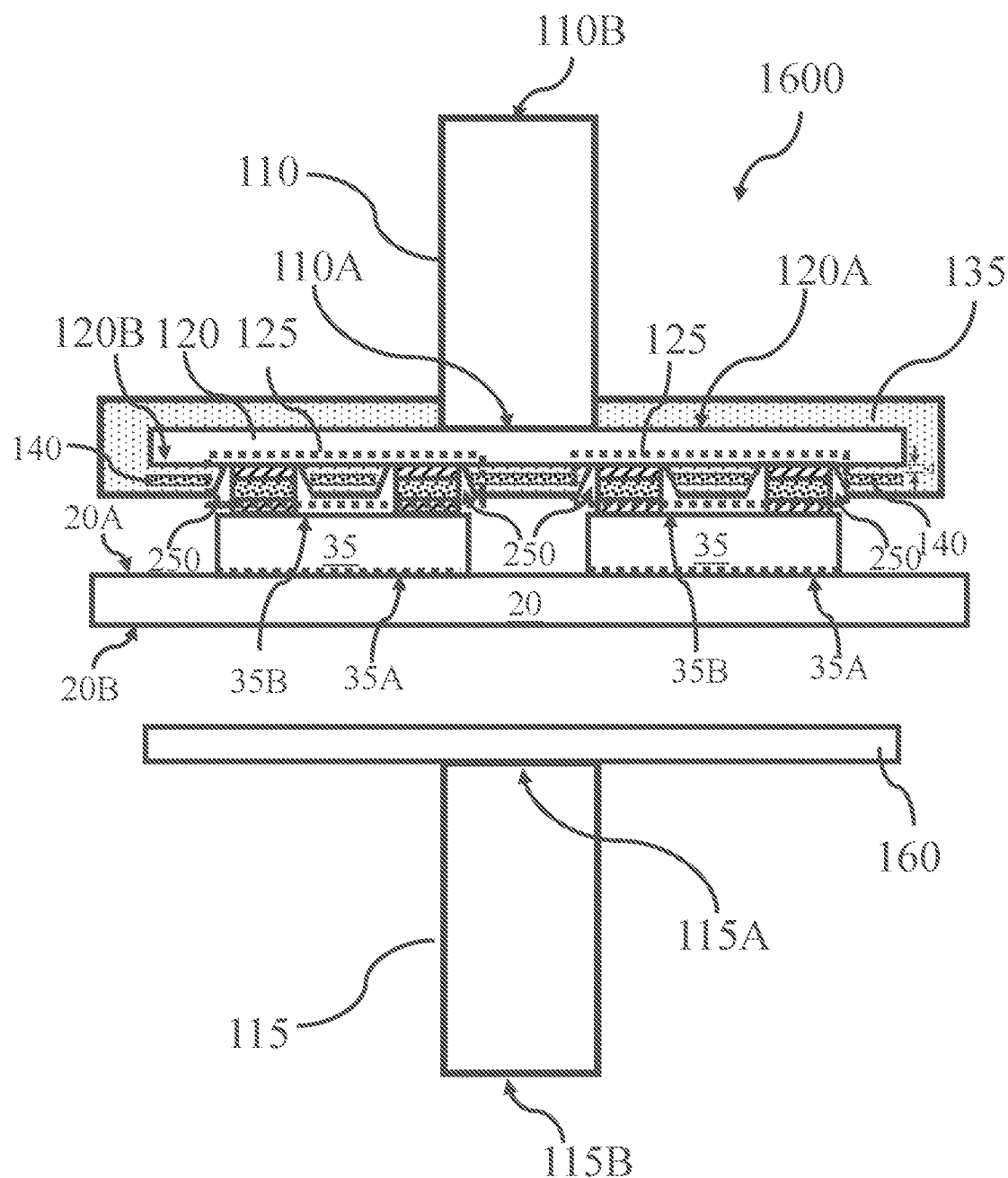
Figure 36C:
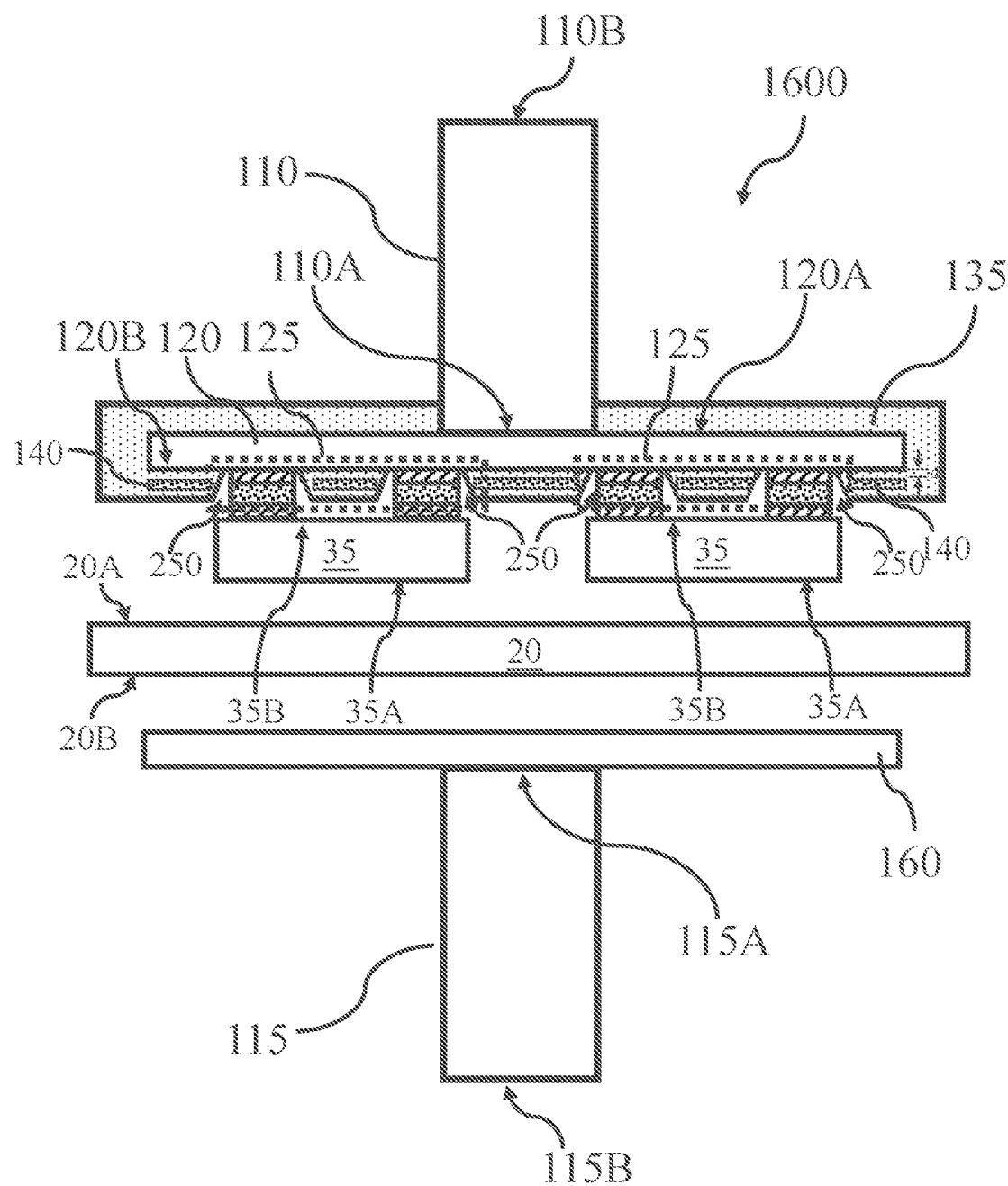

Next, referring to FIGS. 36B~36C. The magnetic field intensity of the first magnet 110 and the second magnet 115 of the apparatus for transferring microdevice 1600 were controlled to make each of the microdevices 35 be attracted by the magnetic attracting holes 250 in each of the microdevice alignment regions 125 through the magnetic attracting layer 50 of the magnetic attracting surface 35B thereof as shown in FIG. 36B and separated from the third surface 20A of the temporary carrier substrate 20 as shown in FIG. 36C. The microdevices 35 on the temporary carrier substrate 20 can sensing greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160. The microdevices 35 on the temporary carrier substrate 20 of this embodiment sensed greater magnetic force generated by the first magnetic attracting substrate 120 than that generated by the second magnetic attracting substrate 160 by controlling the distance between the temporary carrier substrate 20 and the first magnetic substrate 120, and/or by forming a magnetic shielding layer on the second magnetic substrate 160, and the magnetic field generated by the first magnetic substrate 120 and the second magnetic substrate 160 was stable, thereby the magnetic attracting layer 50 of the magnetic attracting surface 35B of each microdevice 35 was more precisely attracted by one of the magnetic attracting heads 150 in the alignment regions 125.

Figure 36D:
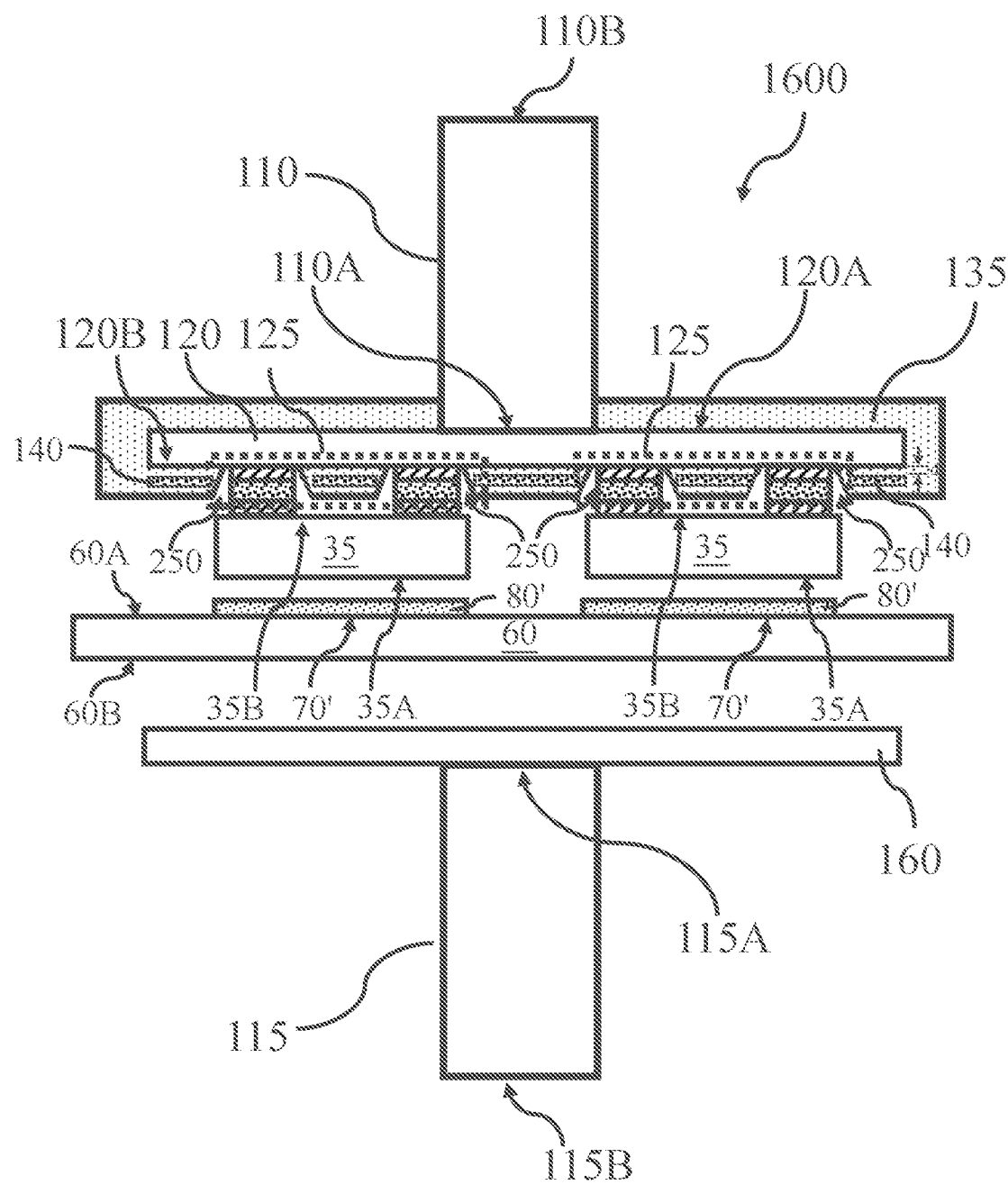

Next, referring to FIG. 36D. The target substrate 60 was moved into the apparatus for transferring microdevice 1600 after the temporary carrier substrate 20 was moved out of the apparatus for transferring microdevice 1600, wherein the target substrate 60 was located below the first magnetic attracting substrate 120 and faced the second surface 120B of the first magnetic attracting substrate 120 through the fifth surface 60A, and each of the microdevice bonding regions 70' on the fifth surface 60A of the target substrate 60 faced and aligned to each of the microdevice alignment regions 125 on the second surface 120B of the first magnetic attracting substrate 120.

Figure 36E:
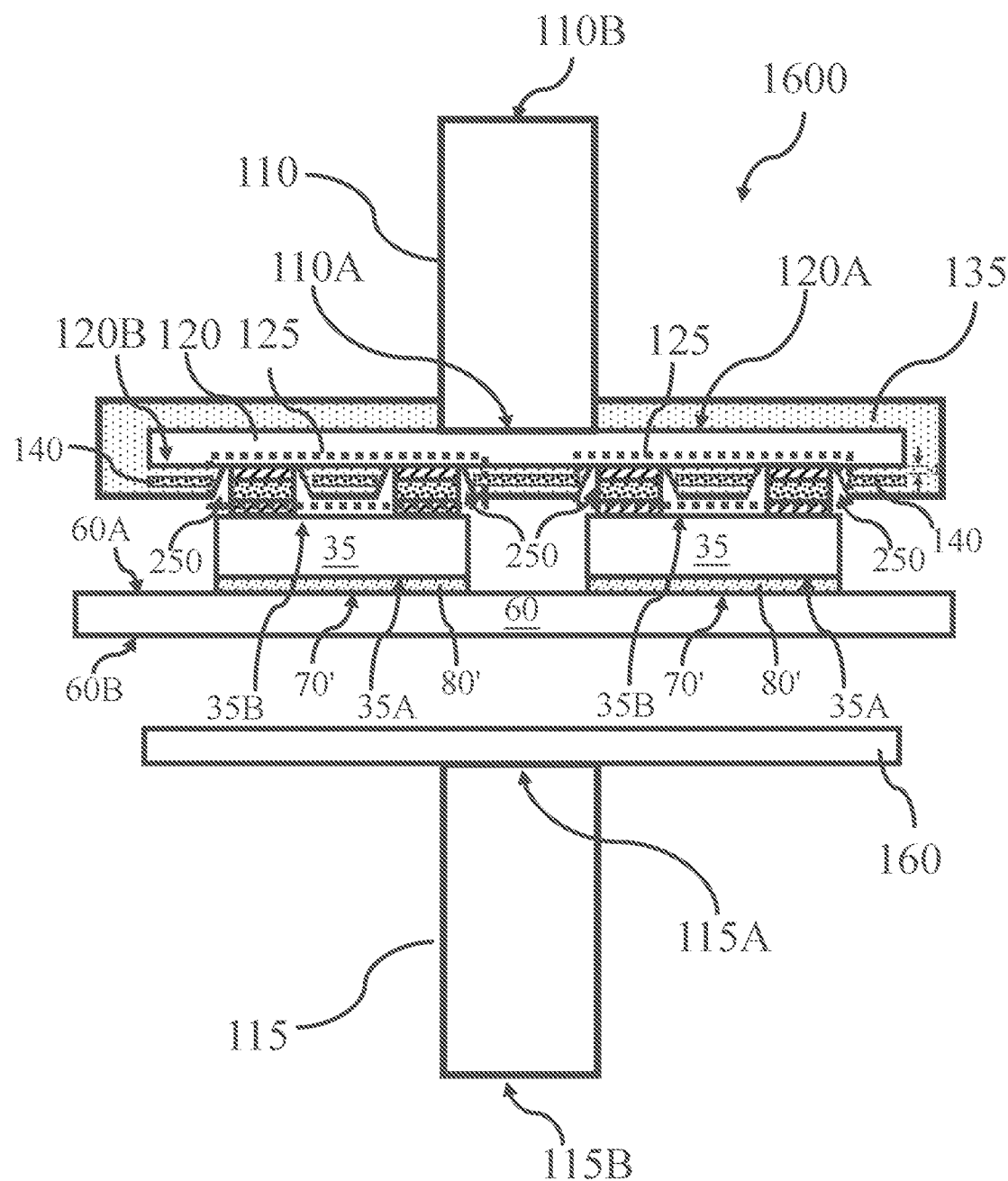

Next, referring to FIG. 36E. The first magnetic attracting substrate 120 was joined with the target substrate 60 to contact each of the microdevices 35 attracted by the magnetic attracting holes 250 in one of the microdevice alignment regions 125 to the conductive bonding layer 80' of the microdevice bonding regions 70' on the fifth surface 60A of the target substrate 60 through the bonding surface 35A thereof.

Figure 36F:
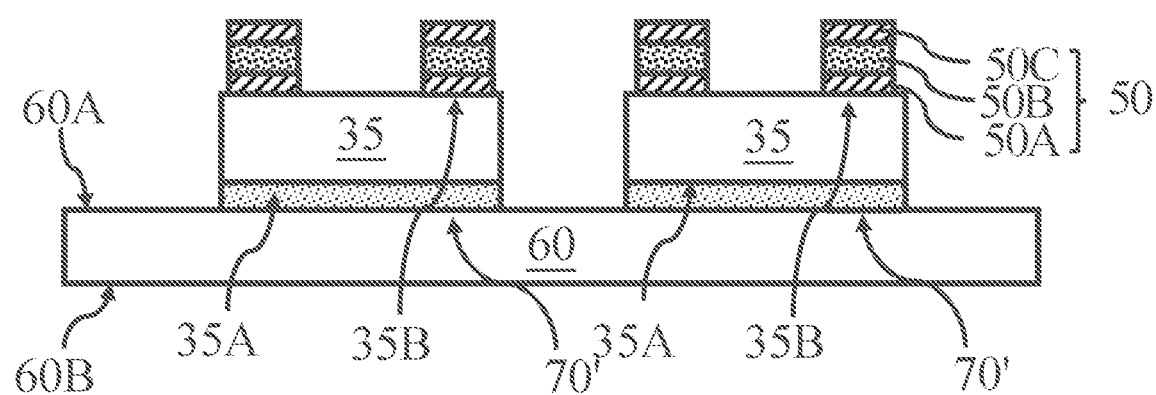

Finally, referring to FIG. 36F. A thermal treatment was applied to make each microdevice 35 bond to each conductive bonding layer 80' of each microdevice bonding region 70' through the bonding surface 35A thereof and separate from one of the alignment region 125 thereafter. Then, the process for transferring the microdevices 35 from the temporary carrier substrate 20 to the target substrate 60 was finished after each microdevice 35 was independently bonded to each conductive bonding layer 80' of each microdevice bonding region 70' on the fifth surface 60A of the target substrate 60.

The thermal treatment can be proceeded with or without a magnetic field. According to another embodiment of this invention, a cooling treatment can also be optionally proceeded after the thermal treatment to strength the bonding between the bonding pads (not shown) and the conductive bonding layers 80'.

Accordingly, microdevices can be mass-transferred and self-aligned since each of the microdevices 35 on the temporary carrier substrate 20 cab be attracted by the magnetic attracting holes 250 in each of the alignment regions 125 through the magnetic attracting layer 50 of the magnetic attracting surface 35B thereof, and transferred to each microdevice bonding regions 70' formed on the target 60 and aligned to each alignment region 125 thereafter.

The second surface 120B of the first magnetic absorbing substrate 120 as shown in one of the apparatus for transferring microdevices 100~800 according to above-mentioned Embodiments 1~8 exemplarily comprises a plurality of microdevice alignment regions 125 spaced with each other. Alternatively, the second surface 120B of the first magnetic absorbing substrate 120 as shown in one of the apparatus for transferring microdevices 100~800 according to other embodiment of this invention can be optionally modified to comprise only one microdevice alignment region 125, and the microdevice alignment region 125 comprises at least one magnetic attracting head 150 protruding out of the second surface 120B or the insulating layer 130 in the microdevice alignment region 125 comprises at least one magnetic attracting hole 250 exposing the second surface 120B for transferring a single microdevice 30 from the temporary substrate 20 to the target substrate 60. For example, a N.G.

microdevice 30 bonded on the target substrate 60 can be repaired by peeling off from the microdevice bonding region 70 on the fifth surface 60A of the target substrate 60 by laser to expose the conductive bonding layer 80 thereon in advance, and then a normal microdevice 30 on a temporary substrate 20 for replacing the N.G. microdevice 30 can be attracted by the magnetic attracting head 150 or the magnetic attracting hole 250 in the microdevice alignment region 125 and transferred to bond to the exposed conductive bonding layer 80 of the microdevice bonding region 70 thereafter by one of the methods described in Embodiment 1~8.

The second surface 120B of the first magnetic absorbing substrate 120 as shown in one of the apparatus for transferring microdevices 900-1600 according to above-mentioned Embodiments 9~16 exemplarily comprises a plurality of microdevice alignment regions 125 spaced with each other. Alternatively, the second surface 120B of the first magnetic absorbing substrate 120 as shown in one of the apparatus for transferring microdevices 900-1600 according to other embodiment of this invention can be optionally modified to comprise only one microdevice alignment region 125, and the microdevice alignment region 125 comprises at least one magnetic attracting head 150 protruding out of the second surface 120B or the insulating layer 130 in the microdevice alignment region 125 comprises at least one magnetic attracting hole 250 exposing the second surface 120B for transferring a single microdevice 35 from the temporary substrate 20 to the target substrate 60. For example, a N.G. microdevice 35 bonded on the target substrate 60 can be repaired by peeling off from the microdevice bonding region 70' on the fifth surface 60A of the target substrate 60 by laser to expose the conductive bonding layer 80' thereon in advance, and then a normal microdevice 35 on a temporary substrate 20 for replacing the N.G. microdevice 35 can be attracted by the magnetic attracting head 150 or the magnetic attracting hole 250 in the microdevice alignment region 125 and transferred to bond to the exposed conductive bonding layer 80 of the microdevice bonding region 70 thereafter by one of the methods described in Embodiment 9~16.

Although particular embodiments have been shown and described, it should be understood that the above discussion is not intended to limit the present invention to these embodiments. Persons skilled in the art will understand that various changes and modifications may be made without departing from the scope of the present invention as literally and equivalently covered by the following claims.

What is claimed is:

1. An apparatus for transferring at least one microdevice, comprising:
    a first magnet with a first terminal and a second terminal opposite to each other;
    a first magnetic attracting substrate with a first surface and a second surface opposite to each other disposed under the first magnet, wherein the first surface of the first magnetic attracting substrate is directly contacted to the first terminal of the first magnet, and the second surface of the first magnetic attracting substrate comprises at least one microdevice alignment region, and each one of the at least one microdevice alignment region comprises at least one magnetic attracting head protruding out of the second surface; and
    an insulating layer enveloping the first magnetic attracting substrate but partially exposing the at least one magnetic attracting head in each of the at least one microdevice alignment region.

2. The apparatus for transferring at least one microdevice as claimed in claim 1, further comprising a magnetic shielding layer disposed adjacent to the second surface of the first magnetic attracting substrate spaced with a distance d (d>0), wherein the magnetic shielding layer surrounds the at least one magnetic attracting head in each of the at least one microdevice alignment region.

3. The apparatus for transferring at least one microdevice as claimed in claim 1, further comprising a second magnet with a third terminal and a fourth terminal opposite to each other and a second magnetic attracting substrate, wherein the second magnetic attracting substrate is contacted to the third terminal of the second magnet, and the second magnetic attracting substrate is disposed under the first magnetic attracting substrate.

4. The apparatus for transferring at least one microdevice as claimed in claim 2, further comprising a second magnet with a third terminal and a fourth terminal opposite to each other and a second magnetic attracting substrate, wherein the second magnetic attracting substrate is contacted to the third terminal of the second magnet, and the second magnetic substrate is disposed under the first magnetic substrate.

5. A method for transferring at least one microdevice, comprising the steps of:
    providing an apparatus for transferring at least one microdevice as claimed in claim 1;
    providing a temporary carrier substrate with a third surface and a fourth surface opposite to each other, wherein at least one microdevice is placed on the third surface of the temporary carrier substrate through the bonding surface thereof, wherein the at least one microdevice comprises a bonding surface and a magnetic attracting surface opposite to the bonding surface, and the bonding surface comprises at least one bonding pad, and the magnetic attracting surface comprises at least one magnetic attracting layer;
    providing a target substrate with a fifth surface and a sixth surface opposite to each other, wherein the fifth surface comprises at least one microdevice bonding region, and each of the at least one microdevice bonding region has a conductive bonding layer formed thereon;
    moving the temporary carrier substrate into the apparatus for transferring at least one microdevice, wherein the temporary carrier substrate is located below the first magnetic attracting substrate and faces the second surface of the first magnetic attracting substrate by the third surface, and the magnetic attracting layer of the magnetic attracting surface of the at least one microdevice faces the at least one microdevice alignment region of the first magnetic attracting substrate;
    controlling the magnetic field intensity of the first magnet of the apparatus for transferring at least one microdevice to make the at least one microdevice be attracted by one of the at least one magnetic attracting head in one of the at least one microdevice alignment region through the magnetic attracting layer of the magnetic attracting surface thereof and separated from the third surface of the temporary carrier substrate;
    removing the temporary carrier substrate out of the apparatus for transferring at least one microdevice, and moving the target substrate into the apparatus for transferring at least one microdevice thereafter, wherein the target substrate is located below the first magnetic attracting substrate and faces the second surface of the first magnetic attracting substrate through the fifth surface, and each of the at least one microdevice bonding region on the fifth surface of the target substrate faces and aligns to each of the at least one microdevice alignment region on the second surface of the first magnetic attracting substrate;

jointing the first magnetic attracting substrate with the target substrate to contact the at least one microdevice attracted by one of the at least one magnetic attracting head in one of the at least one microdevice alignment region to the conductive bonding layer of the at least one microdevice bonding region on the fifth surface of the target substrate through the bonding surface thereof; and applying a thermal treatment to make the at least one microdevice bond to the conductive bonding layer of the at least one microdevice bonding region through the bonding surface thereof, and separate from the at least one alignment region and independently bond to the conductive bonding layer of the at least one microdevice bonding region on the fifth surface of the target substrate thereafter, and finish the process for transferring the at least one microdevice from the temporary carrier substrate to the target substrate.

6. The method for transferring at least one microdevice as claimed in claim 5, wherein the at least one microdevice is a semiconductor device, a light emitting diode (LED) die or a micro light emitting diode (LED) die.

7. The method for transferring at least one microdevice as claimed in claim 5, wherein the magnetic material layer of the at least one microdevice comprises a magnetic material selected from at least one of the group consisting of iron, cobalt, nickel and alloy thereof.

8. The method for transferring at least one microdevice as claimed in claim 5, further comprising a step of lift-off to lift off the at least one microdevice from the third surface of the temporary carrier substrate before the step of moving the temporary carrier substrate into the apparatus for transferring at least one microdevice.

9. The method for transferring at least one microdevice as claimed in claim 8, wherein the step of lift-off is proceeded by laser lift-off or UV lift-off.

10. A method for transferring at least one microdevice, comprising the steps of:

providing an apparatus for transferring at least one microdevice as claimed in claim 2;

providing a temporary carrier substrate with a third surface and a fourth surface opposite to each other, wherein at least one microdevice is placed on the third surface of the temporary carrier substrate through the bonding surface thereof, wherein the at least one microdevice comprises a bonding surface and a magnetic attracting surface opposite to the bonding surface, and the bonding surface comprises at least one bonding pad, and the magnetic attracting surface comprises at least one magnetic attracting layer;

providing a target substrate with a fifth surface and a sixth surface opposite to each other, wherein the fifth surface comprises at least one microdevice bonding region, and each of the at least one microdevice bonding region has a conductive bonding layer formed thereon;

moving the temporary carrier substrate into the apparatus for transferring at least one microdevice, wherein the temporary carrier substrate is located below the first magnetic attracting substrate and faces the second surface of the first magnetic attracting substrate by the third surface, and the magnetic attracting layer of the magnetic attracting surface of the at least one microdevice faces the at least one microdevice alignment region of the first magnetic attracting substrate;

controlling the magnetic field intensity of the first magnet of the apparatus for transferring at least one microdevice to make the at least one microdevice be attracted by one of the at least one magnetic attracting head in one of the at least one microdevice alignment region through the magnetic attracting layer of the magnetic attracting surface thereof and separated from the third surface of the temporary carrier substrate;

removing the temporary carrier substrate out of the apparatus for transferring at least one microdevice, and moving the target substrate into the apparatus for transferring at least one microdevice thereafter, wherein the target substrate is located below the first magnetic attracting substrate and faces the second surface of the first magnetic attracting substrate through the fifth surface, and each of the at least one microdevice bonding region on the fifth surface of the target substrate faces and aligns to each of the at least one microdevice alignment region on the second surface of the first magnetic attracting substrate;

jointing the first magnetic attracting substrate with the target substrate to contact the at least one microdevice attracted by one of the at least one magnetic attracting head in one of the at least one microdevice alignment region to the conductive bonding layer of the at least one microdevice bonding region on the fifth surface of the target substrate through the bonding surface thereof; and applying a thermal treatment to make the at least one microdevice bond to the conductive bonding layer of the at least one microdevice bonding region through the bonding surface thereof, and separate from the at least one alignment region and independently bond to the conductive bonding layer of the at least one microdevice bonding region on the fifth surface of the target substrate thereafter, and finish the process for transferring the at least one microdevice from the temporary carrier substrate to the target substrate.

11. The method for transferring at least one microdevice as claimed in claim 10, wherein the at least one microdevice is a semiconductor device, a light emitting diode (LED) die or a micro light emitting diode (LED) die.

12. The method for transferring at least one microdevice as claimed in claim 10, wherein the magnetic material layer of the at least one microdevice comprises a magnetic material selected from at least one of the group consisting of iron, cobalt, nickel and alloy thereof.

13. The method for transferring at least one microdevice as claimed in claim 10, further comprising a step of lift-off to lift off the at least one microdevice from the third surface of the temporary carrier substrate before the step of moving the temporary carrier substrate into the apparatus for transferring at least one microdevice.

14. The method for transferring at least one microdevice as claimed in claim 13, wherein the step of lift-off is proceeded by laser lift-off or UV lift-off.

15. A method for transferring at least one microdevice, comprising the steps of:

providing an apparatus for transferring at least one microdevice as claimed in claim 3;

providing a temporary carrier substrate with a third surface and a fourth surface opposite to each other, wherein at least one microdevice is placed on the third surface of the temporary carrier substrate through the bonding surface thereof, wherein the at least one microdevice comprises a bonding surface and a magnetic attracting surface opposite to the bonding surface, and the bonding surface comprises at least one bonding pad, and the magnetic attracting surface comprises at least one magnetic attracting layer;

providing a target substrate with a fifth surface and a sixth surface opposite to each other, wherein the fifth surface comprises at least one microdevice bonding region, and each of the at least one microdevice bonding region has a conductive bonding layer formed thereon;

moving the temporary carrier substrate into the apparatus for transferring at least one microdevice, wherein the temporary carrier substrate is located below the first magnetic attracting substrate and faces the second surface of the first magnetic attracting substrate by the third surface, and the magnetic attracting layer of the magnetic attracting surface of the at least one microdevice faces the at least one microdevice alignment region of the first magnetic attracting substrate;

controlling the magnetic field intensity of the first magnet of the apparatus for transferring at least one microdevice to make the at least one microdevice be attracted by one of the at least one magnetic attracting head in one of the at least one microdevice alignment region through the magnetic attracting layer of the magnetic attracting surface thereof and separated from the third surface of the temporary carrier substrate;

removing the temporary carrier substrate out of the apparatus for transferring at least one microdevice, and moving the target substrate into the apparatus for transferring at least one microdevice thereafter, wherein the target substrate is located below the first magnetic attracting substrate and faces the second surface of the first magnetic attracting substrate through the fifth surface, and each of the at least one microdevice bonding region on the fifth surface of the target substrate faces and aligns to each of the at least one microdevice alignment region on the second surface of the first magnetic attracting substrate;

jointing the first magnetic attracting substrate with the target substrate to contact the at least one microdevice attracted by one of the at least one magnetic attracting head in one of the at least one microdevice alignment region to the conductive bonding layer of the at least one microdevice bonding region on the fifth surface of the target substrate through the bonding surface thereof; and applying a thermal treatment to make the at least one microdevice bond to the conductive bonding layer of the at least one microdevice bonding region through the bonding surface thereof, and separate from the at least one alignment region and independently bond to the conductive bonding layer of the at least one microdevice bonding region on the fifth surface of the target substrate thereafter, and finish the process for transferring the at least one microdevice from the temporary carrier substrate to the target substrate.

16. The method for transferring at least one microdevice as claimed in claim 15, wherein the at least one microdevice is a semiconductor device, a light emitting diode (LED) die or a micro light emitting diode (LED) die.

17. The method for transferring at least one microdevice as claimed in claim 15, wherein the magnetic material layer of the at least one microdevice comprises a magnetic material selected from at least one of the group consisting of iron, cobalt, nickel and alloy thereof.

18. The method for transferring at least one microdevice as claimed in claim 15, further comprising a step of lift-off to lift off the at least one microdevice from the third surface of the temporary carrier substrate before the step of moving the temporary carrier substrate into the apparatus for transferring at least one microdevice.

19. The method for transferring at least one microdevice as claimed in claim 18, wherein the step of lift-off is proceeded by laser lift-off or UV lift-off.

20. The method for transferring at least one microdevice as claimed in claim 15, wherein a magnetic force generated by the first magnetic substrate greater than that generated by the second magnetic substrate felt by the at least one microdevice on the temporary carrier substrate is achieved by adjusting the distance between the temporary carrier substrate and the first magnetic attracting substrate, and/or enveloping the second magnetic substrate with a magnetic shielding layer.

21. A method for transferring at least one microdevice, comprising the steps of:

providing an apparatus for transferring at least one microdevice as claimed in claim 4;

providing a temporary carrier substrate with a third surface and a fourth surface opposite to each other, wherein at least one microdevice is placed on the third surface of the temporary carrier substrate through the bonding surface thereof, wherein the at least one microdevice comprises a bonding surface and a magnetic attracting surface opposite to the bonding surface, and the bonding surface comprises at least one bonding pad, and the magnetic attracting surface comprises at least one magnetic attracting layer;

providing a target substrate with a fifth surface and a sixth surface opposite to each other, wherein the fifth surface comprises at least one microdevice bonding region, and each of the at least one microdevice bonding region has a conductive bonding layer formed thereon;

moving the temporary carrier substrate into the apparatus for transferring at least one microdevice, wherein the temporary carrier substrate is located below the first magnetic attracting substrate and faces the second surface of the first magnetic attracting substrate by the third surface, and the magnetic attracting layer of the magnetic attracting surface of the at least one microdevice faces the at least one microdevice alignment region of the first magnetic attracting substrate;

controlling the magnetic field intensity of the first magnet of the apparatus for transferring at least one microdevice to make the at least one microdevice be attracted by one of the at least one magnetic attracting head in one of the at least one microdevice alignment region through the magnetic attracting layer of the magnetic attracting surface thereof and separated from the third surface of the temporary carrier substrate;

removing the temporary carrier substrate out of the apparatus for transferring at least one microdevice, and moving the target substrate into the apparatus for transferring at least one microdevice thereafter, wherein the target substrate is located below the first magnetic attracting substrate and faces the second surface of the first magnetic attracting substrate through the fifth surface, and each of the at least one microdevice bonding region on the fifth surface of the target substrate faces and aligns to each of the at least one microdevice alignment region on the second surface of the first magnetic attracting substrate;

jointing the first magnetic attracting substrate with the target substrate to contact the at least one microdevice attracted by one of the at least one magnetic attracting head in one of the at least one microdevice alignment region to the conductive bonding layer of the at least one microdevice bonding region on the fifth surface of the target substrate through the bonding surface thereof; and applying a thermal treatment to make the at least one microdevice bond to the conductive bonding layer of the at least one microdevice bonding region through the bonding surface thereof, and separate from the at least one alignment region and independently bond to the conductive bonding layer of the at least one microdevice bonding region on the fifth surface of the target substrate thereafter, and finish the process for transferring the at least one microdevice from the temporary carrier substrate to the target substrate.

22. The method for transferring at least one microdevice as claimed in claim 21, wherein the at least one microdevice is a semiconductor device, a light emitting diode (LED) die or a micro light emitting diode (LED) die.

23. The method for transferring at least one microdevice as claimed in claim 21, wherein the magnetic material layer of the at least one microdevice comprises a magnetic material selected from at least one of the group consisting of iron, cobalt, nickel and alloy thereof.

24. The method for transferring at least one microdevice as claimed in claim 21, further comprising a step of lift-off to lift off the at least one microdevice from the third surface of the temporary carrier substrate before the step of moving the temporary carrier substrate into the apparatus for transferring at least one microdevice.

25. The method for transferring at least one microdevice as claimed in claim 24, wherein the step of lift-off is proceeded by laser lift-off or UV lift-off.

26. The method for transferring at least one microdevice as claimed in claim 21, wherein a magnetic force generated by the first magnetic substrate greater than that generated by the second magnetic substrate felt by the at least one microdevice on the temporary carrier substrate is achieved by adjusting the distance between the temporary carrier substrate and the first magnetic attracting substrate, and/or enveloping the second magnetic substrate with a magnetic shielding layer.

27. An apparatus for transferring at least one microdevice, comprising:
a first magnet with a first terminal and a second terminal opposite to each other;
a first magnetic attracting substrate with a first surface and a second surface opposite to each other disposed under the first magnet, wherein the first surface of the first magnetic attracting substrate is directly contacted to the first terminal of the first magnet, and the second surface of the first magnetic attracting substrate comprises at least one microdevice alignment region; and
an insulating layer enveloping the first magnetic attracting substrate, wherein each of the at least one microdevice alignment region comprises at least one magnetic attracting hole exposing the second surface of the first magnetic attracting substrate.

28. The apparatus for transferring at least one microdevice as claimed in claim 27, further comprising a magnetic shielding layer disposed adjacent to the second surface of the first magnetic attracting substrate spaced with a distance d (d>0), wherein the magnetic shielding layer surrounds the at least one magnetic attracting hole in each of the at least one microdevice alignment region.

29. The apparatus for transferring at least one microdevice as claimed in claim 27, further comprising a second magnet with a third terminal and a fourth terminal opposite to each other and a second magnetic attracting substrate, wherein the second magnetic attracting substrate is contacted to the third terminal of the second magnet, and the second magnetic attracting substrate is disposed under the first magnetic attracting substrate.

30. The apparatus for transferring at least one microdevice as claimed in claim 28, further comprising a second magnet with a third terminal and a fourth terminal opposite to each other and a second magnetic attracting substrate, wherein the second magnetic attracting substrate is contacted to the third terminal of the second magnet, and the second magnetic substrate is disposed under the first magnetic substrate.

31. A method for transferring at least one microdevice, comprising the steps of:
providing an apparatus for transferring at least one microdevice as claimed in claim 27;
providing a temporary carrier substrate with a third surface and a fourth surface opposite to each other, wherein at least one microdevice is placed on the third surface of the temporary carrier substrate through the bonding surface thereof, wherein the at least one microdevice comprises a bonding surface and a magnetic attracting surface opposite to the bonding surface, and the bonding surface comprises at least one bonding pad, and the magnetic attracting surface comprises at least one magnetic attracting layer;
providing a target substrate with a fifth surface and a sixth surface opposite to each other, wherein the fifth surface comprises at least one microdevice bonding region, and each of the at least one microdevice bonding region has a conductive bonding layer formed thereon;
moving the temporary carrier substrate into the apparatus for transferring at least one microdevice, wherein the temporary carrier substrate is located below the first magnetic attracting substrate and faces the second surface of the first magnetic attracting substrate by the third surface, and the magnetic attracting layer of the magnetic attracting surface of the at least one microdevice faces the at least one microdevice alignment region of the first magnetic attracting substrate;
controlling the magnetic field intensity of the first magnet of the apparatus for transferring at least one microdevice to make the at least one microdevice be attracted by one of the at least one magnetic attracting hole in one of the at least one microdevice alignment region through the magnetic attracting layer of the magnetic attracting surface thereof and separated from the third surface of the temporary carrier substrate;
removing the temporary carrier substrate out of the apparatus for transferring at least one microdevice, and moving the target substrate into the apparatus for transferring at least one microdevice thereafter, wherein the target substrate is located below the first magnetic attracting substrate and faces the second surface of the first magnetic attracting substrate through the fifth surface, and each of the at least one microdevice bonding region on the fifth surface of the target substrate faces and aligns to each of the at least one microdevice alignment region on the second surface of the first magnetic attracting substrate;
jointing the first magnetic attracting substrate with the target substrate to contact the at least one microdevice attracted by one of the at least one magnetic attracting hole in one of the at least one microdevice alignment region to the conductive bonding layer of the at least one microdevice bonding region on the fifth surface of the target substrate through the bonding surface thereof; and applying a thermal treatment to make the at least one microdevice bond to the conductive bonding layer of the at least one microdevice bonding region through the bonding surface thereof, and separate from the at least one alignment region and independently bond to the conductive bonding layer of the at least one microdevice bonding region on the fifth surface of the target substrate thereafter, and finish the process for transferring the at least one microdevice from the temporary carrier substrate to the target substrate.

32. The method for transferring at least one microdevice as claimed in claim 31, wherein the at least one microdevice is a semiconductor device, a light emitting diode (LED) die or a micro light emitting diode (LED) die.

33. The method for transferring at least one microdevice as claimed in claim 31, wherein the magnetic material layer of the at least one microdevice comprises a magnetic material selected from at least one of the group consisting of iron, cobalt, nickel and alloy thereof.

34. The method for transferring at least one microdevice as claimed in claim 31, further comprising a step of lift-off to lift off the at least one microdevice from the third surface of the temporary carrier substrate before the step of moving the temporary carrier substrate into the apparatus for transferring at least one microdevice.

35. The method for transferring at least one microdevice as claimed in claim 34, wherein the step of lift-off is proceeded by laser lift-off or UV lift-off.

36. A method for transferring at least one microdevice, comprising the steps of:
providing an apparatus for transferring at least one microdevice as claimed in claim 28;
providing a temporary carrier substrate with a third surface and a fourth surface opposite to each other, wherein at least one microdevice is placed on the third surface of the temporary carrier substrate through the bonding surface thereof, wherein the at least one microdevice comprises a bonding surface and a magnetic attracting surface opposite to the bonding surface, and the bonding surface comprises at least one bonding pad, and the magnetic attracting surface comprises at least one magnetic attracting layer;
providing a target substrate with a fifth surface and a sixth surface opposite to each other, wherein the fifth surface comprises at least one microdevice bonding region, and each of the at least one microdevice bonding region has a conductive bonding layer formed thereon;
moving the temporary carrier substrate into the apparatus for transferring at least one microdevice, wherein the temporary carrier substrate is located below the first magnetic attracting substrate and faces the second surface of the first magnetic attracting substrate by the third surface, and the magnetic attracting layer of the magnetic attracting surface of the at least one microdevice faces the at least one microdevice alignment region of the first magnetic attracting substrate;
controlling the magnetic field intensity of the first magnet of the apparatus for transferring at least one microdevice to make the at least one microdevice be attracted by one of the at least one magnetic attracting hole in one of the at least one microdevice alignment region through the magnetic attracting layer of the magnetic attracting surface thereof and separated from the third surface of the temporary carrier substrate;

removing the temporary carrier substrate out of the apparatus for transferring at least one microdevice, and moving the target substrate into the apparatus for transferring at least one microdevice thereafter, wherein the target substrate is located below the first magnetic attracting substrate and faces the second surface of the first magnetic attracting substrate through the fifth surface, and each of the at least one microdevice bonding region on the fifth surface of the target substrate faces and aligns to each of the at least one microdevice alignment region on the second surface of the first magnetic attracting substrate;

jointing the first magnetic attracting substrate with the target substrate to contact the at least one microdevice attracted by one of the at least one magnetic attracting hole in one of the at least one microdevice alignment region to the conductive bonding layer of the at least one microdevice bonding region on the fifth surface of the target substrate through the bonding surface thereof; and applying a thermal treatment to make the at least one microdevice bond to the conductive bonding layer of the at least one microdevice bonding region through the bonding surface thereof, and separate from the at least one alignment region and independently bond to the conductive bonding layer of the at least one microdevice bonding region on the fifth surface of the target substrate thereafter, and finish the process for transferring the at least one microdevice from the temporary carrier substrate to the target substrate.

37. The method for transferring at least one microdevice as claimed in claim 36, wherein the at least one microdevice is a semiconductor device, a light emitting diode (LED) die or a micro light emitting diode (LED) die.

38. The method for transferring at least one microdevice as claimed in claim 36, wherein the magnetic material layer of the at least one microdevice comprises a magnetic material selected from at least one of the group consisting of iron, cobalt, nickel and alloy thereof.

39. The method for transferring at least one microdevice as claimed in claim 36, further comprising a step of lift-off to lift off the at least one microdevice from the third surface of the temporary carrier substrate before the step of moving the temporary carrier substrate into the apparatus for transferring at least one microdevice.

40. The method for transferring at least one microdevice as claimed in claim 39, wherein the step of lift-off is proceeded by laser lift-off or UV lift-off.

41. A method for transferring at least one microdevice, comprising the steps of:
providing an apparatus for transferring at least one microdevice as claimed in claim 29;
providing a temporary carrier substrate with a third surface and a fourth surface opposite to each other, wherein at least one microdevice is placed on the third surface of the temporary carrier substrate through the bonding surface thereof, wherein the at least one microdevice comprises a bonding surface and a magnetic attracting surface opposite to the bonding surface, and the bonding surface comprises at least one bonding pad, and the magnetic attracting surface comprises at least one magnetic attracting layer;
providing a target substrate with a fifth surface and a sixth surface opposite to each other, wherein the fifth surface comprises at least one microdevice bonding region, and each of the at least one microdevice bonding region has a conductive bonding layer formed thereon;

moving the temporary carrier substrate into the apparatus for transferring at least one microdevice, wherein the temporary carrier substrate is located below the first magnetic attracting substrate and faces the second surface of the first magnetic attracting substrate by the third surface, and the magnetic attracting layer of the magnetic attracting surface of the at least one microdevice faces the at least one microdevice alignment region of the first magnetic attracting substrate;

controlling the magnetic field intensity of the first magnet of the apparatus for transferring at least one microdevice to make the at least one microdevice be attracted by one of the at least one magnetic attracting hole in one of the at least one microdevice alignment region through the magnetic attracting layer of the magnetic attracting surface thereof and separated from the third surface of the temporary carrier substrate;

removing the temporary carrier substrate out of the apparatus for transferring at least one microdevice, and moving the target substrate into the apparatus for transferring at least one microdevice thereafter, wherein the target substrate is located below the first magnetic attracting substrate and faces the second surface of the first magnetic attracting substrate through the fifth surface, and each of the at least one microdevice bonding region on the fifth surface of the target substrate faces and aligns to each of the at least one microdevice alignment region on the second surface of the first magnetic attracting substrate;

jointing the first magnetic attracting substrate with the target substrate to contact the at least one microdevice attracted by one of the at least one magnetic attracting hole in one of the at least one microdevice alignment region to the conductive bonding layer of the at least one microdevice bonding region on the fifth surface of the target substrate through the bonding surface thereof; and applying a thermal treatment to make the at least one microdevice bond to the conductive bonding layer of the at least one microdevice bonding region through the bonding surface thereof, and separate from the at least one alignment region and independently bond to the conductive bonding layer of the at least one microdevice bonding region on the fifth surface of the target substrate thereafter, and finish the process for transferring the at least one microdevice from the temporary carrier substrate to the target substrate.

42. The method for transferring at least one microdevice as claimed in claim 41, wherein the at least one microdevice is a semiconductor device, a light emitting diode (LED) die or a micro light emitting diode (LED) die.

43. The method for transferring at least one microdevice as claimed in claim 41, wherein the magnetic material layer of the at least one microdevice comprises a magnetic material selected from at least one of the group consisting of iron, cobalt, nickel and alloy thereof.

44. The method for transferring at least one microdevice as claimed in claim 41, further comprising a step of lift-off to lift off the at least one microdevice from the third surface of the temporary carrier substrate before the step of moving the temporary carrier substrate into the apparatus for transferring at least one microdevice.

45. The method for transferring at least one microdevice as claimed in claim 44, wherein the step of lift-off is proceeded by laser lift-off or UV lift-off.

46. The method for transferring at least one microdevice as claimed in claim 41, wherein a magnetic force generated by the first magnetic substrate greater than that generated by the second magnetic substrate felt by the at least one microdevice on the temporary carrier substrate is achieved by adjusting the distance between the temporary carrier substrate and the first magnetic attracting substrate, and/or enveloping the second magnetic substrate with a magnetic shielding layer.

47. A method for transferring at least one microdevice, comprising the steps of:

providing an apparatus for transferring at least one microdevice as claimed in claim 30;

providing a temporary carrier substrate with a third surface and a fourth surface opposite to each other, wherein at least one microdevice is placed on the third surface of the temporary carrier substrate through the bonding surface thereof, wherein the at least one microdevice comprises a bonding surface and a magnetic attracting surface opposite to the bonding surface, and the bonding surface comprises at least one bonding pad, and the magnetic attracting surface comprises at least one magnetic attracting layer;

providing a target substrate with a fifth surface and a sixth surface opposite to each other, wherein the fifth surface comprises at least one microdevice bonding region, and each of the at least one microdevice bonding region has a conductive bonding layer formed thereon;

moving the temporary carrier substrate into the apparatus for transferring at least one microdevice, wherein the temporary carrier substrate is located below the first magnetic attracting substrate and faces the second surface of the first magnetic attracting substrate by the third surface, and the magnetic attracting layer of the magnetic attracting surface of the at least one microdevice faces the at least one microdevice alignment region of the first magnetic attracting substrate;

controlling the magnetic field intensity of the first magnet of the apparatus for transferring at least one microdevice to make the at least one microdevice be attracted by one of the at least one magnetic attracting hole in one of the at least one microdevice alignment region through the magnetic attracting layer of the magnetic attracting surface thereof and separated from the third surface of the temporary carrier substrate;

removing the temporary carrier substrate out of the apparatus for transferring at least one microdevice, and moving the target substrate into the apparatus for transferring at least one microdevice thereafter, wherein the target substrate is located below the first magnetic attracting substrate and faces the second surface of the first magnetic attracting substrate through the fifth surface, and each of the at least one microdevice bonding region on the fifth surface of the target substrate faces and aligns to each of the at least one microdevice alignment region on the second surface of the first magnetic attracting substrate;

jointing the first magnetic attracting substrate with the target substrate to contact the at least one microdevice attracted by one of the at least one magnetic attracting hole in one of the at least one microdevice alignment region to the conductive bonding layer of the at least one microdevice bonding region on the fifth surface of the target substrate through the bonding surface thereof; and applying a thermal treatment to make the at least one microdevice bond to the conductive bonding layer of the at least one microdevice bonding region through the bonding surface thereof, and separate from the at least one alignment region and independently bond to the conductive bonding layer of the at least one microdevice bonding region on the fifth surface of the target substrate thereafter, and finish the process for transferring the at least one microdevice from the temporary carrier substrate to the target substrate.

48. The method for transferring at least one microdevice as claimed in claim 47, wherein the at least one microdevice is a semiconductor device, a light emitting diode (LED) die or a micro light emitting diode (LED) die.

49. The method for transferring at least one microdevice as claimed in claim 47, wherein the magnetic material layer of the at least one microdevice comprises a magnetic material selected from at least one of the group consisting of iron, cobalt, nickel and alloy thereof.

50. The method for transferring at least one microdevice as claimed in claim 47, further comprising a step of lift-off to lift off the at least one microdevice from the third surface of the temporary carrier substrate before the step of moving the temporary carrier substrate into the apparatus for transferring at least one microdevice.

51. The method for transferring at least one microdevice as claimed in claim 50, wherein the step of lift-off is proceeded by laser lift-off or UV lift-off.

52. The method for transferring at least one microdevice as claimed in claim 47, wherein a magnetic force generated by the first magnetic substrate greater than that generated by the second magnetic substrate felt by the at least one microdevice on the temporary carrier substrate is achieved by adjusting the distance between the temporary carrier substrate and the first magnetic attracting substrate, and/or enveloping the second magnetic substrate with a magnetic shielding layer.

* * * * *